(12) United States Patent
Szigethy

(10) Patent No.: US 10,941,170 B2
(45) Date of Patent: Mar. 9, 2021

(54) ORGANIC ELECTROLUMINESCENT MATERIALS AND DEVICES

(71) Applicant: Universal Display Corporation, Ewing, NJ (US)

(72) Inventor: Geza Szigethy, Ewing, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 319 days.

(21) Appl. No.: 15/944,052

(22) Filed: Apr. 3, 2018

(65) Prior Publication Data

US 2018/0319830 A1    Nov. 8, 2018

Related U.S. Application Data

(60) Provisional application No. 62/500,545, filed on May 3, 2017.

(51) Int. Cl.
| | | |
|---|---|---|
| *C07F 15/00* | (2006.01) | |
| *H01L 51/00* | (2006.01) | |
| *H01L 51/50* | (2006.01) | |

(52) U.S. Cl.
CPC ........ *C07F 15/0033* (2013.01); *C07F 15/002* (2013.01); *C07F 15/0046* (2013.01); *C07F 15/0073* (2013.01); *H01L 51/0067* (2013.01); *H01L 51/0085* (2013.01); *H01L 51/0086* (2013.01); *H01L 51/0088* (2013.01); *H01L 51/0071* (2013.01); *H01L 51/0072* (2013.01); *H01L 51/0074* (2013.01); *H01L 51/0094* (2013.01); *H01L 51/5016* (2013.01)

(58) Field of Classification Search
CPC ................ C07F 15/0046; C07F 15/002; C07F 15/0033; C07F 15/0073; C08L 51/0088; C08L 51/0085; C08L 51/0067; C08L 51/0086; C08L 51/0072; C08L 51/0074; C08L 51/0071; C08L 51/0094; C08L 51/0016

See application file for complete search history.

(56) References Cited

U.S. PATENT DOCUMENTS

| | | |
|---|---|---|
| 4,769,292 A | 9/1988 | Tang |
| 5,061,569 A | 10/1991 | Vanslyke |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,528,187 B1 | 3/2003 | Okada |
| 6,687,266 B1 | 2/2004 | Ma |
| 6,835,469 B2 | 12/2004 | Kwong |
| 6,921,915 B2 | 7/2005 | Takiguchi |
| 7,087,321 B2 | 8/2006 | Kwong |
| 7,090,928 B2 | 8/2006 | Thompson |
| 7,154,114 B2 | 12/2006 | Brooks |
| 7,250,226 B2 | 7/2007 | Tokito |
| 7,279,704 B2 | 10/2007 | Walters |
| 7,332,232 B2 | 2/2008 | Ma |
| 7,338,722 B2 | 3/2008 | Thompson |
| 7,393,599 B2 | 7/2008 | Thompson |
| 7,396,598 B2 | 7/2008 | Takeuchi |
| 7,431,968 B1 | 10/2008 | Shtein |
| 7,445,855 B2 | 11/2008 | MacKenzie |
| 7,534,505 B2 | 5/2009 | Lin |
| 7,968,146 B2 | 6/2011 | Wagner |
| 8,409,729 B2 | 4/2013 | Zeng |
| 10,418,569 B2 * | 9/2019 | Kwong et al. ...... C07F 15/0033 |
| 2002/0034656 A1 | 3/2002 | Thompson |
| 2002/0134984 A1 | 9/2002 | Igarashi |
| 2002/0158242 A1 | 10/2002 | Son |
| 2003/0138657 A1 | 7/2003 | Li |
| 2003/0152802 A1 | 8/2003 | Tsuboyama |
| 2003/0162053 A1 | 8/2003 | Marks |
| 2003/0175553 A1 | 9/2003 | Thompson |
| 2003/0230980 A1 | 12/2003 | Forrest |
| 2004/0036077 A1 | 2/2004 | Ise |
| 2004/0137267 A1 | 7/2004 | Igarashi |
| 2004/0137268 A1 | 7/2004 | Igarashi |
| 2004/0174116 A1 | 9/2004 | Lu |

(Continued)

FOREIGN PATENT DOCUMENTS

| | | |
|---|---|---|
| EP | 0650955 | 5/1995 |
| EP | 1238981 | 9/2002 |

(Continued)

OTHER PUBLICATIONS

Wong, Wai-Yeung, "Multifunctional Iridium Complexes Based on Carbazole Modules as Highly Efficient Electrophosphors," Angew. Chem. Int. Ed., 45:7800-7803 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode: an Isoindole Derivative," Chem. Mater., 15(16):3148-3151 (2003).

Okumoto, Kenji et al., "Green Fluorescent Organic Light-Emitting Device with External Quantum Efficiency of Nearly 10%," Appl. Phys. Lett., 89:063504-1-063504-3 (2006).

(Continued)

*Primary Examiner* — Nathan M Nutter
(74) *Attorney, Agent, or Firm* — Riverside Law LLP

(57) ABSTRACT

The present invention includes novel hexadentate metal complexes. The complexes hexadentate ligands of the present invention may be useful as improved emitters in an OLED device.

20 Claims, 2 Drawing Sheets

(56) References Cited

U.S. PATENT DOCUMENTS

| | | |
|---|---|---|
| 2005/0025993 A1 | 2/2005 | Thompson |
| 2005/0112407 A1 | 5/2005 | Ogasawara |
| 2005/0238919 A1 | 10/2005 | Ogasawara |
| 2005/0244673 A1 | 11/2005 | Satoh |
| 2005/0260441 A1 | 11/2005 | Thompson |
| 2005/0260449 A1 | 11/2005 | Walters |
| 2006/0008670 A1 | 1/2006 | Lin |
| 2006/0202194 A1 | 9/2006 | Jeong |
| 2006/0240279 A1 | 10/2006 | Adamovich |
| 2006/0251923 A1 | 11/2006 | Lin |
| 2006/0263635 A1 | 11/2006 | Ise |
| 2006/0280965 A1 | 12/2006 | Kwong |
| 2007/0190359 A1 | 8/2007 | Knowles |
| 2007/0278938 A1 | 12/2007 | Yabunouchi |
| 2008/0015355 A1 | 1/2008 | Schafer |
| 2008/0018221 A1 | 1/2008 | Egen |
| 2008/0106190 A1 | 5/2008 | Yabunouchi |
| 2008/0124572 A1 | 5/2008 | Mizuki |
| 2008/0220265 A1 | 9/2008 | Xia |
| 2008/0297033 A1 | 12/2008 | Knowles |
| 2009/0008605 A1 | 1/2009 | Kawamura |
| 2009/0009065 A1 | 1/2009 | Nishimura |
| 2009/0017330 A1 | 1/2009 | Iwakuma |
| 2009/0030202 A1 | 1/2009 | Iwakuma |
| 2009/0039776 A1 | 2/2009 | Yamada |
| 2009/0045730 A1 | 2/2009 | Nishimura |
| 2009/0045731 A1 | 2/2009 | Nishimura |
| 2009/0101870 A1 | 4/2009 | Prakash |
| 2009/0108737 A1 | 4/2009 | Kwong |
| 2009/0115316 A1 | 5/2009 | Zheng |
| 2009/0165846 A1 | 7/2009 | Johannes |
| 2009/0167162 A1 | 7/2009 | Lin |
| 2009/0179554 A1 | 7/2009 | Kuma |
| 2013/0026452 A1 | 1/2013 | Kottas |
| 2013/0119354 A1 | 5/2013 | Ma |
| 2014/0054564 A1 | 2/2014 | Kim |
| 2015/0318487 A1 | 11/2015 | Ito |
| 2018/0026209 A1 | 1/2018 | Stoessel |

FOREIGN PATENT DOCUMENTS

| | | |
|---|---|---|
| EP | 1725079 | 11/2006 |
| EP | 2034538 | 3/2009 |
| EP | 2551932 | 1/2013 |
| EP | 2977378 | 1/2016 |
| JP | 200511610 | 1/2005 |
| JP | 2007123392 | 5/2007 |
| JP | 2007254297 | 10/2007 |
| JP | 2008074939 A | 4/2008 |
| JP | 2010135467 | 6/2010 |
| JP | 2013168552 | 8/2013 |
| JP | 2013235950 | 11/2013 |
| JP | 2013247174 | 12/2013 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2004111066 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008044723 | 4/2008 |
| WO | 2008056746 | 5/2008 |
| WO | 2008057394 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 A2 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2010011390 | 1/2010 |
| WO | 2010111175 | 9/2010 |
| WO | 2010126234 | 11/2010 |
| WO | 2016124304 | 8/2016 |

OTHER PUBLICATIONS

Paulose, Betty Marie Jennifer S, et al., "First Examples of Alkenyl Pyridines as Organic Ligands for Phosphorescent Iridium Complexes," Adv. Mater., 16(22):2003-2007 (2004).

Tang, C.W. and VanSlyke, S.A., "Organic Electroluminescent Diodes," Appl. Phys. Lett., 51(12):913-915 (1987).

T. Ostergard et al., "Langmuir-Blodgett Light-Emitting Diodes of Poly(3-Hexylthiophene): Electro-Optical Characteristics Related to Structure," Synthetic Metals, 87:171-177 (1997).

Tung, Yung-Liang et al., "Organic Light-Emitting Diodes Based on Charge-Neutral Ru II PHosphorescent Emitters," Adv. Mater., 17(8):1059-1064 (2005).

Van Slyke, S. A. et al., "Organic Electroluminescent Devices with Improved Stability," Appl. Phys. Lett, 69(15):2160-2162 (1996).

Wong, Keith Man-Chung et al., "A Novel Class of Phosphorescent Gold(III) Alkynyl-Based Organic Light-Emitting Devices with Tunable Colour," Chem. Commun., 2906-2908 (2005).

Adachi, Chihaya et al., "Organic Electroluminescent Device Having a Hole Conductor as an Emitting Layer," Appl. Phys. Lett., 55(15):1489-1491 (1989).

Baldo et al., "Highly Efficient Phosphorescent Emission from Organic Electroluminescent Devices," Nature, vol. 395,151-154, (1998).

Gao, Zhiqiang et al., "Bright-Blue Electroluminescence From a Silyl-Substituted ter-(phenylene-vinylene) derivative," Appl. Phys. Lett., 74(6):865-867 (1999).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Wang, Y. et al., "Highly Efficient Electroluminescent Materials Based on Fluorinated Organometallic Iridium Compounds," Appl. Phys. Lett., 79(4):449-451 (2001).

Kwong, Raymond C. et al., "High Operational Stability of Electrophosphorescent Devices," Appl. Phys. Lett., 81(1):162-164 (2002).

Holmes, R.J. et al., "Blue Organic Electrophosphorescence Using Exothermic Host-Guest Energy Transfer," Appl. Phys. Lett., 82(15):2422-2424 (2003).

Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1153505-3 (2005).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

(56) References Cited

OTHER PUBLICATIONS

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
Adachi, Chihaya et al., "High-Efficiency Red Electrophosphorescence Devices," Appl. Phys. Lett., 78(11):1622-1624 (2001).
Hamada, Yuji et al., "High Luminance in Organic Electroluminescent Devices with Bis(10-hydroxybenzordquinolinato)beryllium as an Emitter," Chem. Lett., 905-906 (1993).
Nishida, Jun-ichi et al., "Preparation, Characterization, and Electroluminescence Characteristics of a-Diimine-type Platinum(II) Complexes with Perfluorinated Phenyl Groups as Ligands," Chem. Lett., 34(4):592-593 (2005).
Baldo et al., "Very high-efficiency green organic light-emitting devices based on electrophosphorescence," Appl. Phys. Lett., vol. 75, No. 3, 4-6 (1999).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Niu, Yu-Hua et al., "Highly Efficient Electrophosphorescent Devices with Saturated Red Emission from a Neutral Osmium Complex," Chem. Mater., 17(13):3532-3536 (2005).
Lo, Shih-Chun et al., "Blue Phosphorescence from Iridium(III) Complexes at Room Temperature," Chem. Mater., 18(21):5119-5129 (2006).
Takizawa, Shin-ya et al., "Phosphorescent Iridium Complexes Based on 2-Phenylimidazo[1,2-a]pyridine Ligands: Tuning of Emission Color toward the Blue Region and Application to Polymer Light-Emitting Devices," Inorg. Chem., 46(10):4308-4319 (2007).
Lamansky, Sergey et al., "Synthesis and Characterization of Phosphorescent Cyclometalated Iridium Complexes," Inorg. Chem., 40(7)1 704-1711 (2001).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Noda, Tetsuya and Shirota,Yasuhiko, "5,6-Bis(dinnesitylboryI)-2,2'-bithiophene and 5,5"-Bis(dimesitylboryl)-2,2':5',2"-terthiophene as a Novel Family of Electron-Transporting Amorphous Molecular Materials," J. Am. Chem. Soc., 120 (37):9714-9715 (1998).
Sakamoto, Youichi et al., "Synthesis, Characterization, and Electron-Transport Property of Perfluorinated Phenylene Dendrimers," J. Am. Chem. Soc., 122(8):1832-1833 (2000).
Adachi, Chihaya et al., "Nearly 100% Internal Phosphorescence Efficiency in an Organic Light Emitting Device," J. Appl. Phys., 90(10):5048-5051 (2001).
Shirota, Yasuhiko et al., "Starburst Molecules Based on p-Electron Systems as Materials for Organic Electroluminescent Devices," Journal of Luminescence, 72-74:985-991 (1997).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kido, Junji et al.,"1,2,4-Triazole Derivative as an Electron Transport Layer in Organic Electroluminescent Devices," Jpn. J. Appl. Phys., 32:L917-L920 (1993).
Guo, Tzung-Fang et al., "Highly Efficient Electrophosphorescent Polymer Light-Emitting Devices," Organic Electronics, 1:15-20 (2000).
Palilis, Leonidas C., "High Efficiency Molecular Organic Light-Emitting Diodes Based on Silole Derivatives and Their Exciplexes," Organic Electronics, 4:113-121 (2003).
Ikeda, Hisao et al., "P-185: Low-Drive-Voltage OLEDs with a Buffer Layer Having Molybdenum Oxide," SID Symposium Digest, 37:923-926 (2006).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Salbeck, J. et al., "Low Molecular Organic Glasses for Blue Electroluminescence," Synthetic Metals, 91:209-215 (1997).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Hung, L.S. et al., "Anode Modification in Organic Light-Emitting Diodes by Low-Frequency Plasma Polymerization of CHF3,"Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

\* cited by examiner

ORGANIC ELECTROLUMINESCENT MATERIALS AND DEVICES

CROSS-REFERENCE TO RELATED APPLICATIONS

This application claims priority to U.S. Patent Application Ser. No. 62/500,545, filed May 3, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted Ir(ppy)$_3$, which has the following structure:

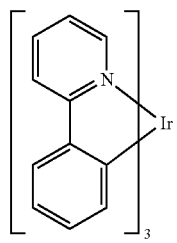

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety There is a need in the art for novel thermally- and photochemically-stable hexadentate phosphorescent complexes. The present invention addresses this need in the art.

SUMMARY

According to an embodiment, a compound is provided that has the structure of a first ligand $L_A$ having Formula I shown below:

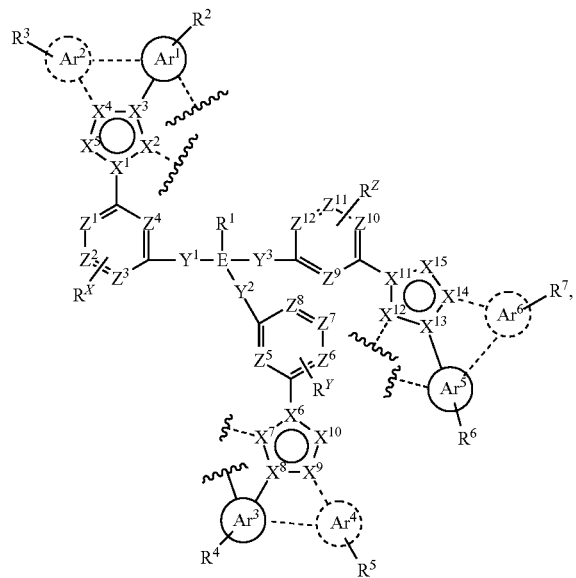

Formula I wherein $X^1$-$X^{15}$ are each independently C or N;

wherein $Y^1$, $Y^2$, and $Y^3$ each independently represent a direct bond, or an organic or inorganic linker;

wherein $Z^1$-$Z^{12}$ are each independently C or N;

wherein $R^1$-$R^7$, $R^X$, $R^Y$, and $R^Z$ each independently represents mono to the maximum allowable substitution, or no substitution;

wherein E is selected from the group consisting of C, N, Si, B, Al, P, and Ge;

wherein $R^1$ is not present when E is N, B, Al, or P;

wherein each $R^1$-$R^7$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein $Ar^1$, $Ar^3$, and $Ar^5$ are each independently a 5- or 6-membered carbocyclic or heterocyclic ring;

wherein $Ar^2$, $Ar^4$, and $Ar^6$ are each optionally present and are each independently a 5- or 6-membered carbocyclic or heterocyclic ring;

wherein any two substituents may be joined or fused to form a ring;

wherein the ligand $L_A$ is coordinated to a metal M; and wherein the wave lines indicate bonds to M.

According to another embodiment, an organic light emitting diode/device (OLED) is also provided. The OLED can include an anode, a cathode, and an organic layer, disposed between the anode and the cathode. The organic layer can include a compound including a first ligand $L_A$ having Formula I. According to yet another embodiment, the organic light emitting device is incorporated into one or more devices selected from a consumer product, an electronic component module, and/or a lighting panel.

According to yet another embodiment, a formulation containing a compound including a first ligand $L_A$ having Formula I is provided.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
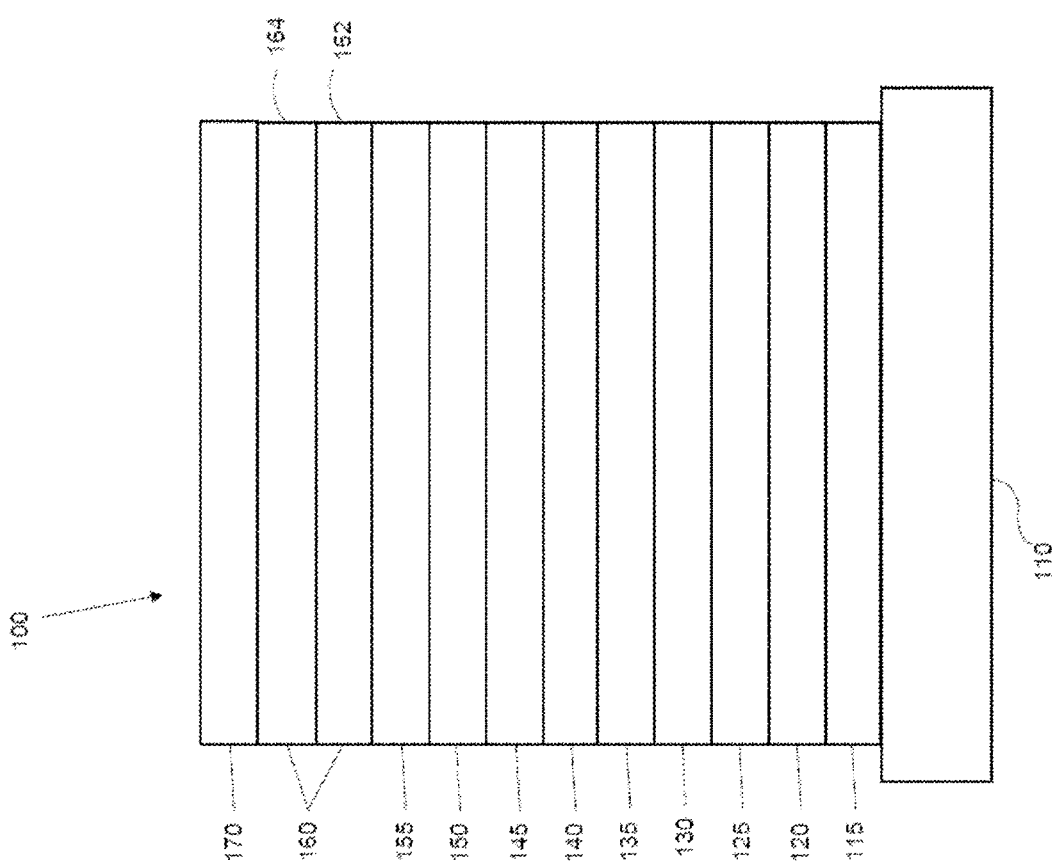
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
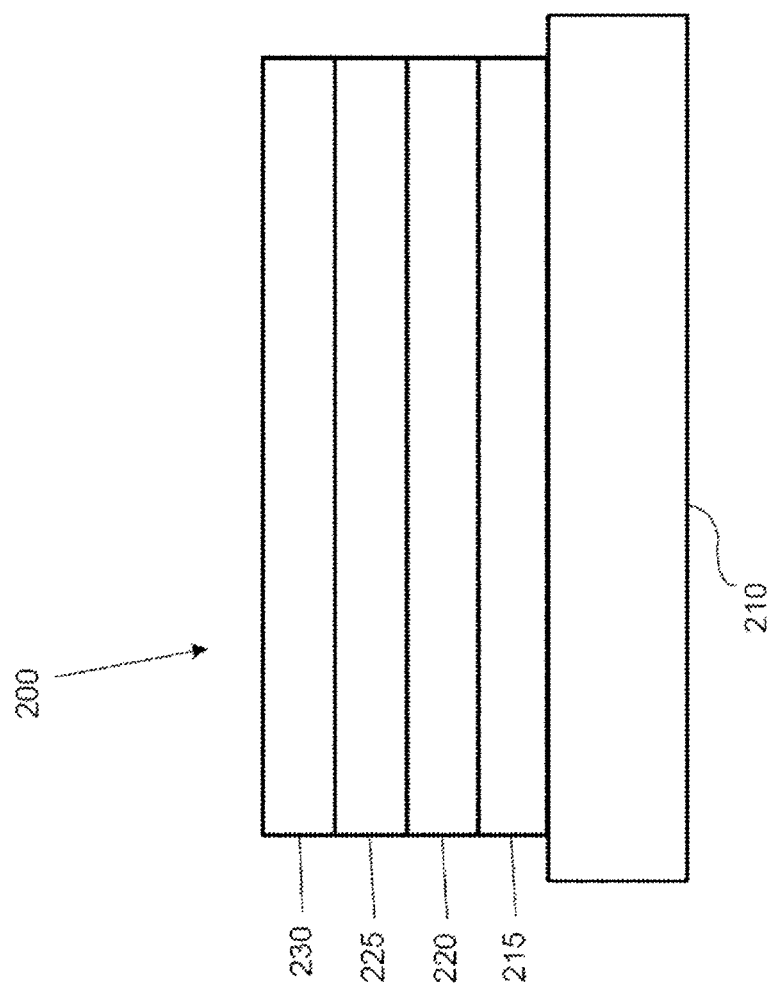
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Hetero-aromatic cyclic radicals also means heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Compounds of the Invention

The present invention includes novel thermally- and photochemically-stable hexadentate phosphorescent complexes wherein the three bidentate moieties are linked to a common tether via a metal-coordinated five-member ring. There are very few examples of such hexadentate architectures in which the three bidentate moieties are linked to a common tether via a metal-coordinated five-member ring. Thus, the compounds of the present invention include novel ligand tethering architecture and mononuclear metal complexes, thereby increasing their thermal and photochemical stability.

In one aspect, the present invention includes a compound having the structure of a first ligand $L_A$ having Formula I:

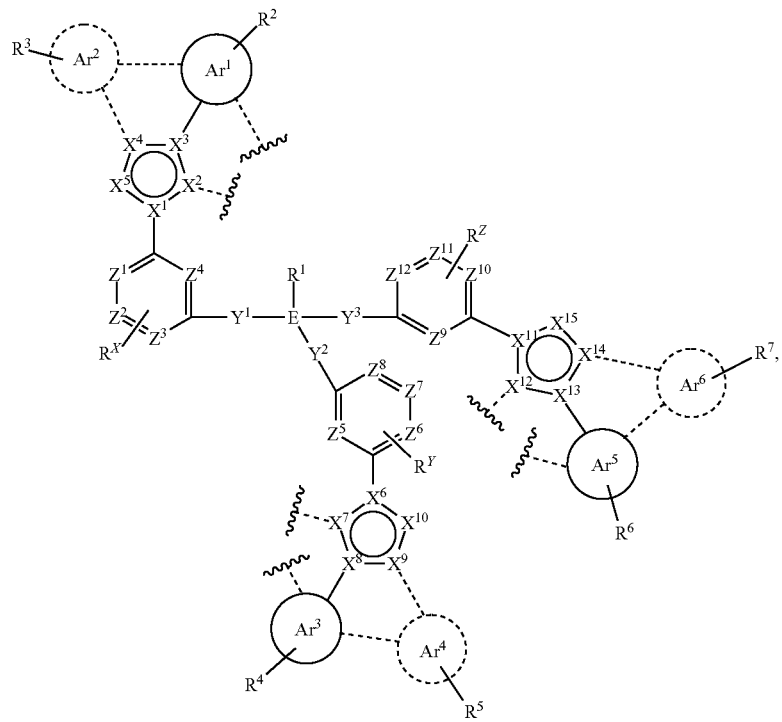

Formula I wherein $X^1$-$X^{15}$ are each independently C or N;
wherein $Y^1$, $Y^2$, and $Y^3$ each independently represent a direct bond, or an organic or inorganic linker;
wherein $Z^1$-$Z^{12}$ are each independently C or N;
wherein $R^1$-$R^7$, $R^X$, $R^Y$, and $R^Z$ each independently represents mono to the maximum allowable substitution, or no substitution;
wherein E is selected from the group consisting of C, N, Si, B, Al, P, and Ge;
wherein $R^1$ is not present when E is N, B, Al, or P;
wherein each $R^1$-$R^7$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein $Ar^1$, $Ar^3$, and $Ar^5$ are each independently a 5- or 6-membered carbocyclic or heterocyclic ring;

wherein $Ar^2$, $Ar^4$, and $Ar^6$ are each optionally present and are each independently a 5- or 6-membered carbocyclic or heterocyclic ring;

wherein any two substituents may be joined or fused to form a ring;

wherein the ligand $L_A$ is coordinated to a metal M; and wherein the wave lines indicate bonds to M.

In one embodiment, each $R^1$-$R^7$, $R^X$, $R^Y$, and $R^Z$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In one embodiment, $R^1$ is selected from the group consisting of unsubstituted and substituted aryl, and unsubstituted and substituted heteroaryl.

In one embodiment, the ligand is symmetric about the atom represented by E. In one embodiment, the ligand is asymmetric about the atom represented by E. The ligand is symmetric about the atom represented by E means that the three sub-bidentate ligands in the hexadentate ligand $L_A$ are identical.

In one embodiment, E is C or Si.

In one embodiment, the metal is selected from the group consisting of Ru, Os, Rh, and Ir. In one embodiment, the metal is iridium.

In one embodiment, the metal complex emits blue color.

In one embodiment, $X^2$, $X^7$ and $X^{12}$ are N. In one embodiment, $X^2$, $X^4$, $X^7$, $X^9$, $X^{12}$, and $X^{14}$ are N, and $X^1$, $X^3$, $X^5$, $X^6$, $X^8$, $X^{10}$, $X^{11}$, $X^{13}$, and $X^{15}$ are C. In one embodiment, $X^2$, $X^3$, $X^7$, $X^8$, $X^{12}$, and $X^{13}$ are N, and $X^1$, $X^4$, $X^5$, $X^6$, $X^9$, $X^{10}$, $X^{11}$, $X^{14}$, and $X^{15}$ are C.

In one embodiment, $Y^1$, $Y^2$, and $Y^3$ are each independently an alkyl or ether linker. In one embodiment, each $Y^1$, $Y^2$, and $Y^3$ is independently O, NR", or CR"$_2$, and wherein R" is selected from the group consisting of hydrogen, deuterium, alkyl, cycloalkyl, aryl, heteroaryl, and combinations thereof.

In one embodiment, $Z^1$-$Z^{12}$ are CH.

In one embodiment, $Ar^2$, $Ar^4$, and $Ar^6$, are each present, and each is a 6-membered aromatic ring. In one embodiment, $Ar^1$, $Ar^3$, and $Ar^5$ is an aromatic ring. In one embodiment, $Ar^2$, $Ar^4$, and $Ar^6$ are present, $Ar^1$ is joined by a direct bond to $Ar^2$, $Ar^3$ is joined by a direct bond to $Ar^4$, and $Ar^5$ is joined by a direct bond to $Ar^6$. In one embodiment, $Ar^2$ is joined to $X^4$ by a direct bond, $Ar^4$ is joined to $X^9$ by a direct bond, $Ar^6$ is joined to $X^{14}$ by a direct bond, and $X^4$, $X^9$, and $X^{14}$ are C. In one embodiment, $Ar^2$, $Ar^4$, and $Ar^6$ are present, $Ar^1$ is joined by a direct bond to $Ar^2$, $Ar^3$ is joined by a direct bond to $Ar^4$, and $Ar^5$ is joined by a direct bond to $Ar^6$, $Ar^2$ is joined to $X^4$ by a direct bond, $Ar^4$ is joined to $X^9$ by a direct bond, $Ar^6$ is joined to $X^{14}$ by a direct bond, and $X^4$, $X^9$, and $X^{14}$ are C.

In one embodiment, at least one of $R^3$ and $X^5$, $R^5$ and $X^{10}$, and $R^7$ and $X^{15}$, are linked by an organic linker. In one embodiment, $R^3$ and $X^5$, $R^5$ and $X^{10}$, and $R^7$ and $X^{15}$, are linked by an organic linker, and $X^5$, $X^{10}$, and $X^{15}$ are C.

In one embodiment, the first ligand $L_A$ comprises a structure of Formula II:

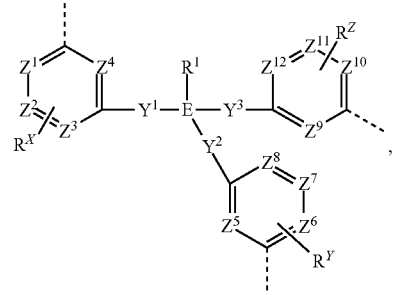

Formula II wherein the structure of Formula II is selected from the group consisting of:

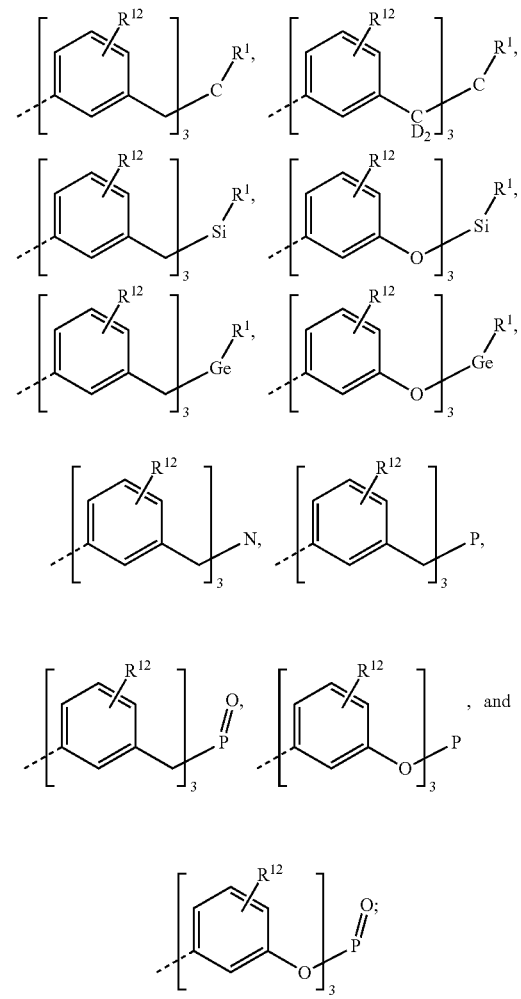

wherein $R^{12}$ represents mono to the maximum possible number of substitutions, or no substitution, and is selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; and wherein the first ligand $L_A$ comprises a structure of Formula III:

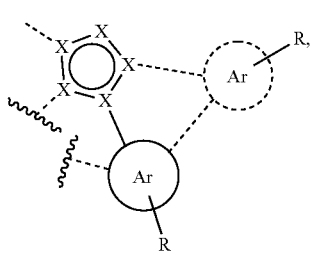
Formula III
wherein the structure of Formula III is selected from the group consisting of:
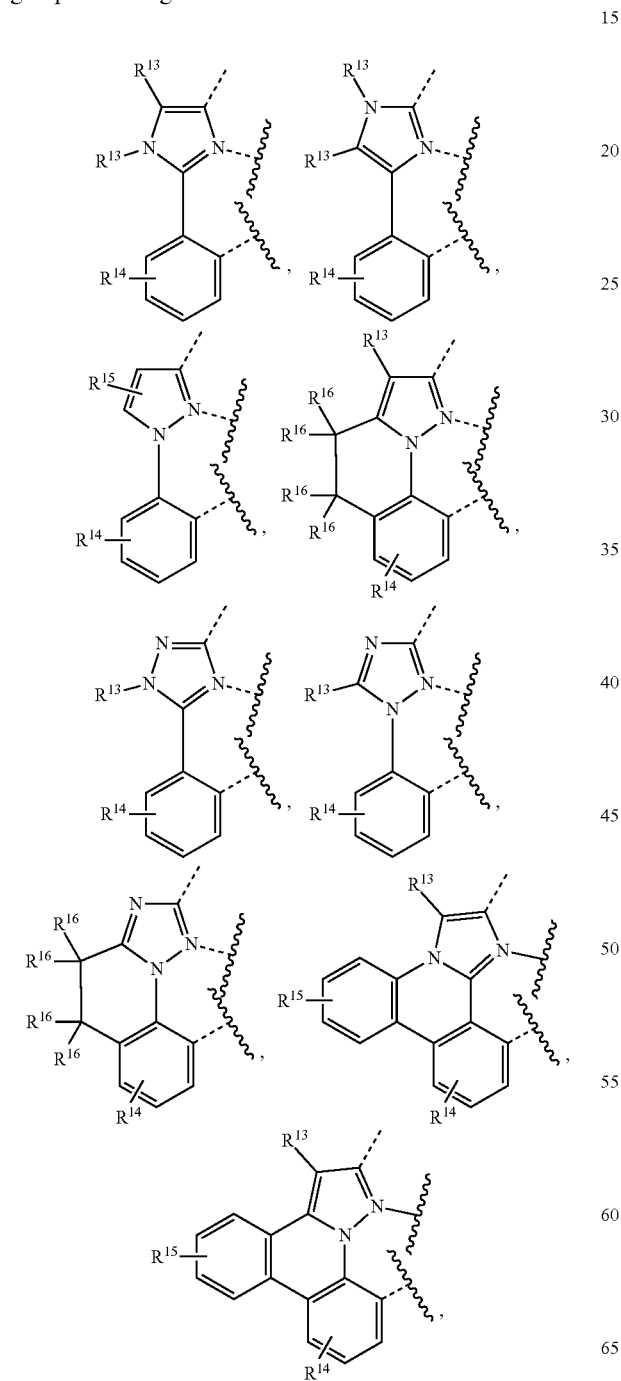
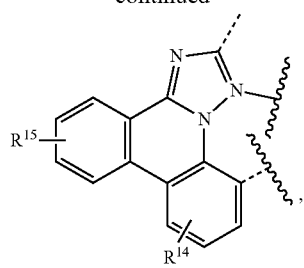
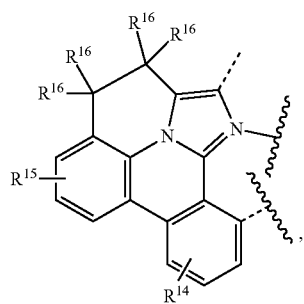
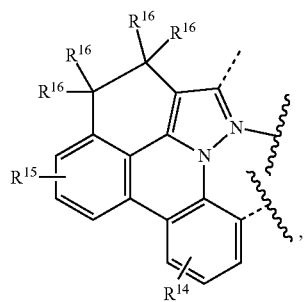
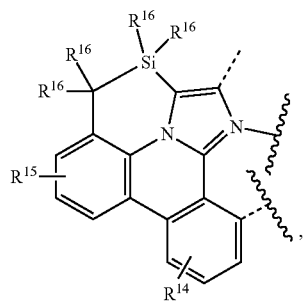
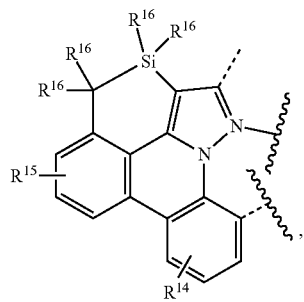

-continued

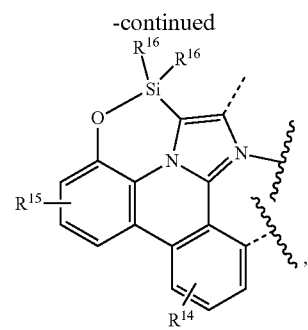,

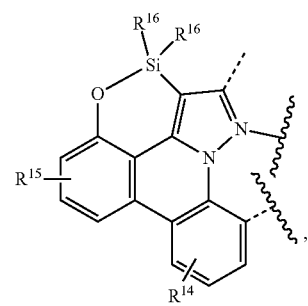,

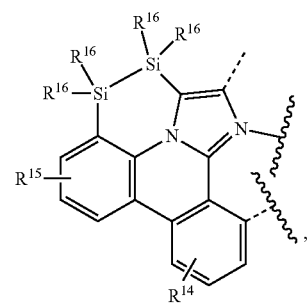,

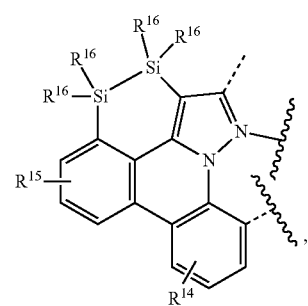,

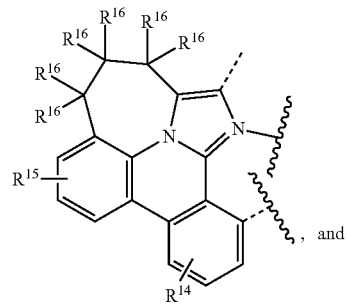, and

-continued

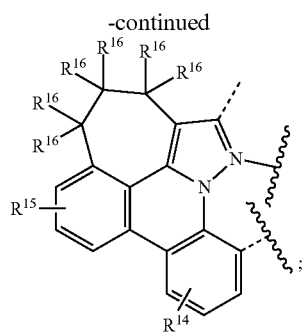;

wherein each R, $R^{13}$, $R^{14}$, and $R^{15}$ independently represents mono to the maximum allowable substitution, or no substitution;

wherein R, $R^{13}$, $R^{14}$, $R^{15}$ and $R^{16}$ are each selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof;

wherein X is C or N; and wherein any two substituents may be joined or fused together to form a ring.

In one embodiment, the compound is the compound x having the formula $IrL_{LlAiAjAk}$;

wherein $L_{LlAiAjAk}$ is a hexadentate ligand comprised of Ai, Aj, Ak, and Ll;

wherein Ai, Aj, and Ak are linked together through Ll;

wherein x=215((215((215(l-1)+k)-1)+j)-1)+i, i, j, and k are integers from 1 to 215, and l is an integer from 1 to 203;

wherein Ai, Aj, and Ak are each independently selected from the group consisting of:

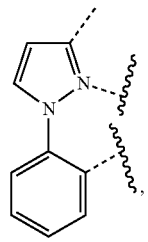

A1

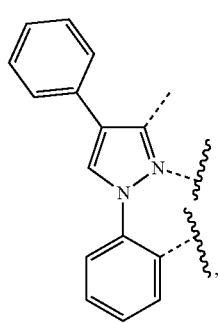

A2

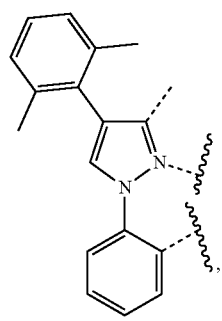
A3
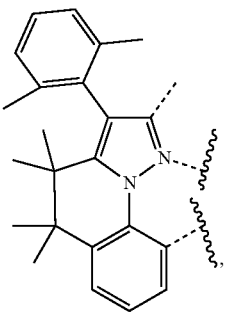
A8
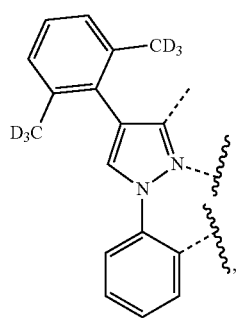
A4
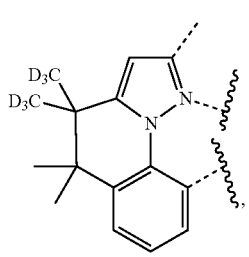
A9
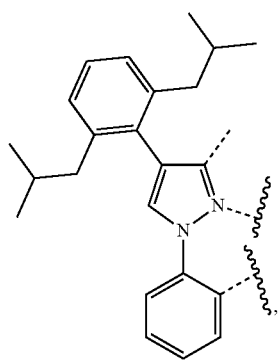
A5
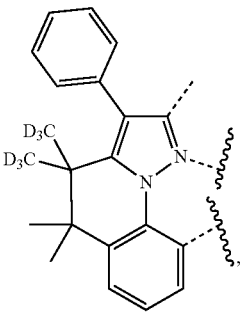
A10
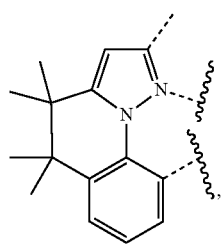
A6
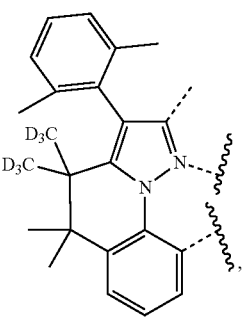
A11
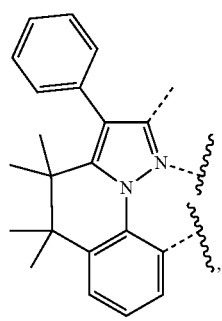
A7
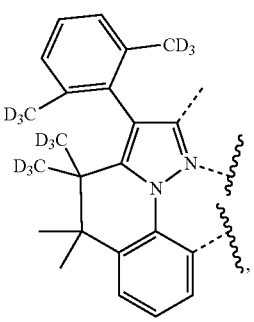
A12

-continued
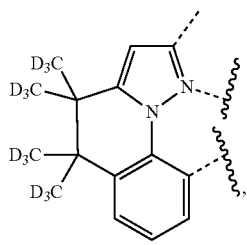
A13
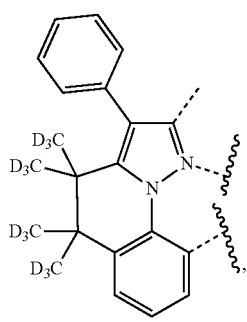
A14
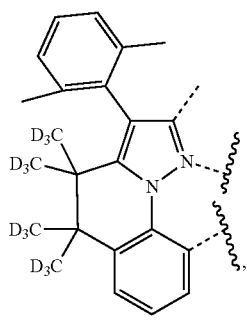
A15
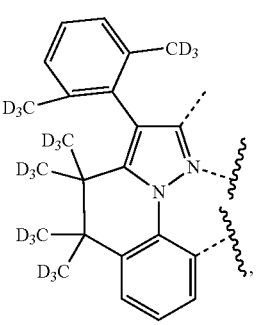
A16
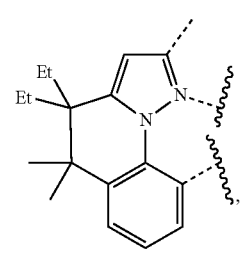
A17
-continued
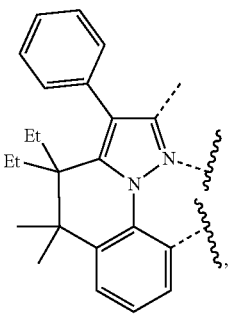
A18
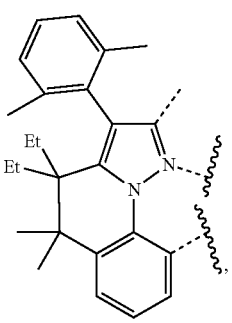
A19
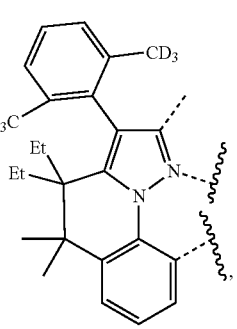
A20
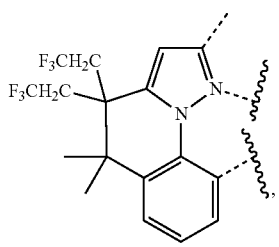
A21
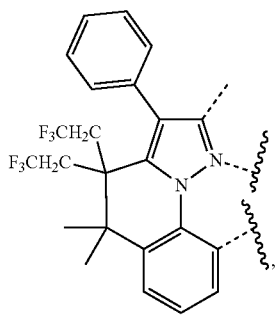
A22

A23 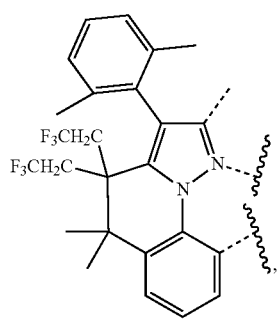
A24 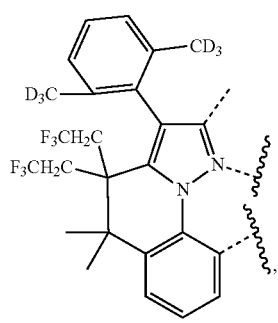
A25 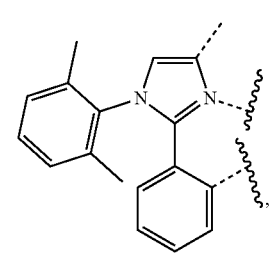
A26 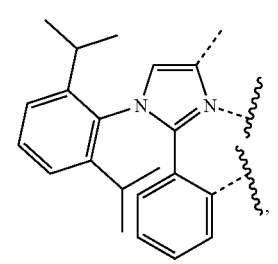
A27 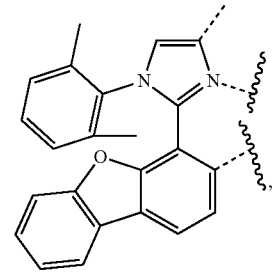
A28 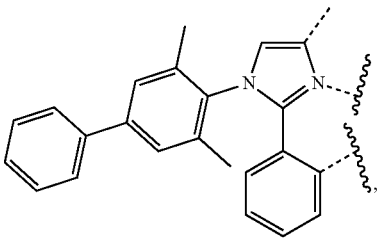
A29 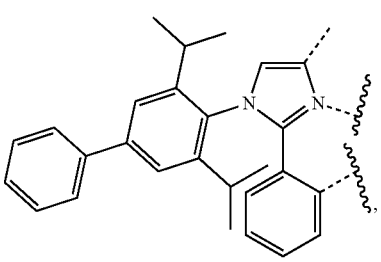
A30 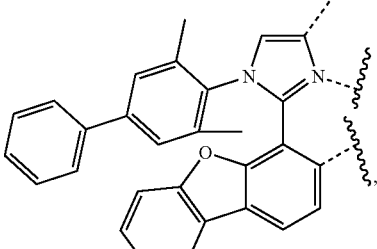
A31 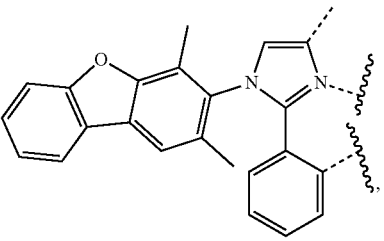
A32 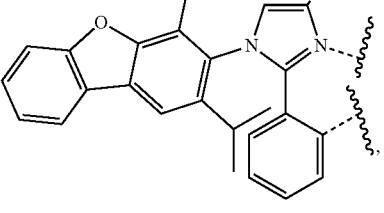
A33 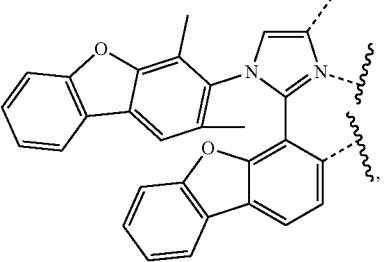

-continued
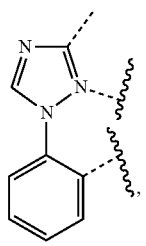
A34
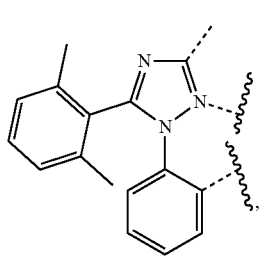
A35
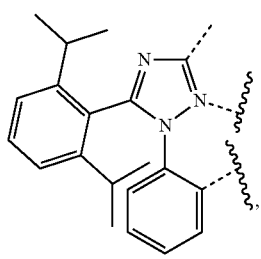
A36
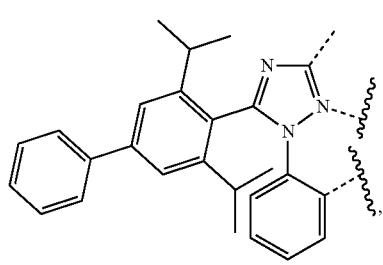
A37
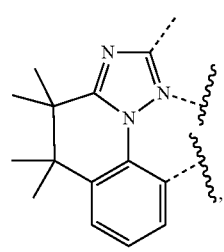
A38
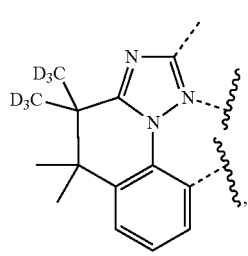
A39
-continued
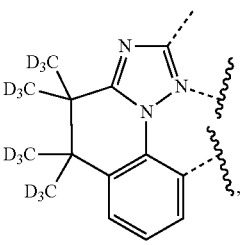
A40
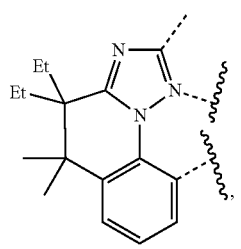
A41
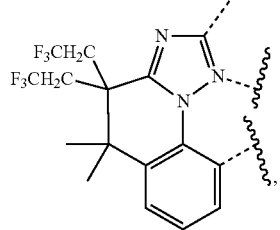
A42
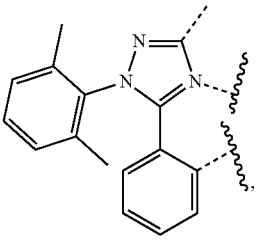
A43
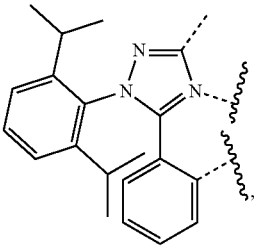
A44
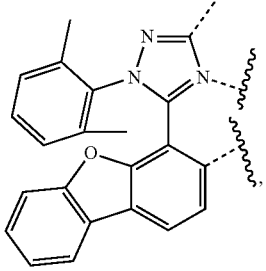
A45

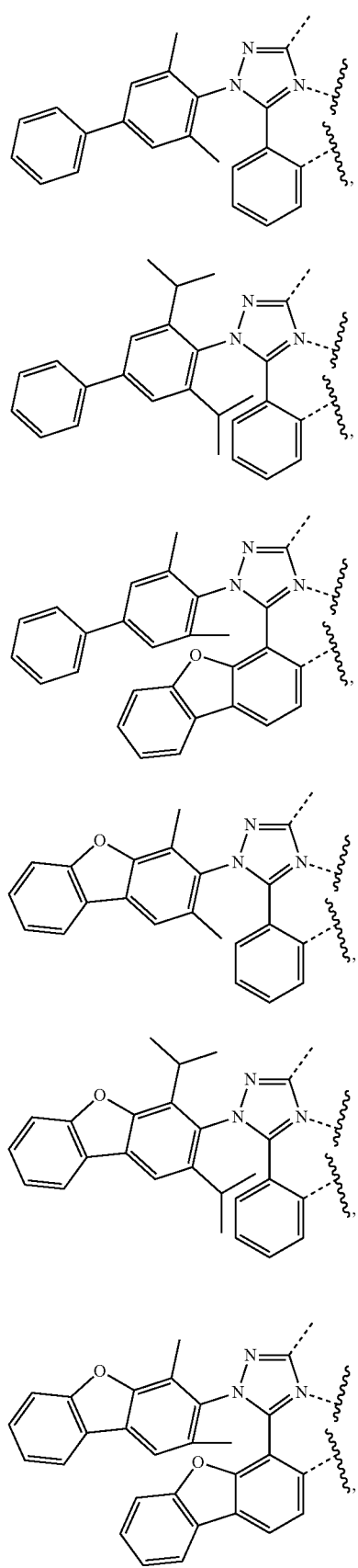
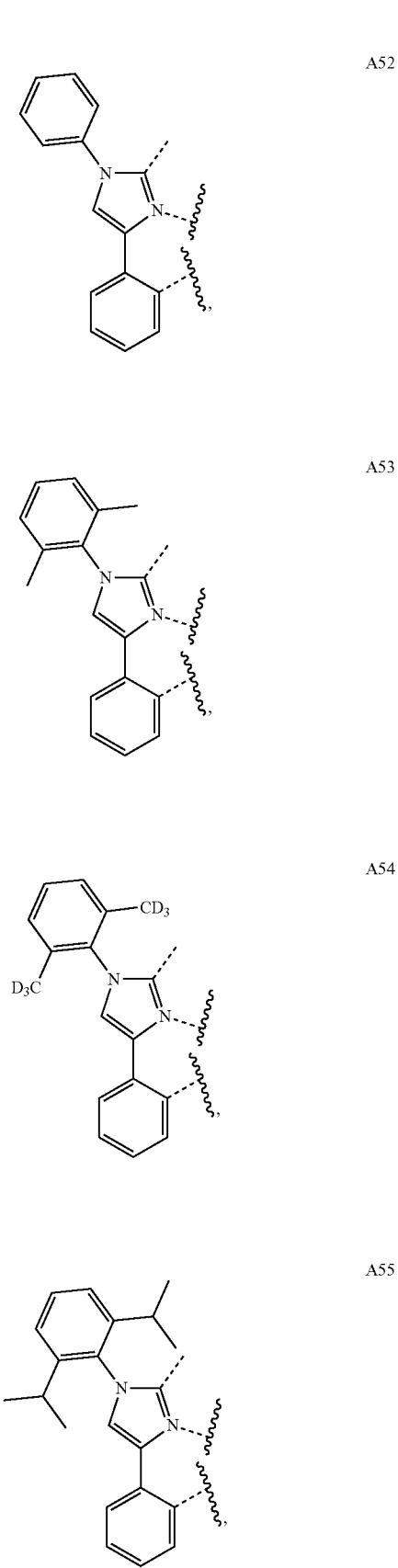

A56 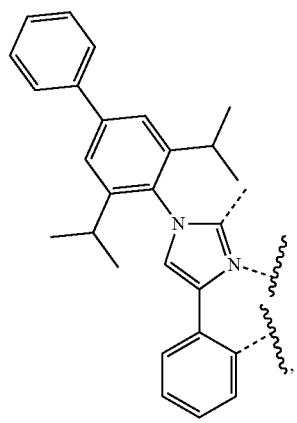
A57 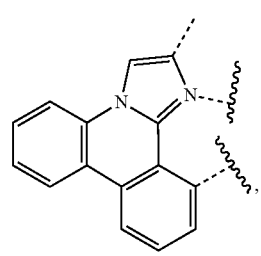
A58 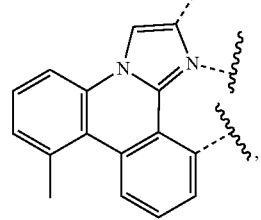
A59 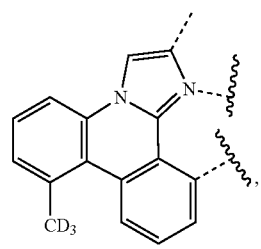
A60 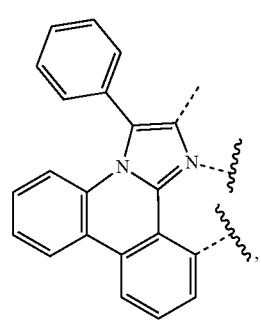
A61 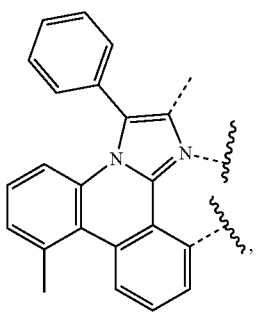
A62 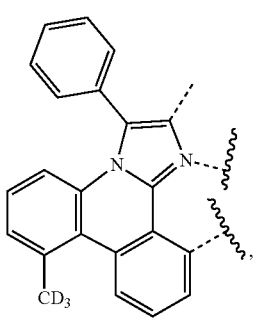
A63 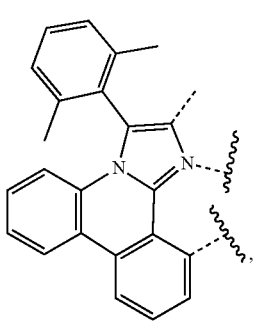
A64 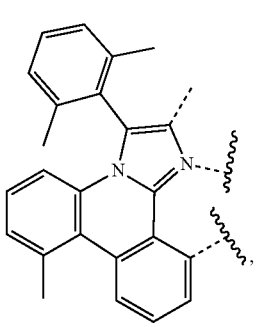
A65 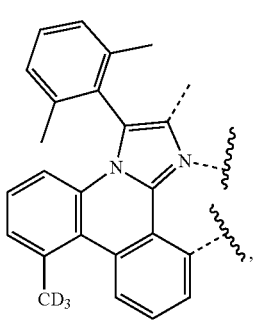

-continued
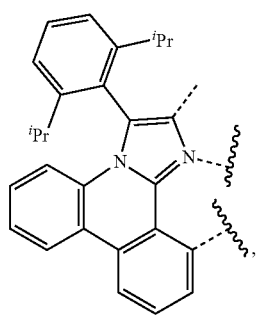 A66
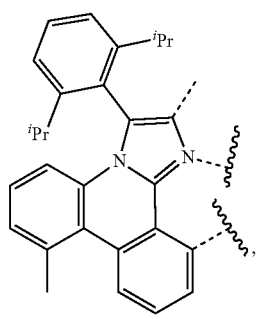 A67
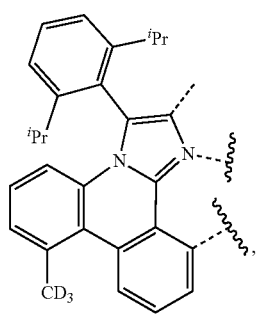 A68
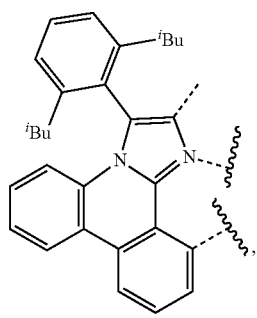 A69
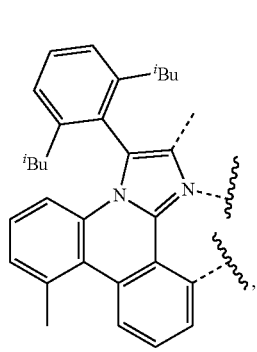 A70
-continued
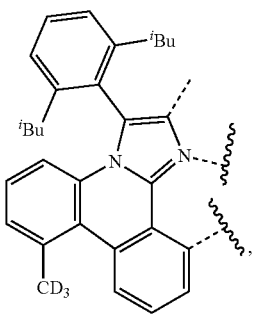 A71
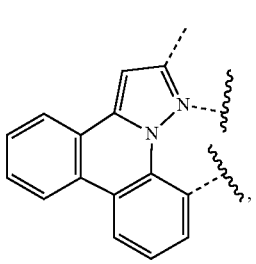 A72
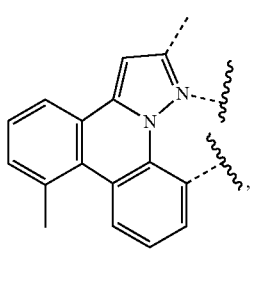 A73
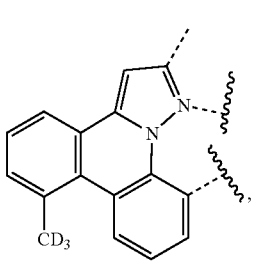 A74
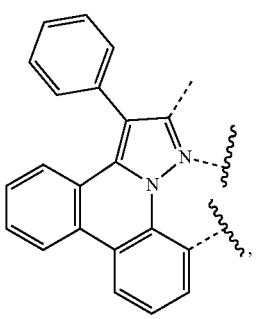 A75

-continued
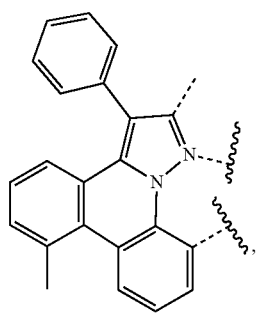
A76,
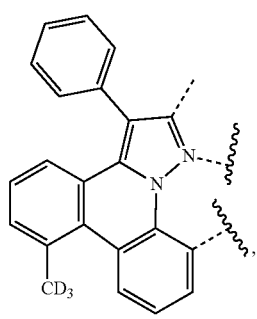
A77,
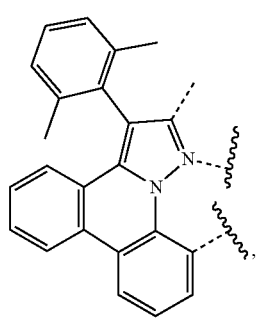
A78,
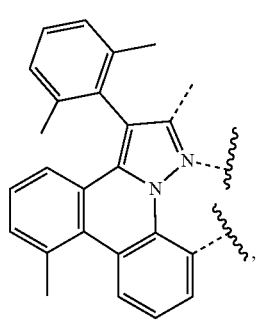
A79,
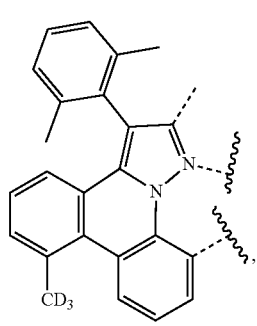
A80,
-continued
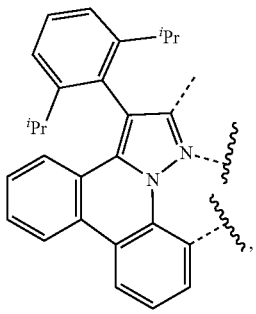
A81,
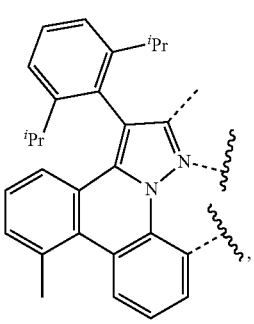
A82,
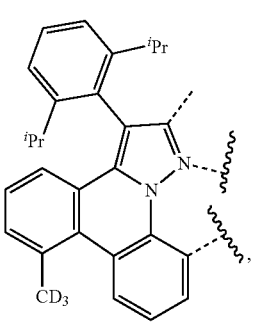
A83,
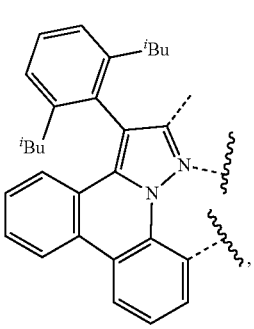
A84,
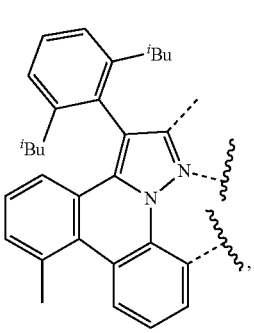
A85, A86 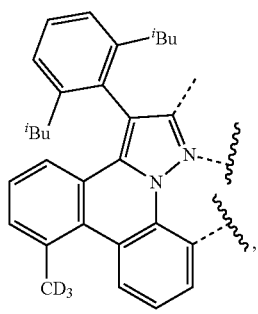
A87 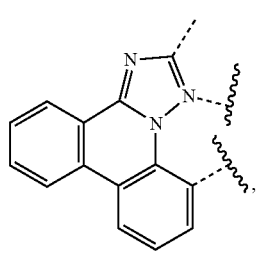
A88 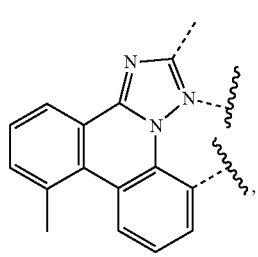
A89 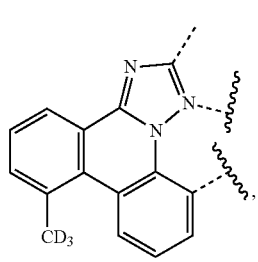
A90 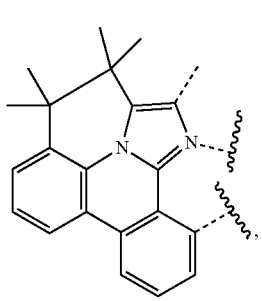
A91 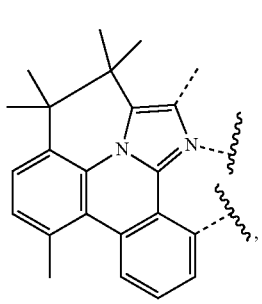
A92 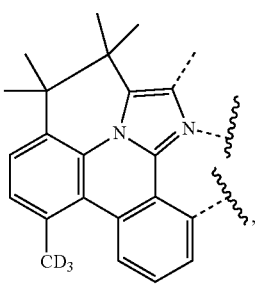
A93 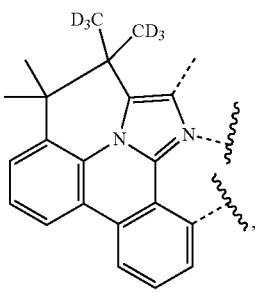
A94 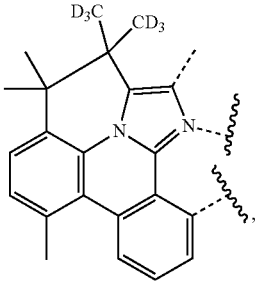
A95 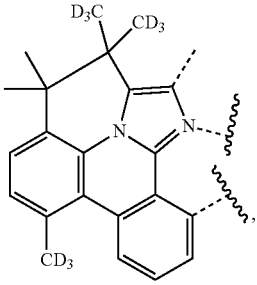
A96 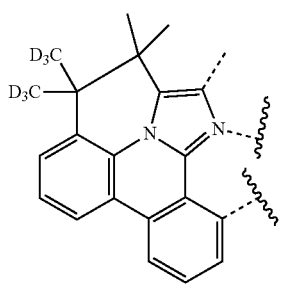

-continued
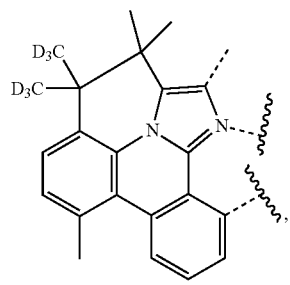 A97
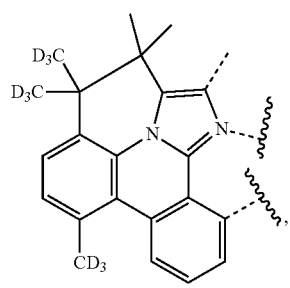 A98
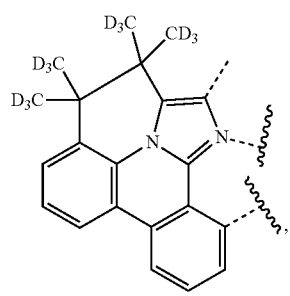 A99
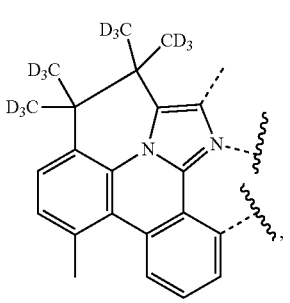 A100
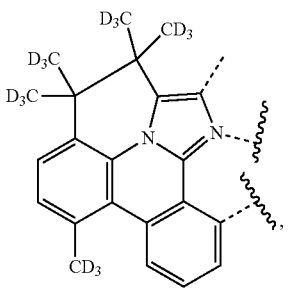 A101
-continued
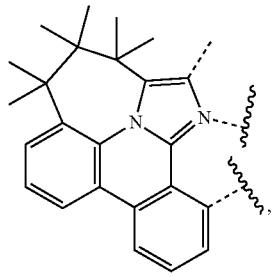 A102
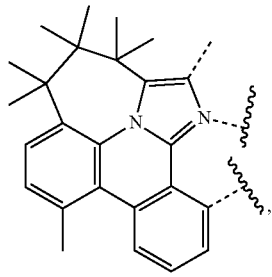 A103
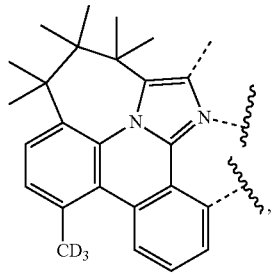 A104
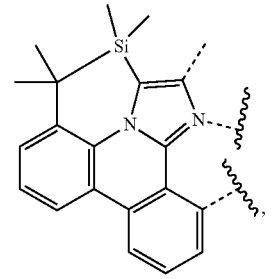 A105
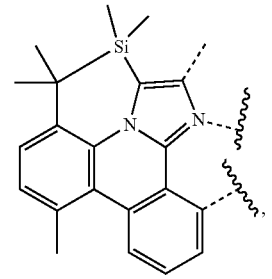 A106

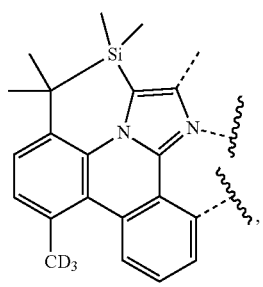 A107
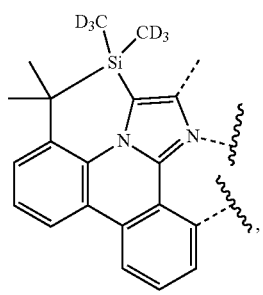 A108
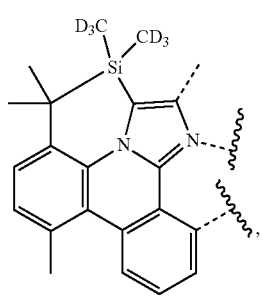 A109
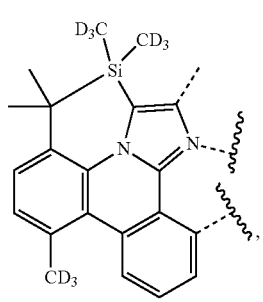 A110
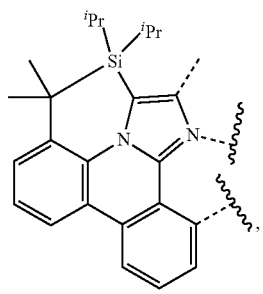 A111
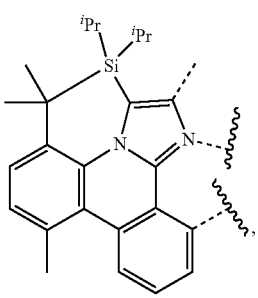 A112
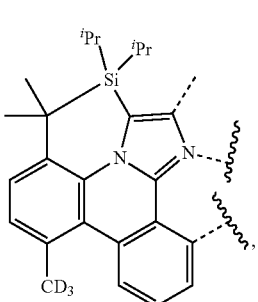 A113
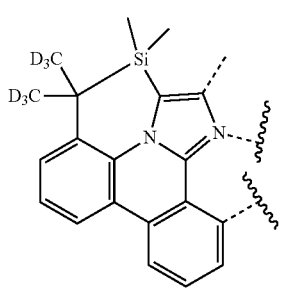 A114
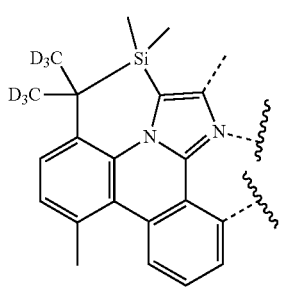 A115
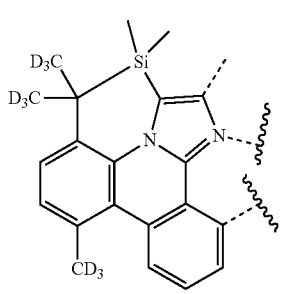 A116

-continued
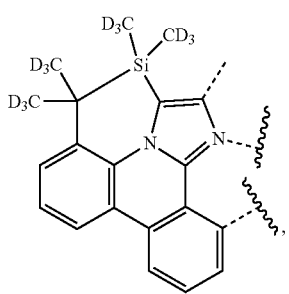 A117
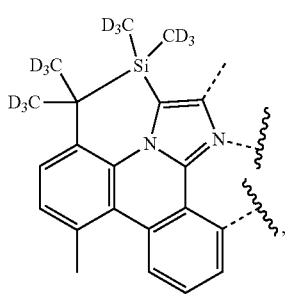 A118
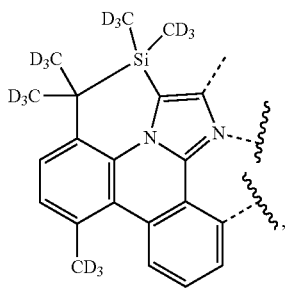 A119
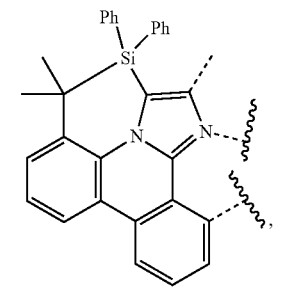 A120
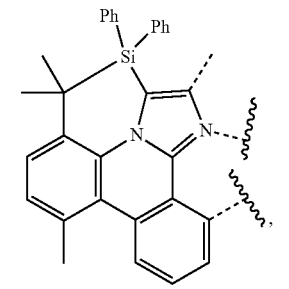 A121
-continued
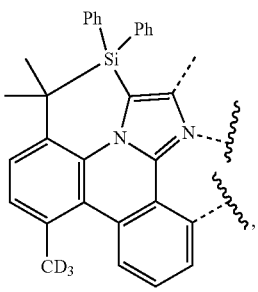 A122
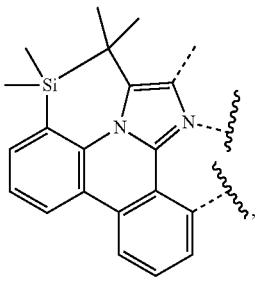 A123
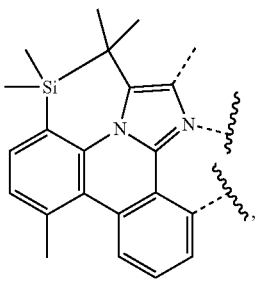 A124
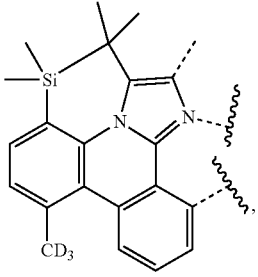 A125
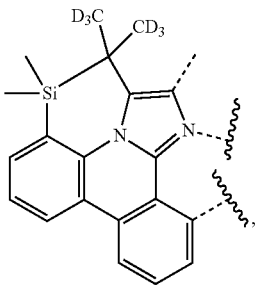 A126

A127 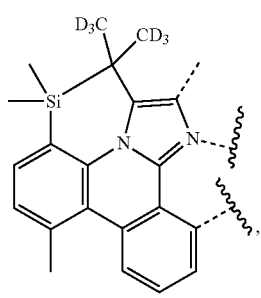
A128 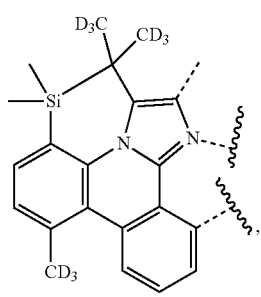
A129 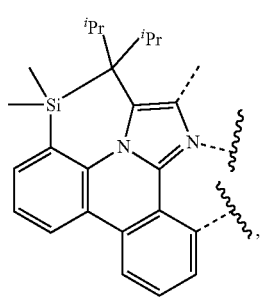
A130 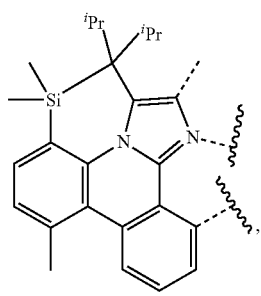
A131 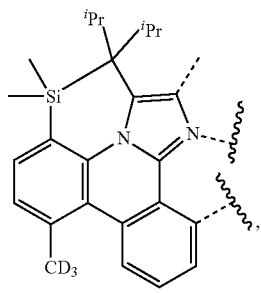
A132 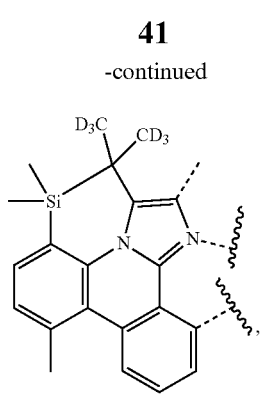
A133 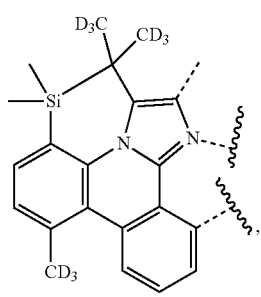
A134 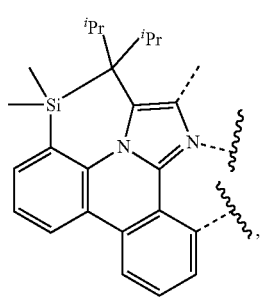
A135 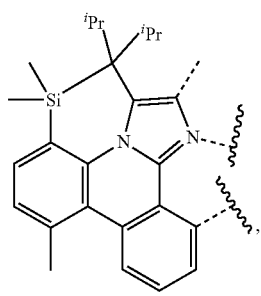
A136 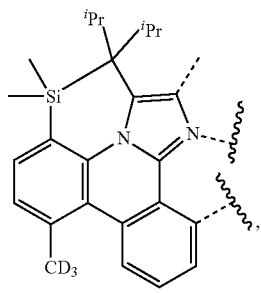

A137 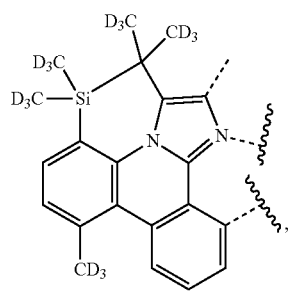
A138 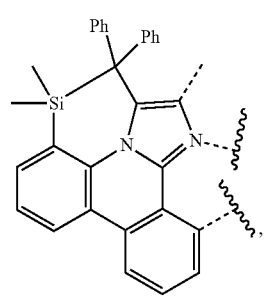
A139 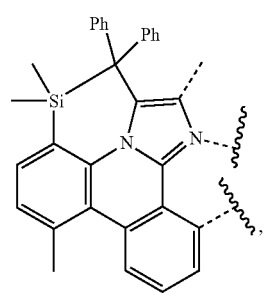
A140 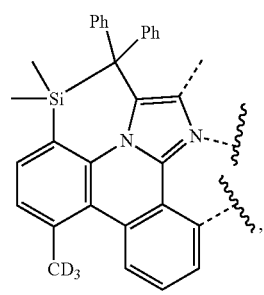
A141 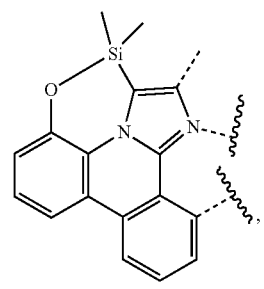
A142 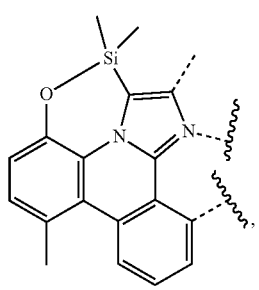
A143 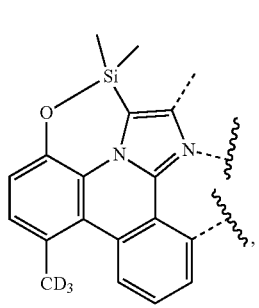
A144 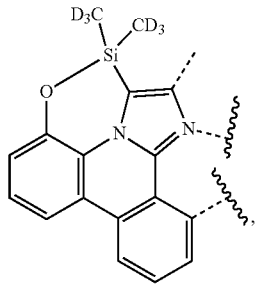
A145 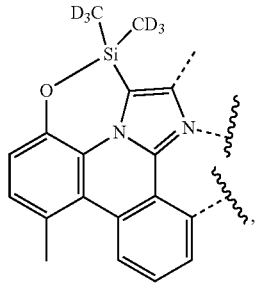
A146 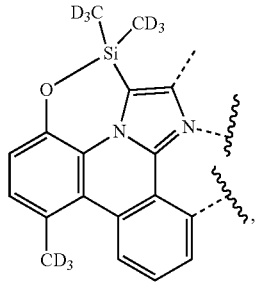

A147 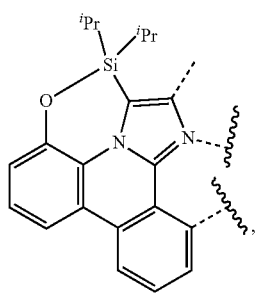
A148 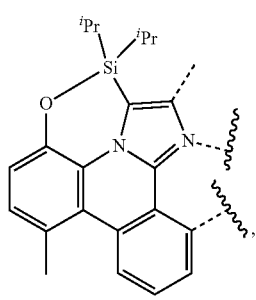
A149 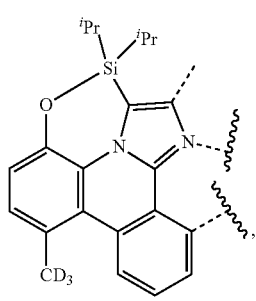
A150 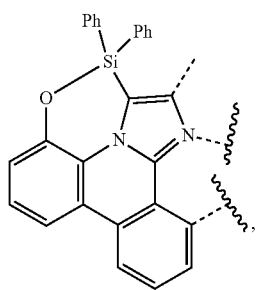
A151 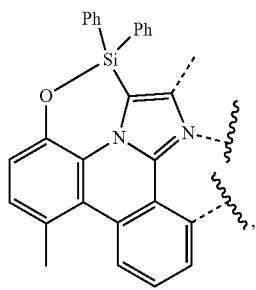
A152 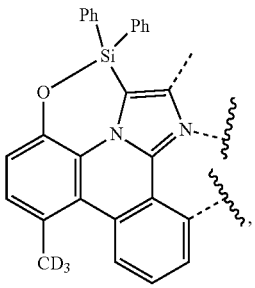
A153 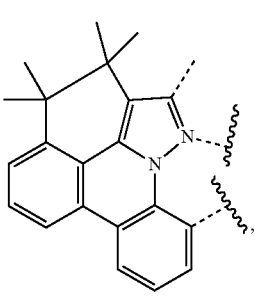
A154 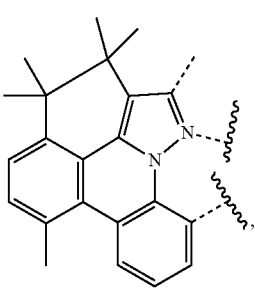
A155 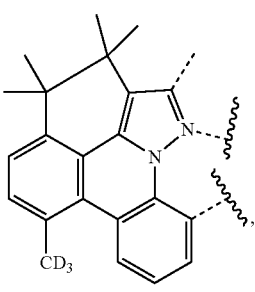
A156 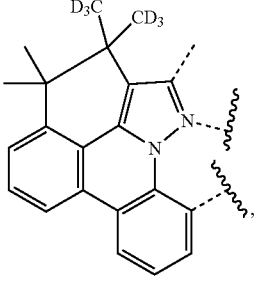

-continued
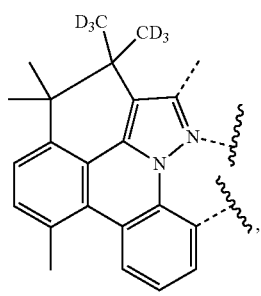 A157
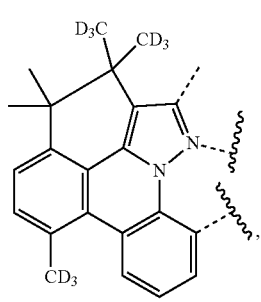 A158
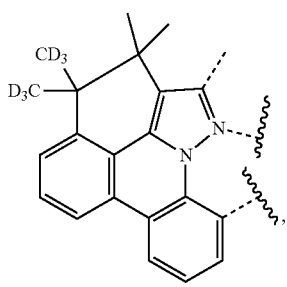 A159
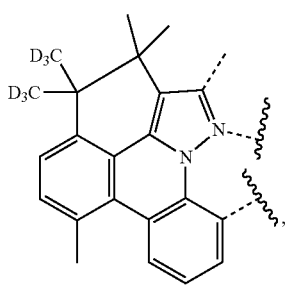 A160
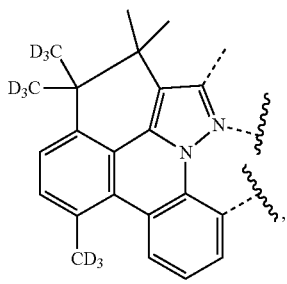 A161
-continued
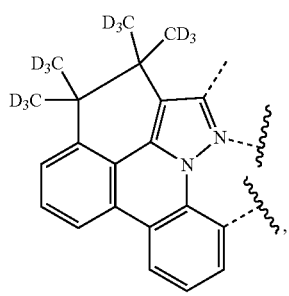 A162
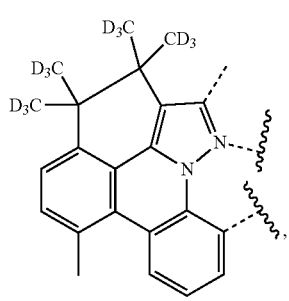 A163
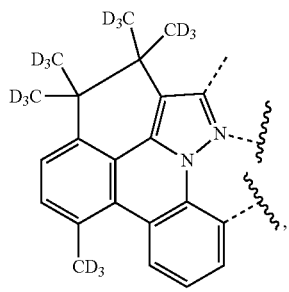 A164
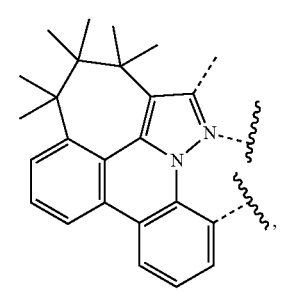 A165
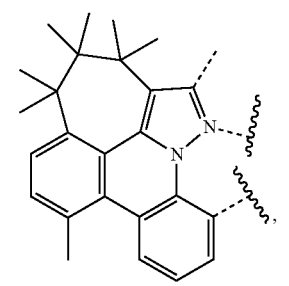 A166

-continued
A167
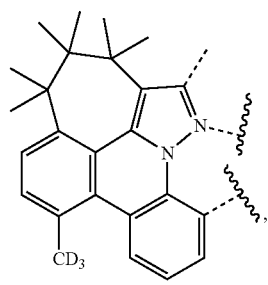
A168
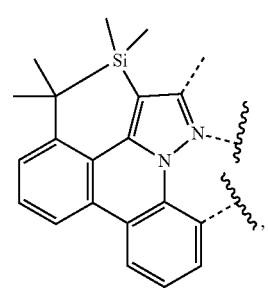
A169
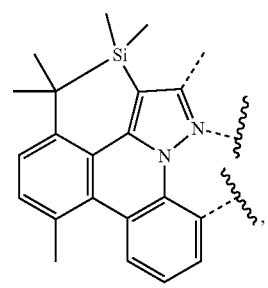
A170
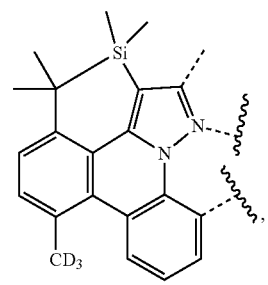
A171
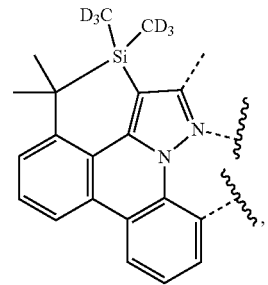
-continued
A172
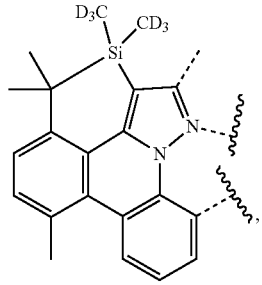
A173
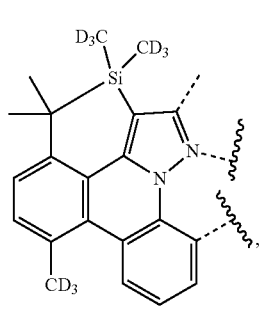
A174
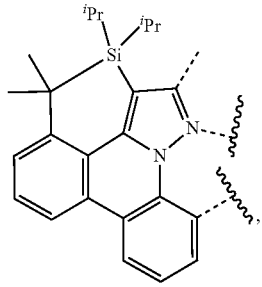
A175
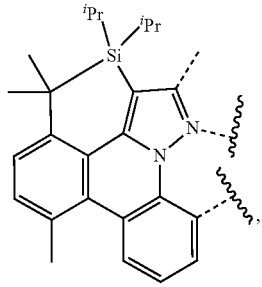
A176
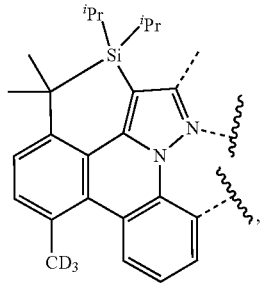

-continued
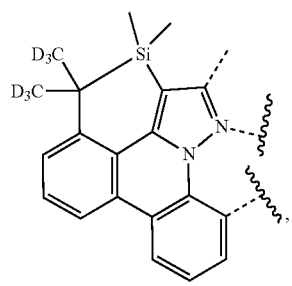 A177
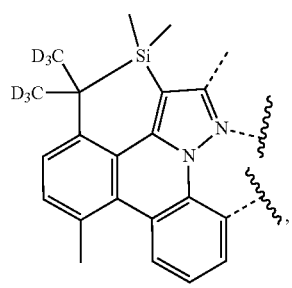 A178
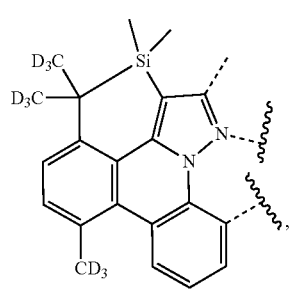 A179
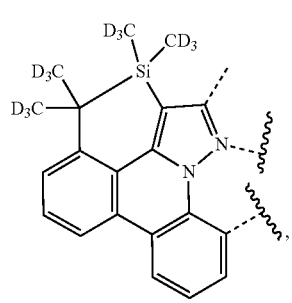 A180
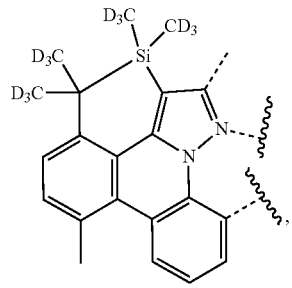 A181
-continued
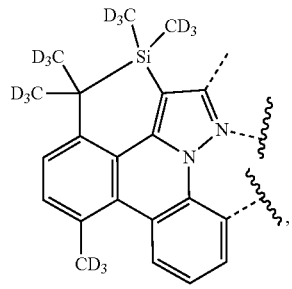 A182
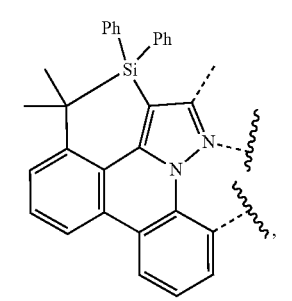 A183
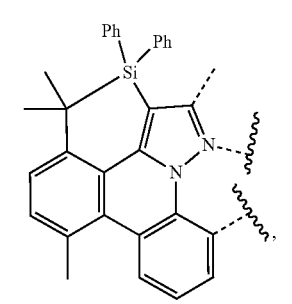 A184
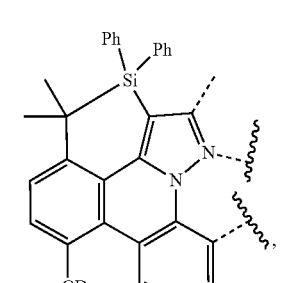 A185
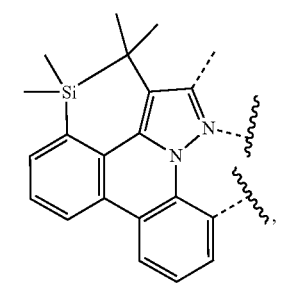 A186

-continued
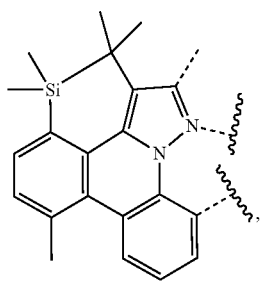 A187
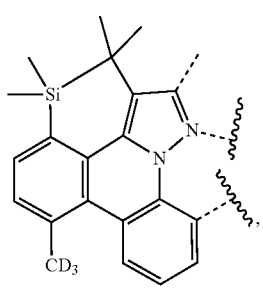 A188
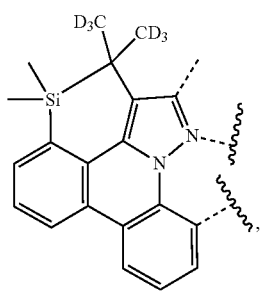 A189
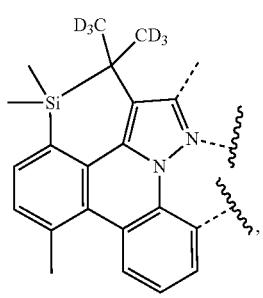 A190
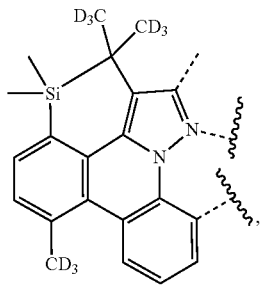 A191
-continued
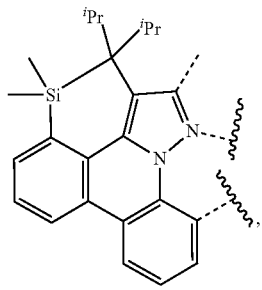 A192
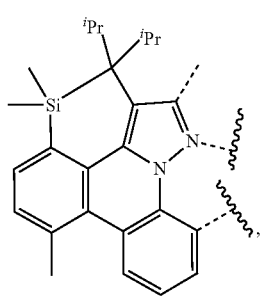 A193
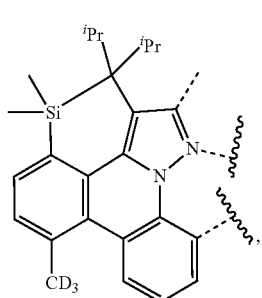 A194
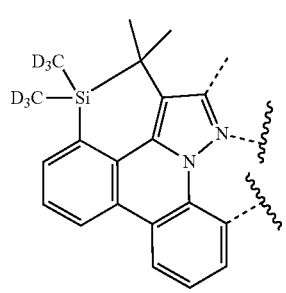 A195
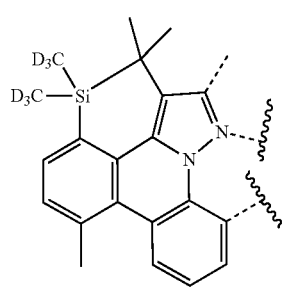 A196

-continued
A197
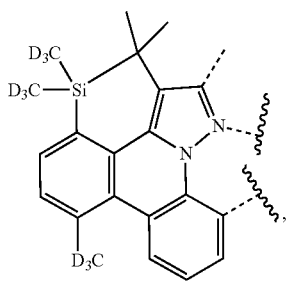
A198
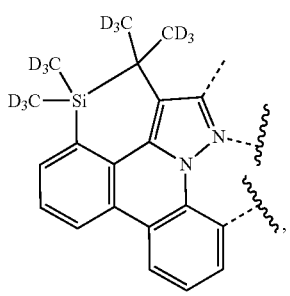
A199
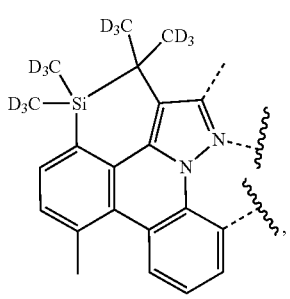
A200
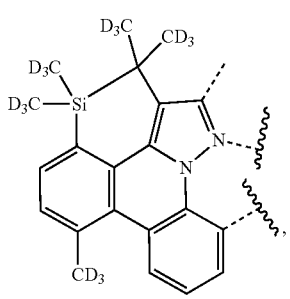
A201
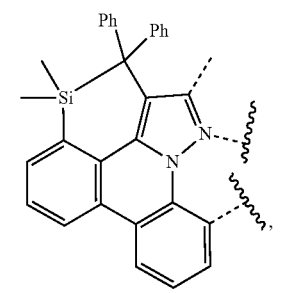
-continued
A202
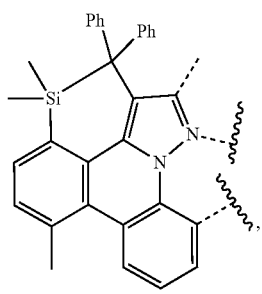
A203
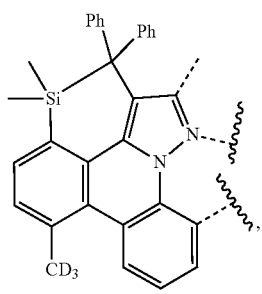
A204
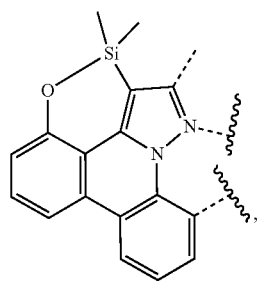
A205
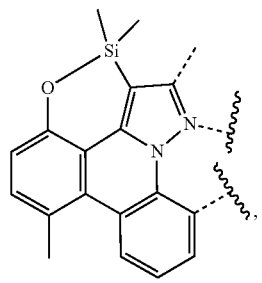
A206
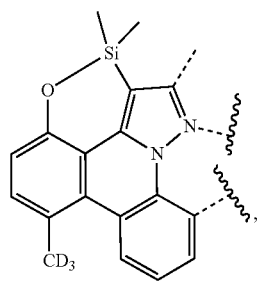

A207 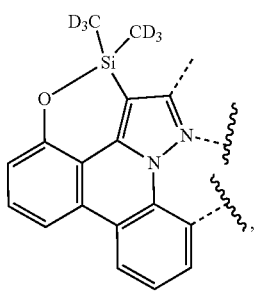
A208 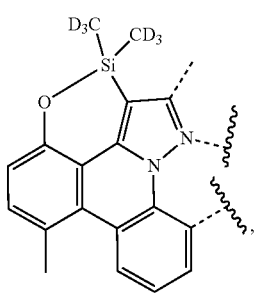
A209 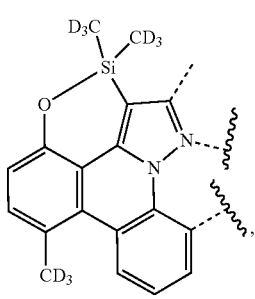
A210 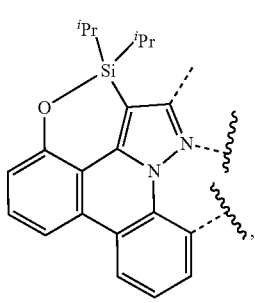
A211 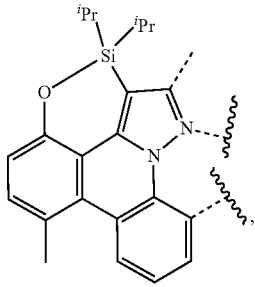
A212 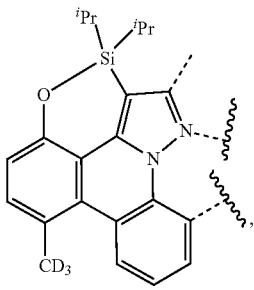
A213 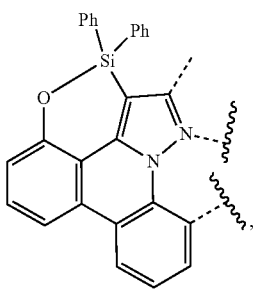
A214 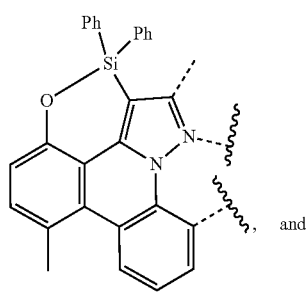, and
A215 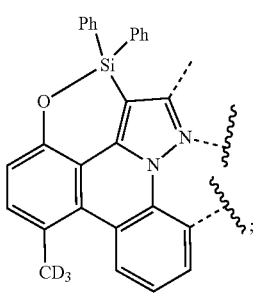;
and wherein Ll is selected from the group consisting of:
L1 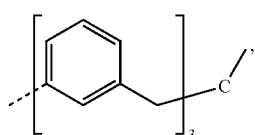
L2 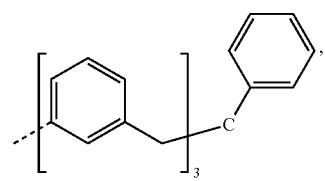

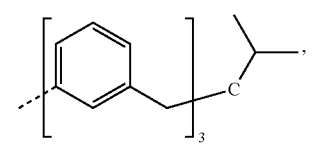 L3
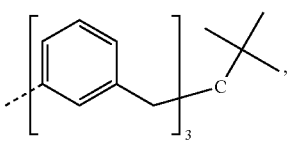 L4
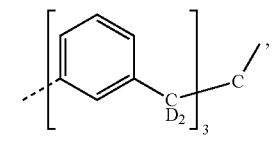 L5
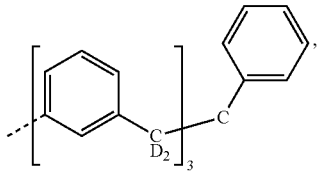 L6
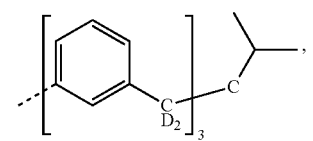 L7
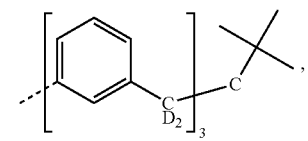 L8
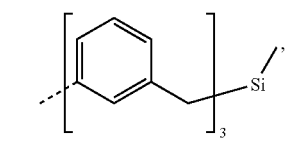 L9
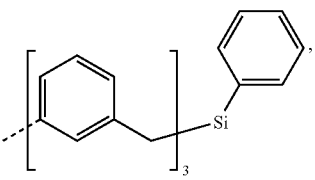 L10
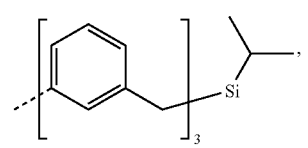 L11
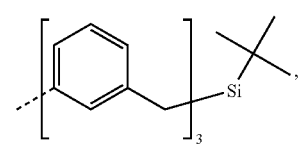 L12
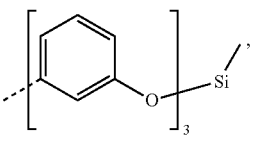 L13
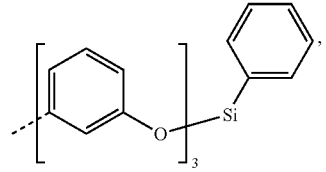 L14
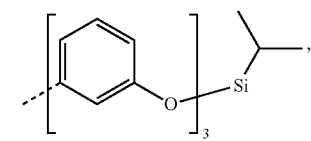 L15
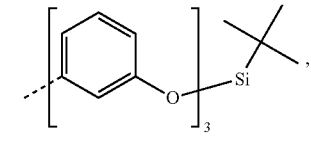 L16
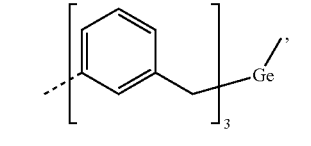 L17
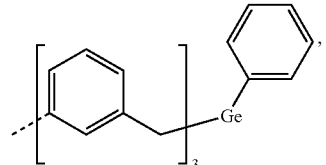 L18
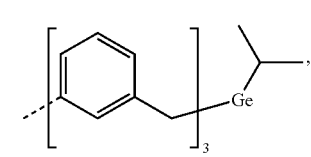 L19
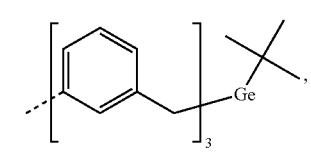 L20
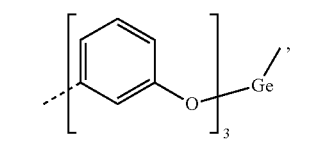 L21
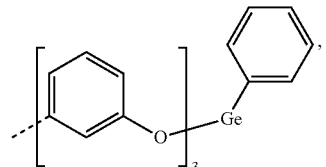 L22

-continued
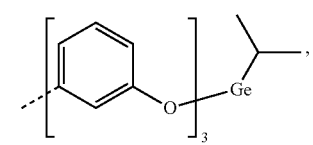 L23
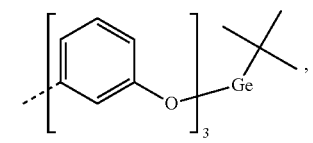 L24
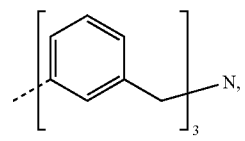 L25
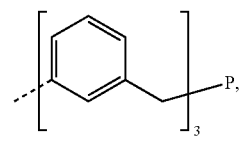 L26
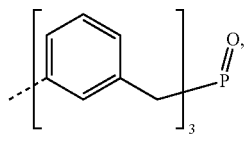 L27
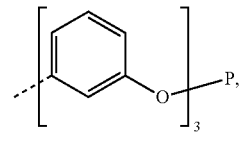 L28
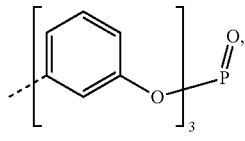 L29
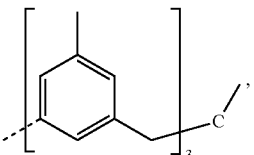 L30
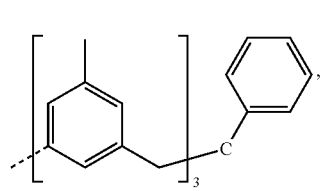 L31
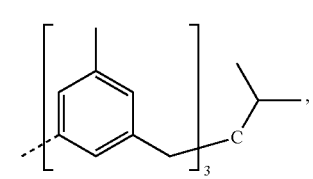 L32
-continued
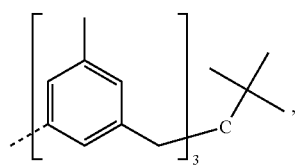 L33
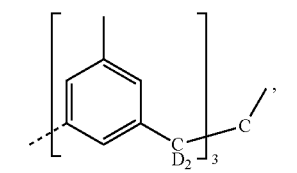 L34
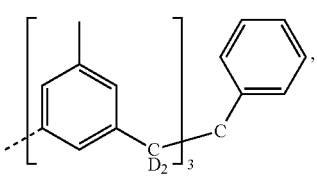 L35
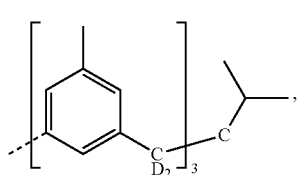 L36
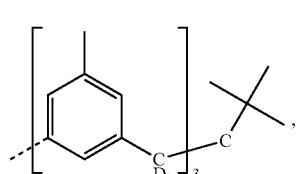 L37
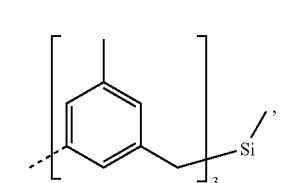 L38
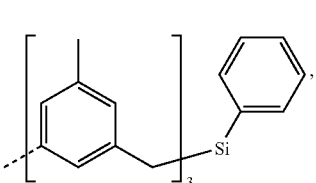 L39
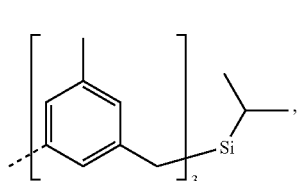 L40
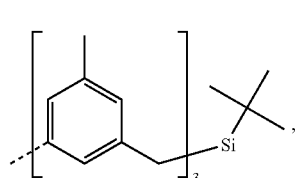 L41

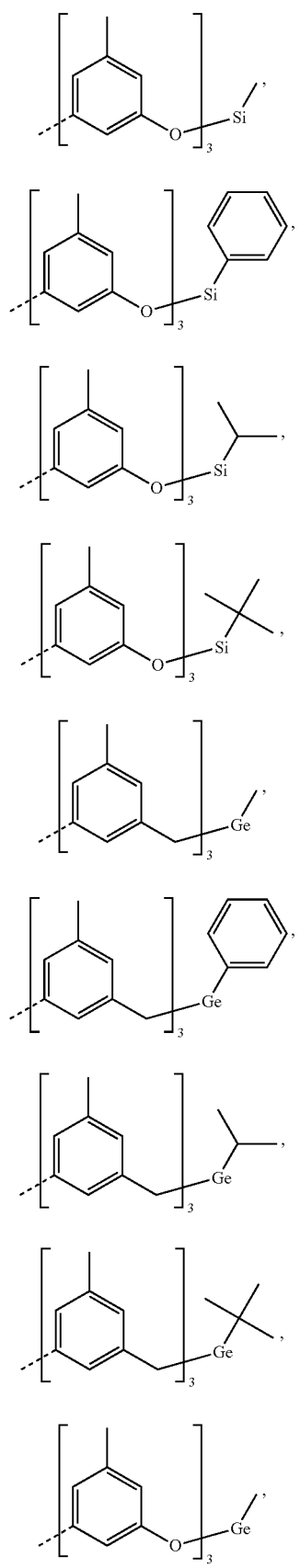
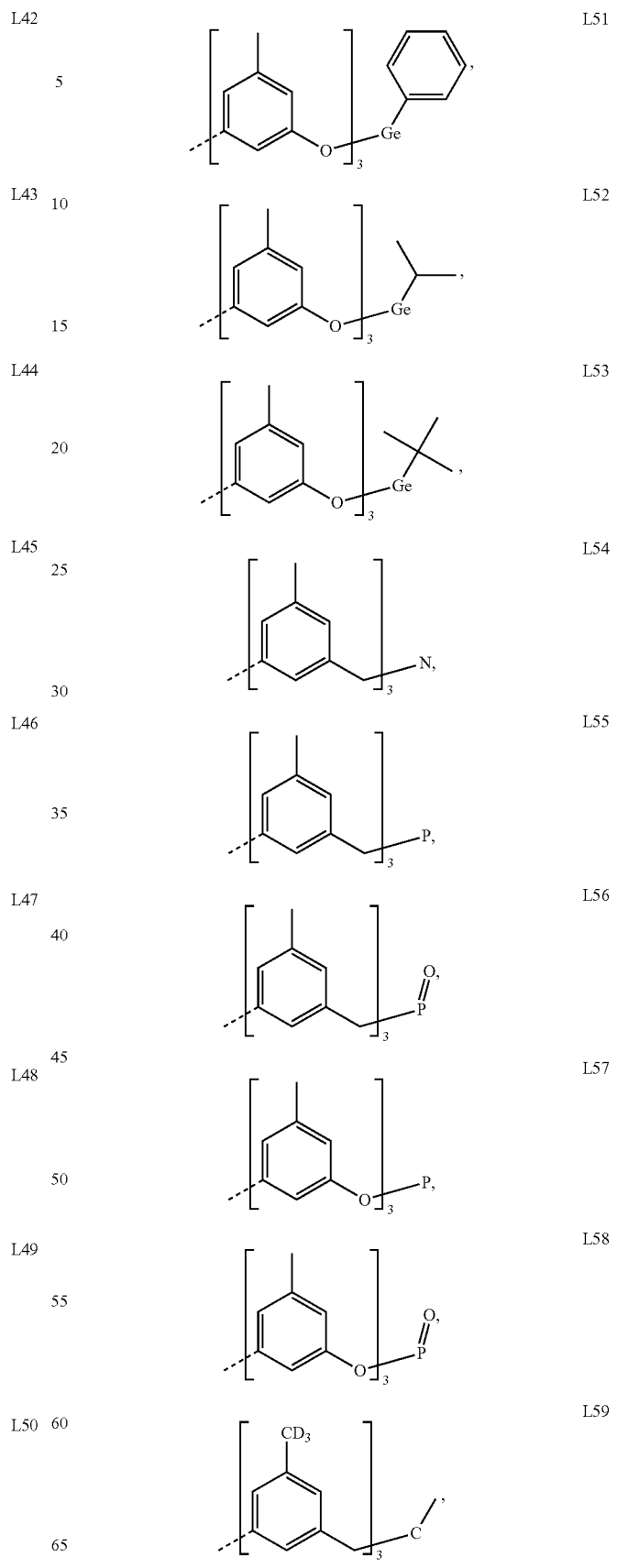

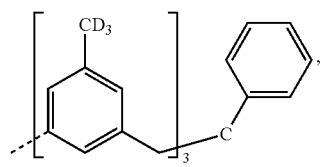 L60
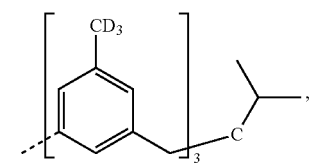 L61
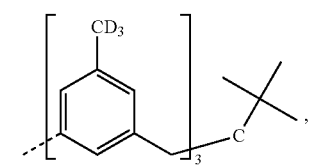 L62
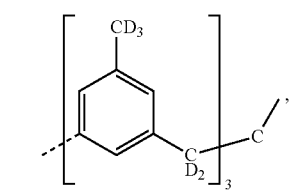 L63
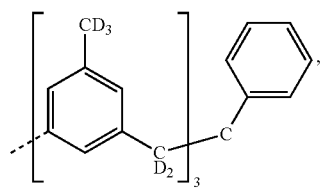 L64
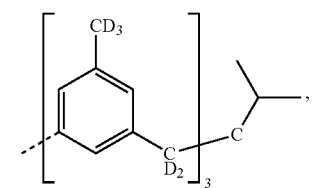 L65
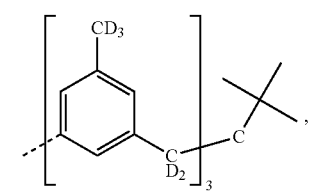 L66
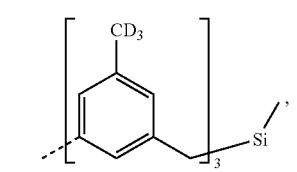 L67
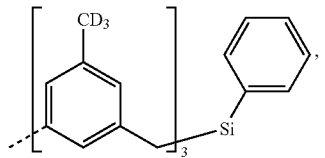 L68
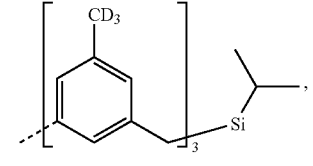 L69
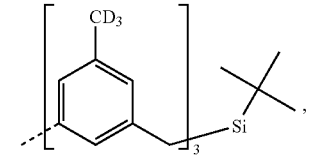 L70
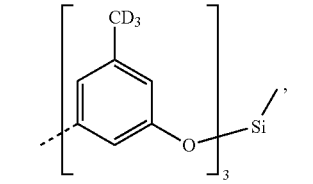 L71
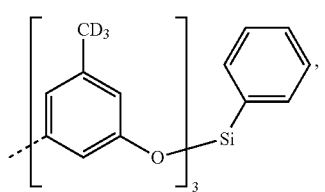 L72
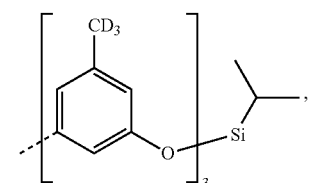 L73
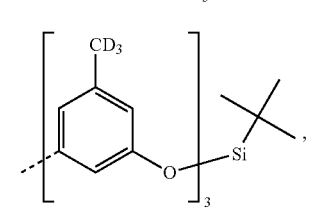 L74
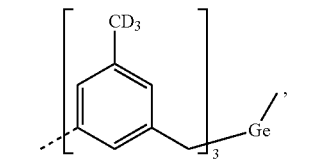 L75
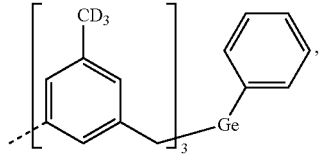 L76

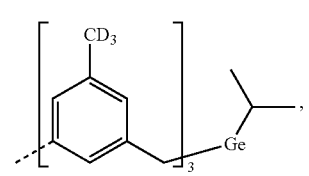 L77
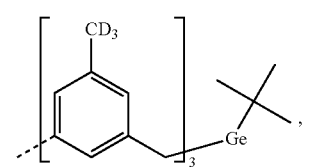 L78
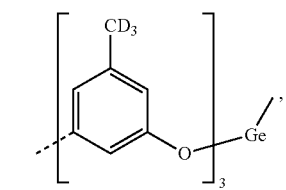 L79
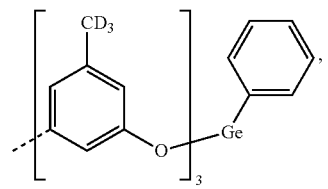 L80
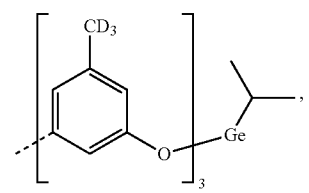 L81
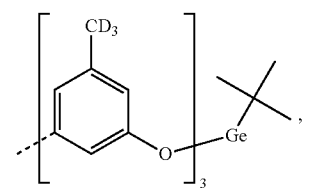 L82
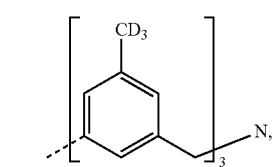 L83
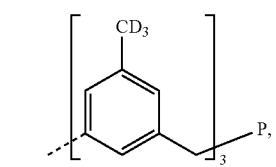 L84
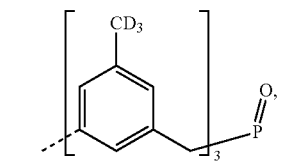 L85
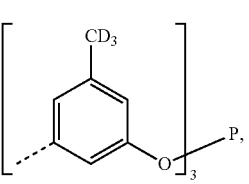 L86
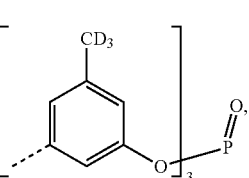 L87
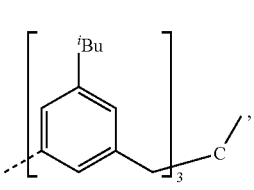 L88
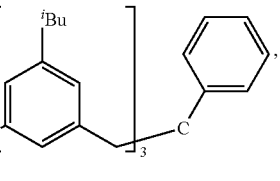 L89
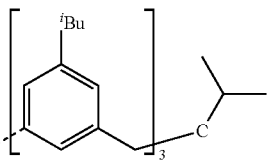 L90
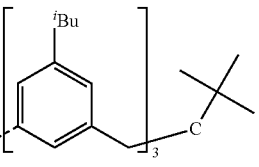 L91
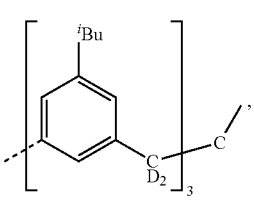 L92
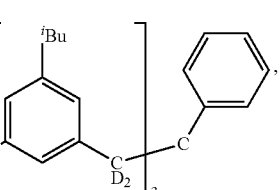 L93
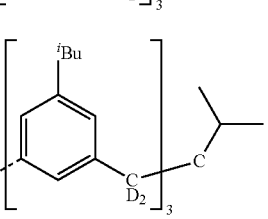 L94

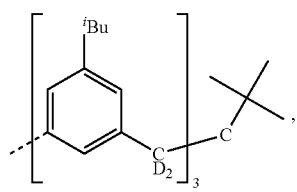 L95
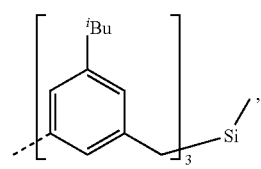 L96
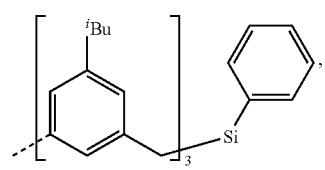 L97
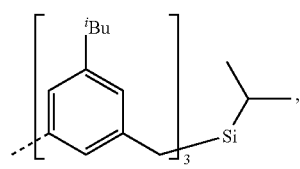 L98
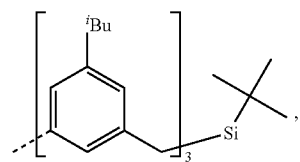 L99
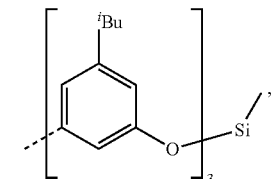 L100
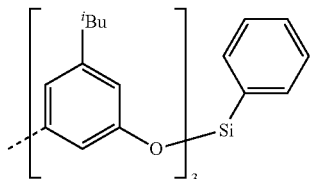 L101
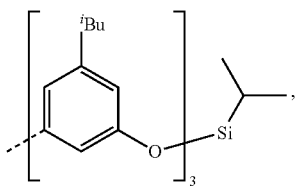 L102
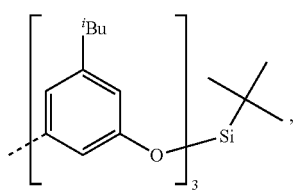 L103
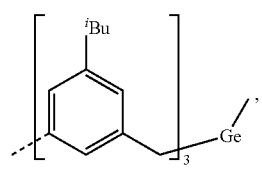 L104
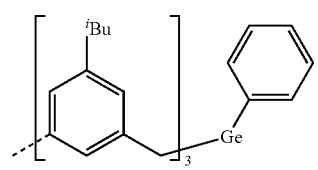 L105
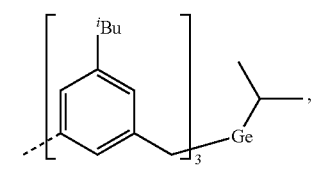 L106
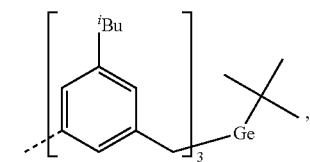 L109
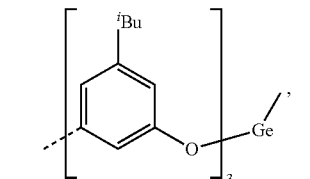 L108
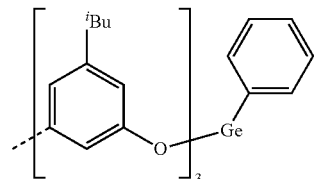 L109
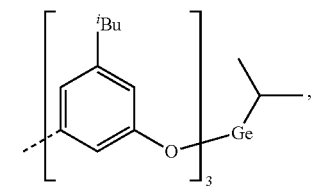 L110

-continued
L111 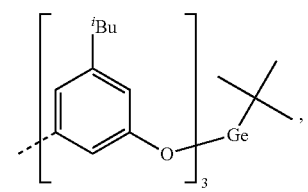
l112 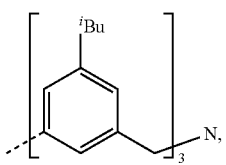
l113 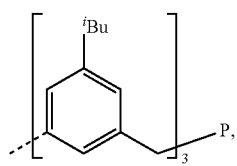
l114 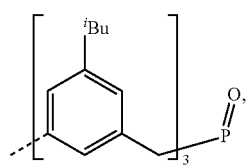
l115 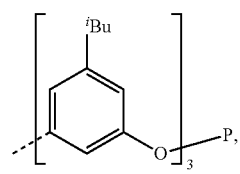
l116 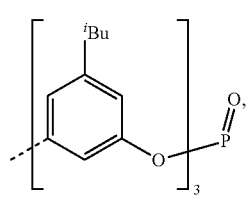
L117 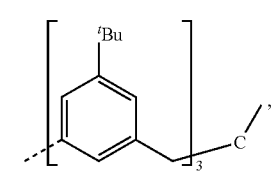
L118 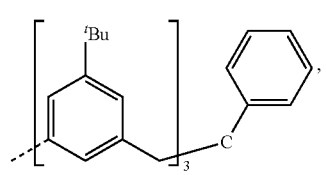
L119 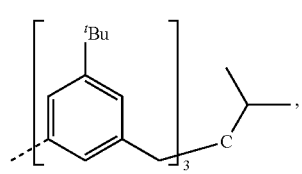
-continued
L120 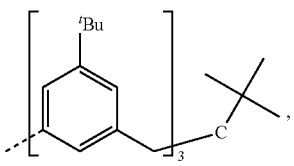
L121 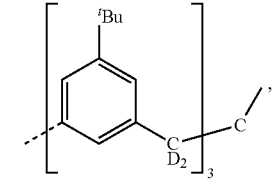
L122 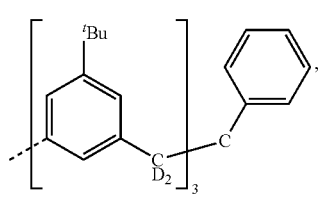
L123 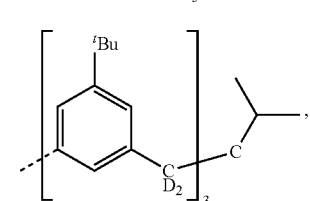
L124 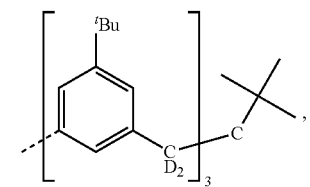
L125 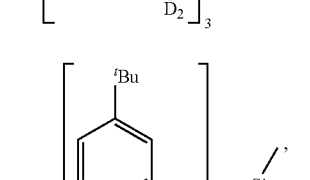
L126 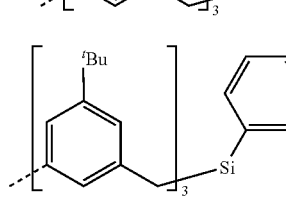
L127 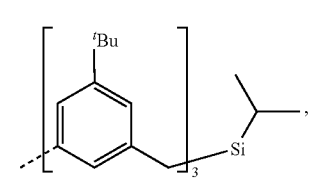
L128 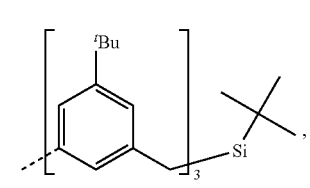

73
-continued
L129 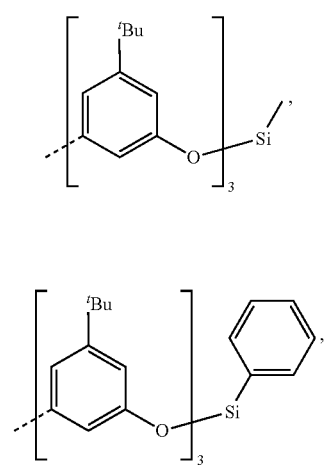
L130 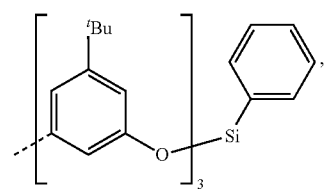
L131 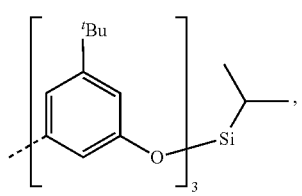
L132 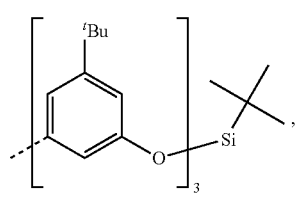
L133 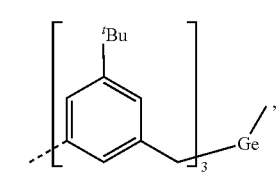
L134 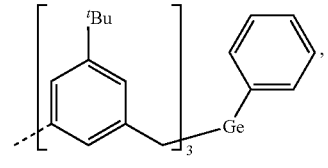
L135 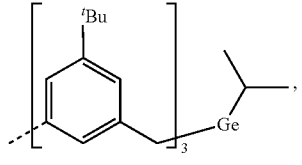
L136 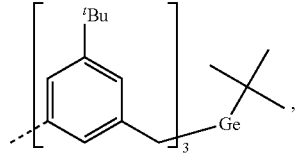
74
-continued
L137 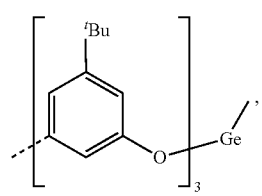
L138 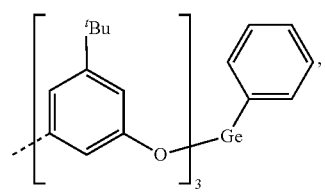
L139 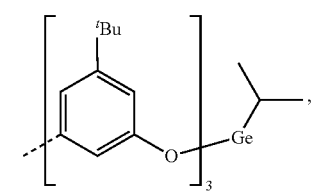
L140 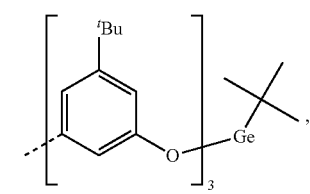
L141 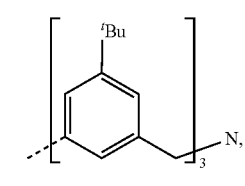
L142 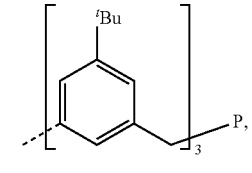
L143 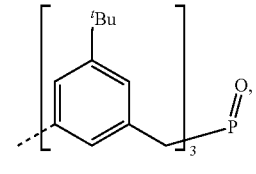
L144 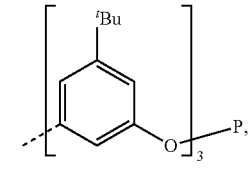

L145 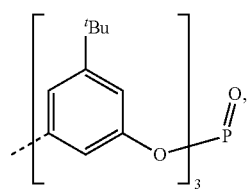
L146 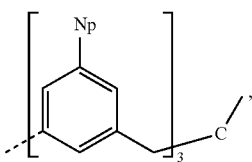
L147 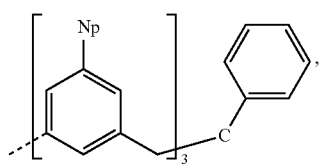
L148 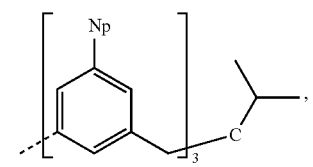
L149 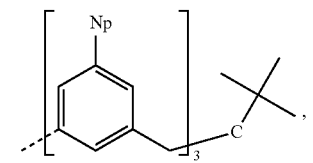
L150 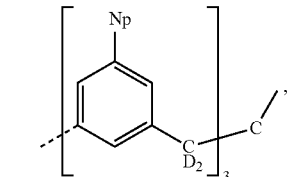
L151 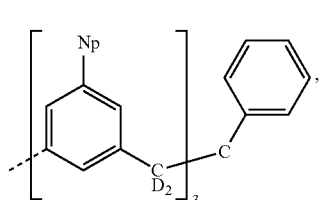
L152 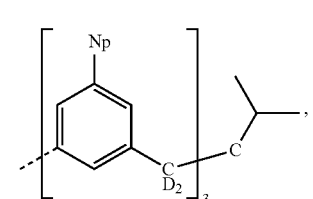
L153 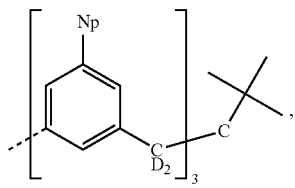
L154 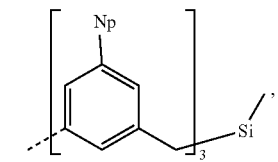
L155 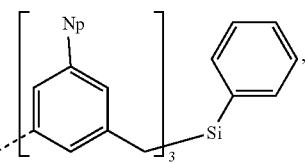
L156 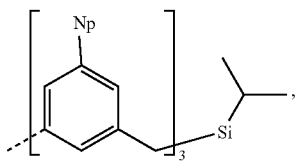
L157 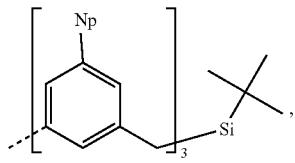
L158 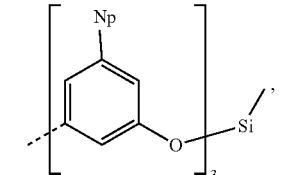
L159 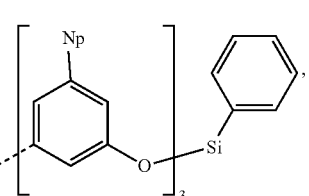
L160 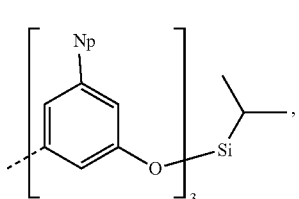

| | | |
|---|---|---|
| 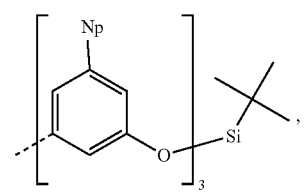 | L161 | 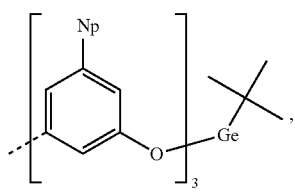 L169 |
| 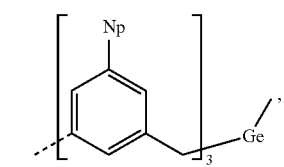 | L162 | 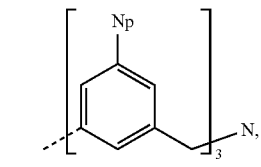 L170 |
| 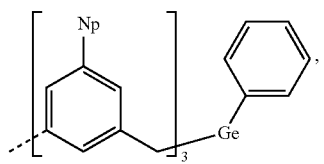 | L163 | 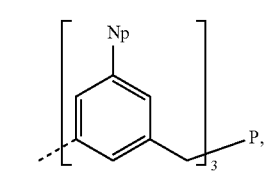 L171 |
| 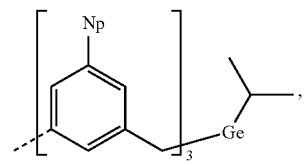 | L164 | 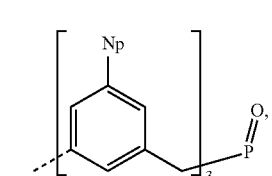 L172 |
| 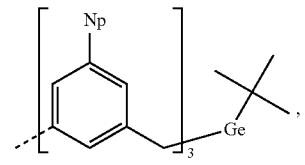 | L165 | 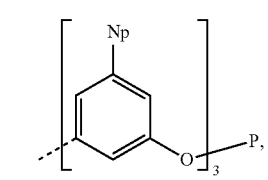 L173 |
| 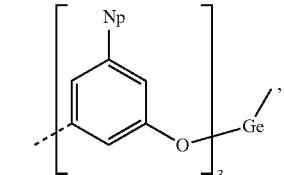 | L166 | 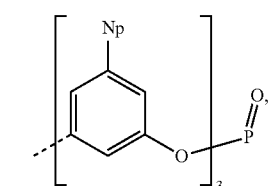 L174 |
| 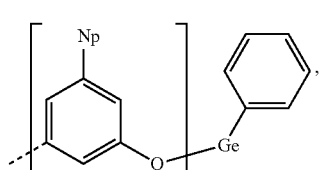 | L167 | 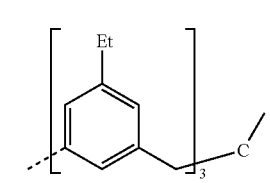 L175 |
| 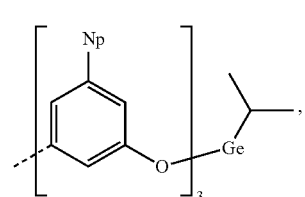 | L168 | 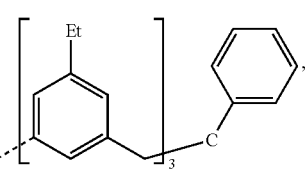 L176 |
| | | 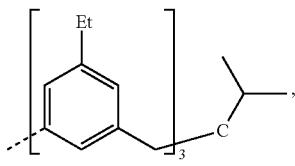 L177 |

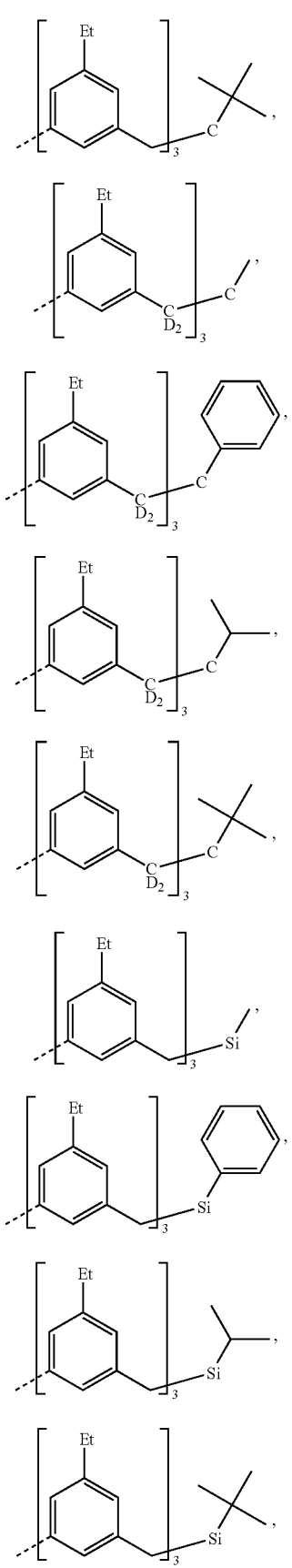

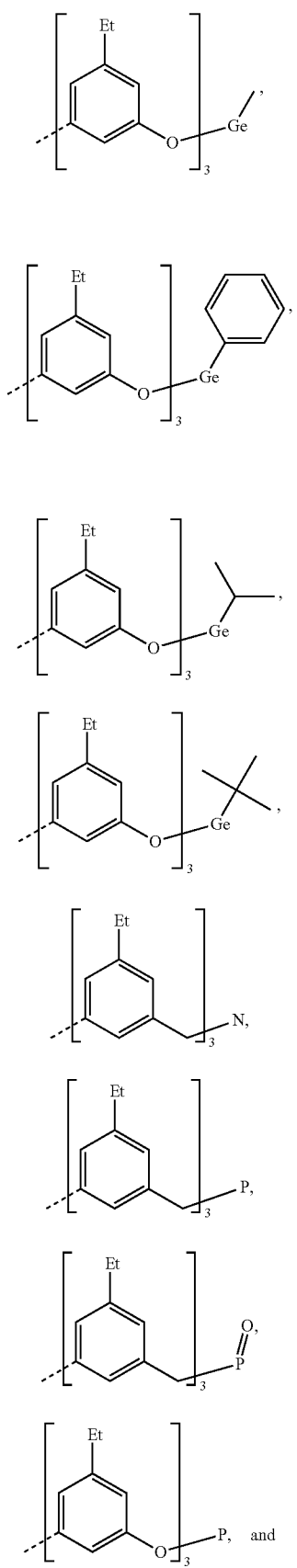

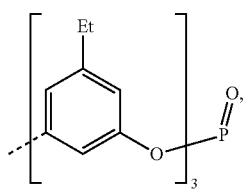

L195

L196

L197

L198

L199

L200

L201

L202

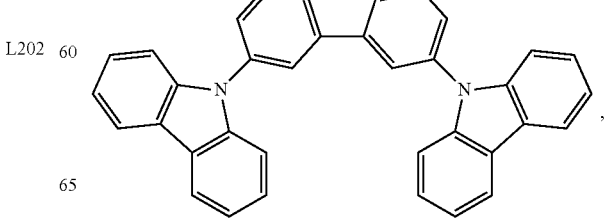

L203

According to another aspect of the present disclosure, an OLED is also provided. The OLED includes an anode, a cathode, and an organic layer disposed between the anode and the cathode. The organic layer may include a host and a phosphorescent dopant. The organic layer can include a compound including a first ligand $L_A$ having Formula I, and its variations as described herein.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the present invention relates to an emissive region or an emissive layer. The emissive region or emissive layer can include a compound of the present invention. In one embodiment, the compound of the present invention is an emissive dopant or a non-emissive dopant.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiment of the emissive region, the emissive region further comprises a host, wherein the host is selected from the group consisting of:

83
-continued
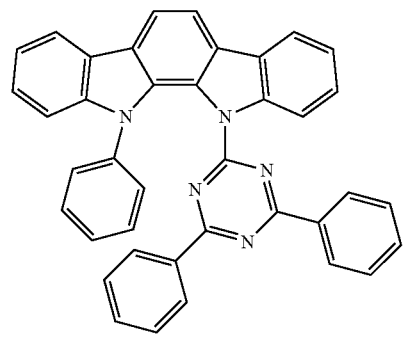
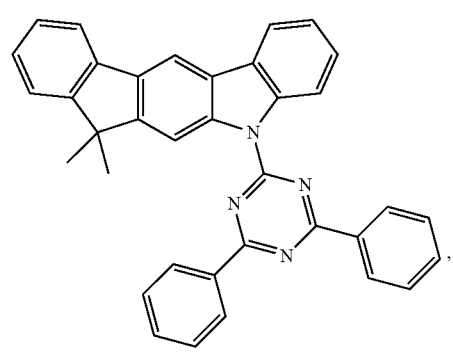
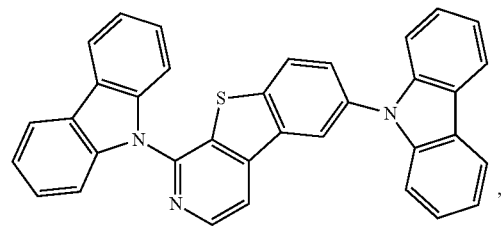
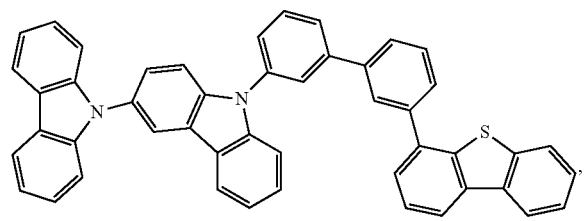
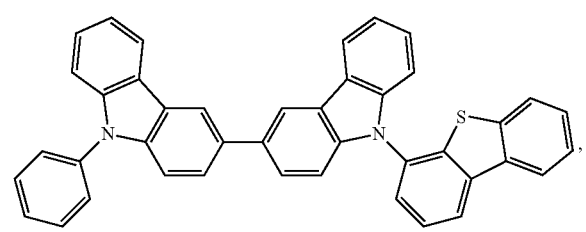
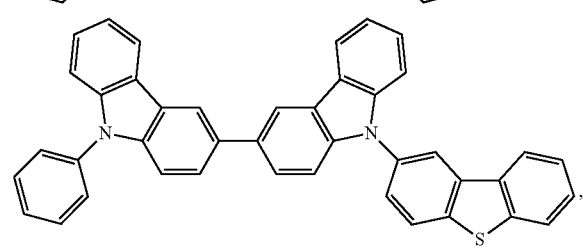
84
-continued
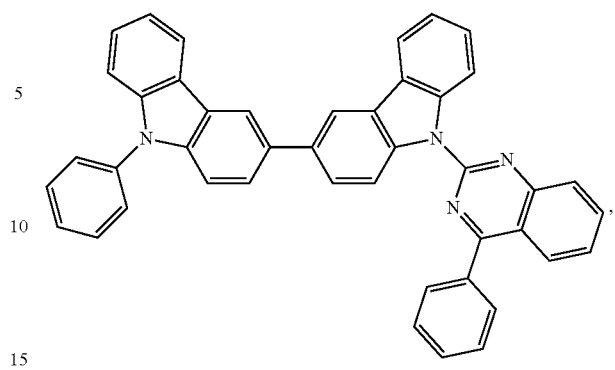
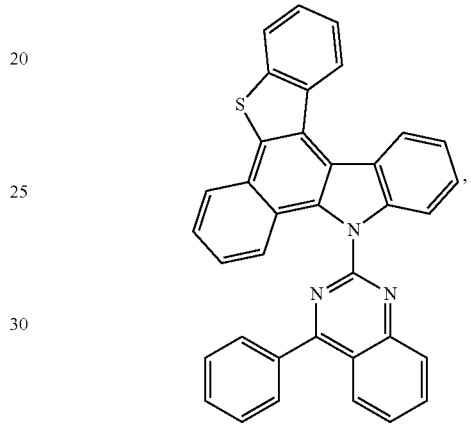
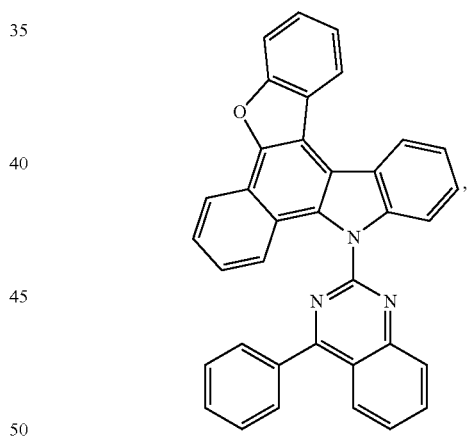
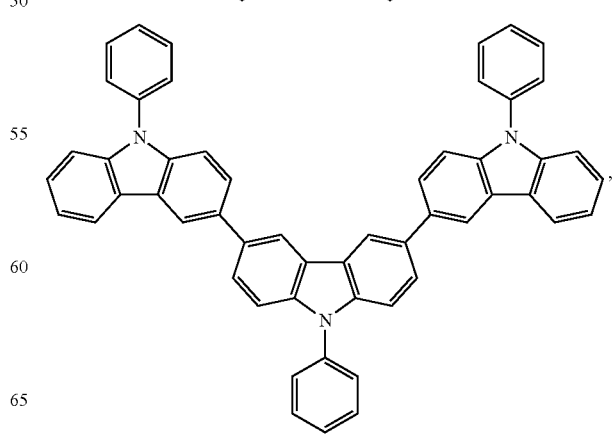

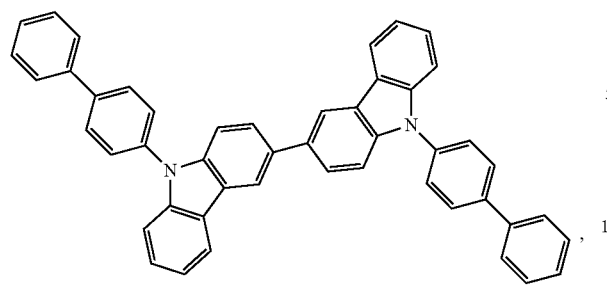
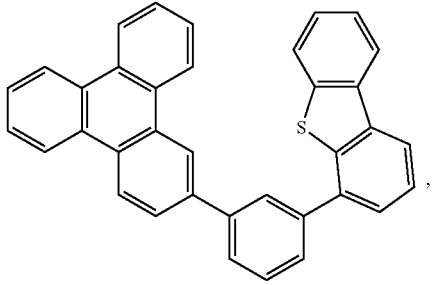
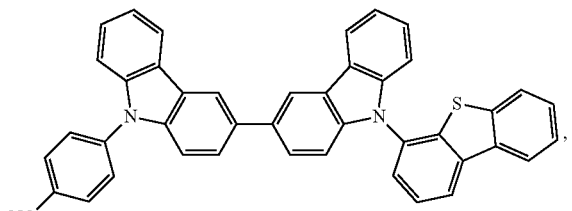
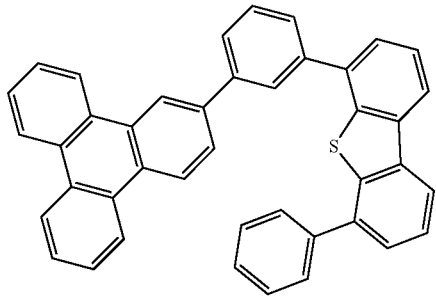
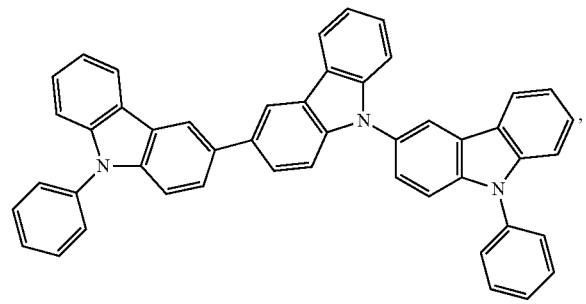
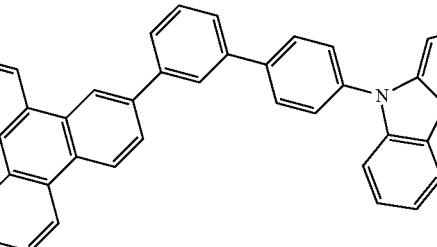
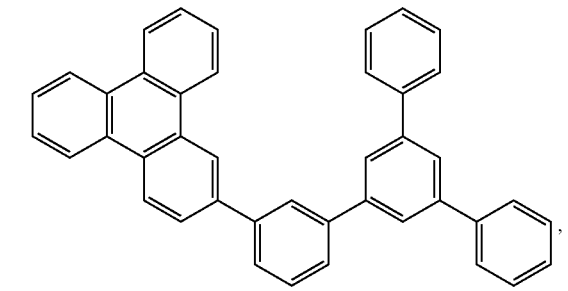
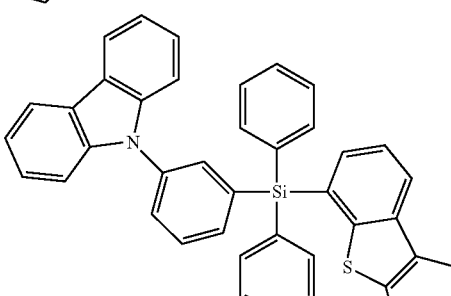
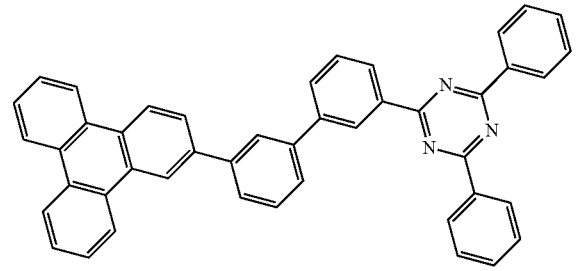
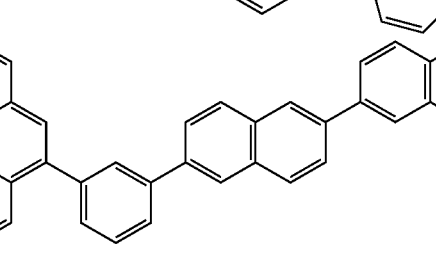
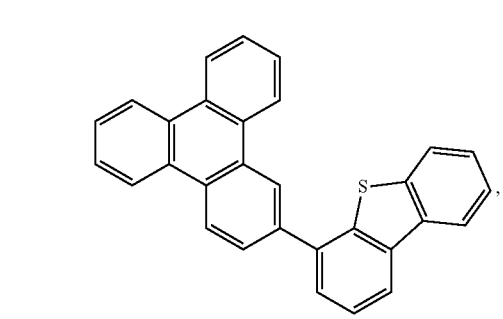
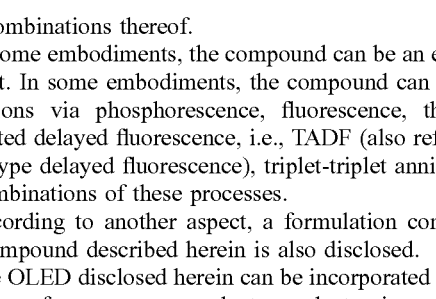

and combinations thereof.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel.

In one embodiment, the consumer product is selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

The organic layer can be an emissive layer and the compound can be an emissive dopant in some embodiments, while the compound can be a non-emissive dopant in other embodiments. In one embodiment, the organic layer further comprises a host, wherein the host comprises a metal complex.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv C-C_nH_{2n+1}$, $Ar_1$, $Ar_1$-$Ar_2$, and $C_nH_{2n}$—$Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example, a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

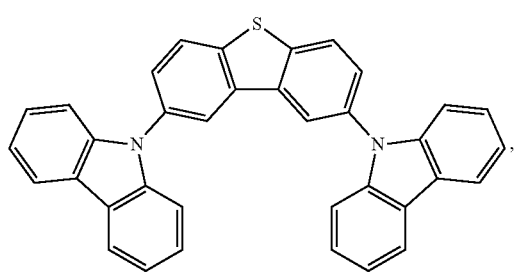

-continued

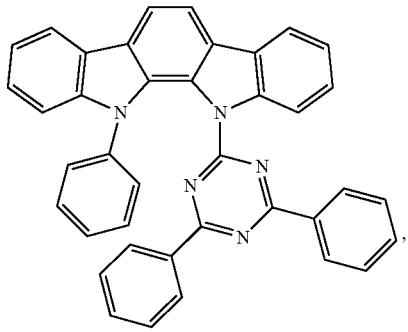

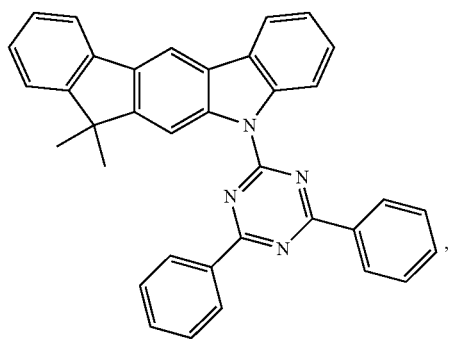

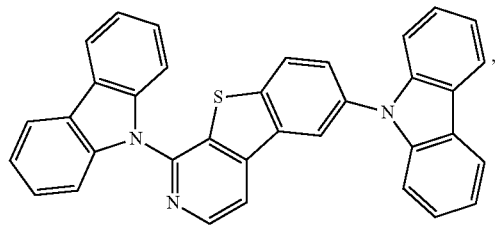

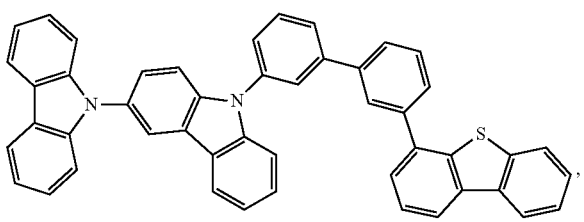

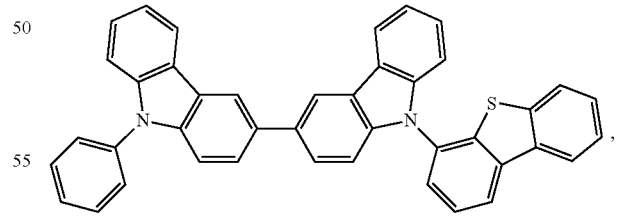

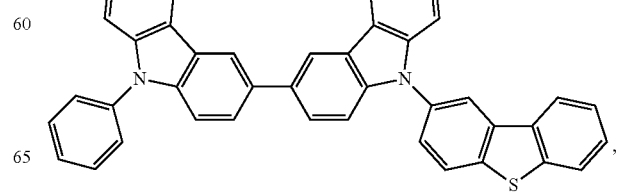

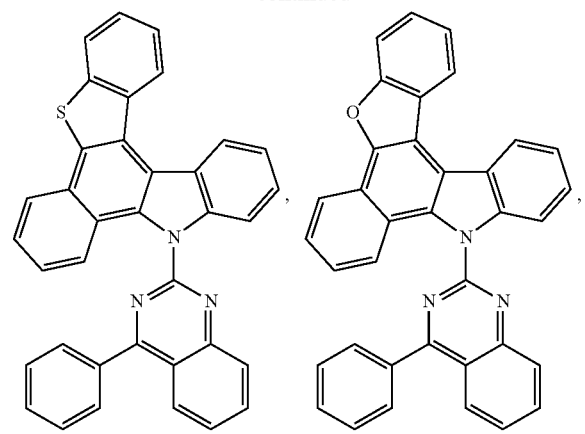
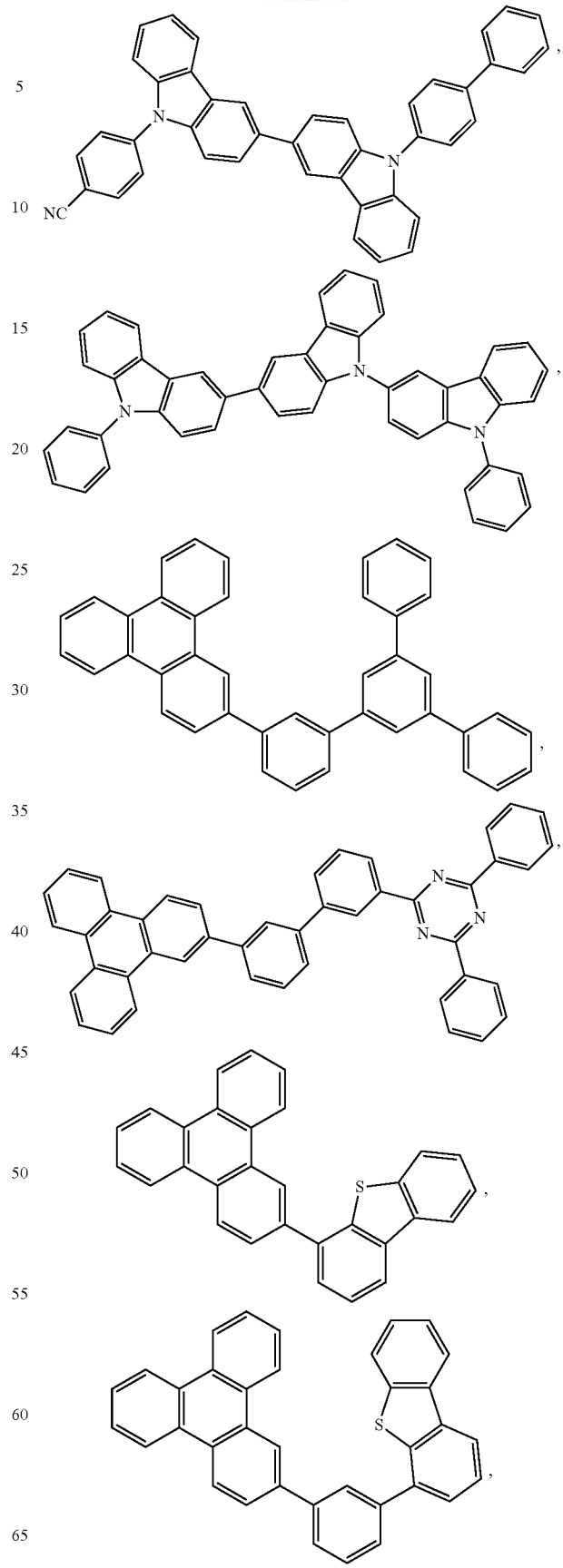

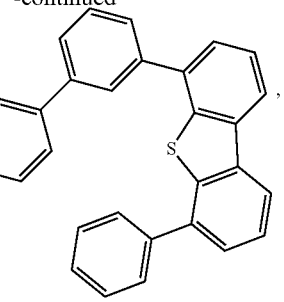
,

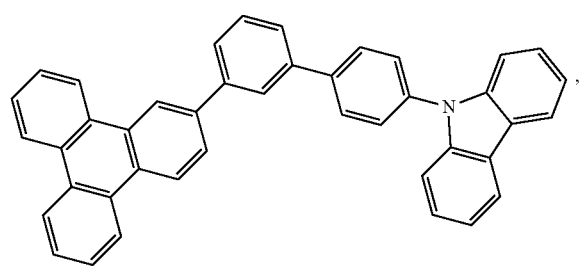
,

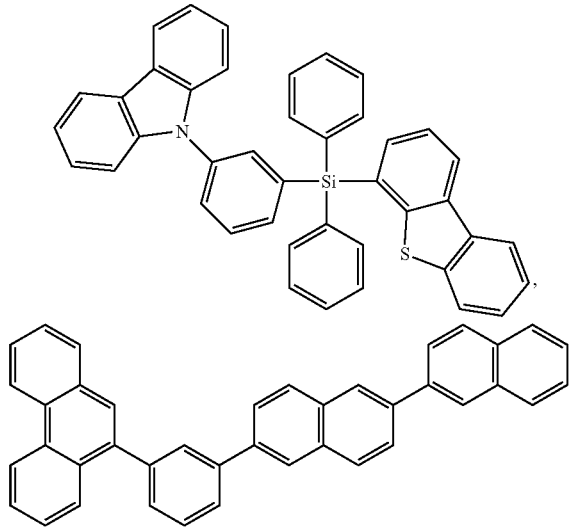
,

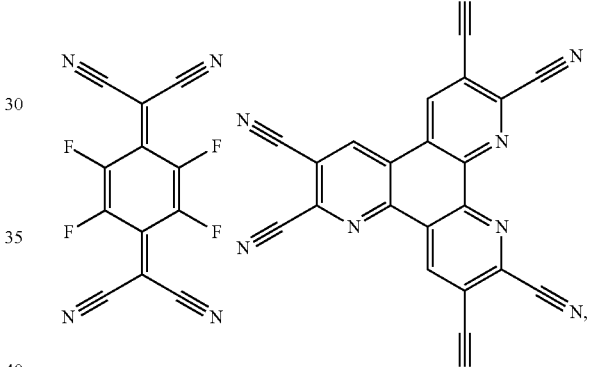

and combinations thereof.
Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

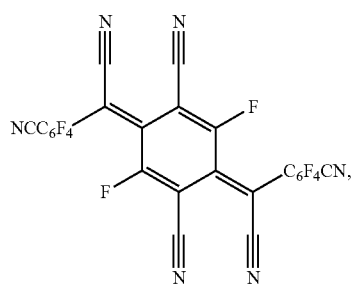

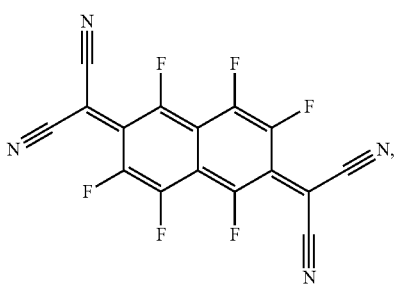

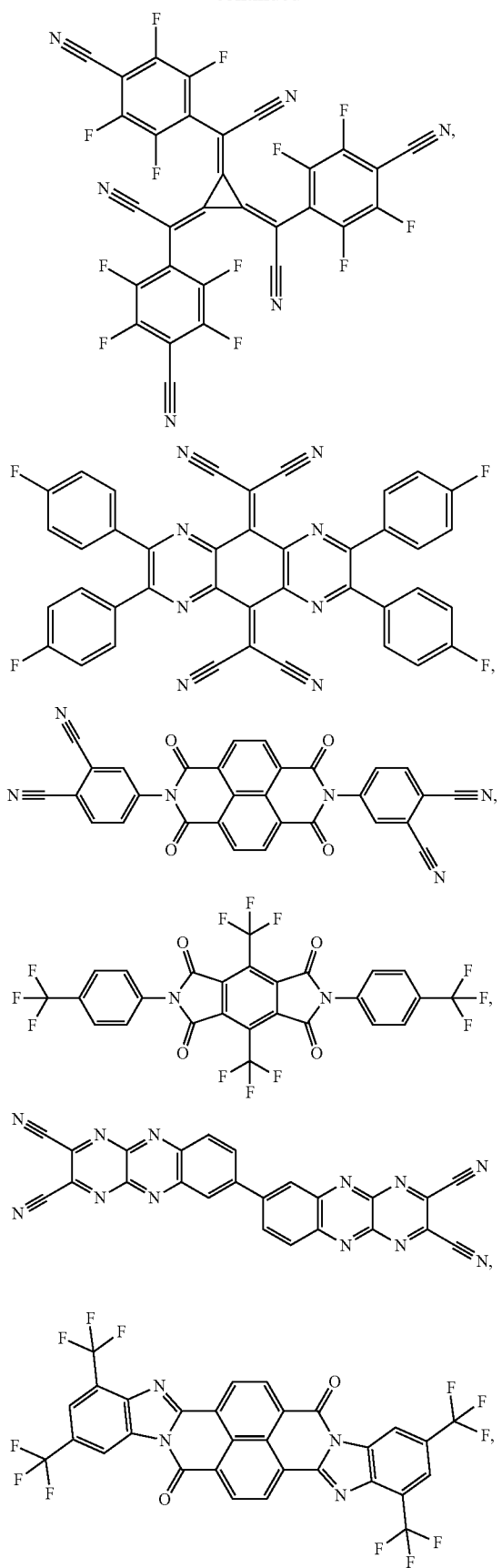

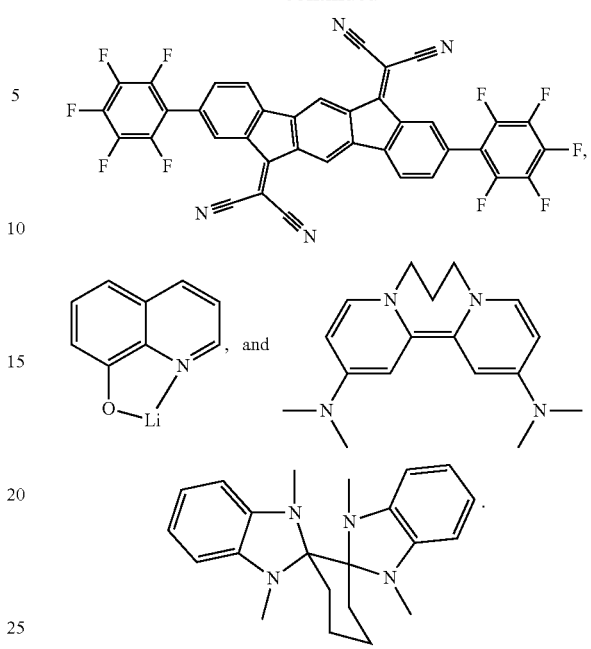

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphoric acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

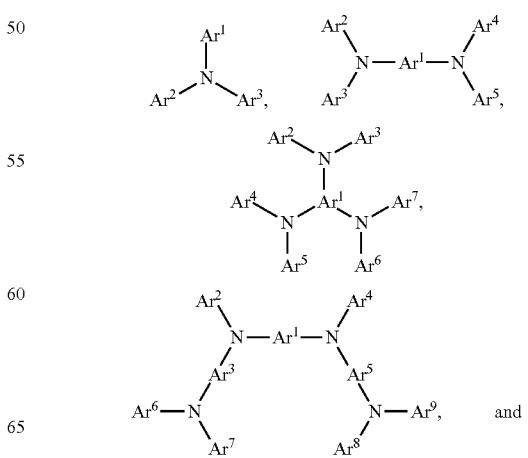

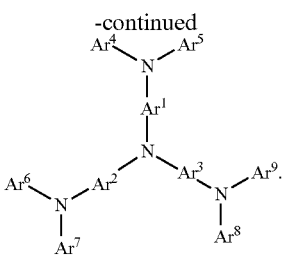

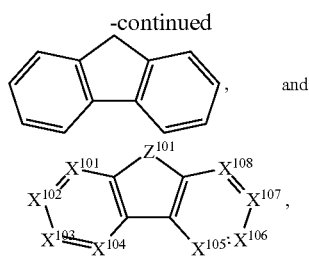
and

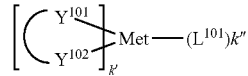

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfonyl, phosphino, and combinations thereof.

In one aspect, $Ar^1$ to $Ar^9$ is independently selected from the group consisting of:

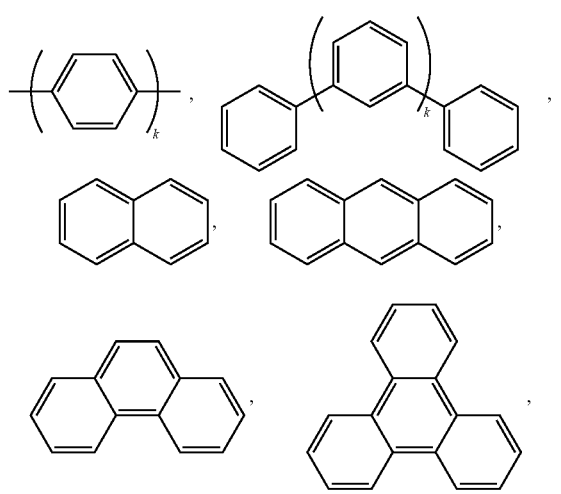

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

$$\left[\left(\begin{array}{c}Y^{101}\\Y^{102}\end{array}\right]_{k'}Met-(L^{101})_{k''}$$

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

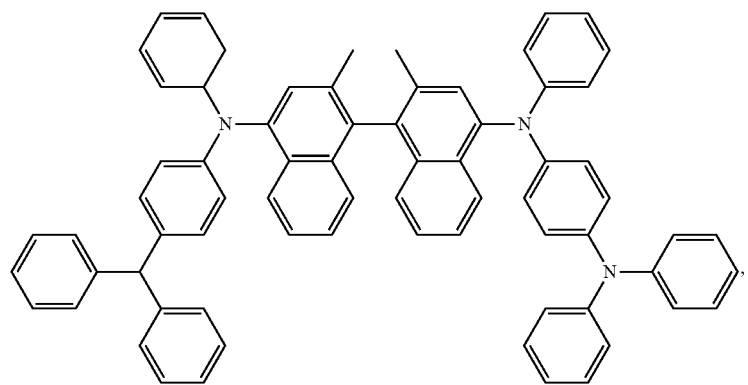
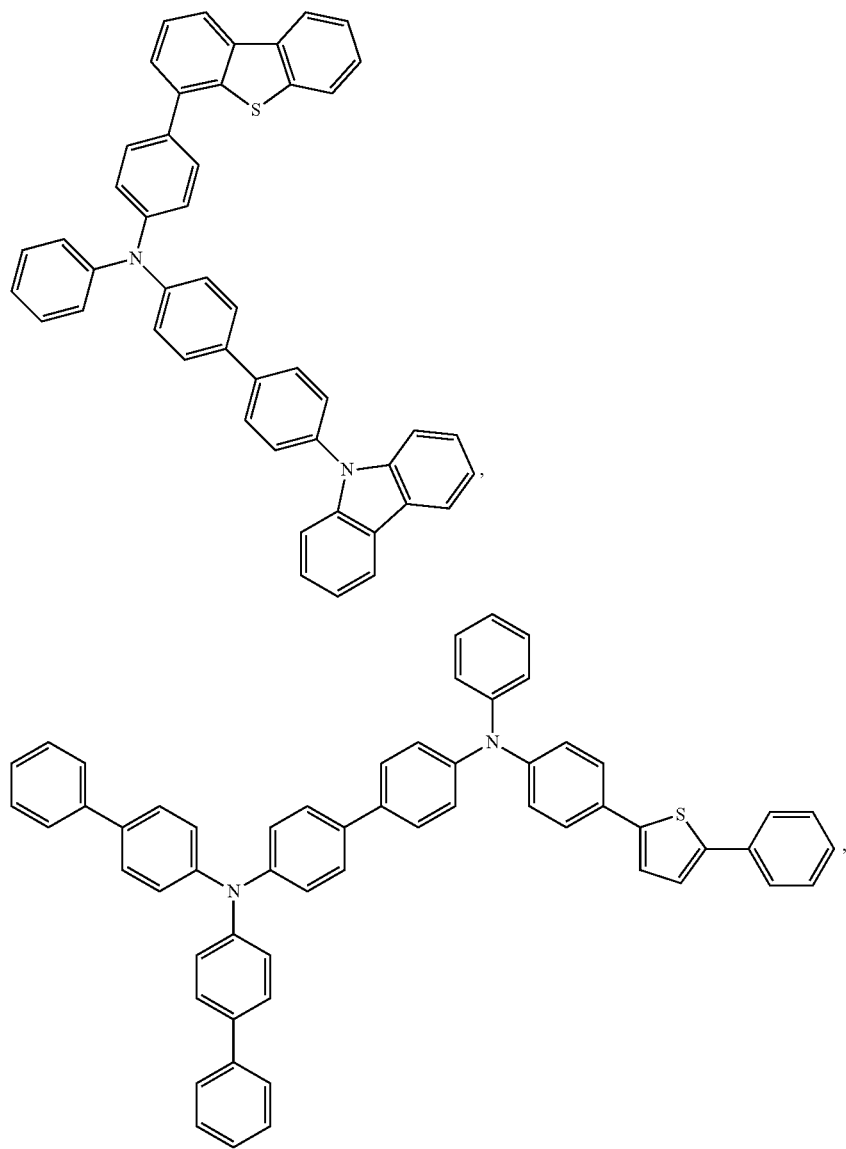

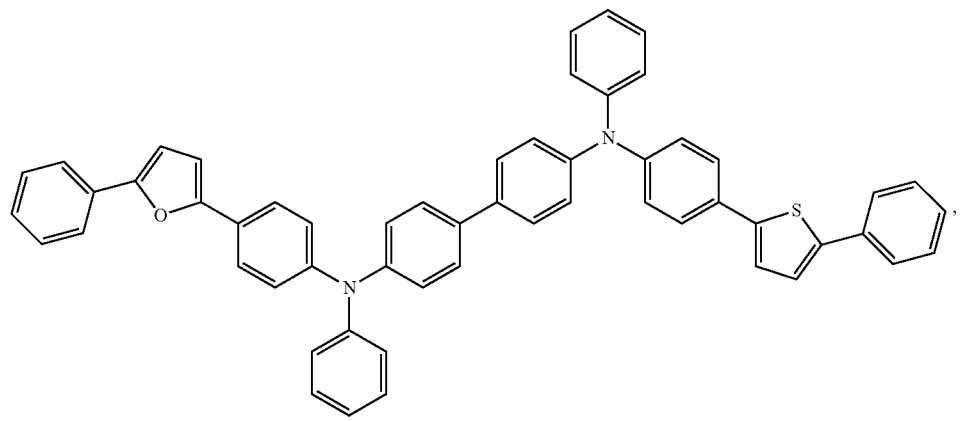
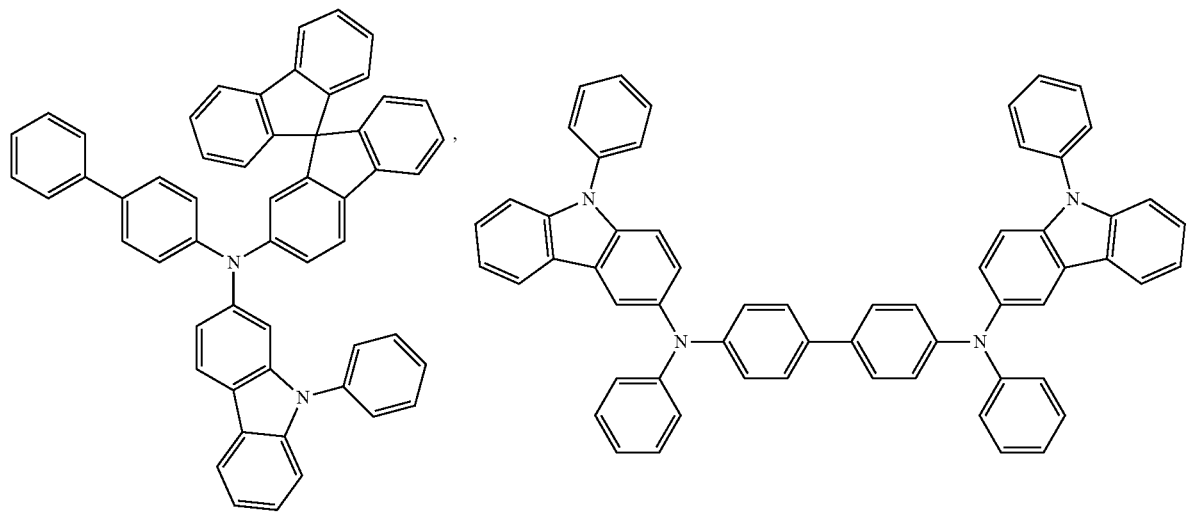
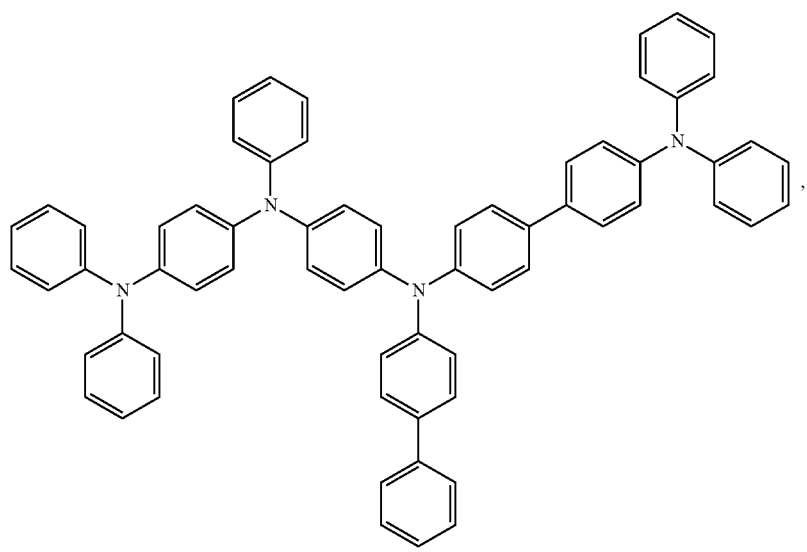

-continued
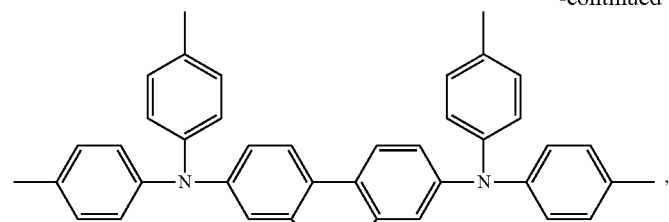
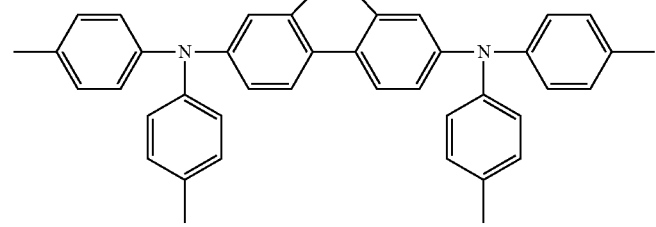
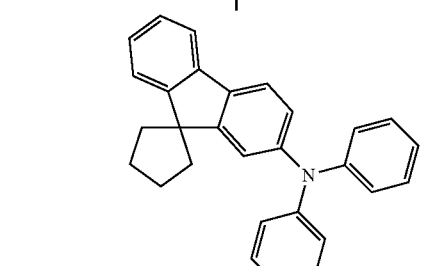
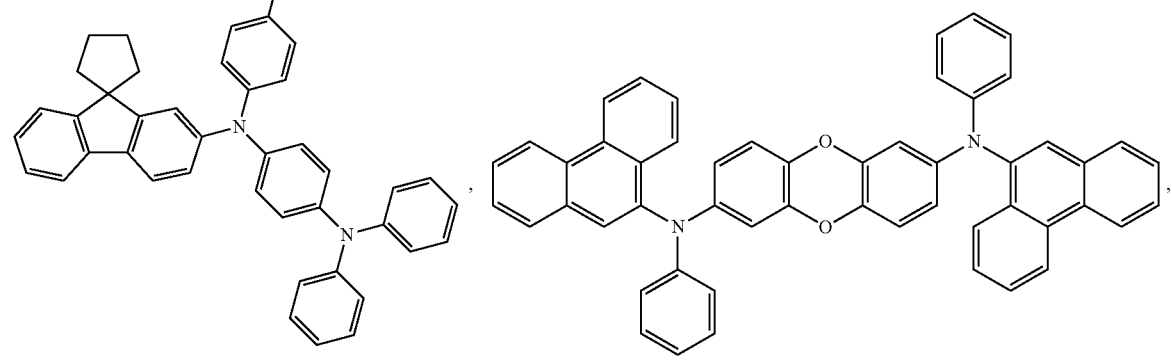

103
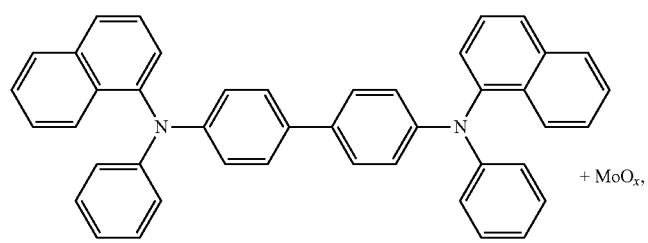
+ MoOx,
104
-continued
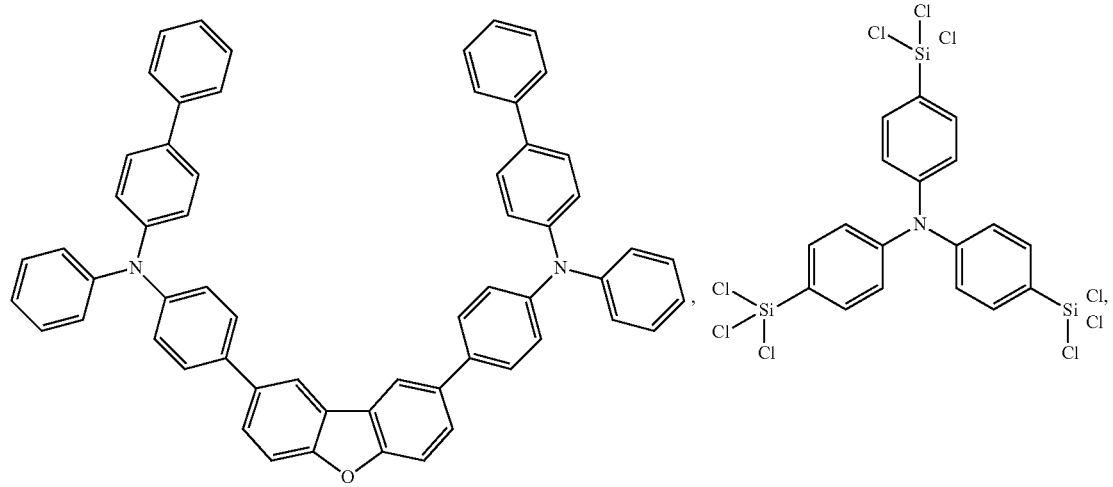
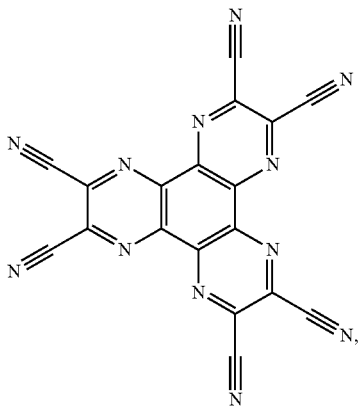
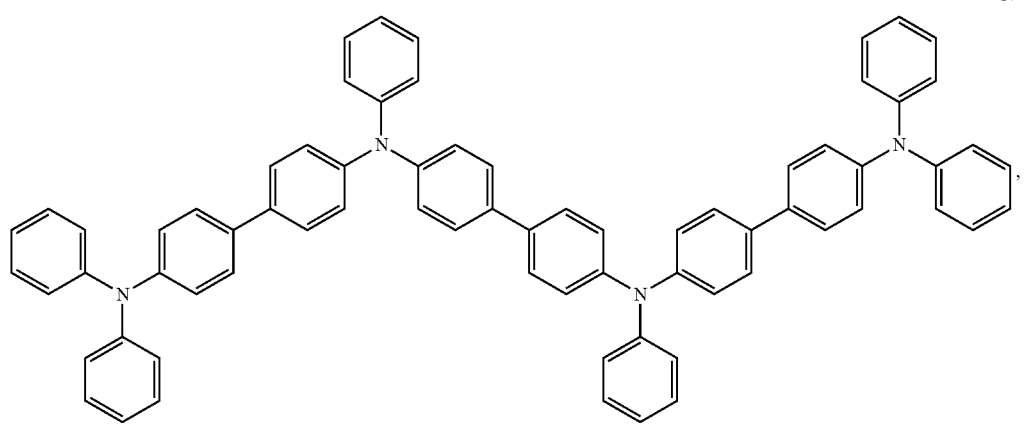

-continued
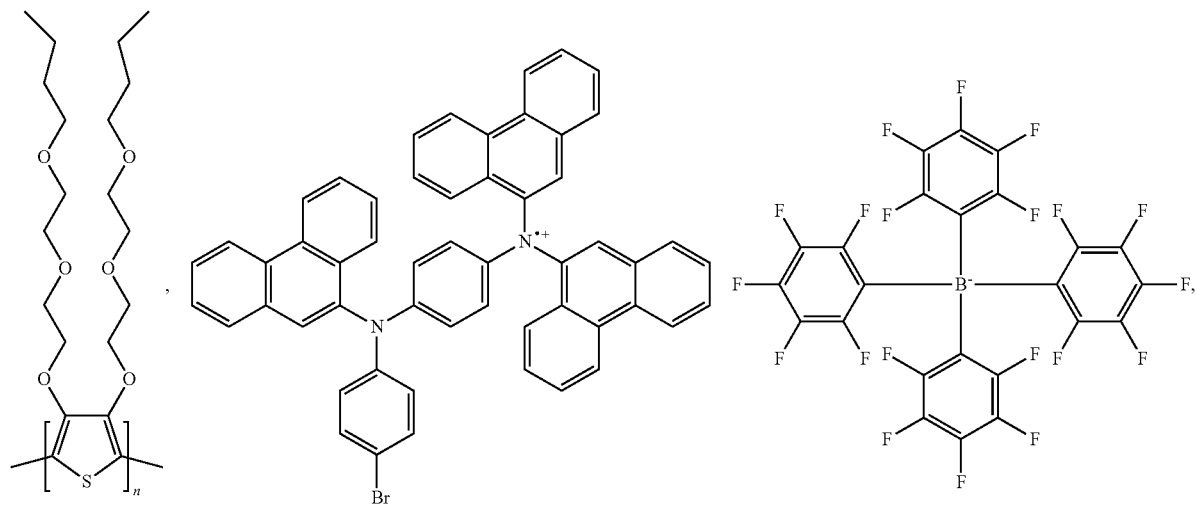
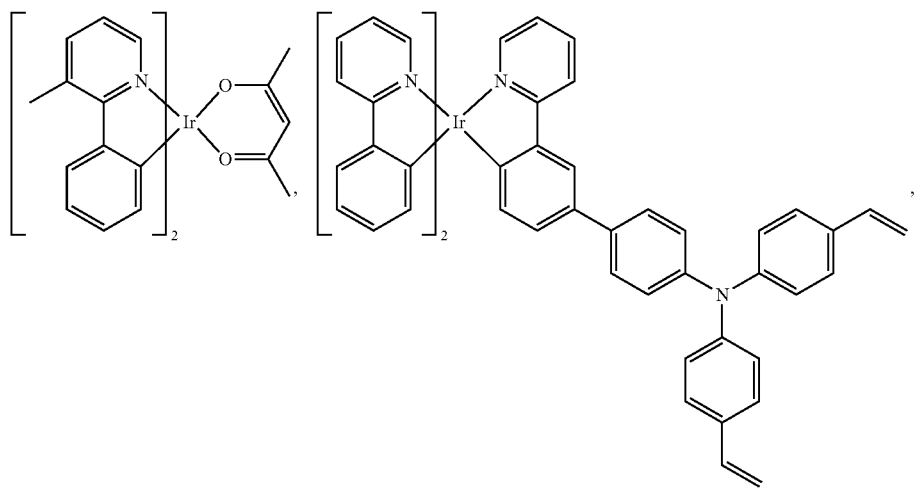
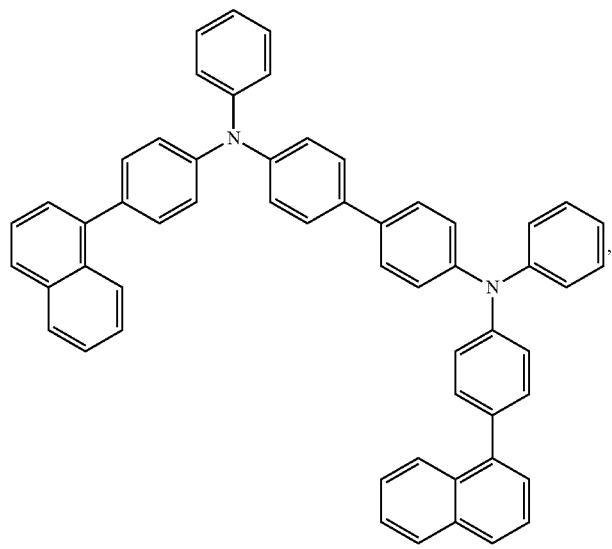

-continued
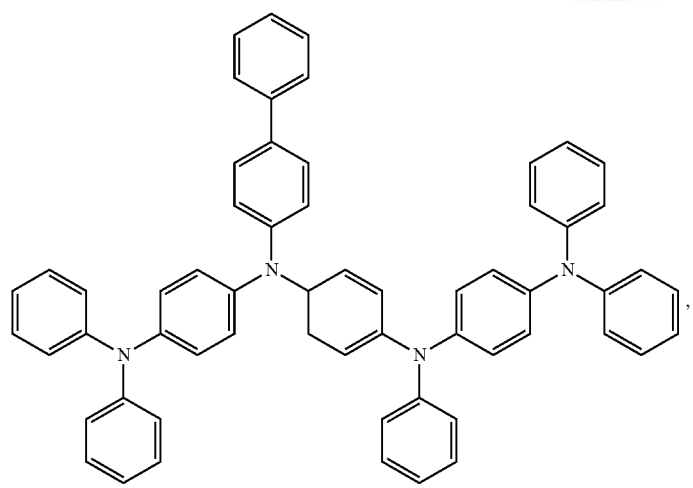
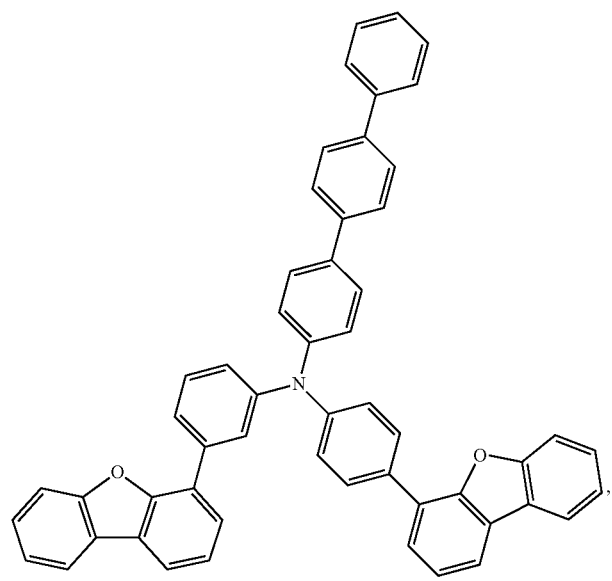
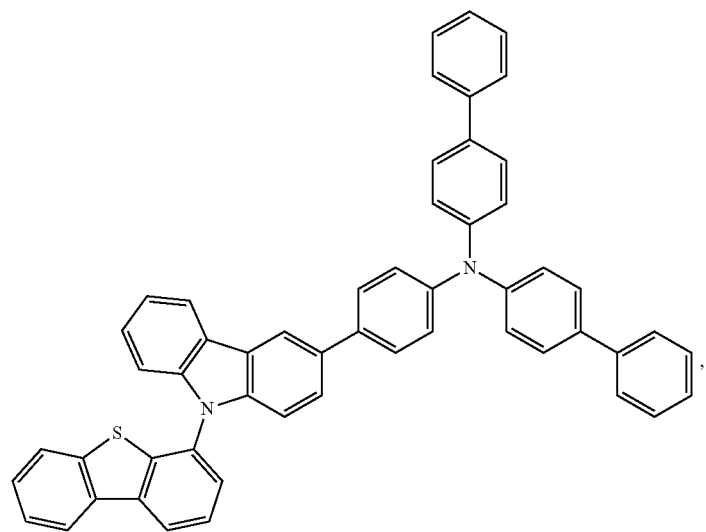

-continued
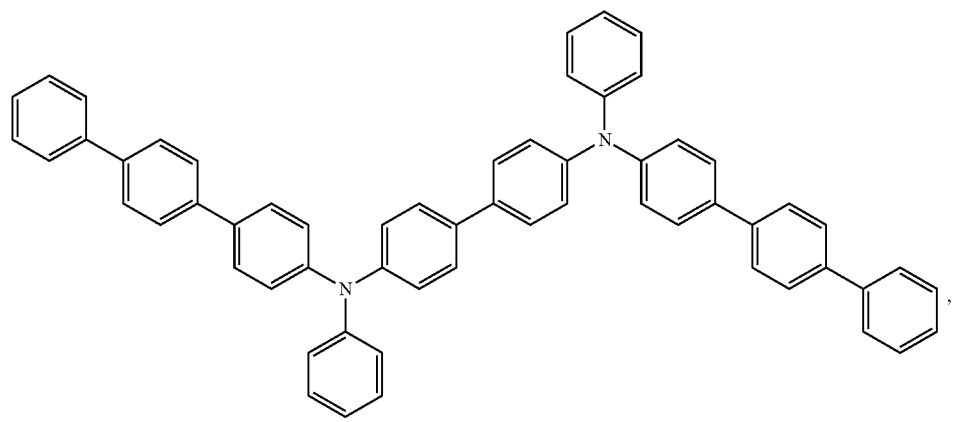
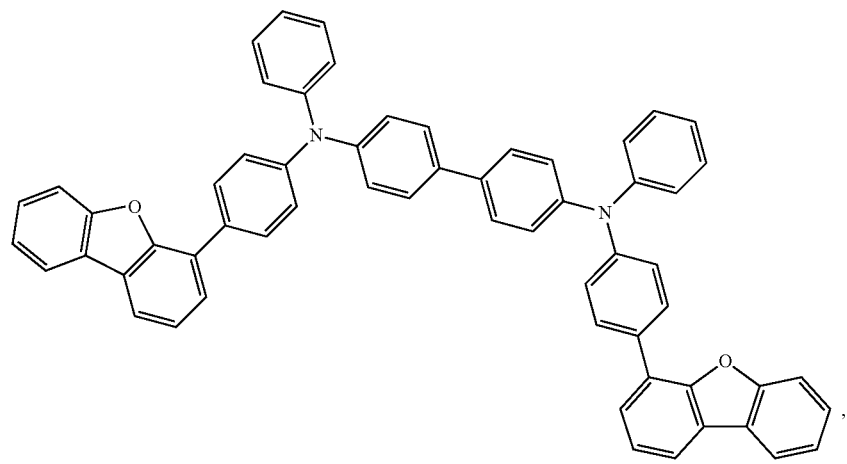
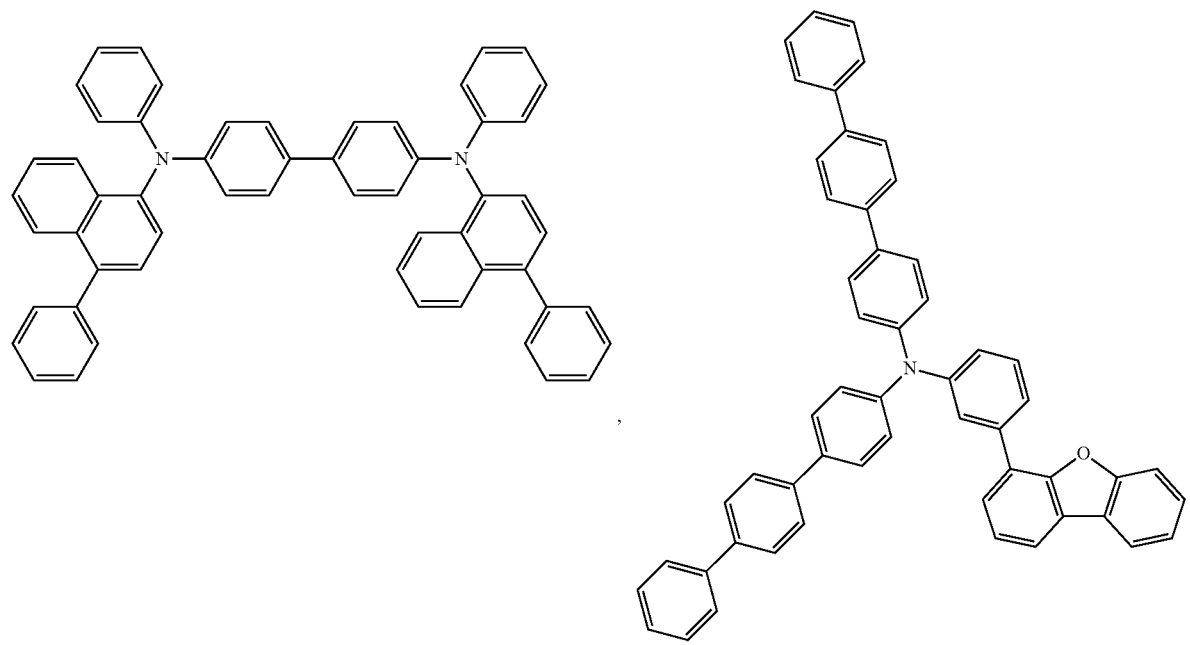

-continued
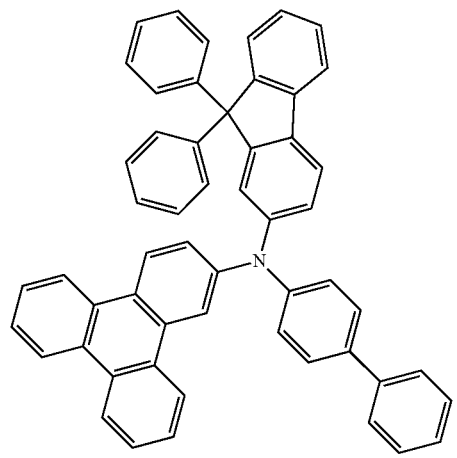
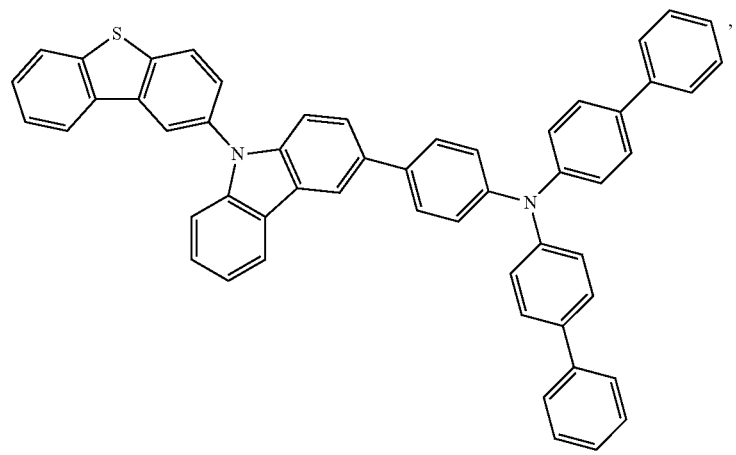
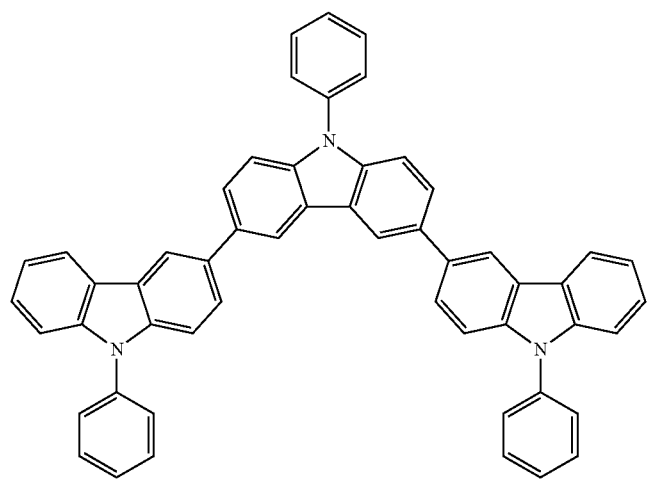
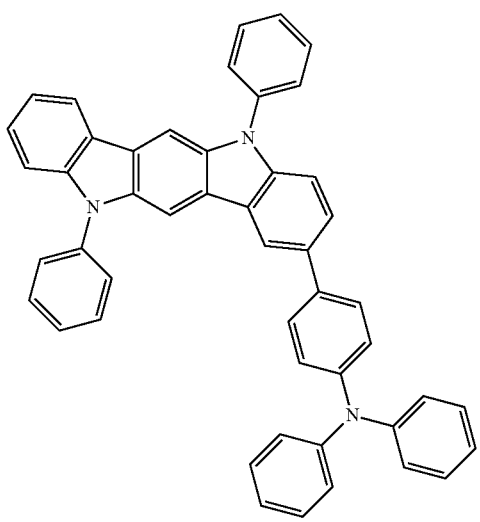
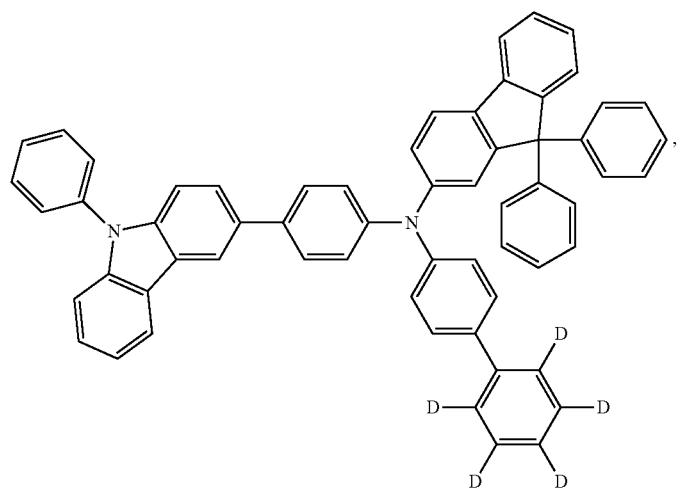

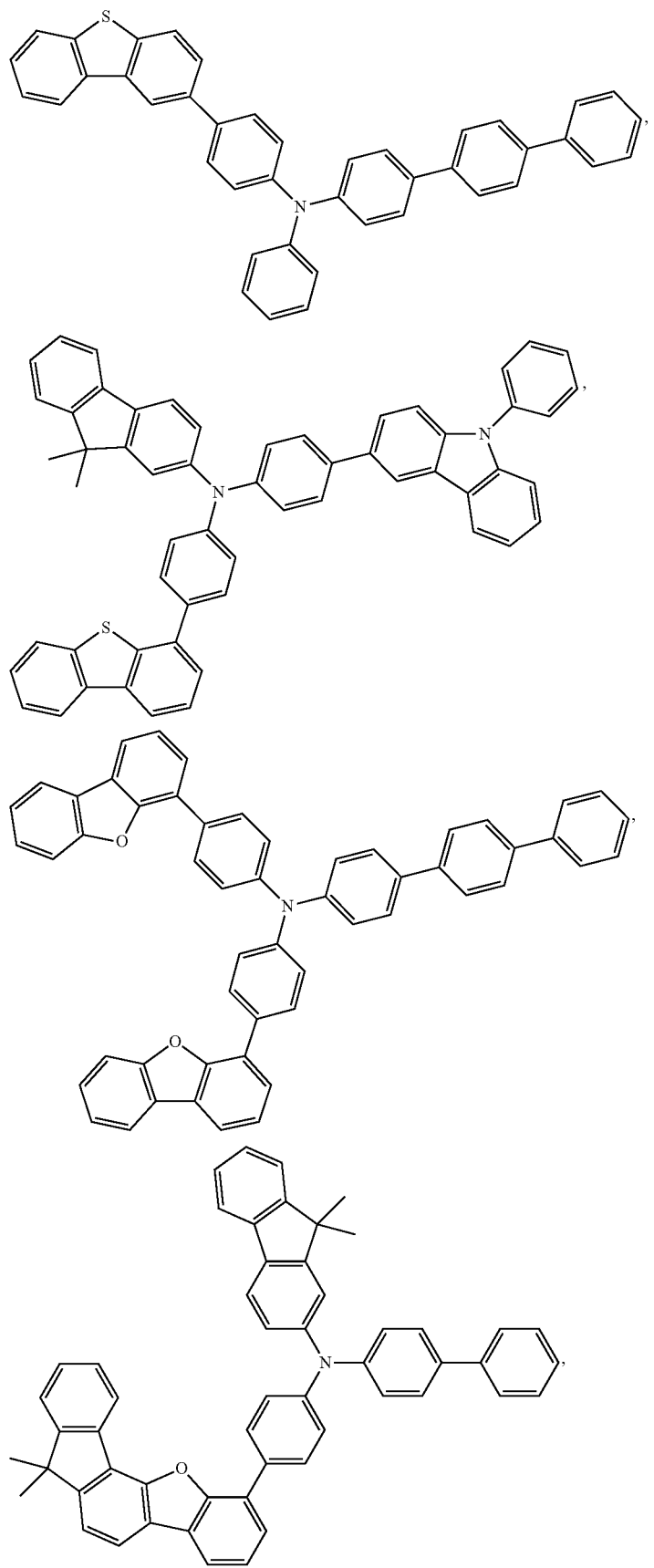

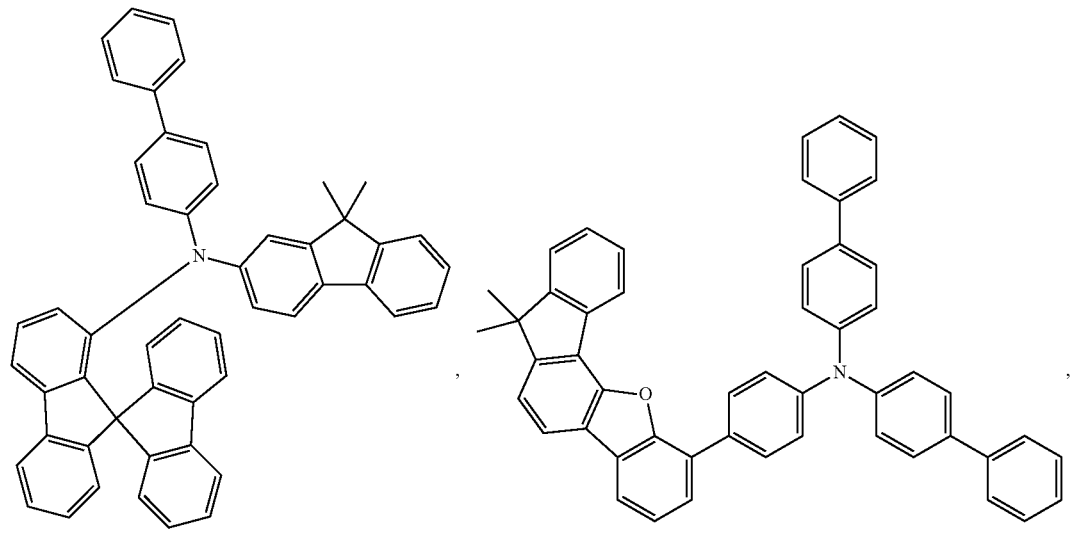
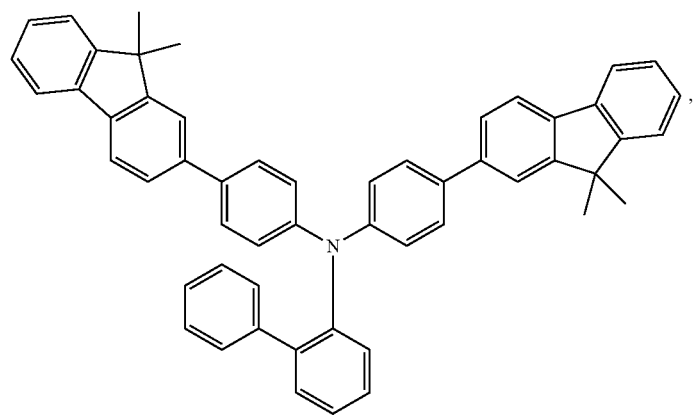
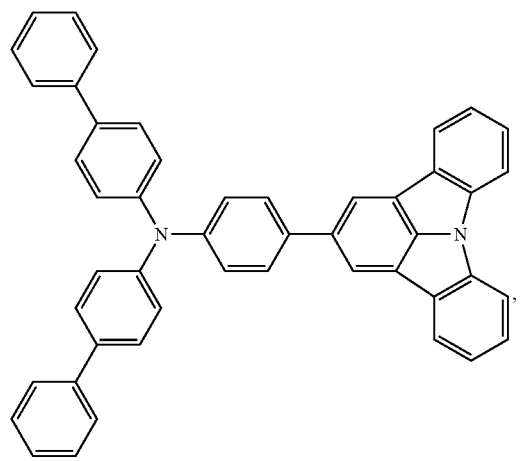

-continued
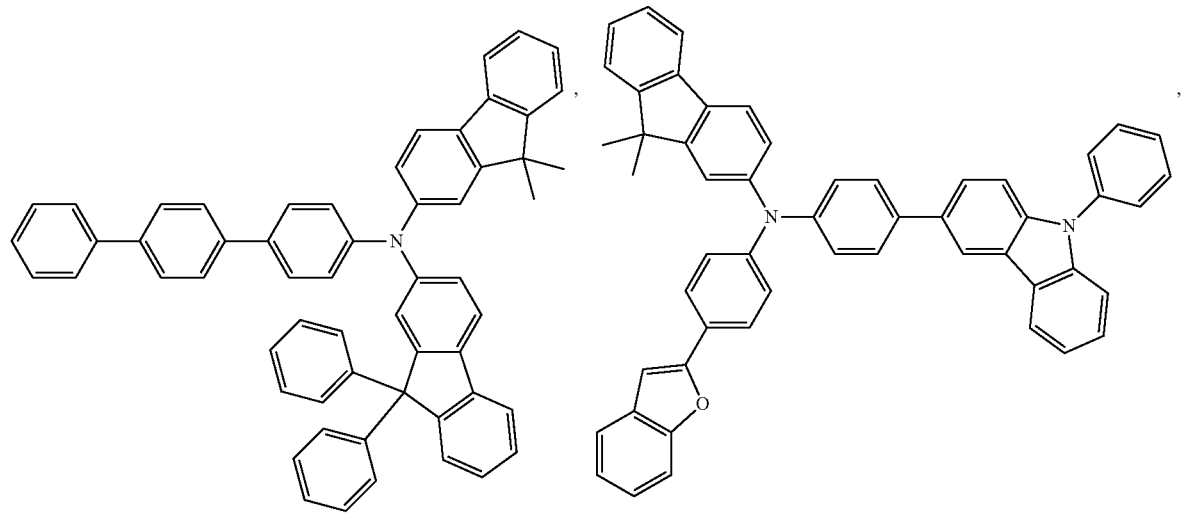
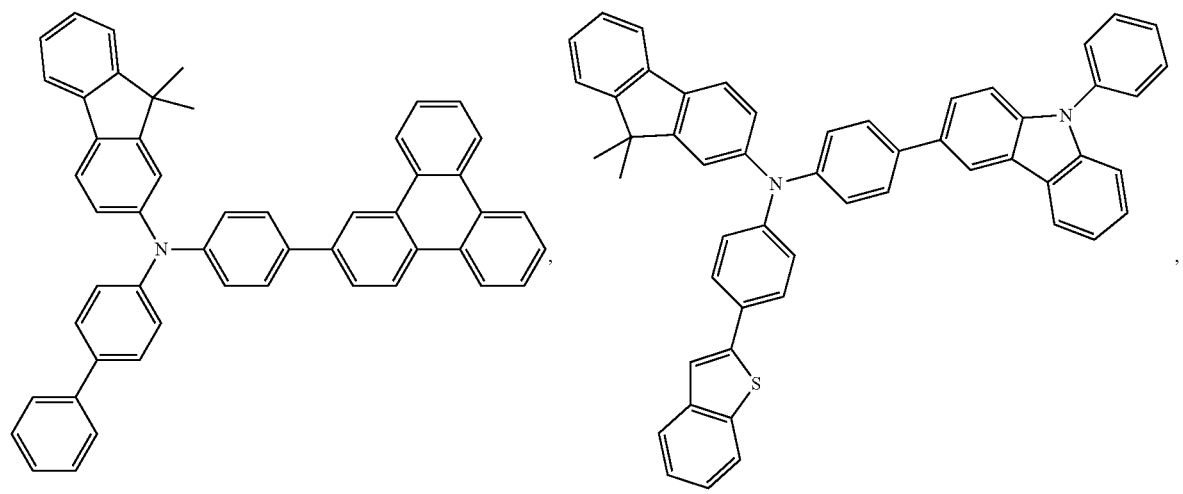
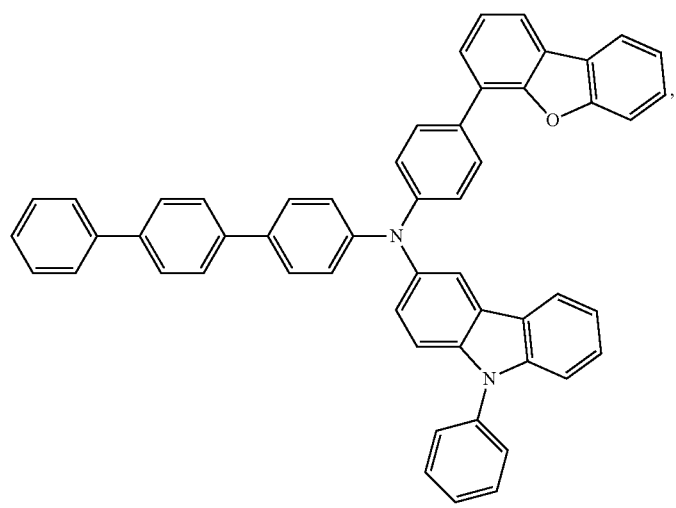

-continued
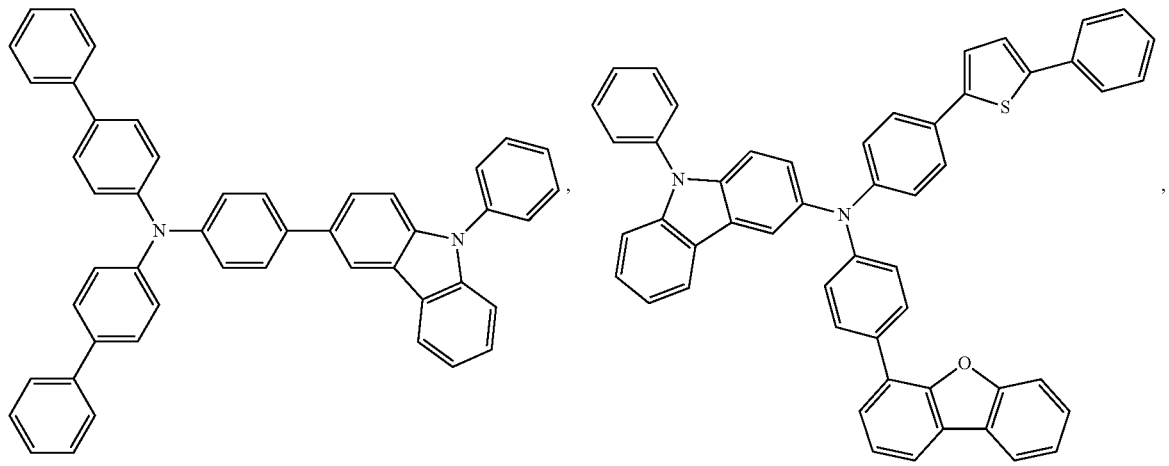
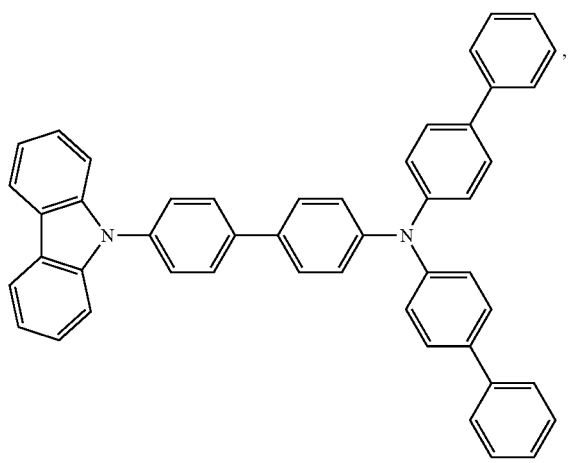
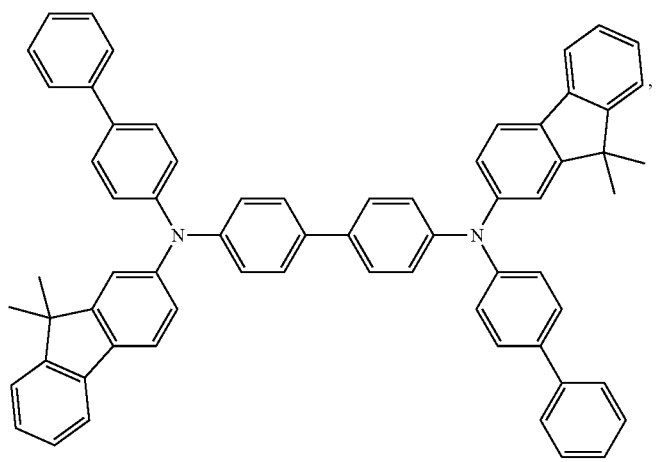

-continued
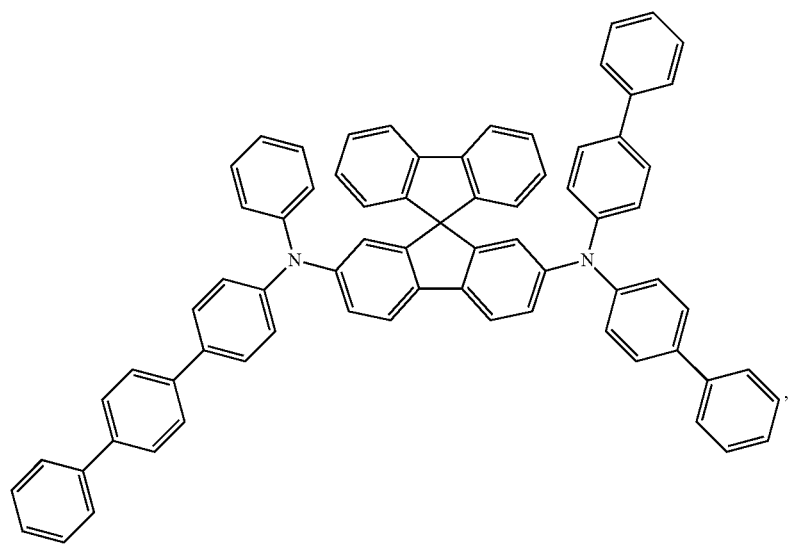
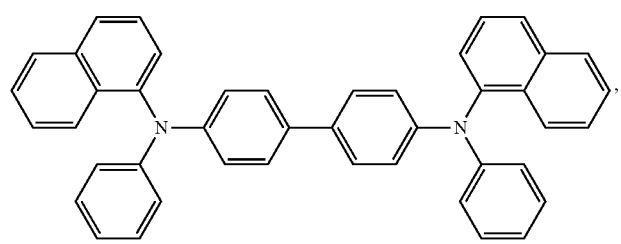
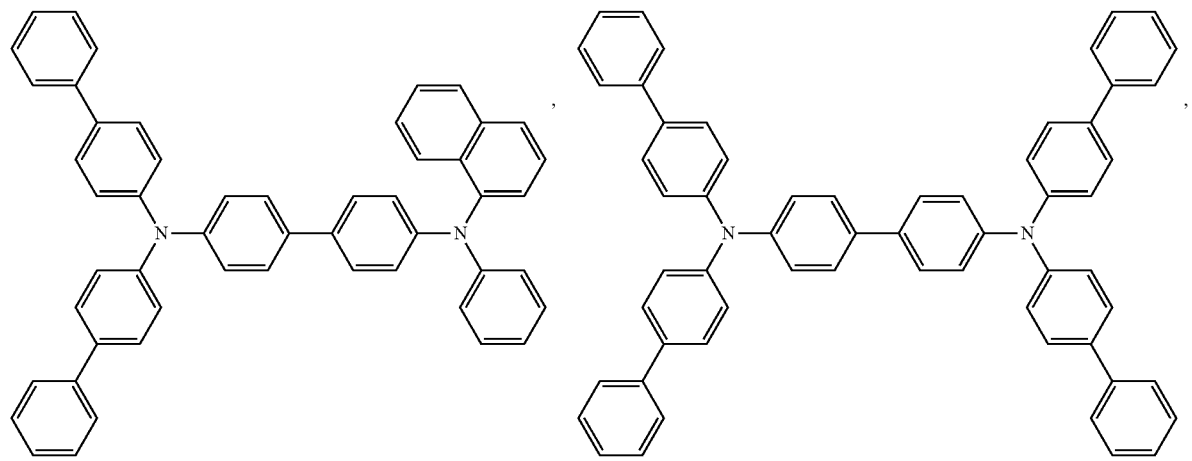
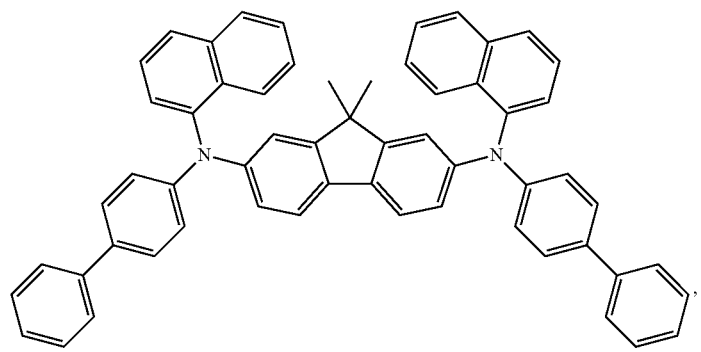

-continued
123
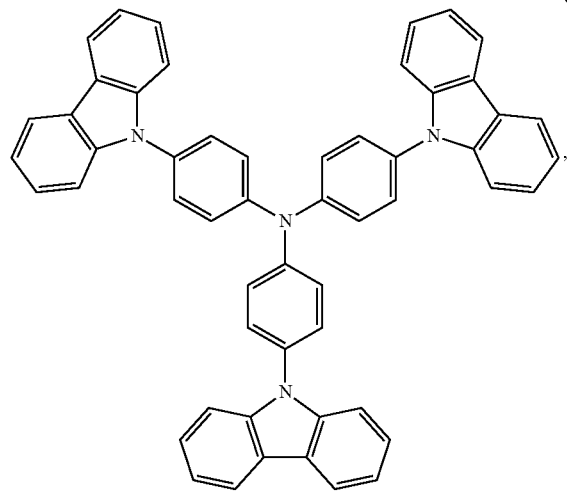
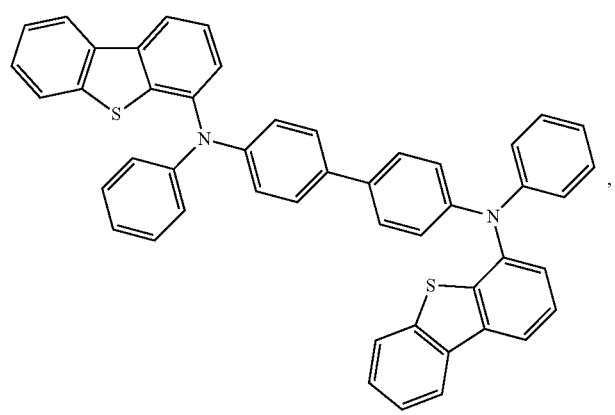
124
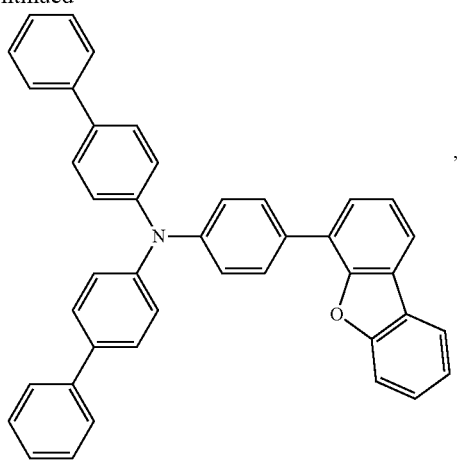
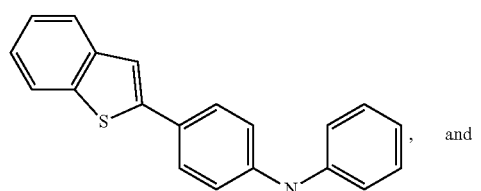
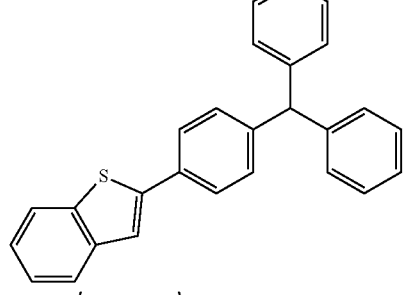
, and
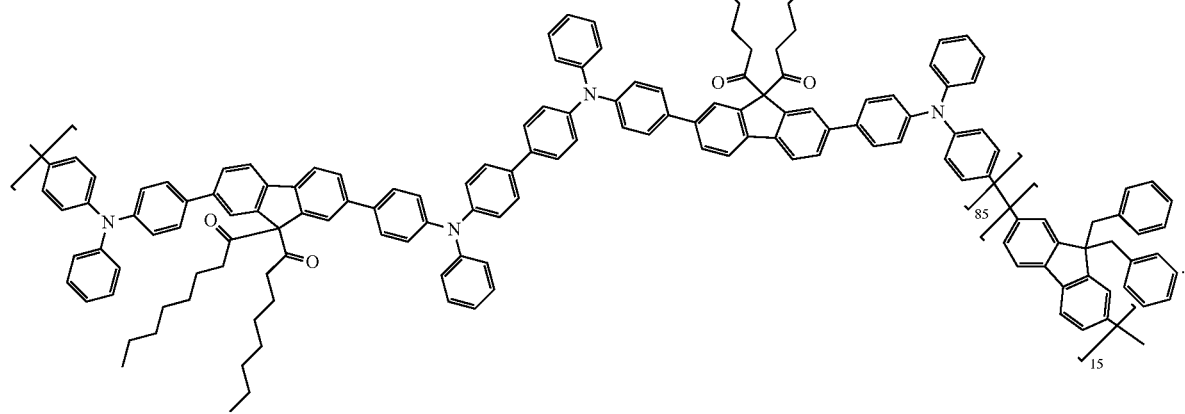

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

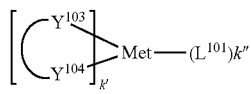

wherein Met is a metal; $(Y^{103}\text{-}Y^{104})$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k'' is the maximum number of ligands that may be attached to the metal.

In one aspect, the metal complexes are:

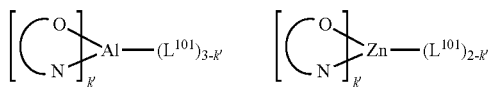

wherein (O—N) is a bidentate ligand, having metal coordinated to atoms O and N.

In another aspect, Met is selected from Ir and Pt. In a further aspect, $(Y^{103}\text{-}Y^{104})$ is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

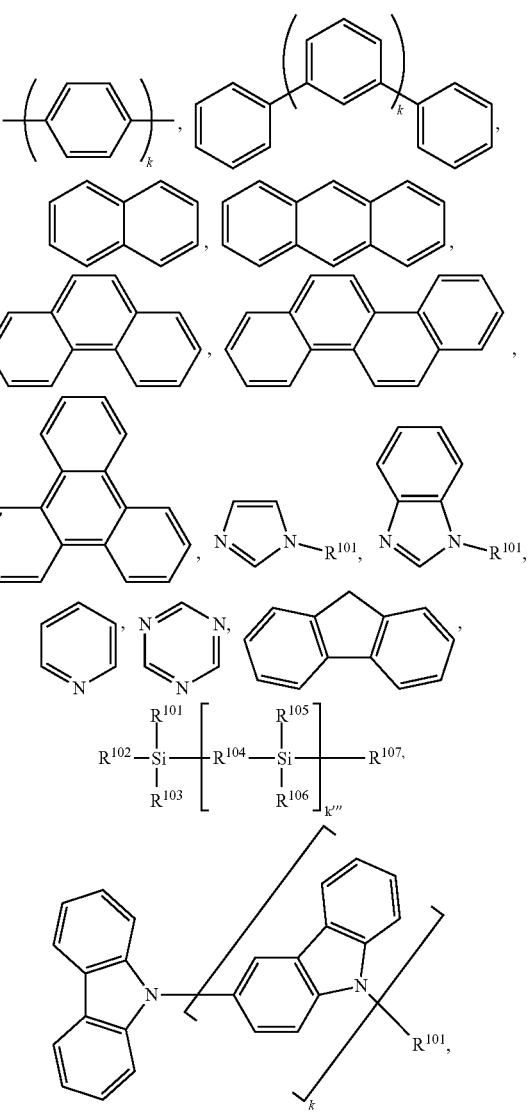

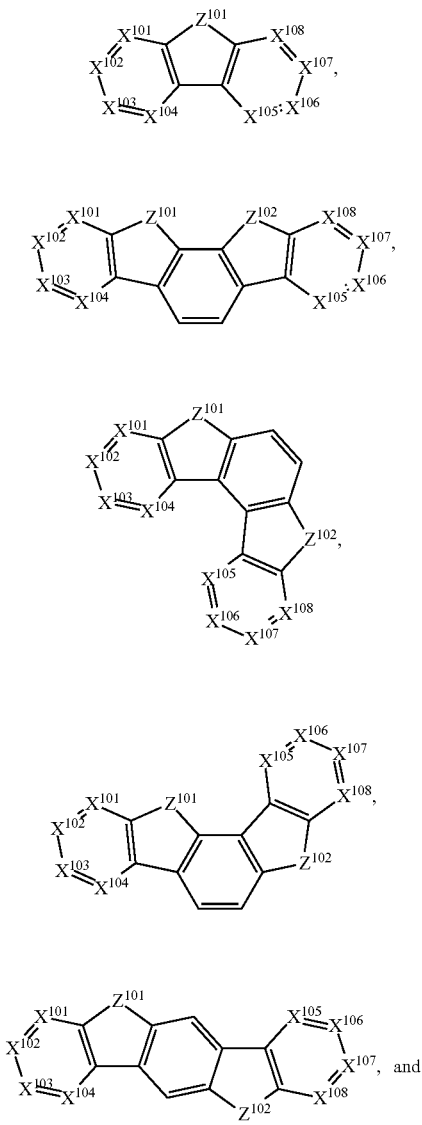

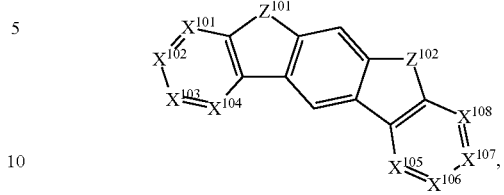

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k" is an integer from 0 to 20. $X^{101}$ to $X^{108}$ is selected from C (including CH) or N. $Z^{101}$ and $Z^{102}$ is selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

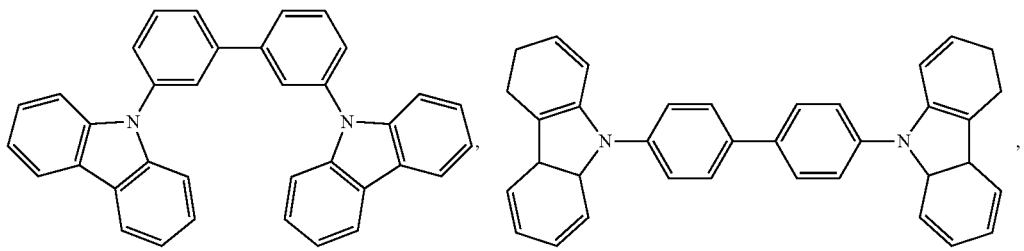

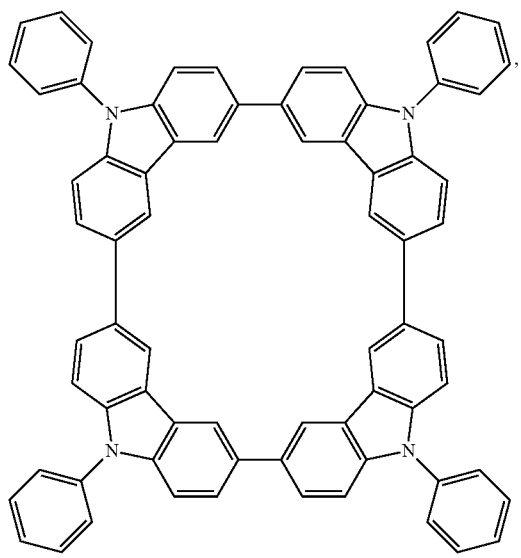
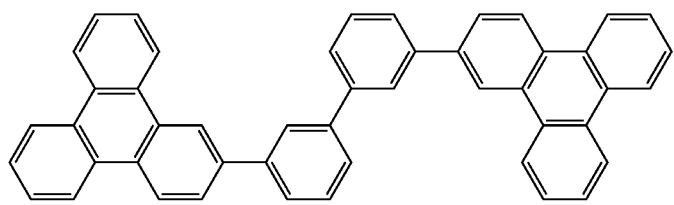
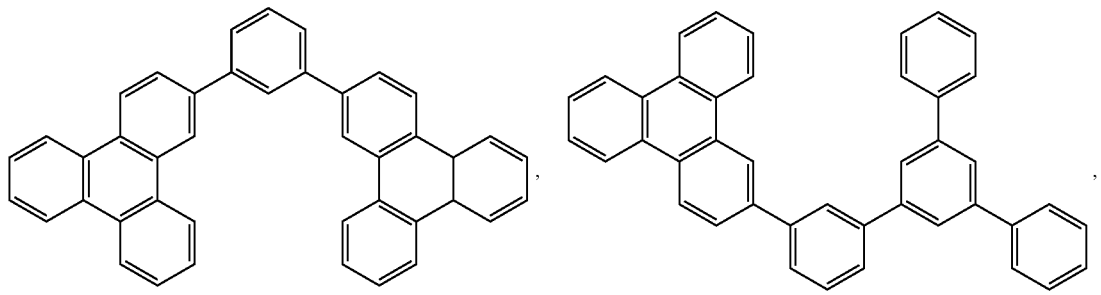
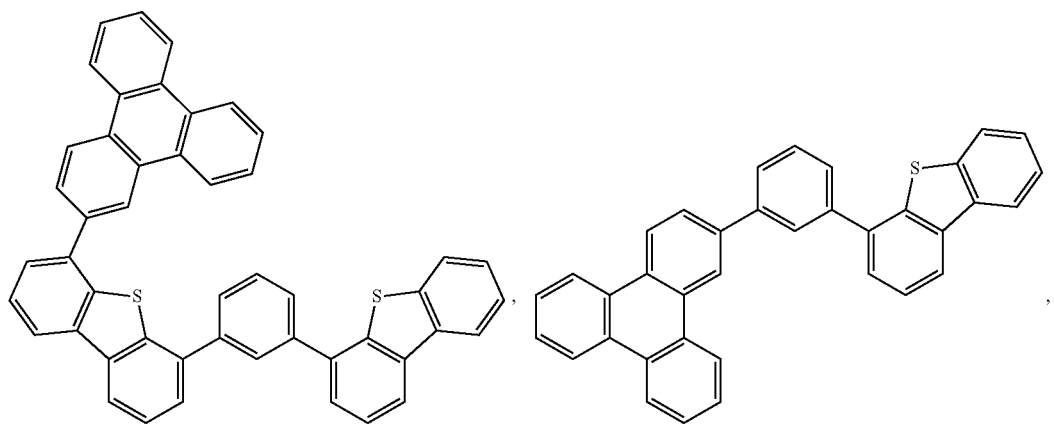

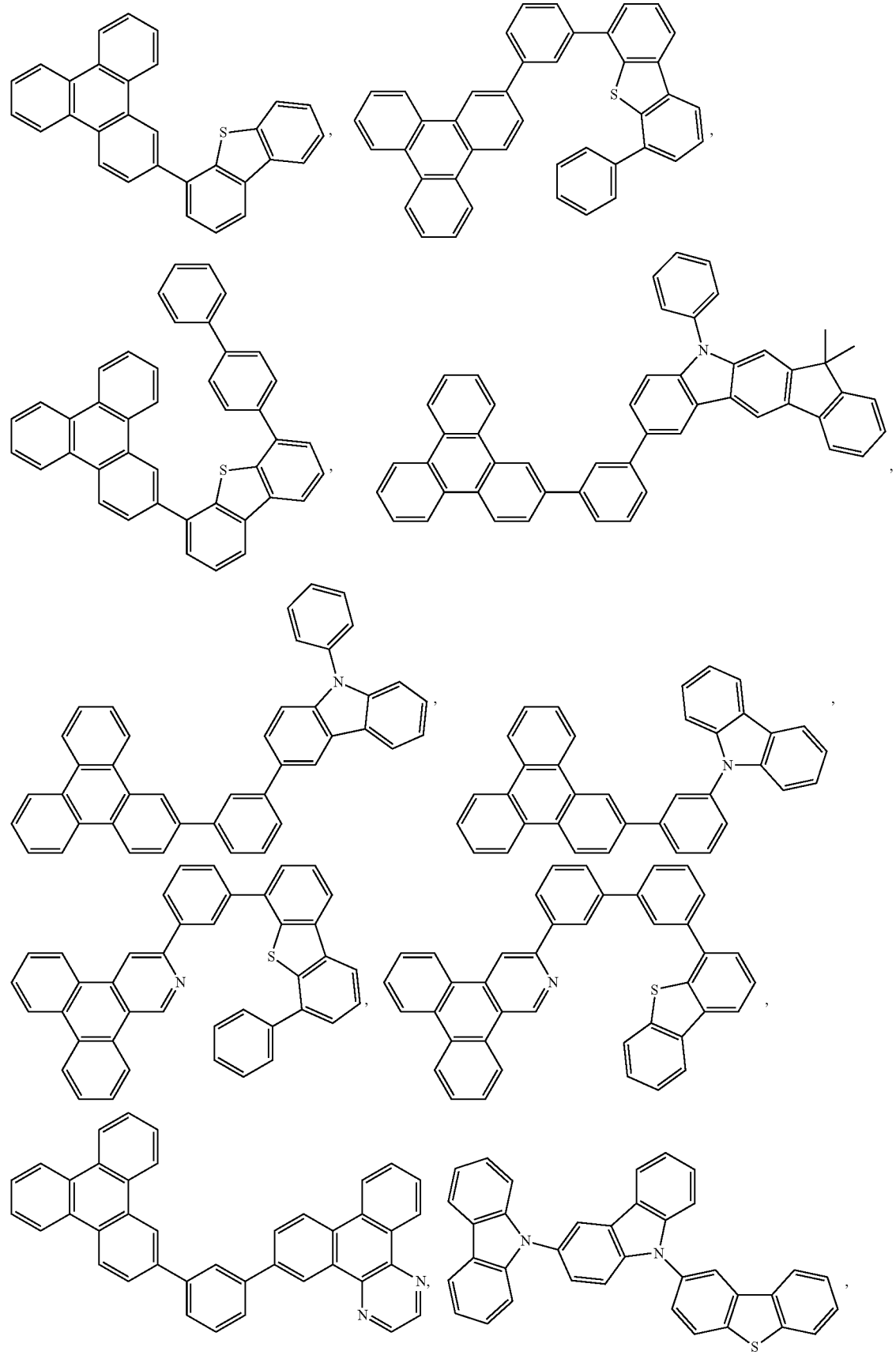

-continued
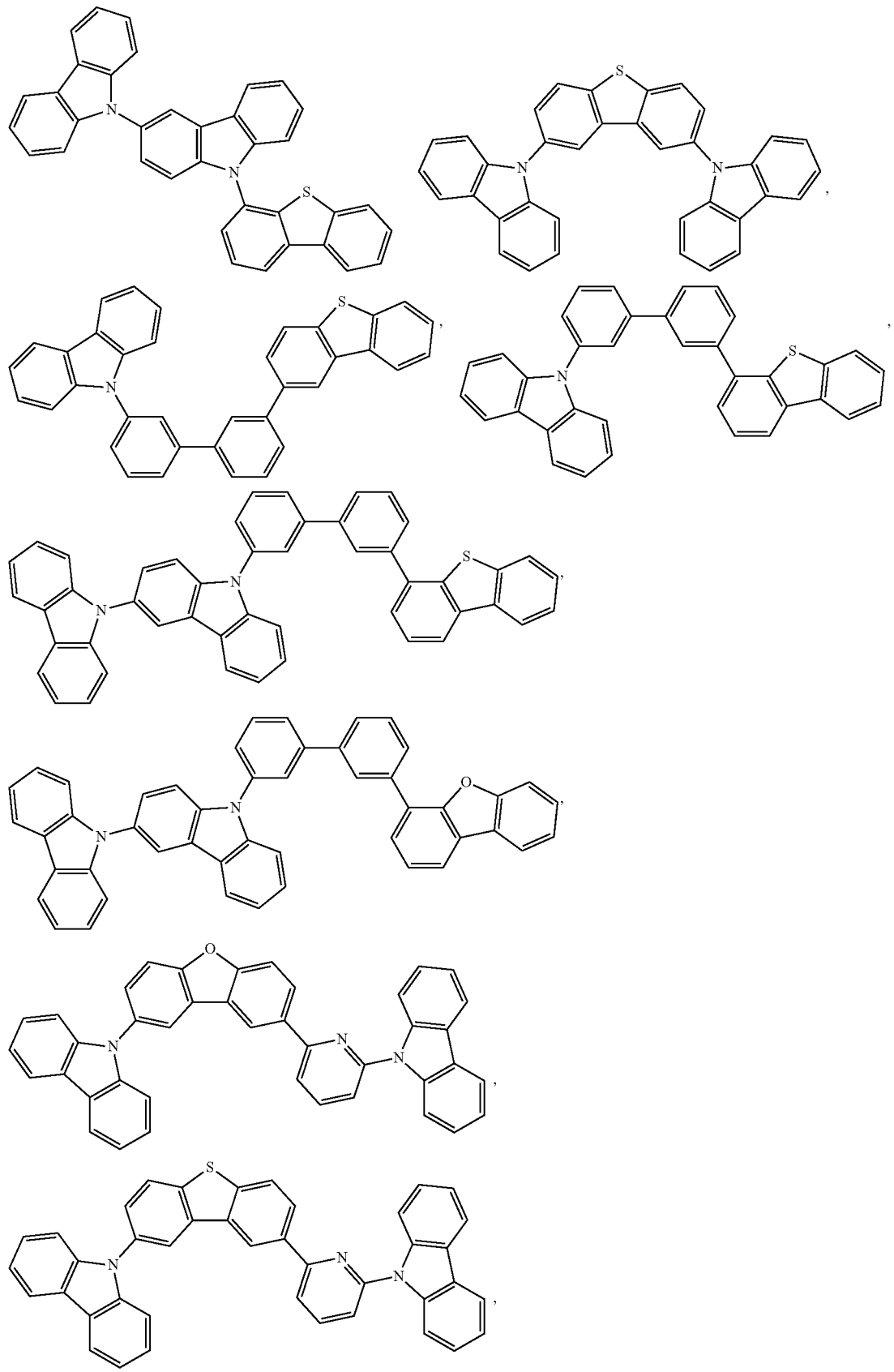

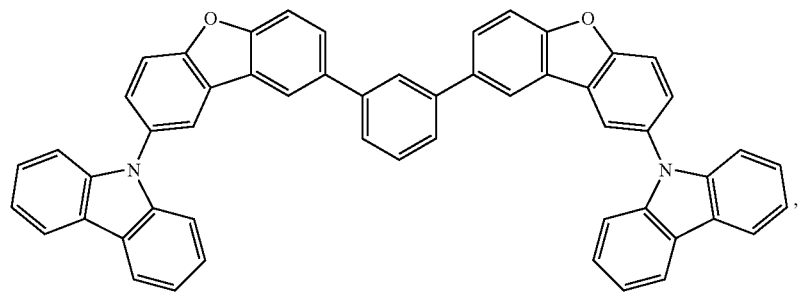
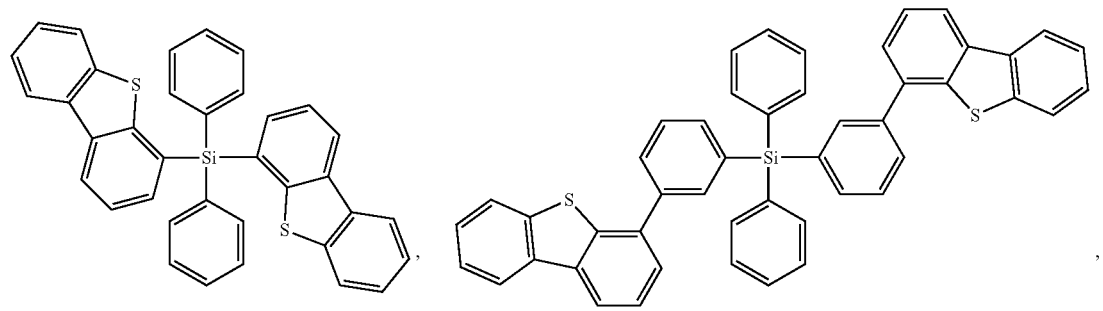
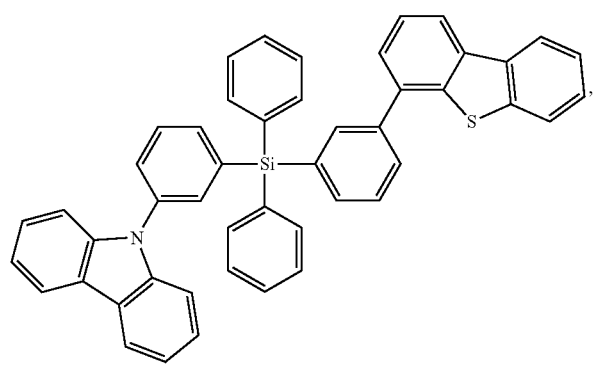
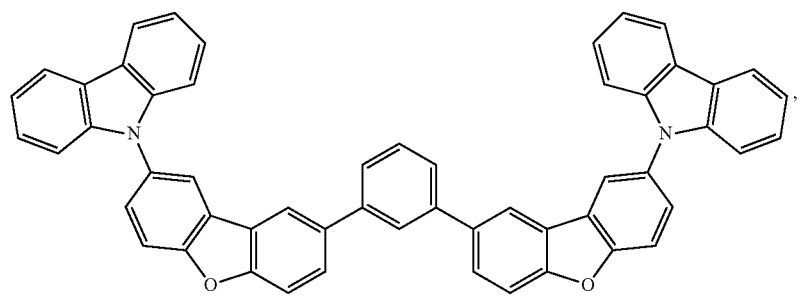
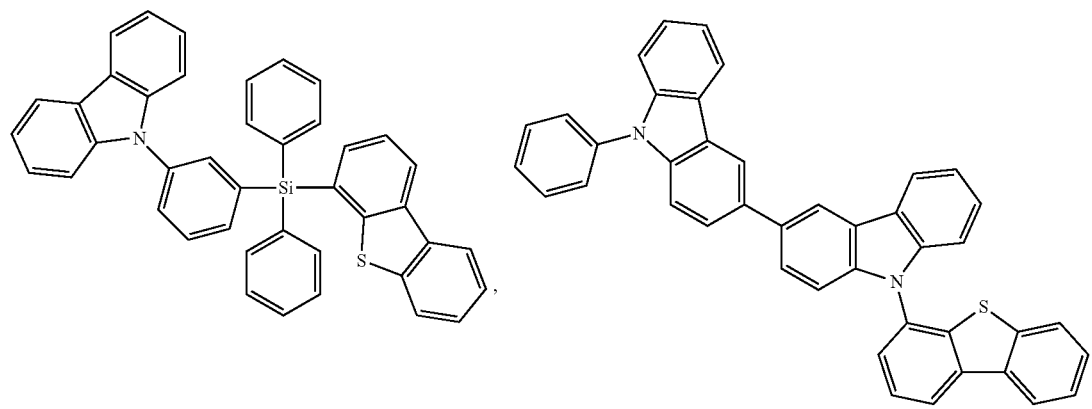

-continued
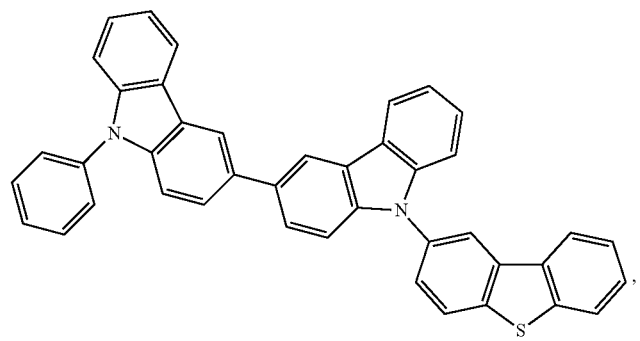
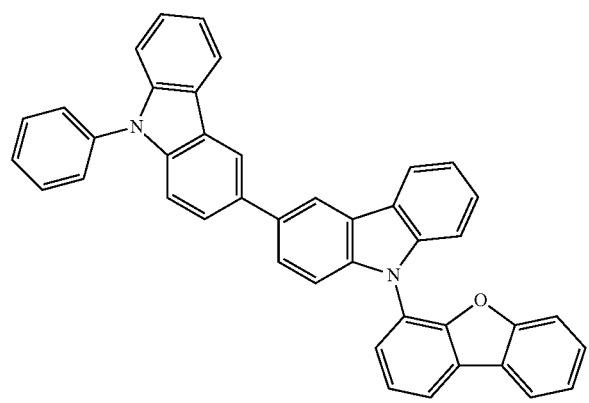
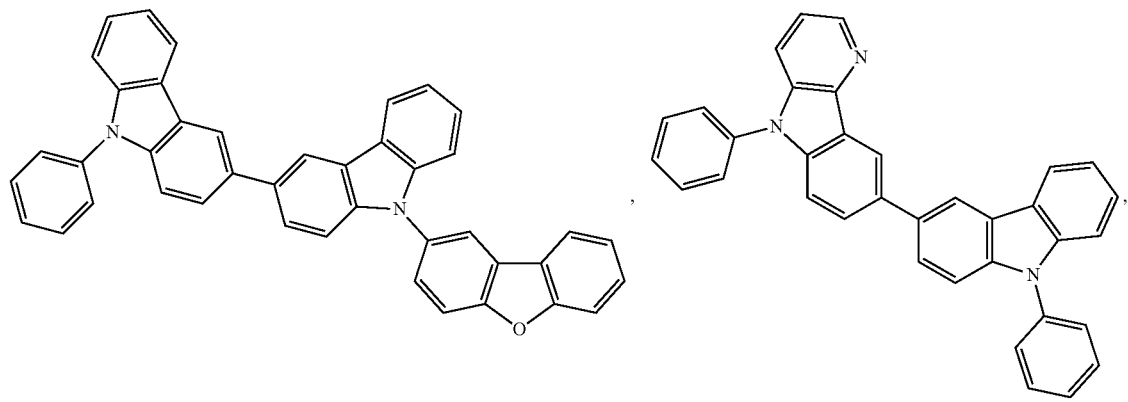
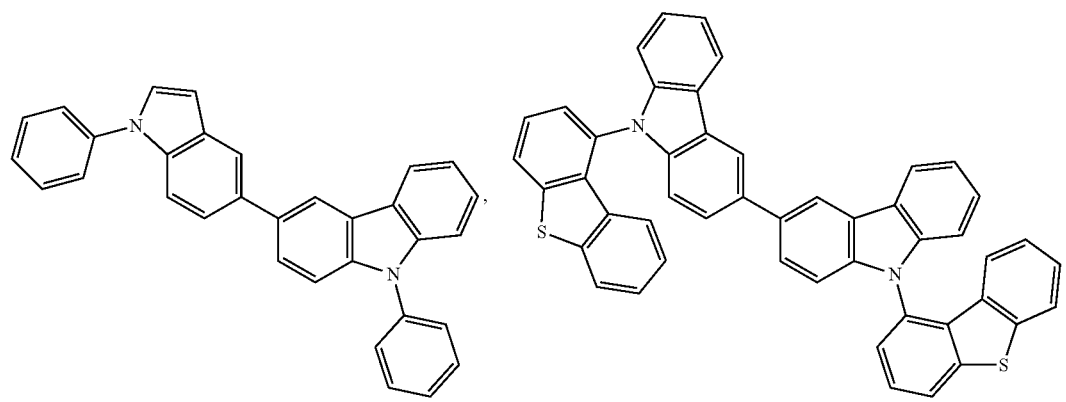

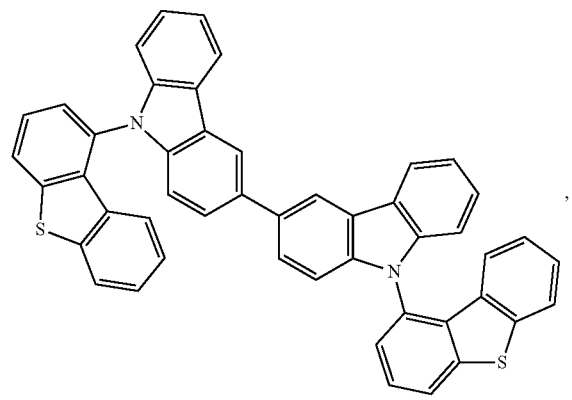
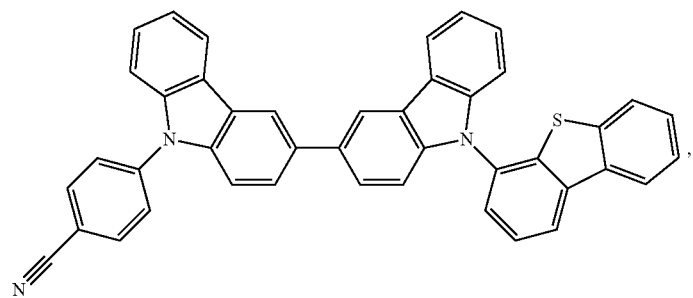
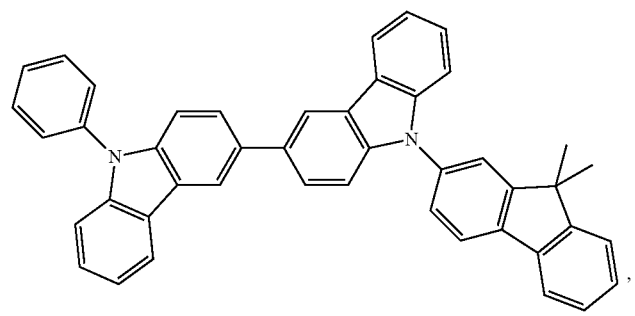
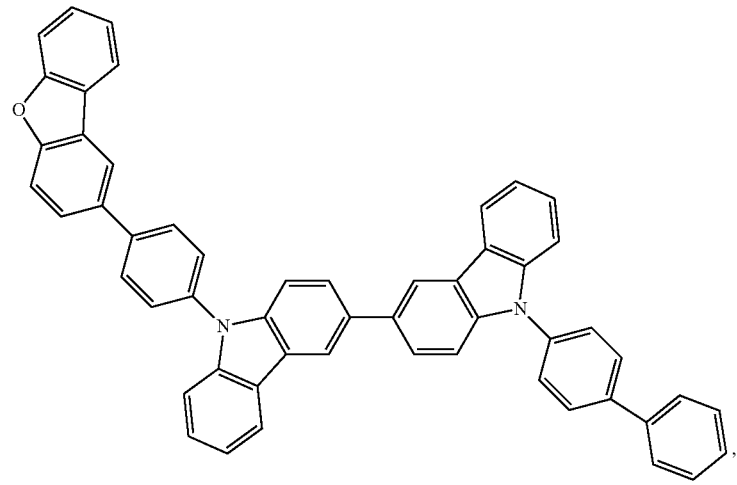

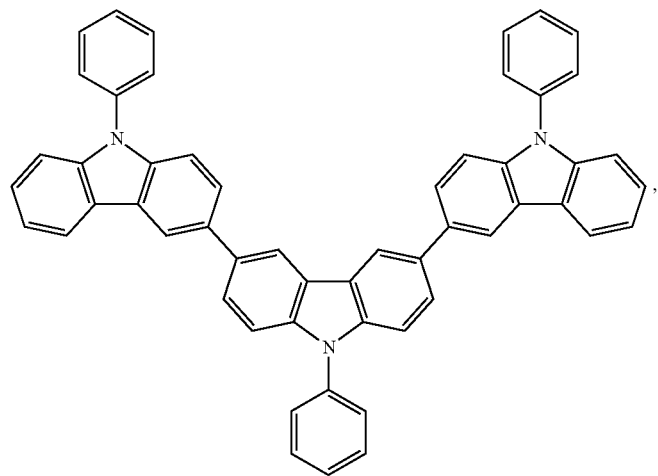
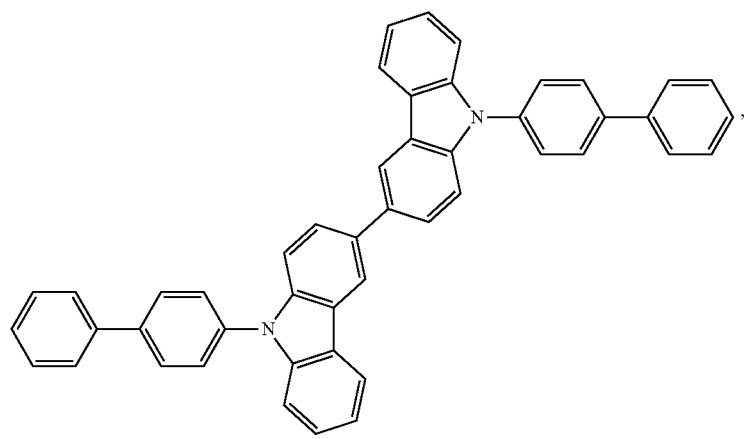
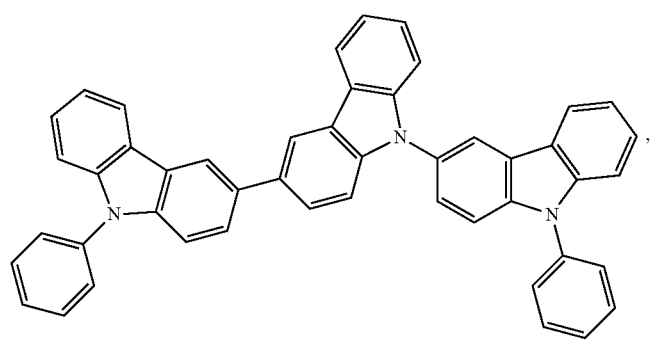
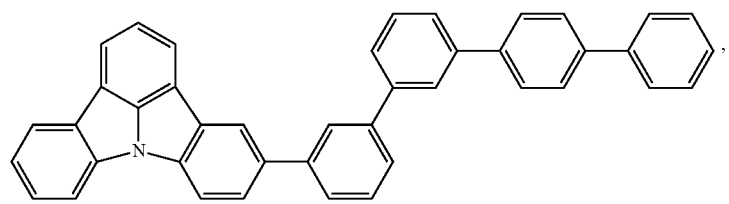

-continued
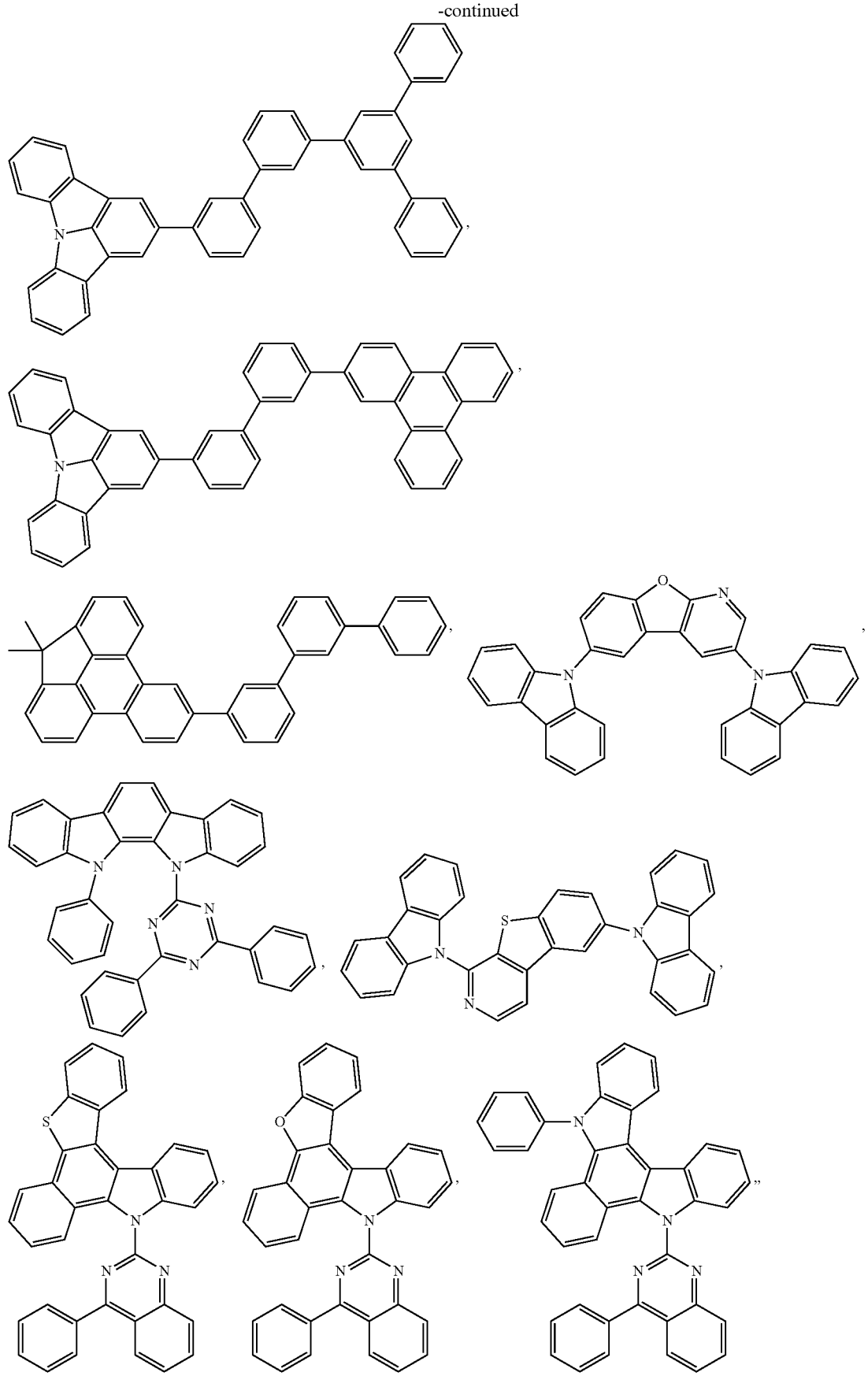

-continued
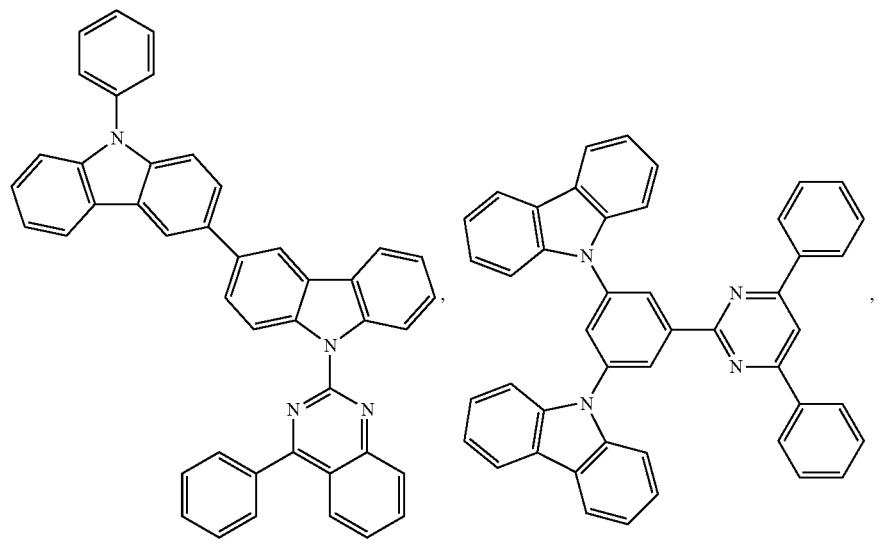
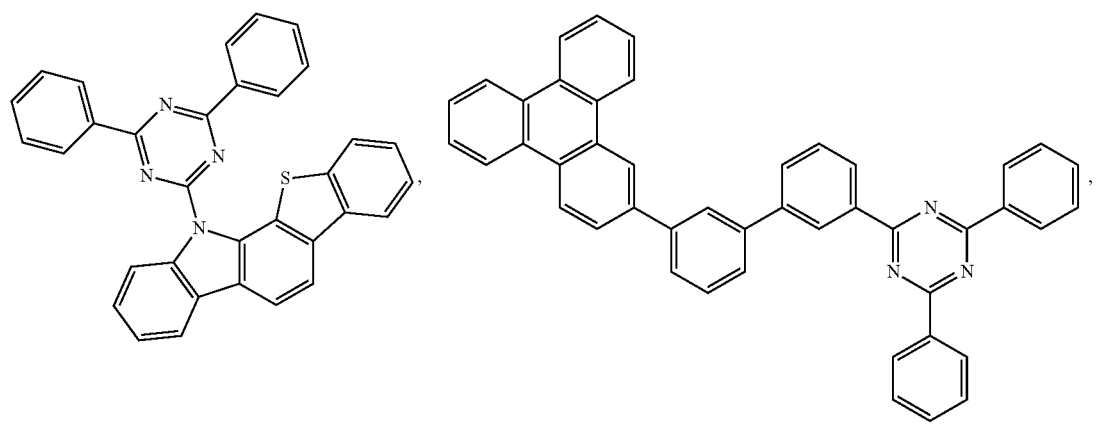
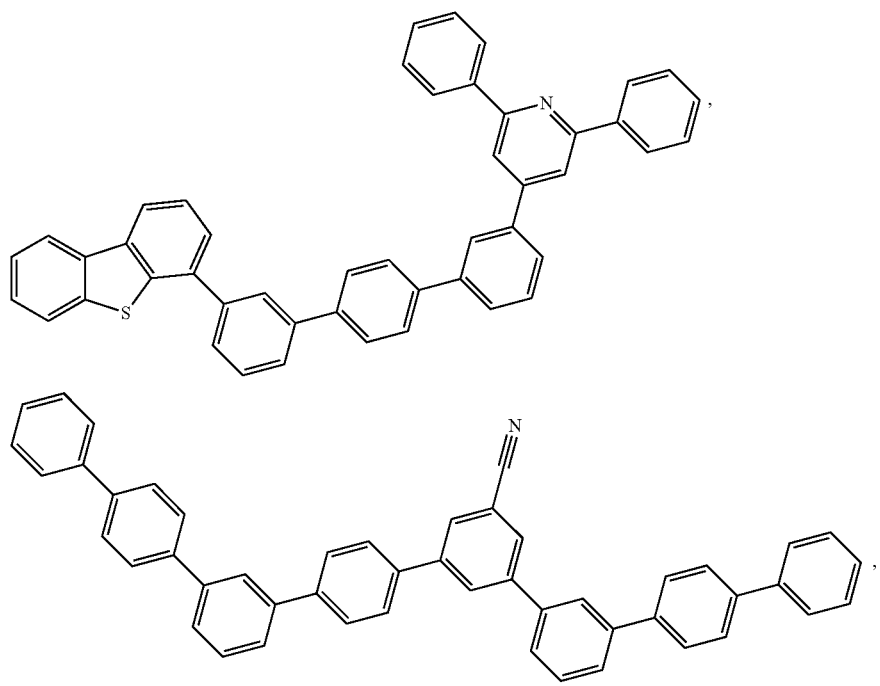

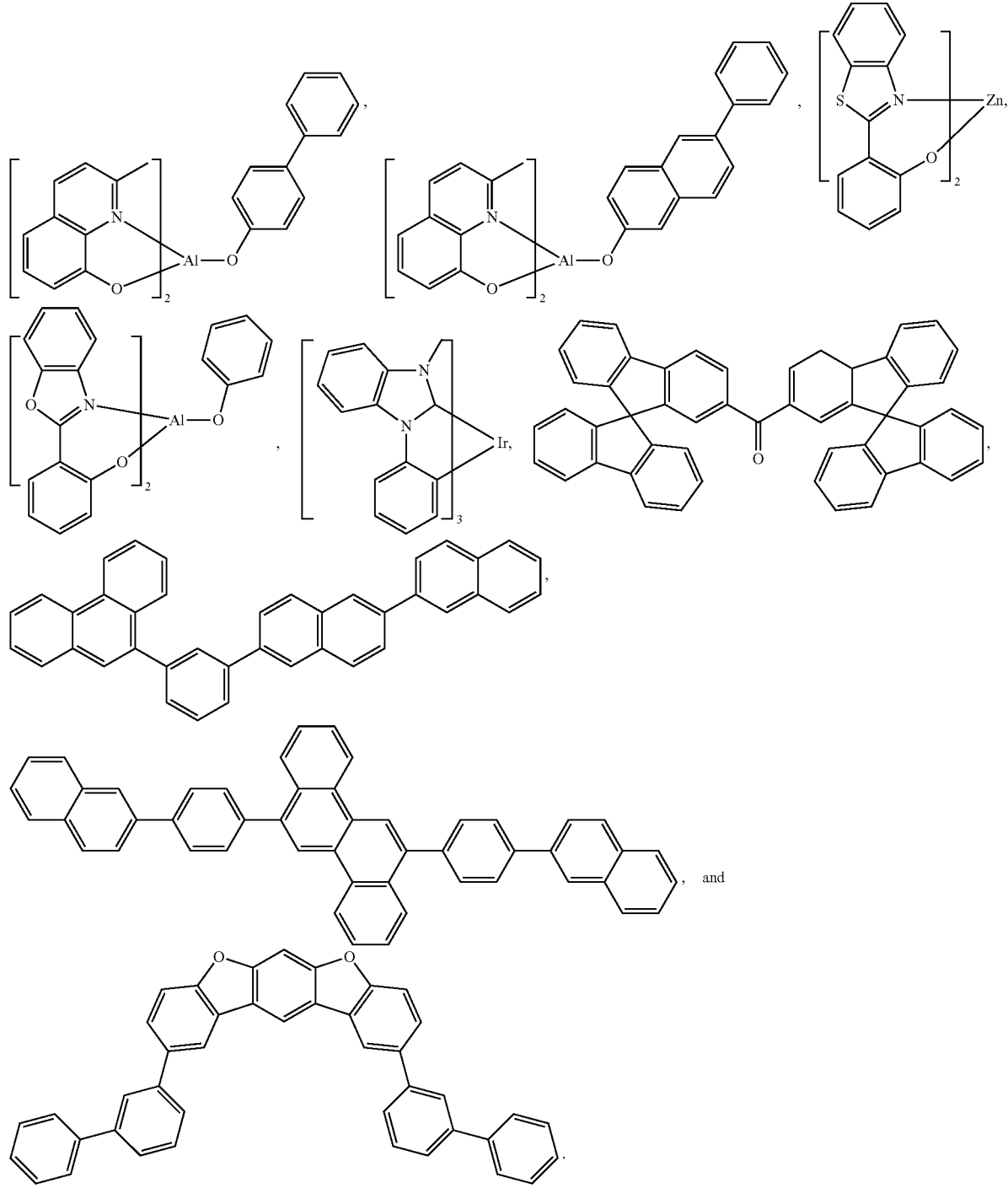

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
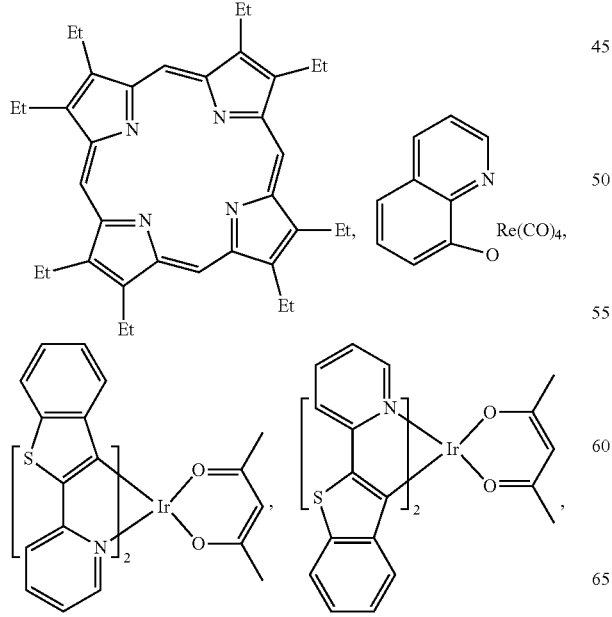
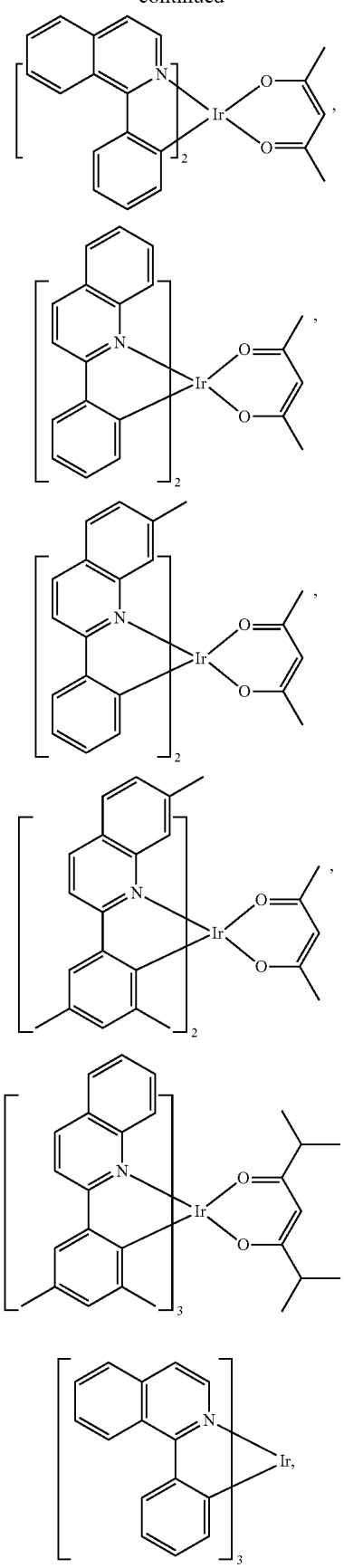

151
-continued
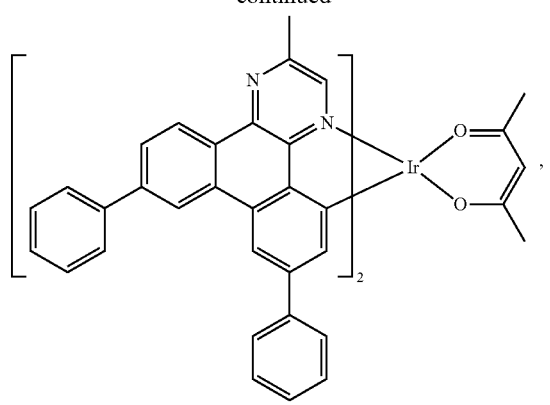
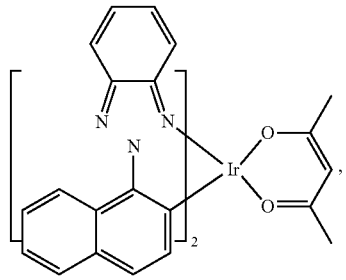
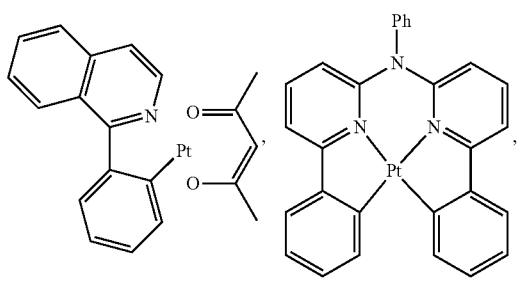
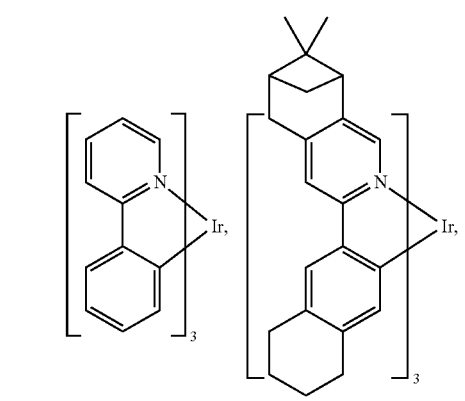
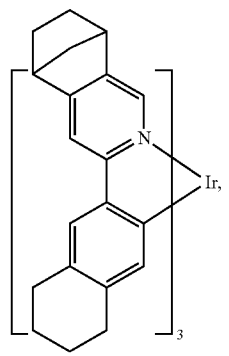
152
-continued
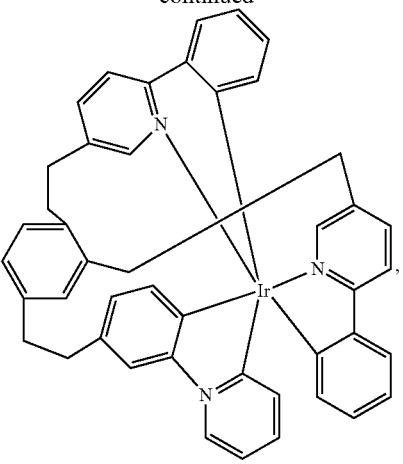
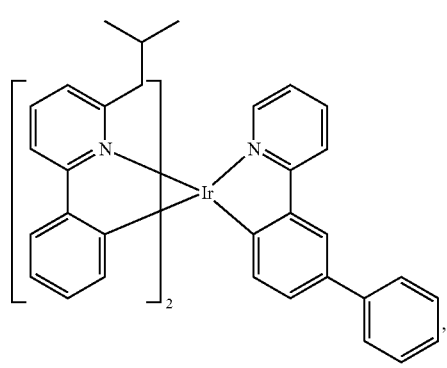
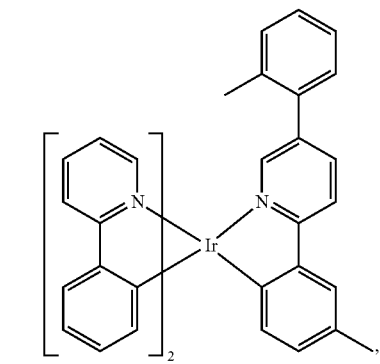
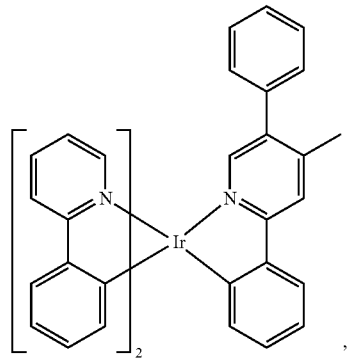

153
-continued
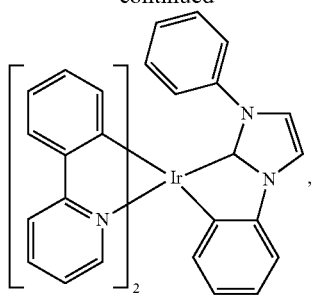
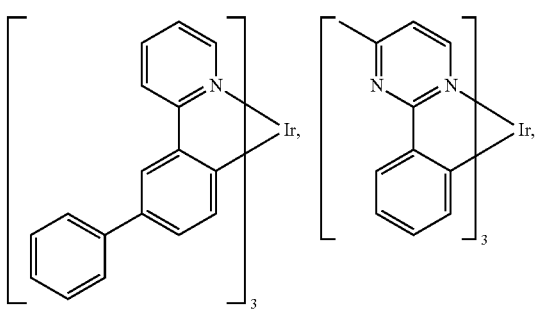
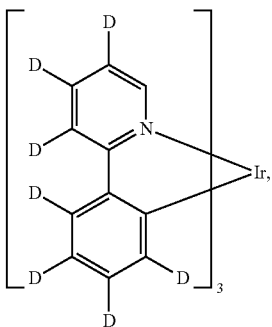
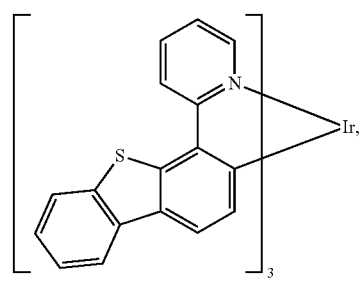
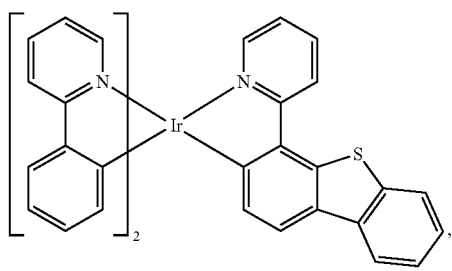
154
-continued
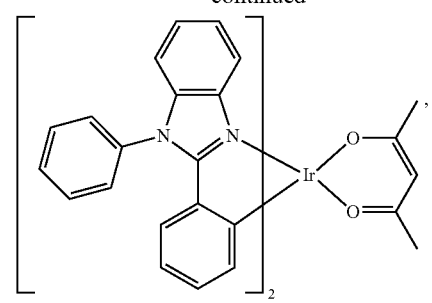
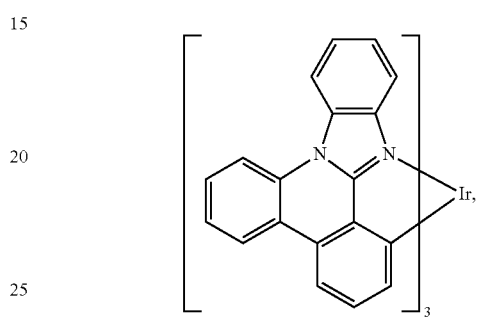
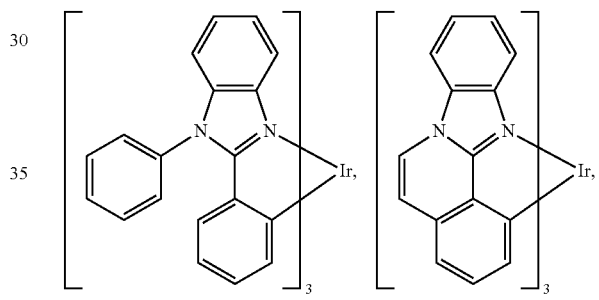
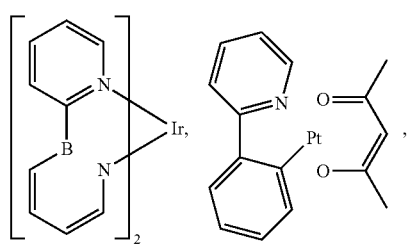
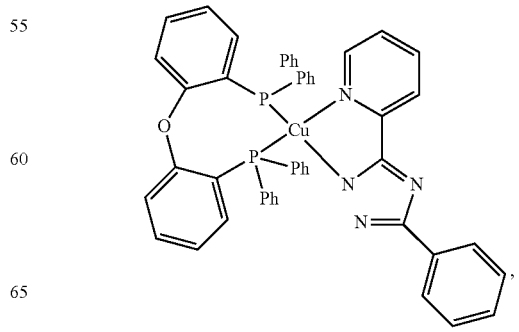

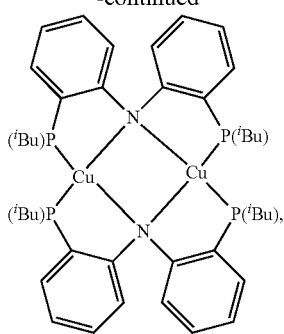
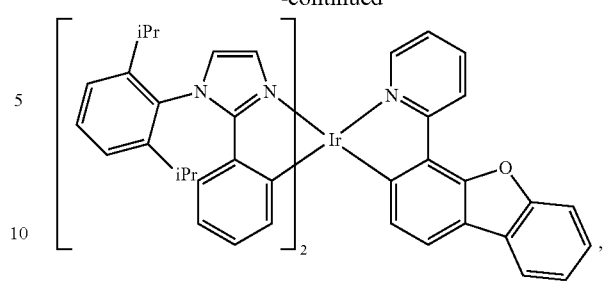
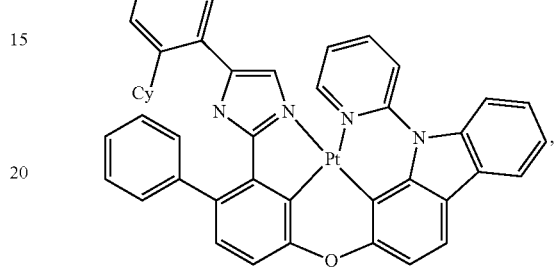
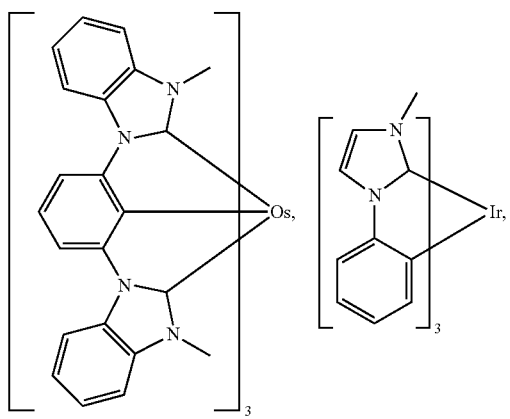
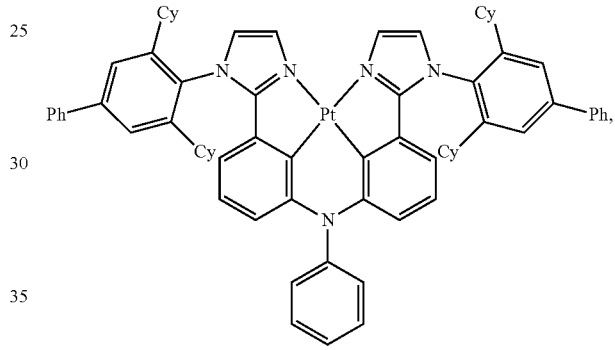
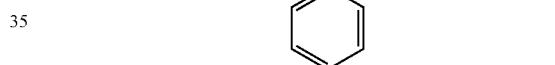
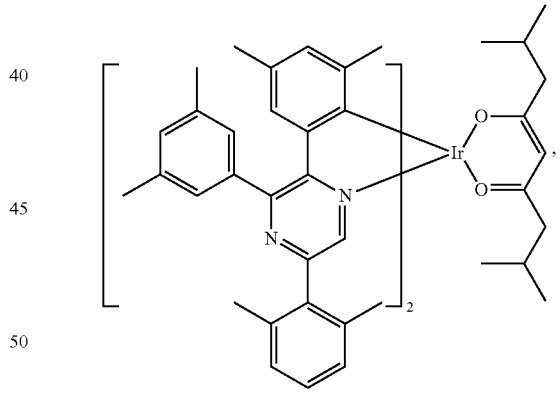
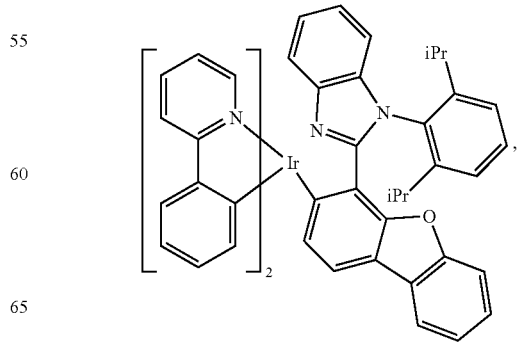

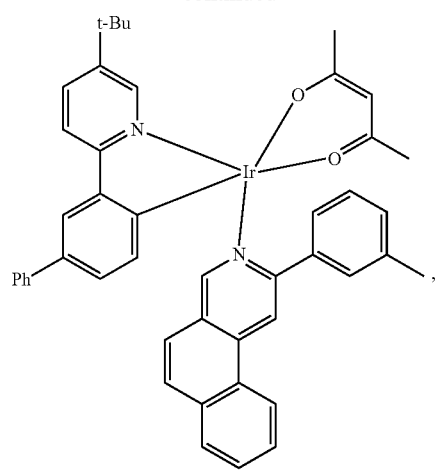
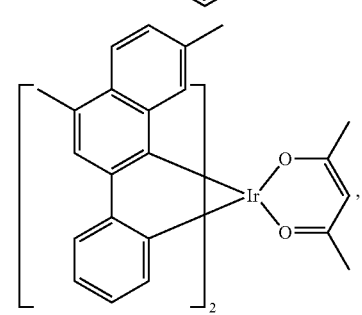
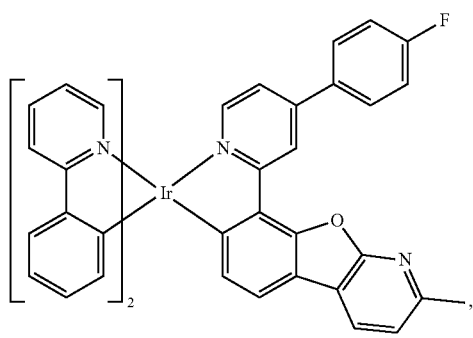
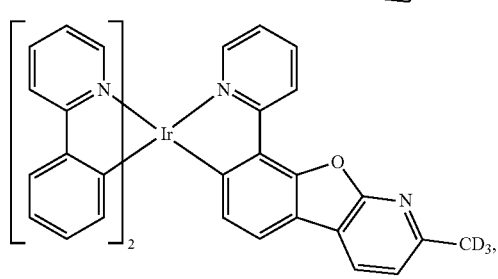
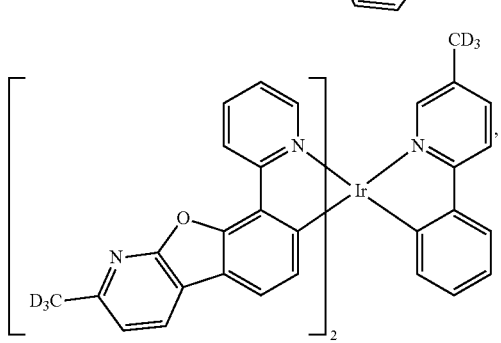
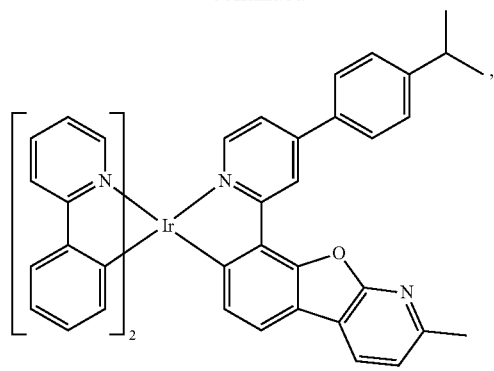
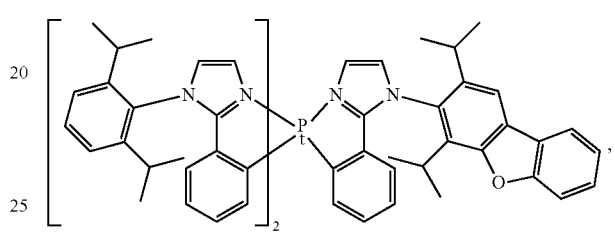
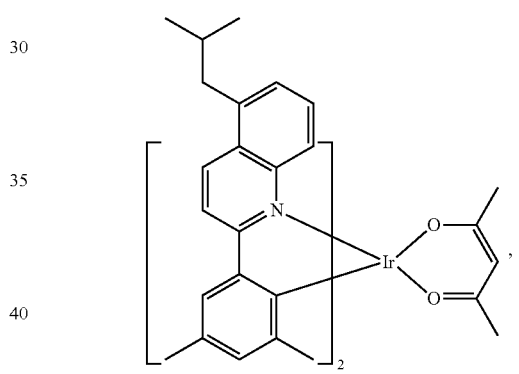
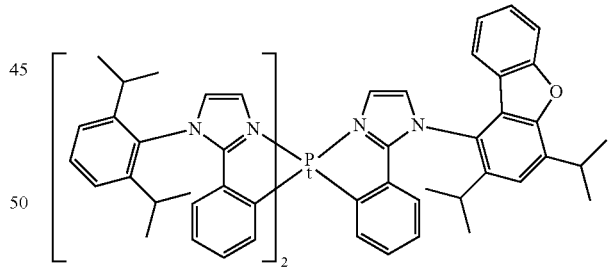
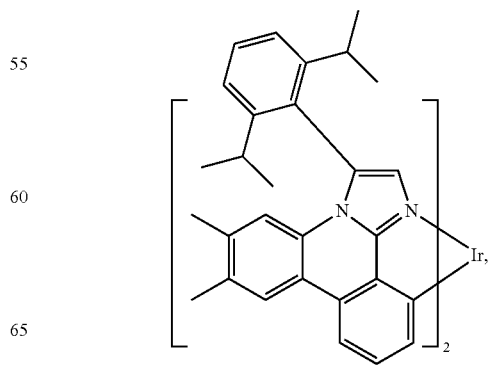

159
-continued
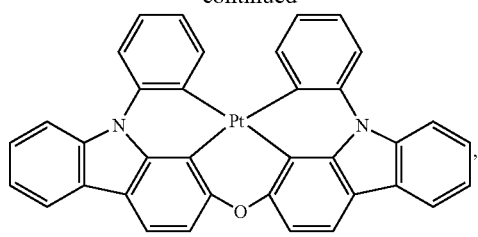
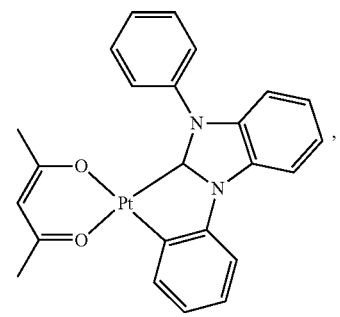
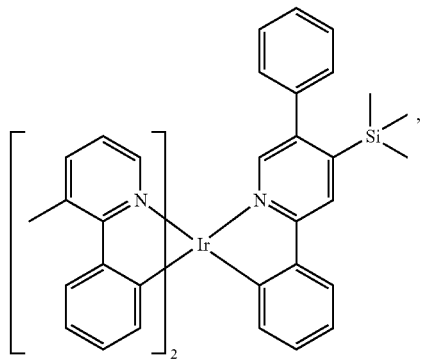
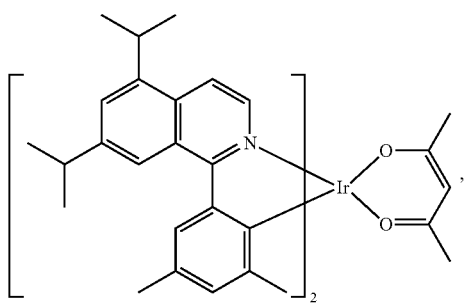
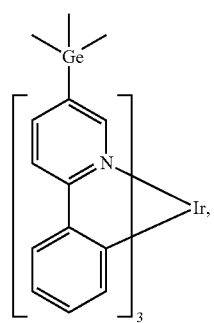
160
-continued
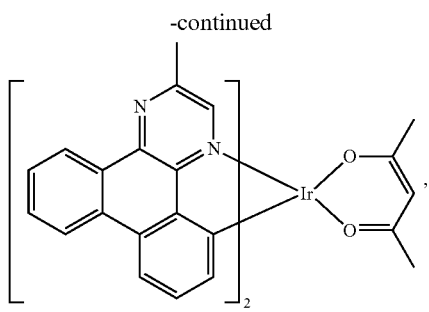
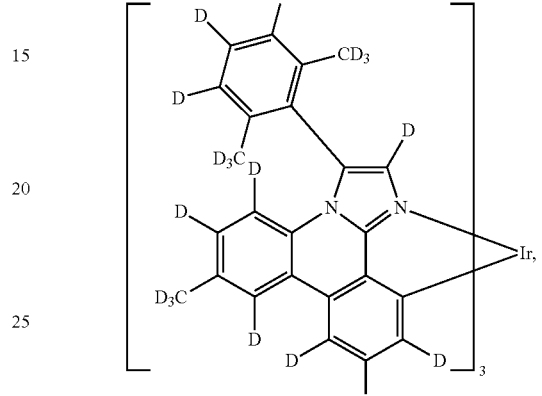
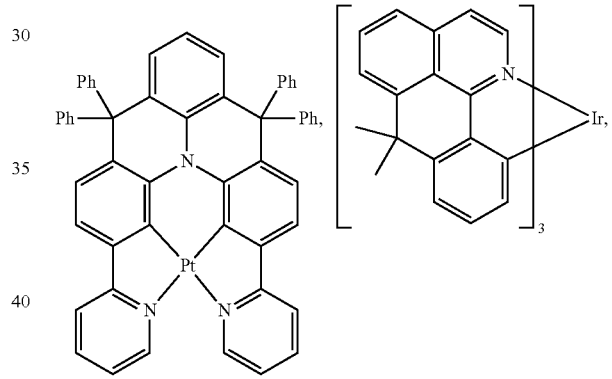
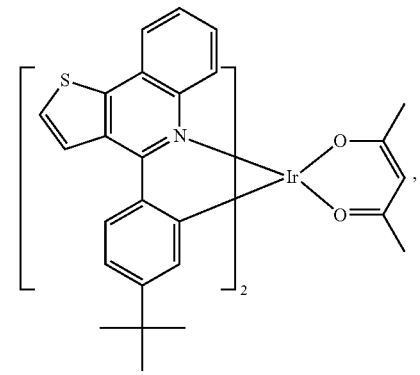
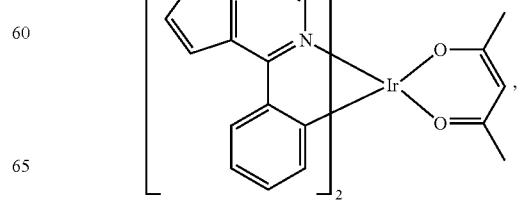

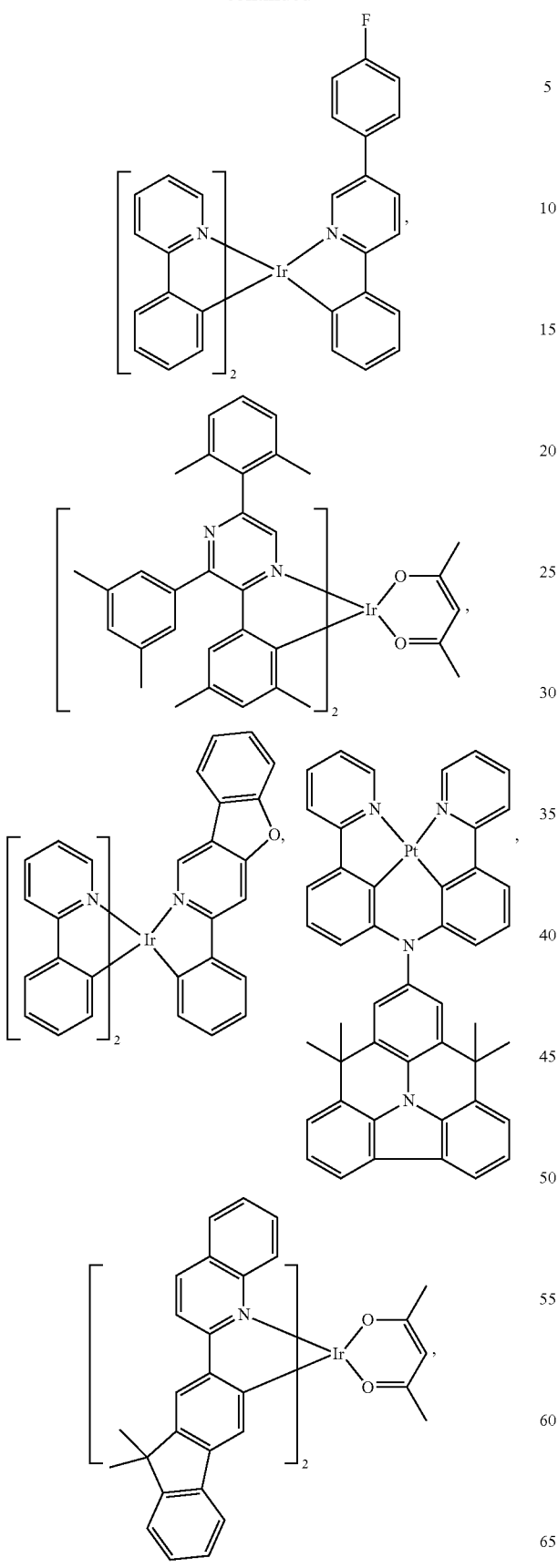
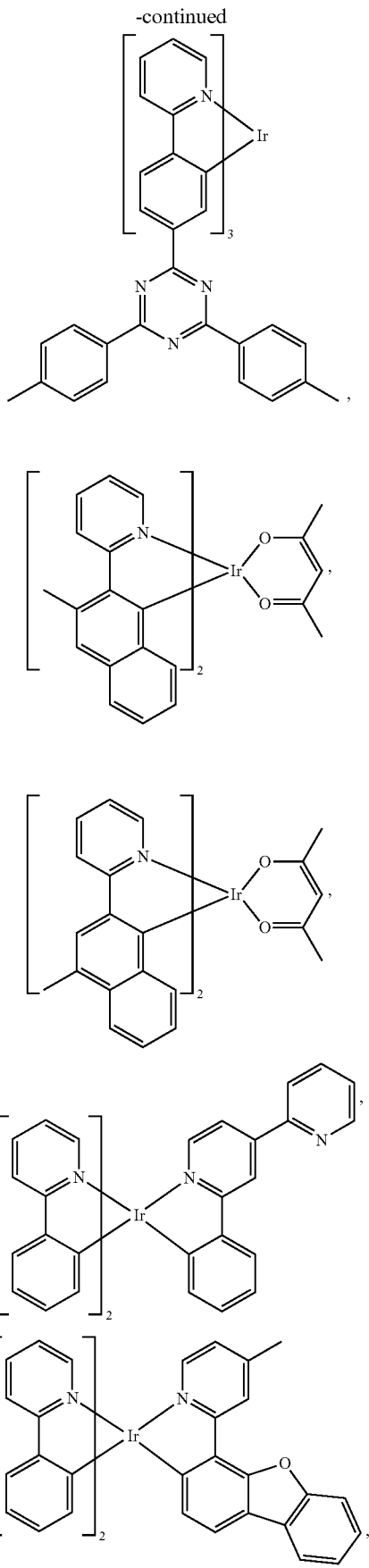

163
-continued
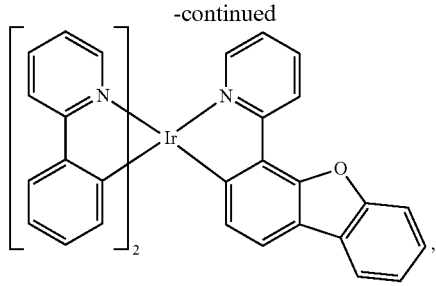
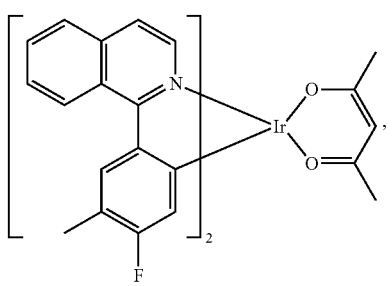
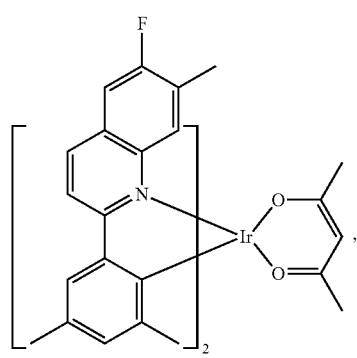
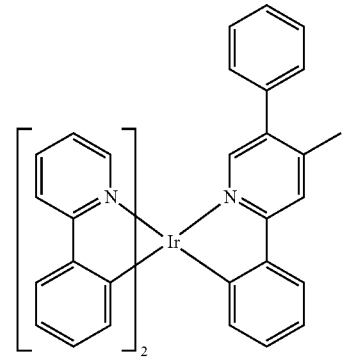
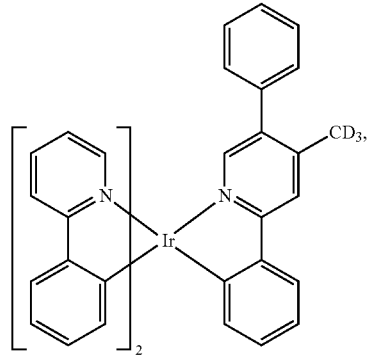
164
-continued
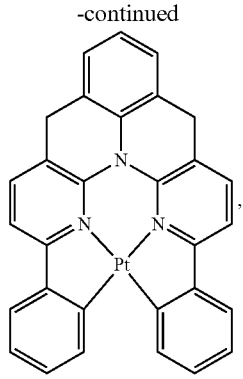
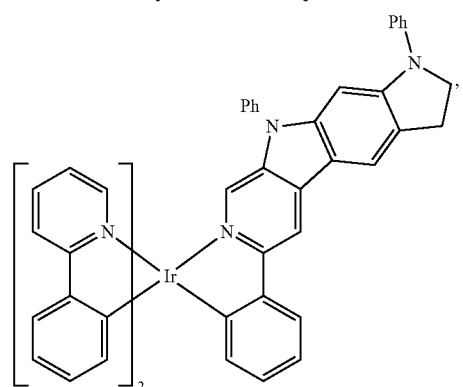
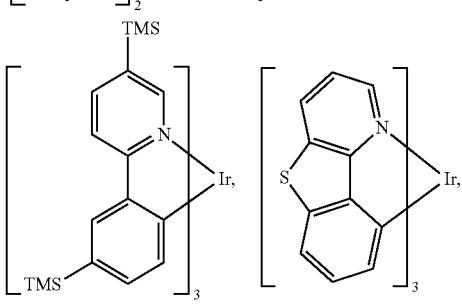
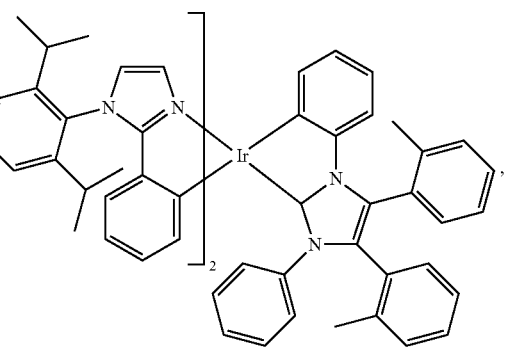
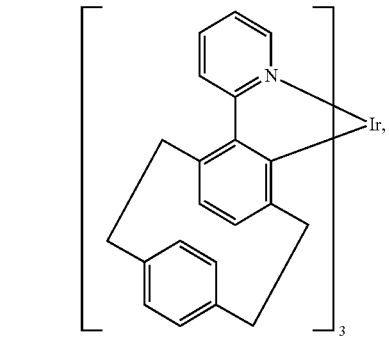

-continued
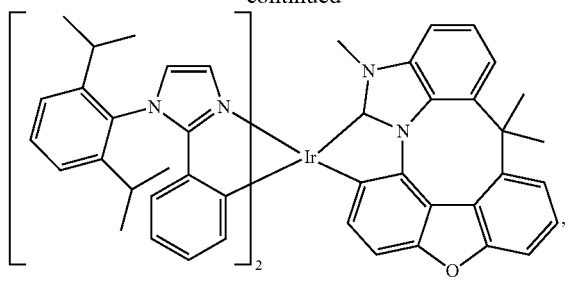
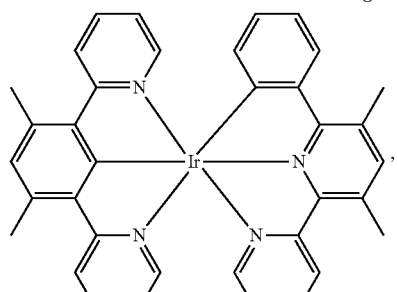
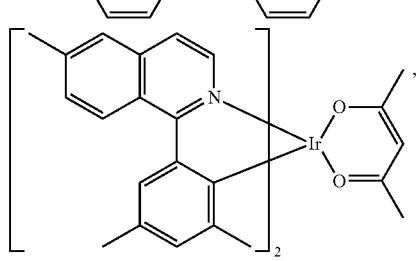
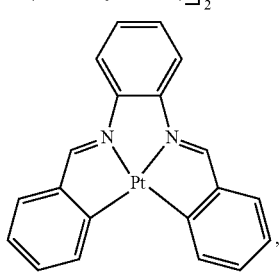
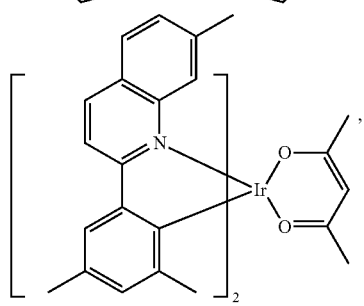
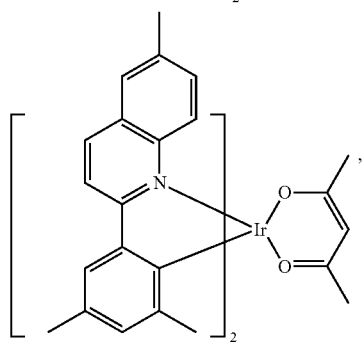
-continued
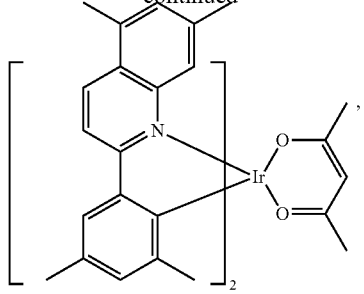
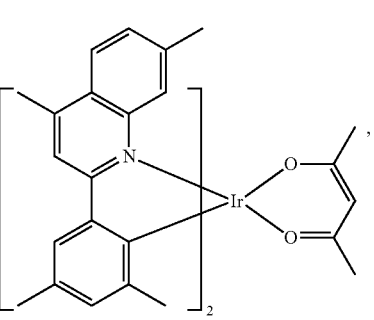
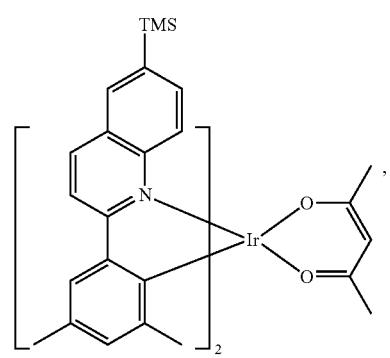
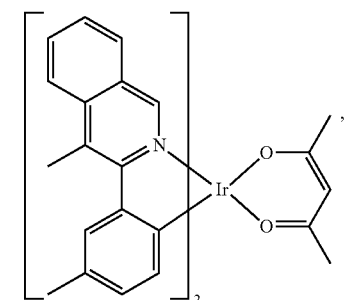
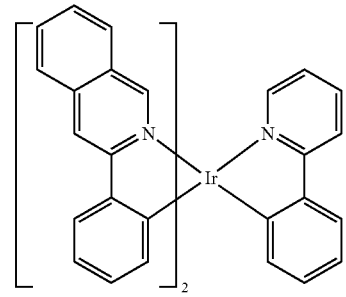

167
-continued
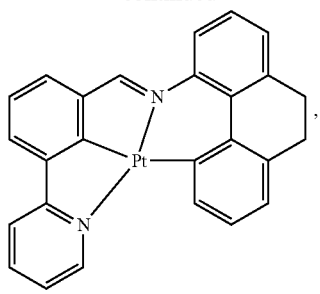
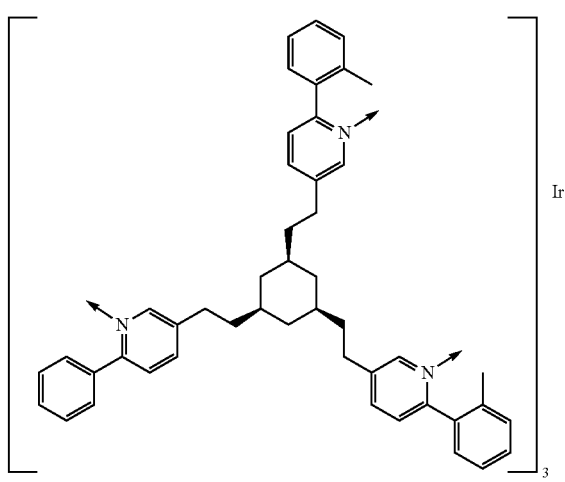
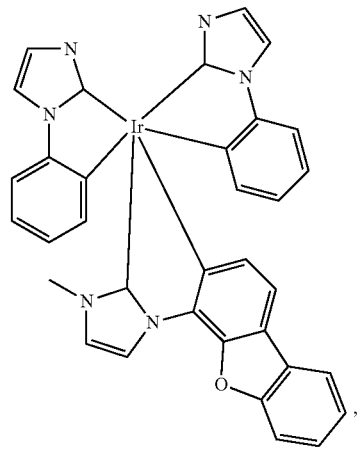
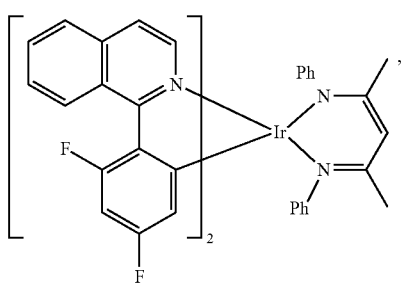
168
-continued
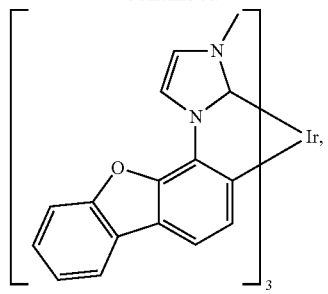
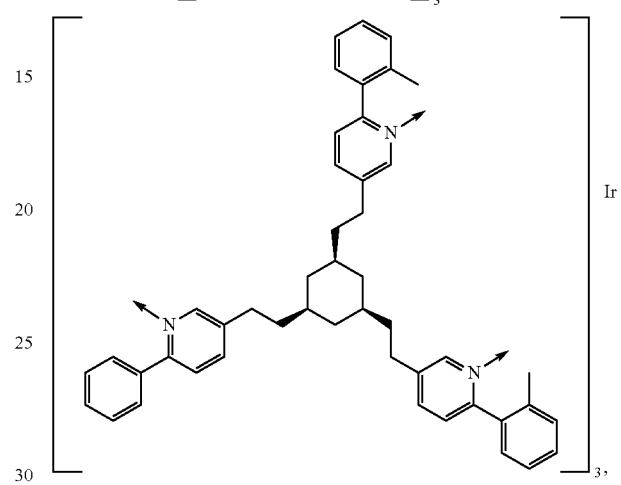
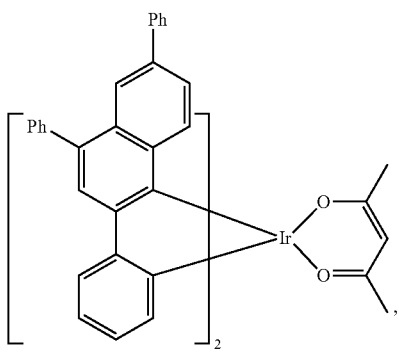
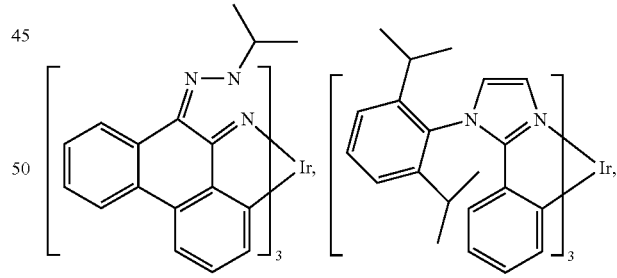
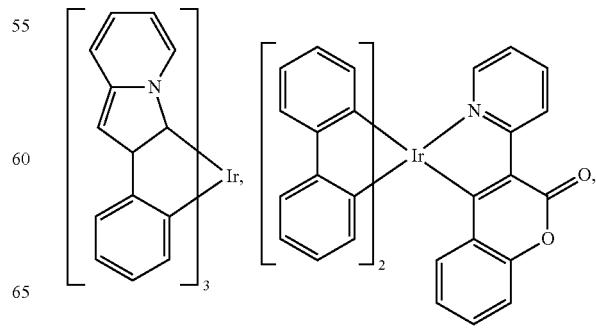

-continued

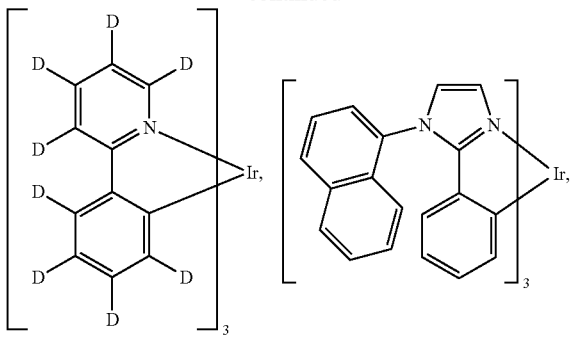

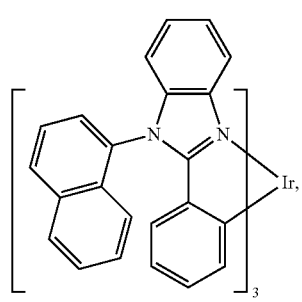

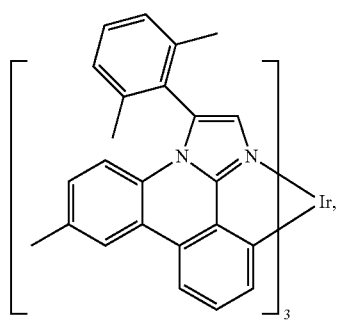

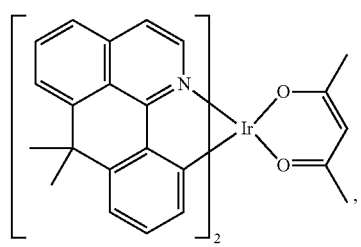

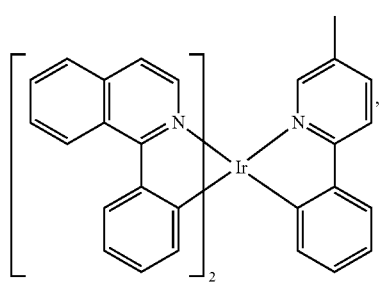

-continued

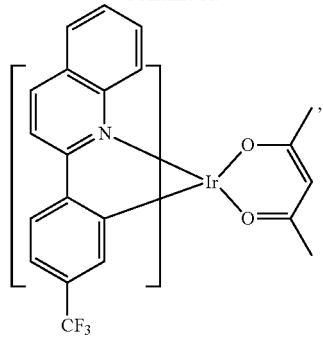

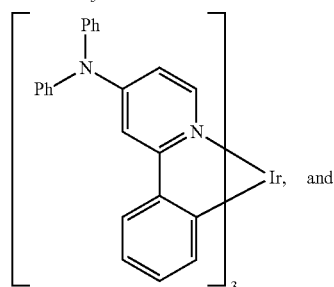

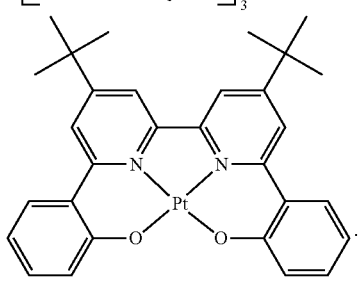

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

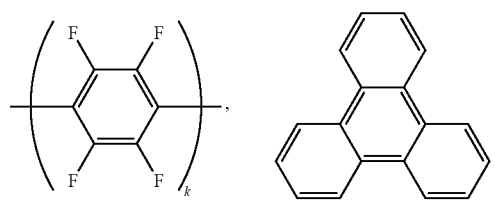

-continued

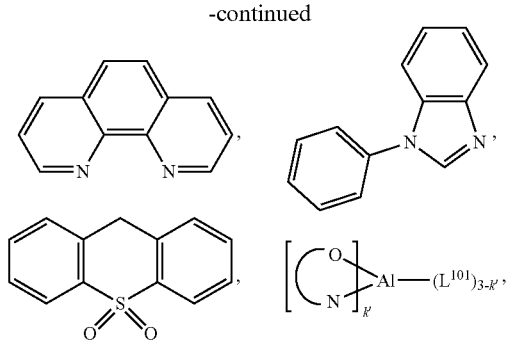

wherein k is an integer from 1 to 20; $L^{101}$ is another ligand, k' is an integer from 1 to 3.

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

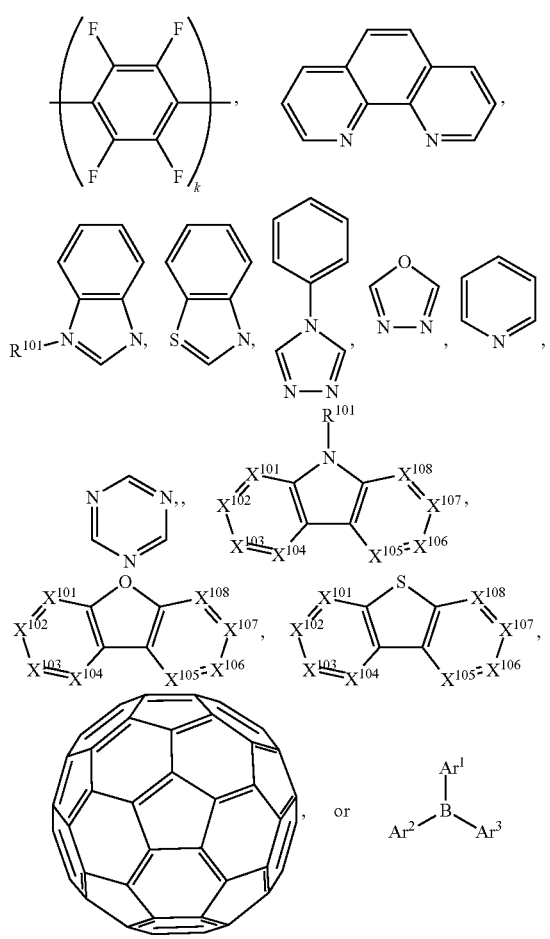

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to Ara has the similar definition as Ar's mentioned above. k is an integer from 1 to 20. $X^{101}$ to $X^{108}$ is selected from C (including CH) or N.

In another aspect, the metal complexes used in ETL contains, but not limited to the following general formula:

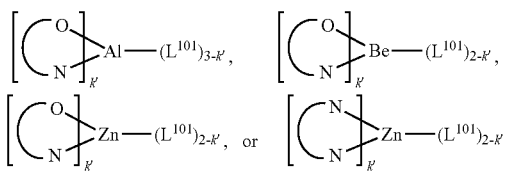

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

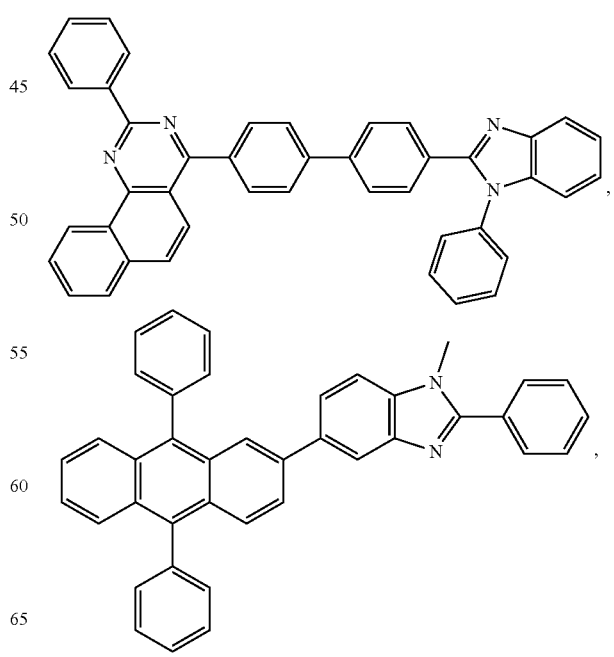

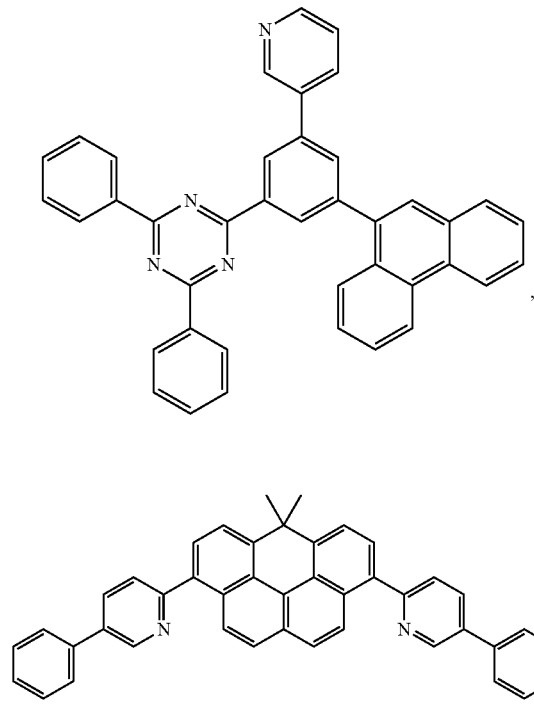
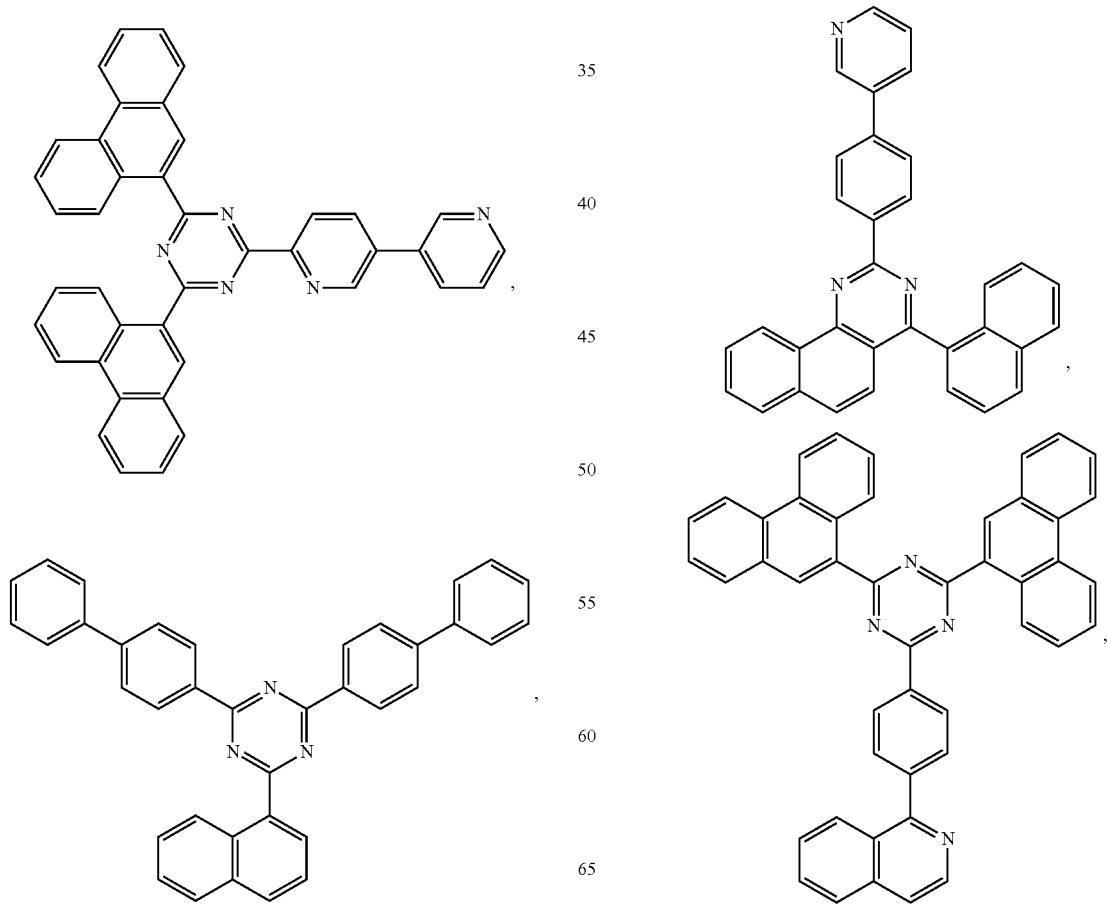

175
-continued
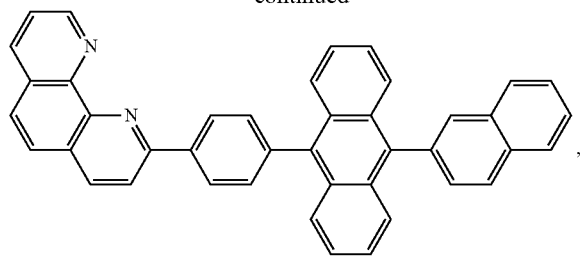
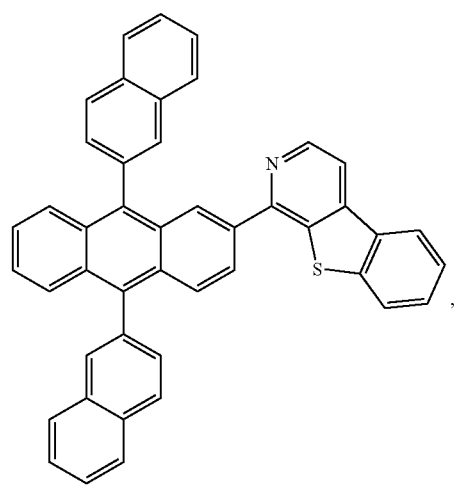
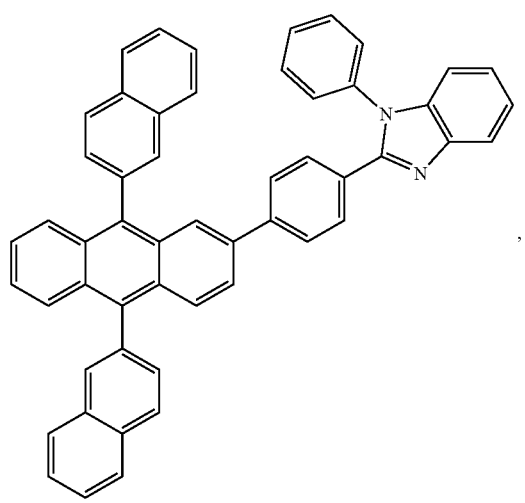
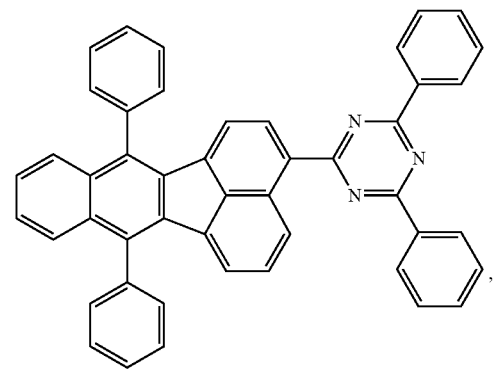
176
-continued
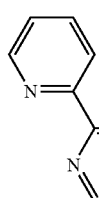
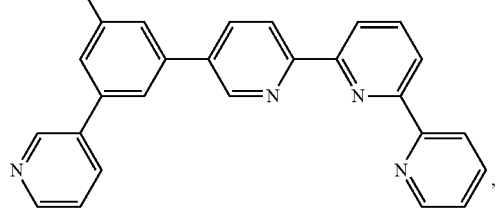
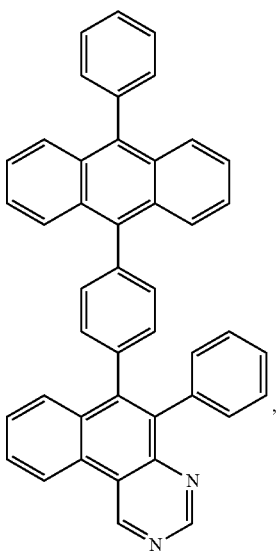
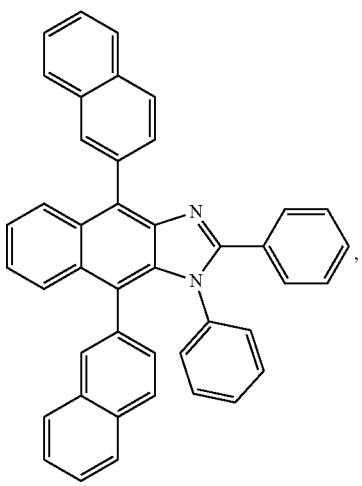

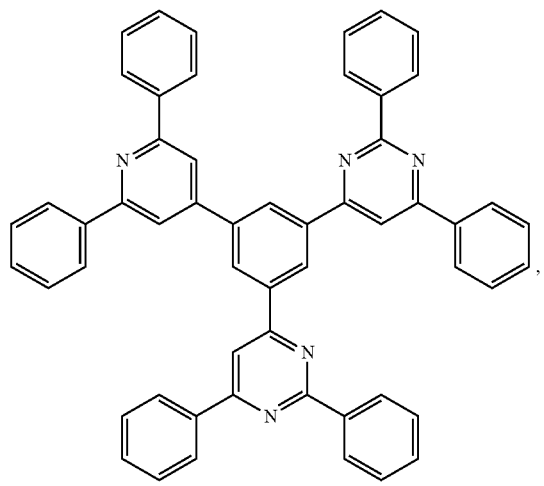
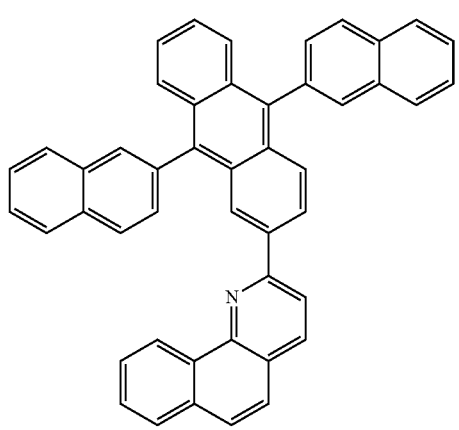
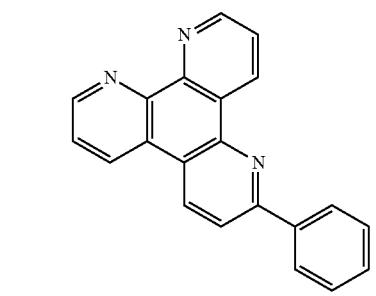
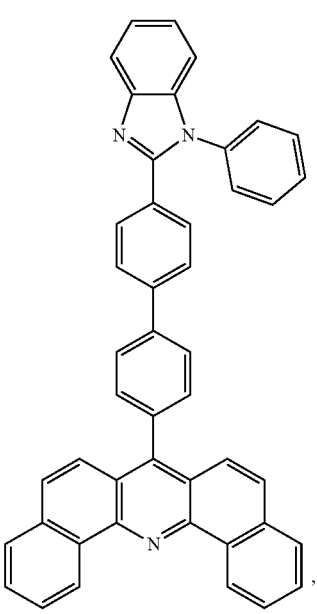
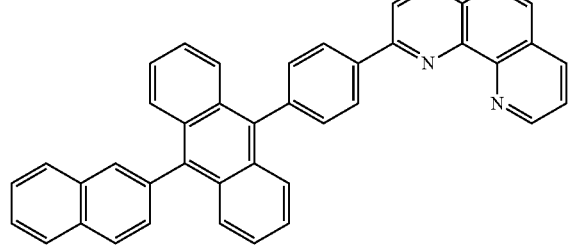
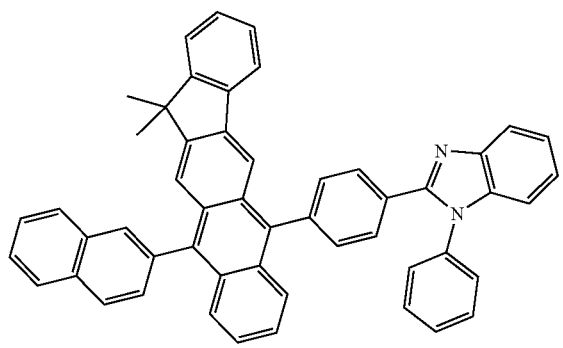
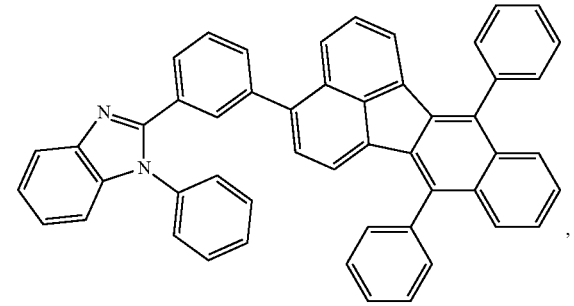

179
-continued
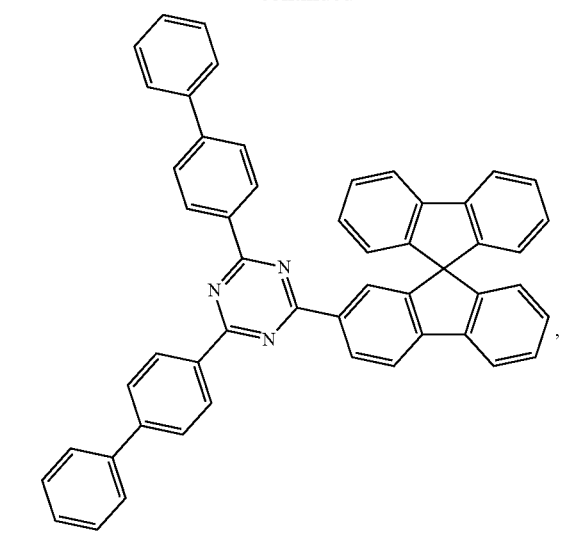
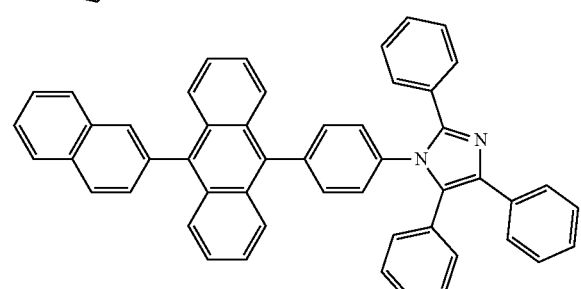
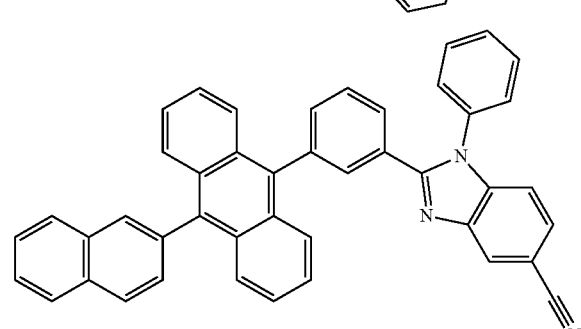
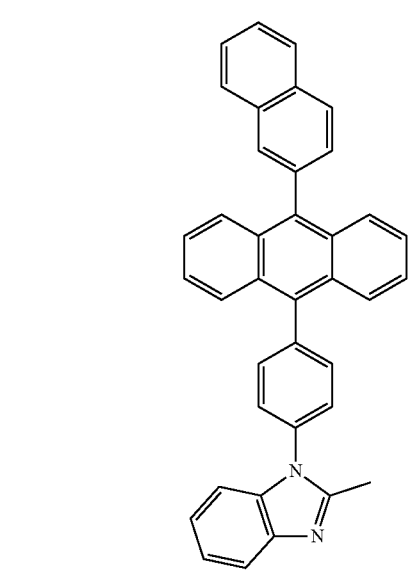
180
-continued
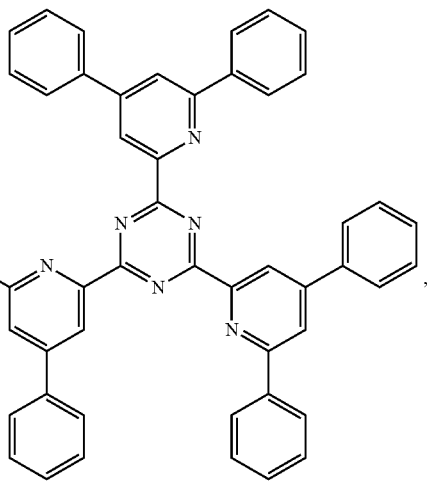
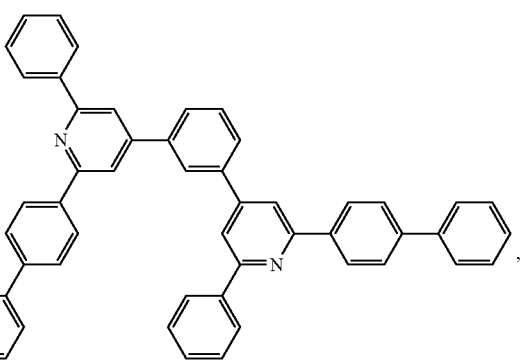

-continued

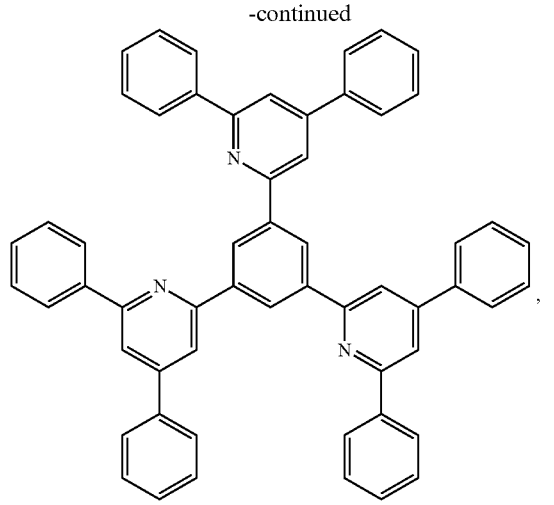

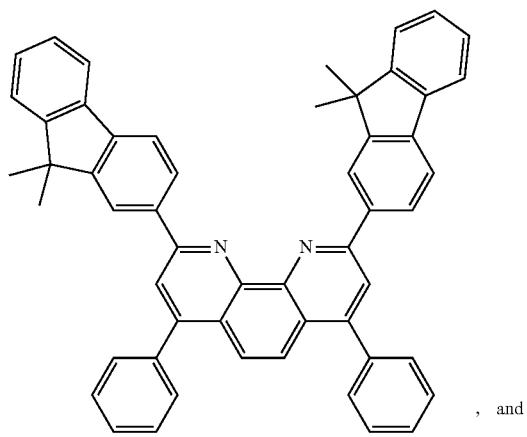, and

-continued

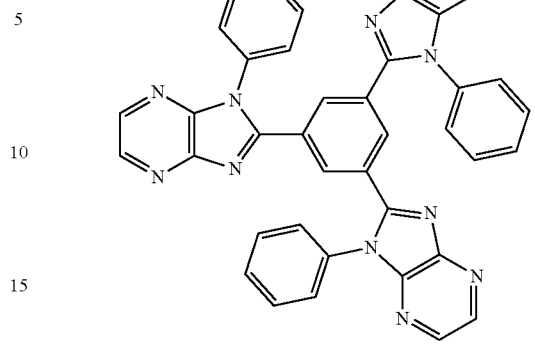

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Scheme 1: Synthesis of hexadentate L1:
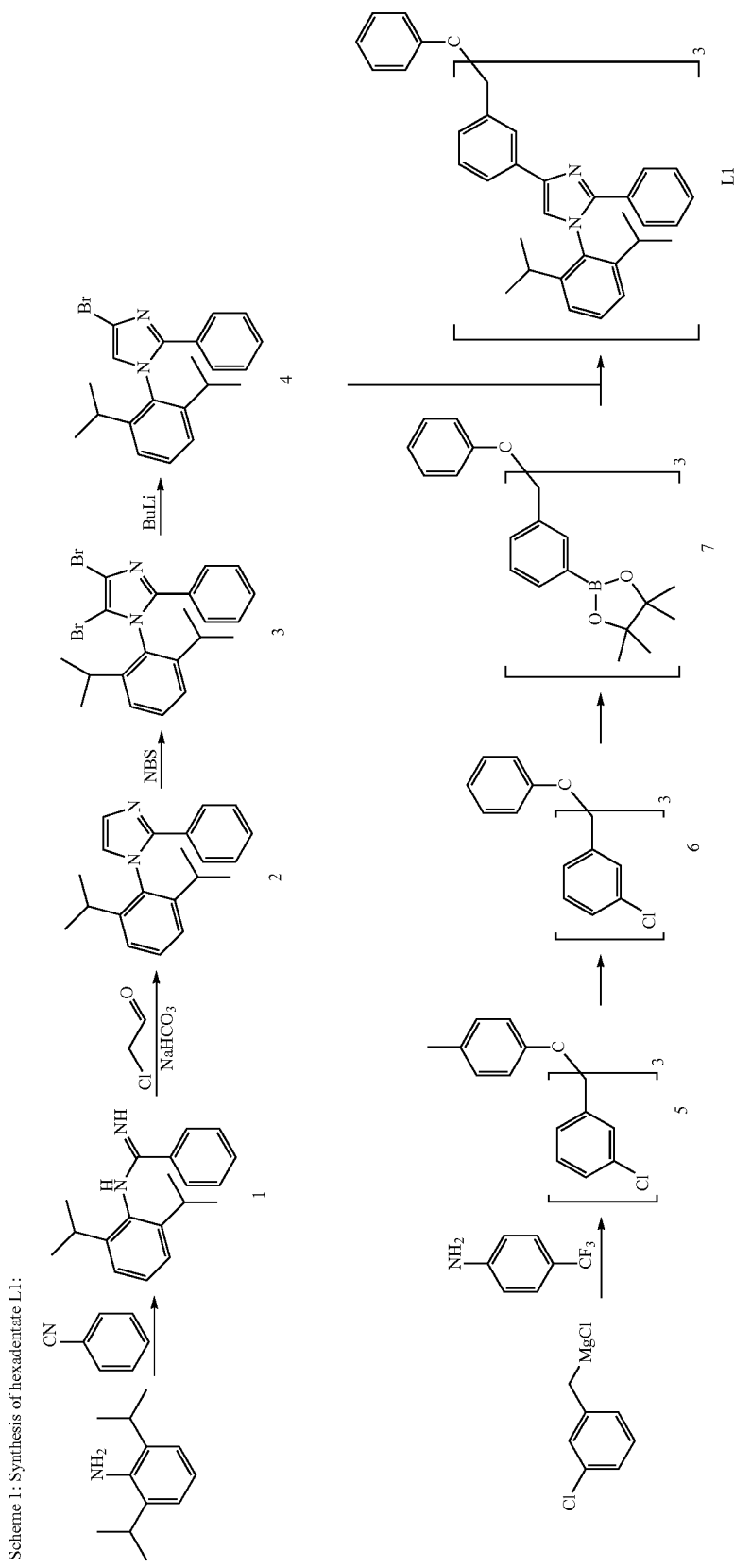

Synthesis of N-(2,6-diisopropylphenyl)benzimidamide (1)

A solution of 2,6-diisopropylaniline (38 ml, 201 mmol) in toluene (500 ml) was cooled in an ice/salt bath and a 2M solution of trimethylaluminum in toluene (150 ml, 300 mmol) was added dropwise. The mixture was allowed to warm to room temperature and stirred for three hours. Benzonitrile (21 ml, 204 mmol) was added and the mixture was heated at 70° C. for 16 hours, causing gentle gas evolution. The light yellow solution was poured slowly with stirring into a slurry of 250 g celite in a 2:1 mixture of DCM/MeOH (600 ml) and then filtered through a pad of celite, washing the celite with additional DCM/MeOH mixture. The filtrates were condensed under vacuum and the residual yellow solid was triturated in hexanes and dried, yielding 1 as a white solid, 39 g (69%).

Synthesis of 1-(2,6-diisopropylphenyl)-2-phenyl-1H-imidazole (2)

N-(2,6-diisopropylphenyl)benzimidamide (13.60 g, 48.5 mmol), 2-chloroacetaldehyde (12.28 ml, 97 mmol), and sodium hydrogen carbonate (8.15 g, 97 mmol) were combined in 2-propanol (250 ml) and heated at reflux overnight, turning brown. The suspension was cooled to room temperature and filtered through celite, washing with DCM. The filtrate was reduced under vacuum purified by column chromatography, yielding 2 in quantitative yield.

SYNTHESIS of 4,5-dibromo-1-(2,6-diisopropylphenyl)-2-phenyl-1H-imidazole (3)

1-(2,6-diisopropylphenyl)-2-phenyl-1H-imidazole (2) (14.77 g, 48.5 mmol) was dissolved in DMF (200 ml) and NBS (9.50 g, 53.4 mmol) was added and the mixture was stirred at room temperature for 48 hours. More NBS (8.63 g, 48.5 mmol) was added and the reaction was stirred in a 70° C. oil bath for another 24 hours. Solvents were removed by kugelrohr and the residue was partitioned between EtOAc and water, filtering through a frit to remove black insoluble materials. The aqueous layer was extracted twice more with EtOAc, the organics were washed with water and brine, dried and purified by column chromatography to yield 3 as a colorless solid, 18.27 (81%).

Synthesis of 4-bromo-1-(2,6-diisopropylphenyl)-2-phenyl-1H-imidazole (4)

4,5-dibromo-1-(2,6-diisopropylphenyl)-2-phenyl-1H-imidazole (3) (18.27 g, 39.5 mmol) was dissolved in THF (264 ml), cooled in $^i$PrOH/CO$_2$ bath, and a butyllithium solution in hexanes (2.5 M, 15.81 ml, 39.5 mmol) was slowly added. The brown solution was stirred cold for 30 minutes, then 15 mL of MeOH was added and allowed to warm to room temperature. Water and brine were added, and the mixture was extracted twice with EtOAc. The organics were washed with brine, dried, and reduced under vacuum. Column chromatography yielded (4) as a white solid, 14.52 g (96%).

Synthesis of 4-(2-(3-chlorobenzyl)-1,3-bis(3-chlorophenyl)propan-2-yl)aniline (5)

Magnesium turnings (1.937 g, 80 mmol) were stirred in diethyl ether (153 ml) at room temperature under nitrogen in a round-bottomed flask with attached addition funnel containing a solution of 1-chloro-3-(chloromethyl)benzene (9.72 ml, 77 mmol) in 30 mL diethyl ether. A small amount of the chloride solution was added to the magnesium turnings and the mixture brought momentarily to reflux using external heating. The remaining chloride solution was then added dropwise, maintaining the temperature of the reaction at just below reflux temperature. Once addition was complete, the heterogeneous mixture was again brought to reflux with external heating and then cooled to −50° C. using an $^i$PrOH/CO$_2$ bath. 4-(trifluoromethyl)aniline (1.9 ml, 15.33 mmol) dissolved in 10 mL THF was added slowly, after which the reaction was allowed to warm slowly to room temperature, turning yellow and homogeneous. The mixture was refluxed an additional 16 hours, forming a white precipitate. The reaction was quenched with water and then 1M HCl was added to dissolve solids and quench the remaining Mg. DCM was added to aid in solvation of formed solids. The organic layer was washed with brine, dried, and reduced under vacuum. Purification by column chromatography yielded 5 as a pale yellow, tacky residue, 5.17 g (70%).

Synthesis of 3,3'-(2-(3-chlorobenzyl)-2-phenylpropane-1,3-diyl)bis(chlorobenzene) (6)

4-(2-(3-chlorobenzyl)-1,3-bis(3-chlorophenyl)propan-2-yl)aniline (5) (5.17 g, 10.75 mmol) was dissolved in acetic acid (75 ml) and conc. hydrochloric acid (2.240 ml, 26.9 mmol) was added to the yellow solution, forming yellow precipitates. The mixture was cooled in an ice bath until the solvent just began to freeze, at which point a solution of sodium nitrite (0.890 g, 12.90 mmol) in 8 mL water was slowly added, becoming homogeneous. After 30 minutes of stirring cold, phosphinic acid solution in water (11.77 ml, 108 mmol) was added and the mixture was allowed to warm to room temperature over 16 hours, with insoluble oily materials coating the flask and stir bar. The mixture was diluted with water and the supernatant was decanted and discarded. The remaining residue was treated with water and excess Na$_2$CO$_3$ and extracted with EtOAc three times. The organics were washed with brine, dried, vacuumed down to an orange oil. Column chromatography yielded 6 as a thick, colorless glassy oil, 2.95 g (59%).

Synthesis of 2,2'-((2-phenyl-2-(3-(4,4,5,5-tetramethyl-1,3,2-dioxaborolan-2-yl)benzyl)propane-1,3-diyl)bis(3,1-phenylene))bis(4,4,5,5-tetramethyl-1,3,2-dioxaborolane) (7)

4,4,4',4',5,5,5',5'-octamethyl-2,2'-bi(1,3,2-dioxaborolane) (4.23 g, 16.66 mmol), potassium acetate (4.09 g, 41.6 mmol), Pd$_2$(dba)$_3$ (0.095 g, 0.104 mmol), X-Phos (0.199 g, 0.416 mmol) and 3,3'-(2-(3-chlorobenzyl)-2-phenylpropane-1,3-diyl)bis(chlorobenzene) (6) (1.94 g, 4.16 mmol) were combined in a flask which was with nitrogen, then dioxane (42 ml) was added via cannula and the mixture was heated at reflux for 16 hours. Water and brine were added and the mixture was extracted with EtOAc three times. The organics were washed with brine, dried, and reduced under vacuum. Column chromatography yielded (7) a pale yellow-stained solid, 2.37 g (77%).

Synthesis of L1

4-bromo-1-(2,6-diisopropylphenyl)-2-phenyl-1H-imidazole (4) (6.78 g, 17.69 mmol), potassium carbonate (2.445 g, 17.69 mmol), Pd$_2$(dba)$_3$ (0.162 g, 0.177 mmol), 2,2'-((2- phenyl-2-(3-(4,4,5,5-tetramethyl-1,3,2-dioxaborolan-2-yl)benzyl)propane-1,3-diyl)bis(3,1-phenylene))bis(4,4,5,5-tetramethyl-1,3,2-dioxaborolane) (7) (2.62 g, 3.54 mmol) and S-Phos (0.291 g, 0.708 mmol) were combined in a schlenk flask under nitrogen. Degassed 10:1 dioxane/water (100 ml) was added via cannula and the mixture was heated at reflux for 16 hours. The mixture was diluted with water and brine, extracted with EtOAc, organics were washed with brine, dried, and reduced under vacuum. Column chromatography yielded (L1) as a white solid, 2.29 g (51%).

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

I claim:

1. A compound comprising a first ligand $L_A$ having Formula 1:

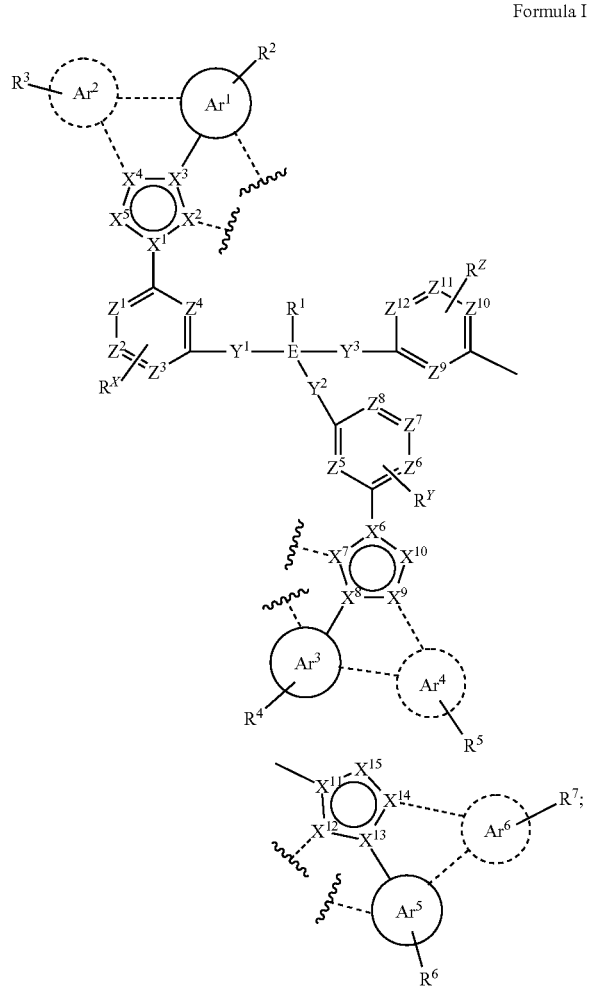

Formula I wherein $X^1$-$X^{15}$ are each independently C or N;

wherein $Y^1$, $Y^2$, and $Y^3$ each independently represent a direct bond, or an organic or inorganic linker;

wherein $Z^1$-$Z^{12}$ are each independently C or N;

wherein $R^1$-$R^7$, $R^X$, $R^Y$, and $R^Z$ each independently represents mono to the maximum allowable substitution, or no substitution;

wherein E is selected from the group consisting of C, N, Si, B, Al, P, and Ge;

wherein $R^1$ is not present when E is N, B, Al, or P;

wherein each $R^1$-$R^7$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein $Ar^1$, $Ar^3$, and $Ar^5$ are each independently a 5- or 6-membered carbocyclic or heterocyclic ring;

wherein $Ar^2$, $Ar^4$, and $Ar^6$ are each optionally present and are each independently a 5- or 6-membered carbocyclic or heterocyclic ring;

wherein any two substituents may be joined or fused to form a ring;

wherein the ligand $L_A$ is coordinated to a metal M; and wherein the wave lines indicate bonds to M.

2. The compound of claim 1, wherein each $R^1$-$R^7$, $R^X$, $R^Y$, and $R^Z$ is independently selected from the group consisting of hydrogen, deuterium, fluorine, alkyl, cycloalkyl, heteroalkyl, alkoxy, alyloxy, amino, silyl, alkenyl, cycloalkenyl, heteroalkenyl, aryl, heteroaryl, nitrile, isonitrile, and combinations thereof.

3. The compound of claim 1, wherein the metal is selected from the group consisting of Ru, Os, Rh, and Ir.

4. The compound of claim 1, wherein $X^2$, $X^7$ and $X^{12}$ are N.

5. The compound of claim 1, wherein E is C or Si.

6. The compound of claim 1, wherein $Y^1$, $Y^2$, and $Y^3$ are each independently an alkyl or ether linker, or each $Y^1$, $Y^2$, and $Y^3$ is independently O, NR", or CR"$_2$, and wherein R" is selected from the group consisting of hydrogen, deuterium, alkyl, cycloalkyl, aryl, heteroaryl and combinations thereof.

7. The compound of claim 1, wherein $X^2$, $X^4$, $X^7$, $X^9$, $X^{12}$, and $X^{14}$ are N, and $X^1$, $X^3$, $X^5$, $X^6$, $X^8$, $X^{10}$, $X^{11}$, $X^{13}$, and $X^{15}$ are C, or $X^2$, $X^3$, $X^7$, $X^8$, $X^{12}$, and $X^{13}$ are N, and $X^1$, $X^4$, $X^6$, $X^9$, $X^{10}$, $X^{11}$, $X^{14}$, and $X^{15}$ are C.

8. The compound of claim 1, wherein $R^1$ is selected from the group consisting of unsubstituted and substituted aryl, and unsubstituted and substituted heteroaryl.

9. The compound of claim 1, wherein $Ar^2$, $Ar^4$, and $Ar^6$ are each present, and each is a 6-membered aromatic ring.

10. The compound of claim 1, wherein each $Ar^1$, $Ar^3$, and $Ar^5$ is an aromatic ring.

11. The compound of claim 1, wherein at least one of $R^3$ and $X^5$, $R^5$ and $X^{10}$, and $R^7$ and $X^{15}$, are linked by an organic linker.

12. The compound of claim 1, wherein the first ligand $L_A$ comprises a structure of Formula II:

Formula II

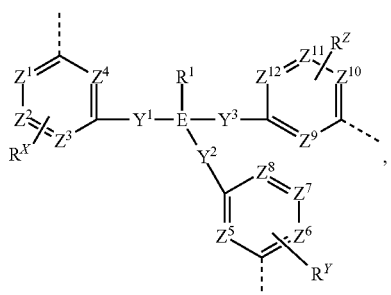

wherein the structure of Formula II is selected from the group consisting of:

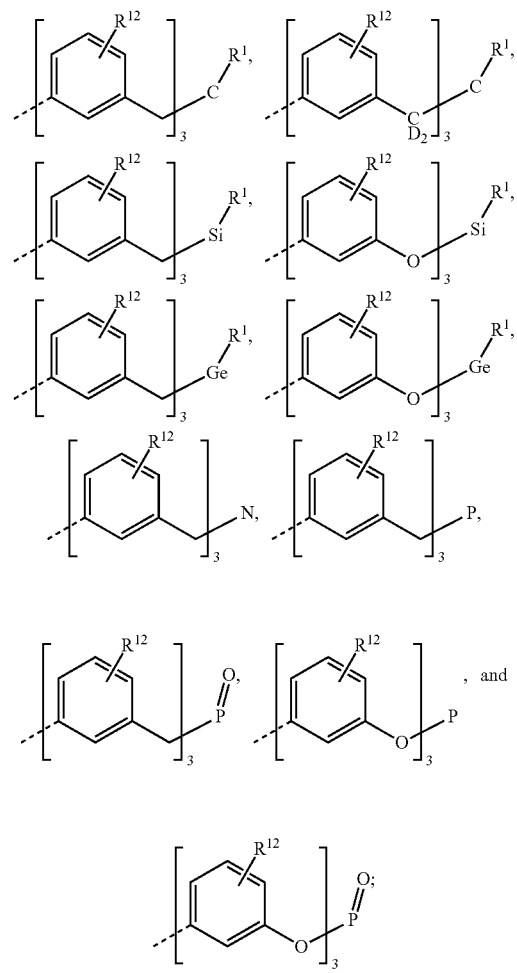

wherein $R^{12}$ represents mono to the maximum possible number of substitutions, or no substitution, and is selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; and wherein the first ligand $L_A$ comprises a structure of Formula III:

Formula III

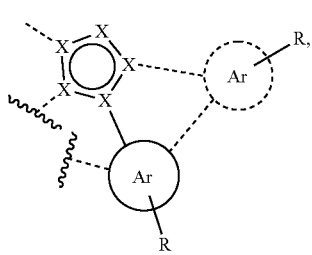

wherein the structure of Formula III is selected from the group consisting of:

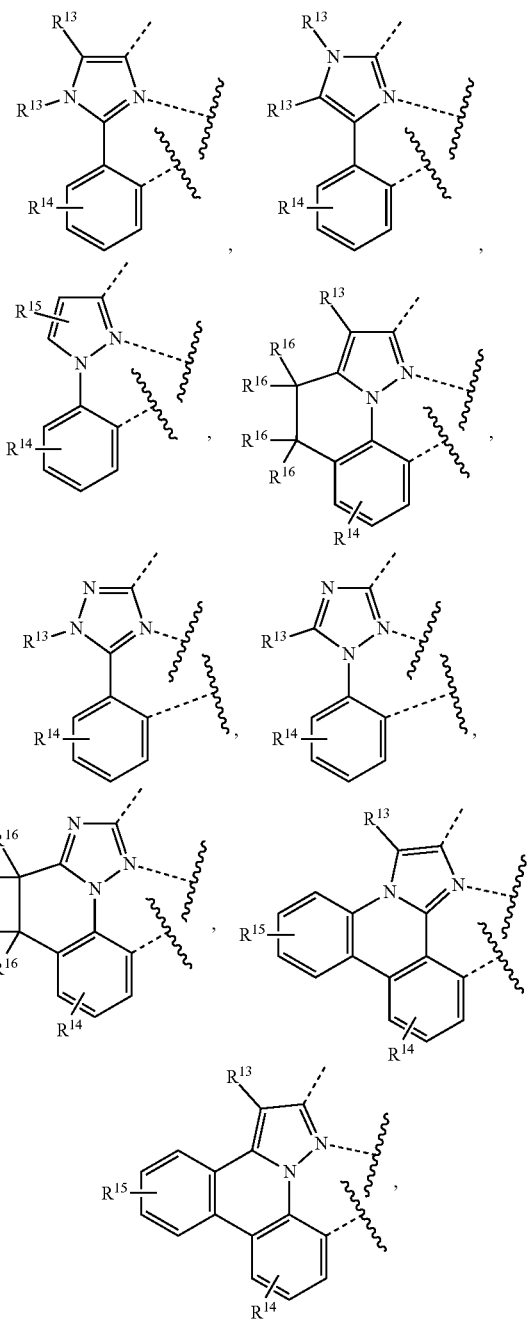

191
-continued
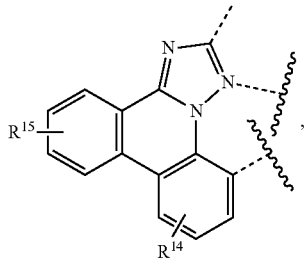,
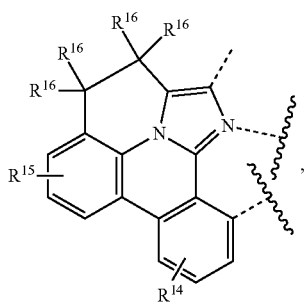,
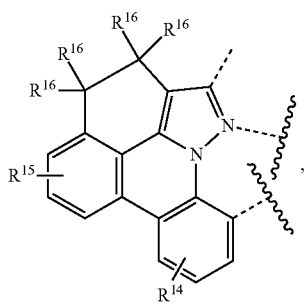,
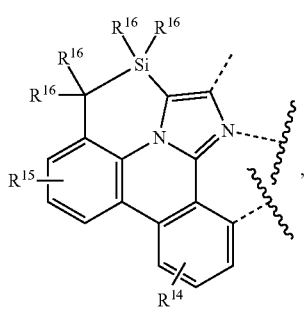,
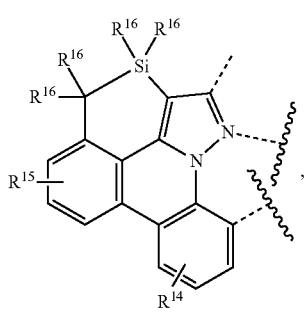,
192
-continued
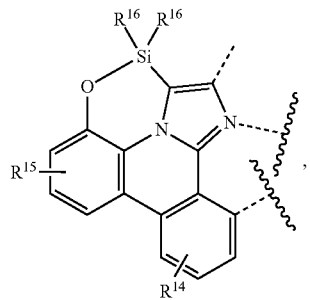,
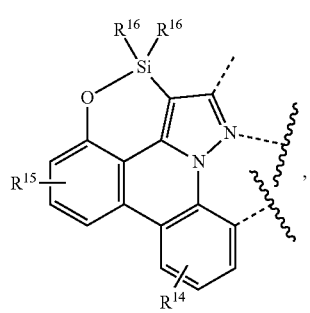,
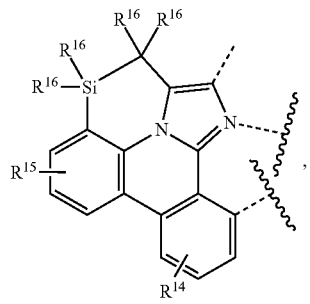,
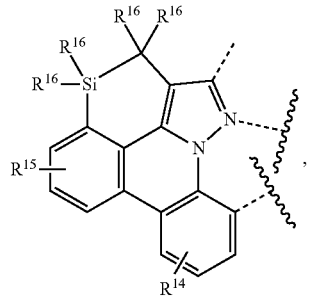,
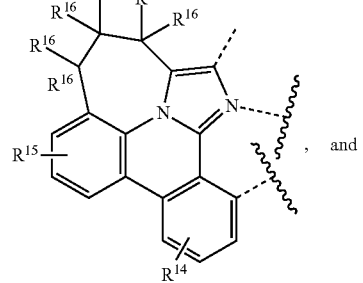, and

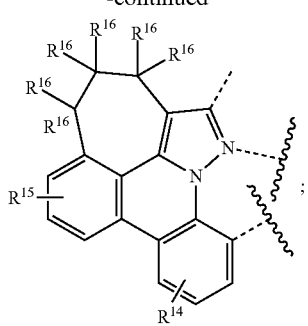

wherein each R, $R^{13}$, $R^{14}$, and $R^{15}$ independently represents mono to the maximum allowable substitution, or no substitution;

wherein R, $R^{13}$, $R^{14}$, $R^{15}$ and $R^{16}$ are each selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof;

wherein X is C or N; and wherein any two substituents may be joined or fused together to form a ring.

13. The compound of claim 1, wherein the compound is the compound x having the formula $IrL_{LlAiAjAk}$;

wherein $L_{LlAiAjAk}$ is a hexadentate ligand comprised of Ai, Aj, Ak, and Ll;

wherein Ai, Aj, and Ak are linked together through Ll;

wherein x=215((215((215(l-1)+k)-1)+j)-1)+i, i, j, and k are integers from 1 to 215, and l is an integer from 1 to 203;

wherein Ai, Aj, and Ak are each independently selected from the group consisting of:

A1
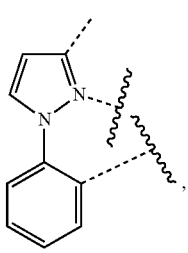

A2
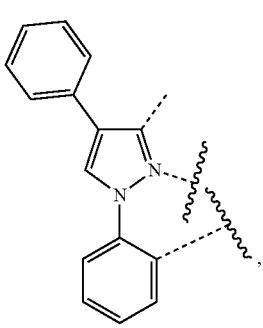

A3
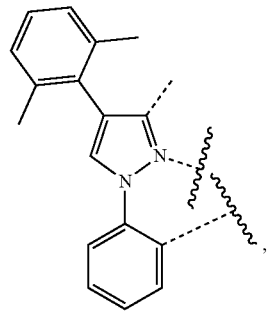

A4
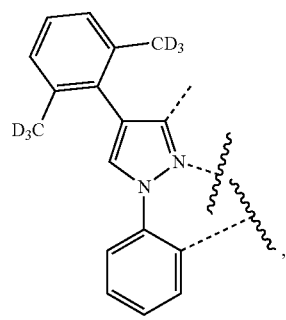

A5
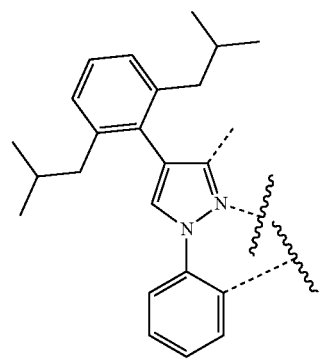

A6
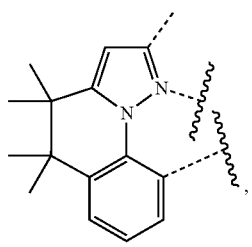

A7
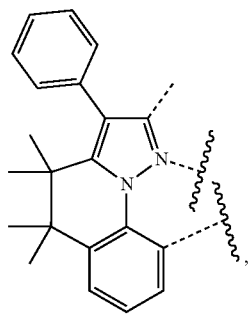

A8 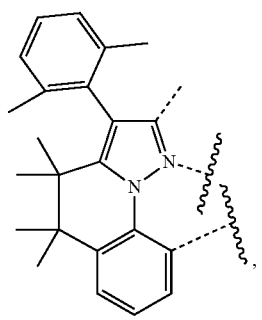
A9 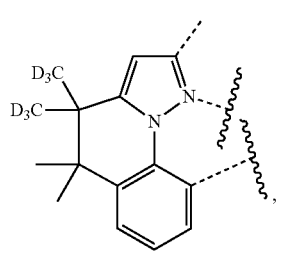
A10 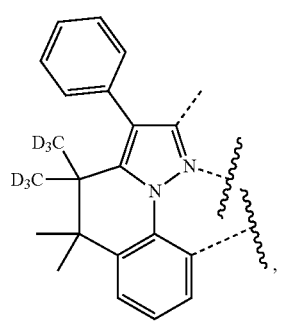
A11 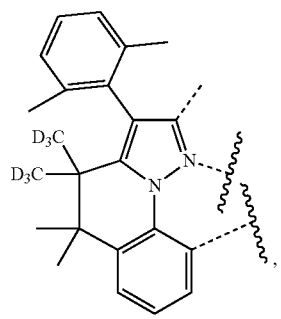
A12 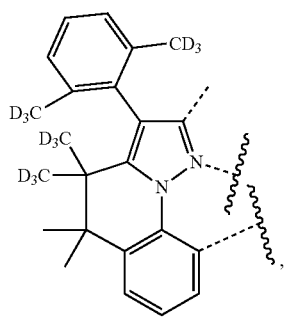
A13 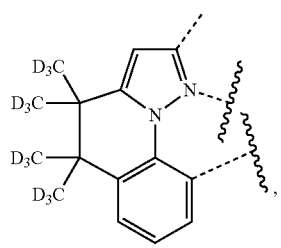
A14 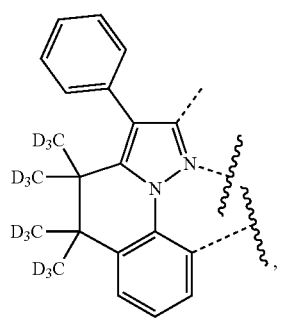
A15 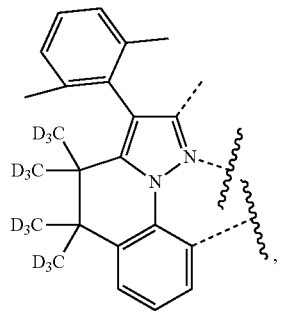
A16 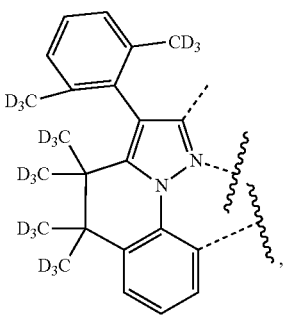
A17 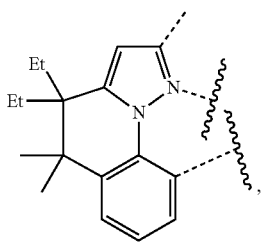

-continued
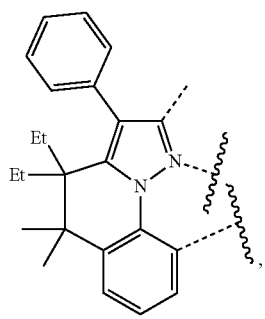
A18
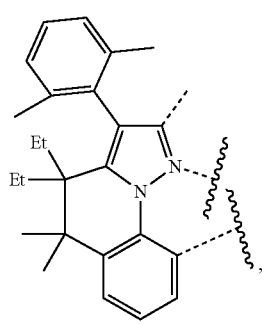
A19
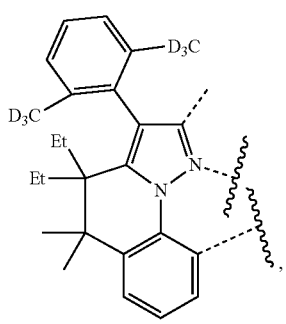
A20
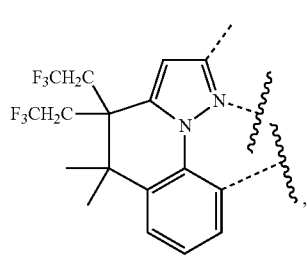
A21
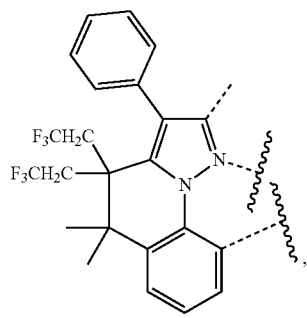
A22
-continued
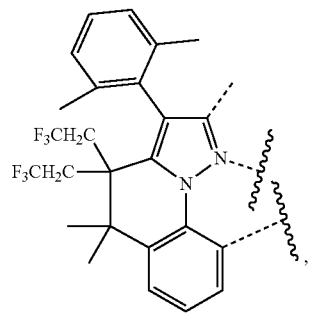
A23
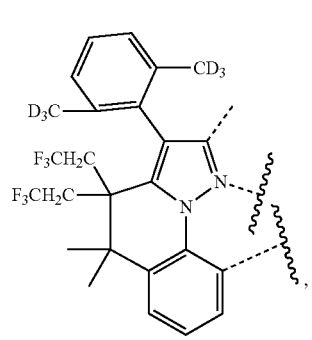
A24
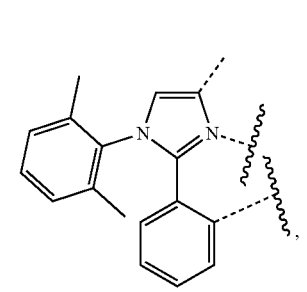
A25
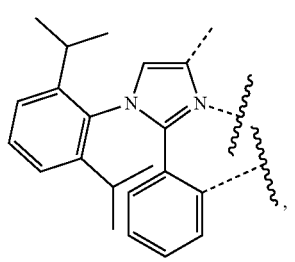
A26
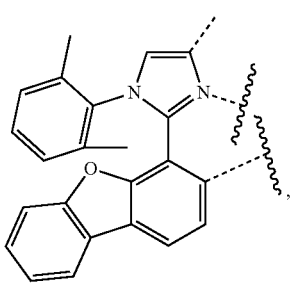
A27

A28 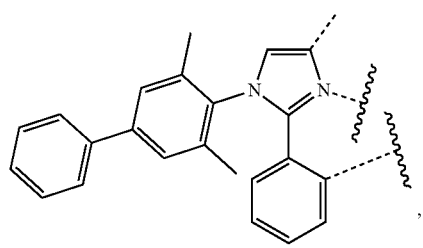
A29 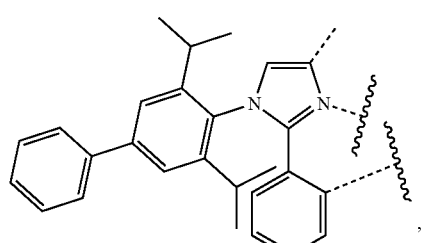
A30 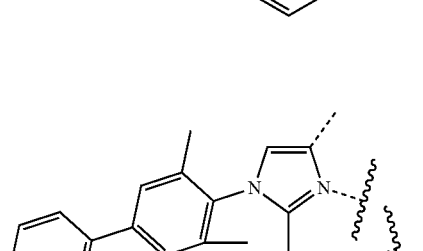
A31 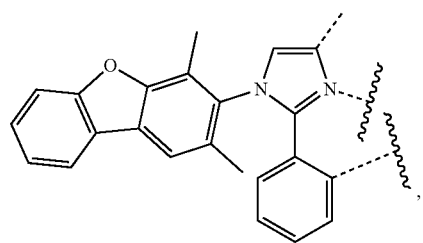
A32 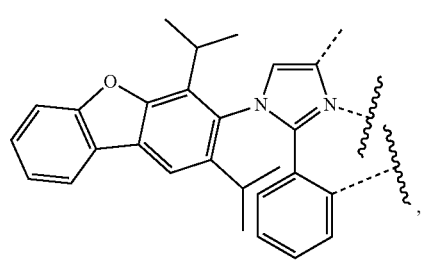
A33 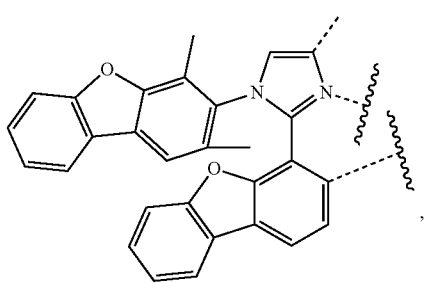
A34 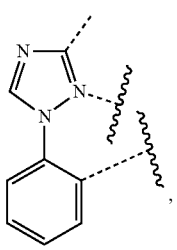
A35 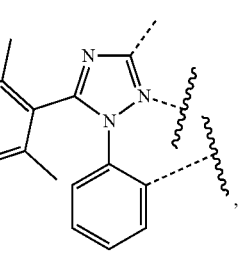
A36 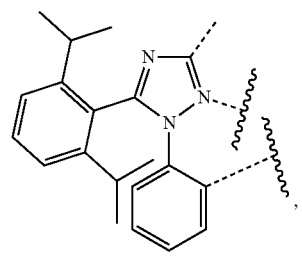
A37 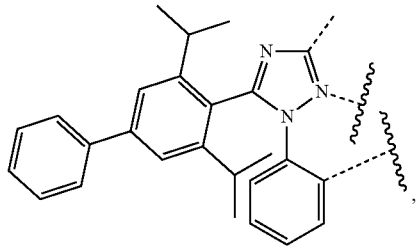
A38 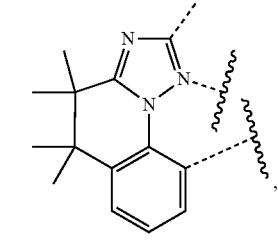
A39 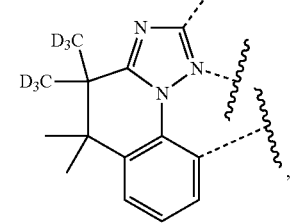

A40 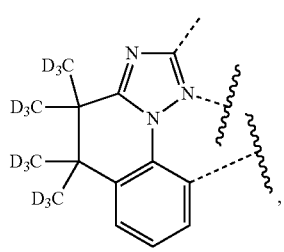
A41 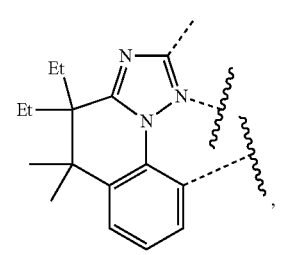
A42 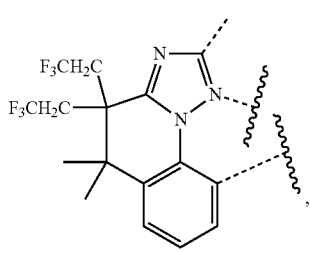
A43 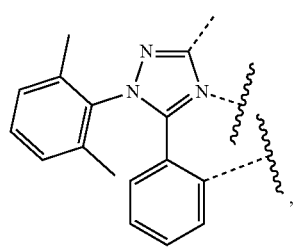
A44 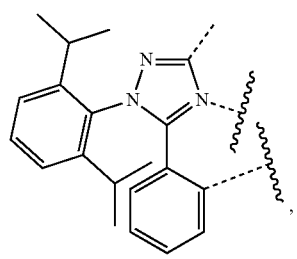
A45 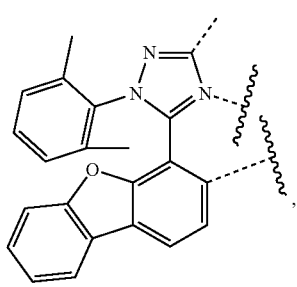
A46 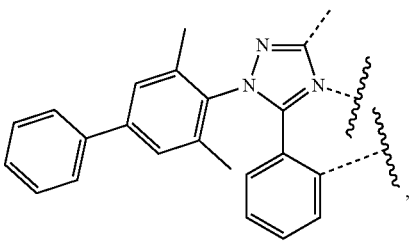
A47 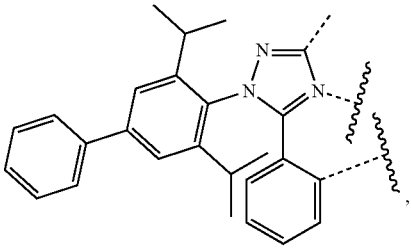
A48 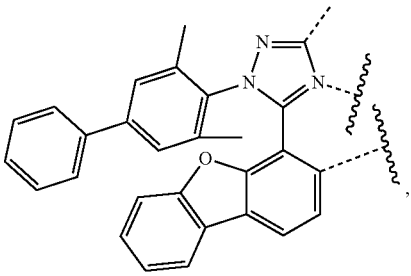
A49 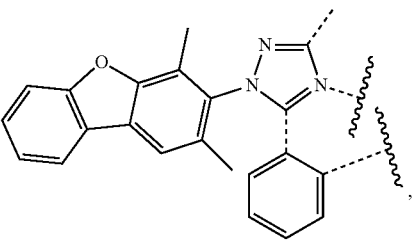
A50 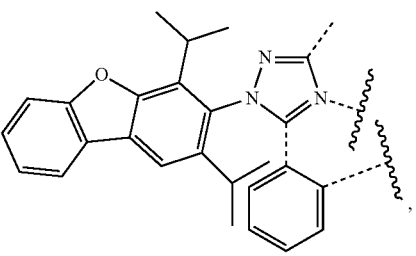
A51 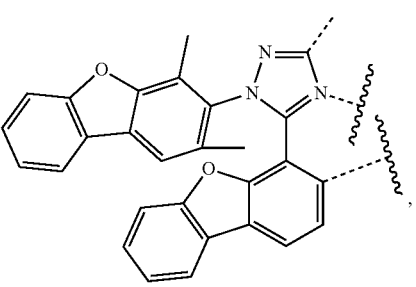

-continued
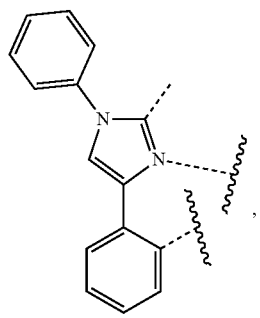 A52
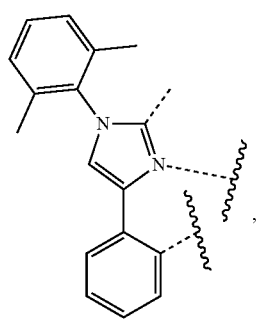 A53
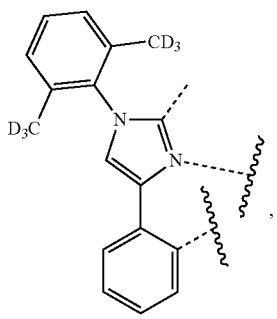 A54
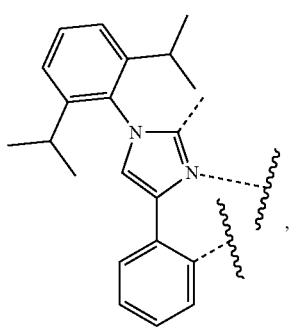 A55
-continued
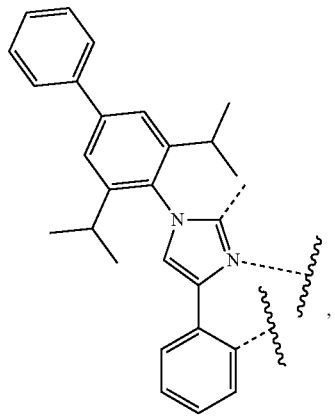 A56
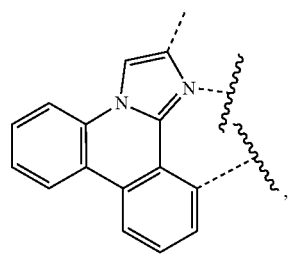 A57
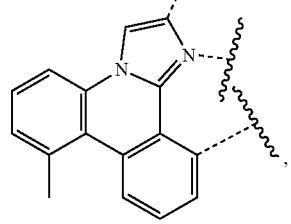 A58
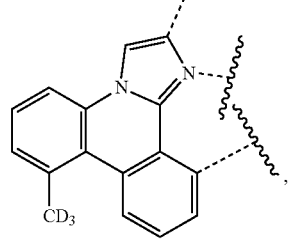 A59
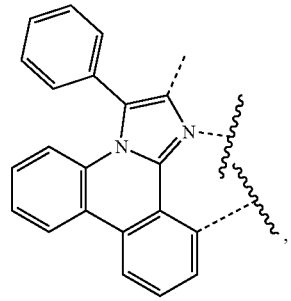 A60

-continued
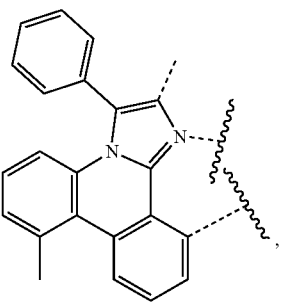 A61
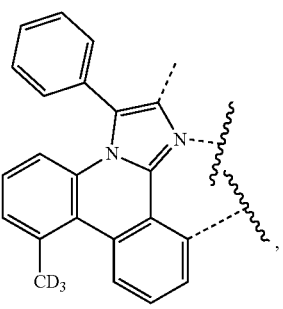 A62
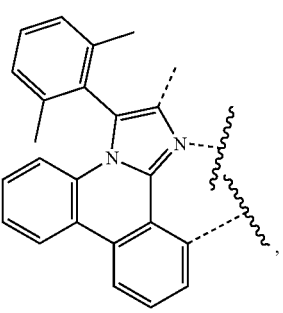 A63
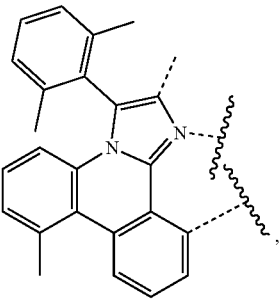 A64
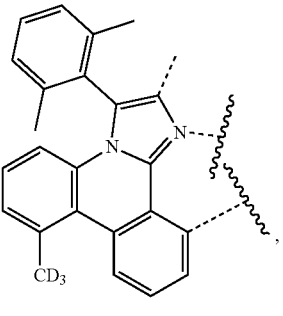 A65
-continued
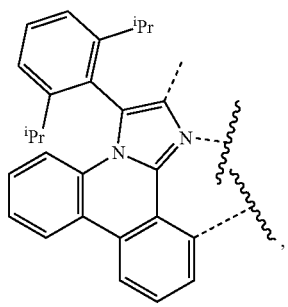 A66
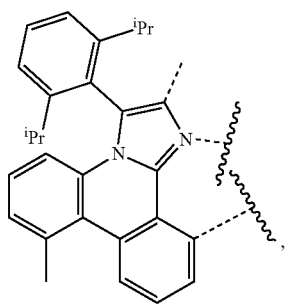 A67
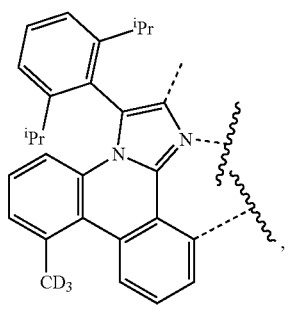 A68
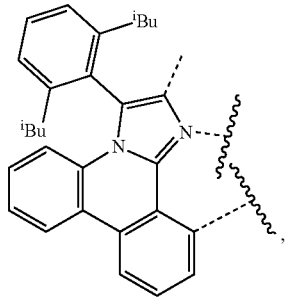 A69
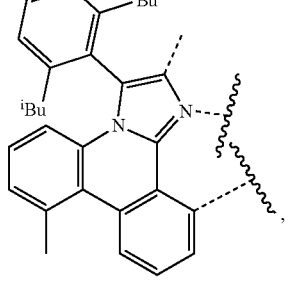 A70

-continued
A71 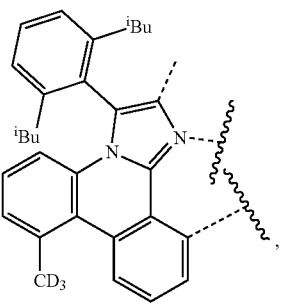,
A72 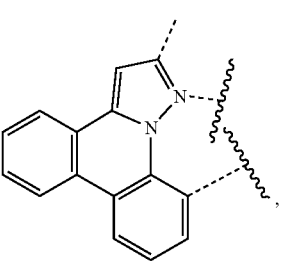,
A73 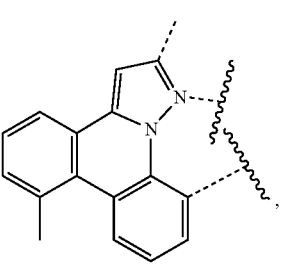,
A74 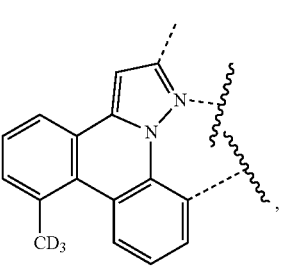,
A75 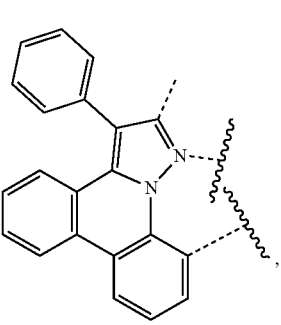,
-continued
A76 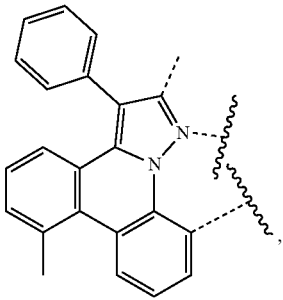,
A77 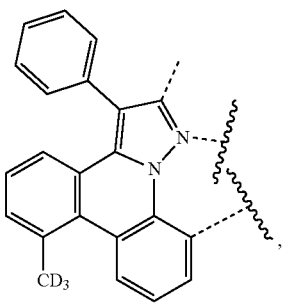,
A78 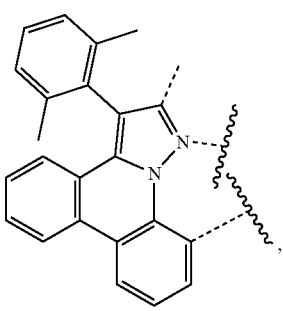,
A79 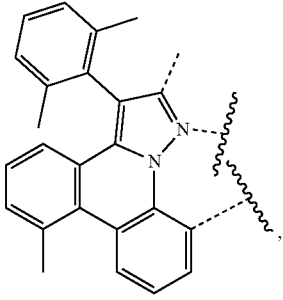,
A80 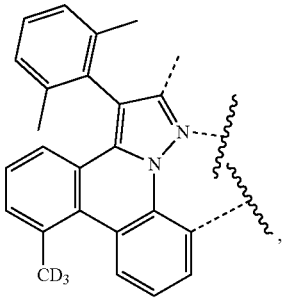,

| | |
|---|---|
| 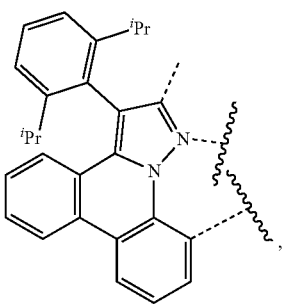 A81 | 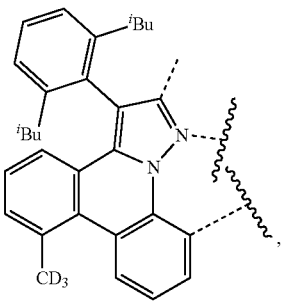 A86 |
| 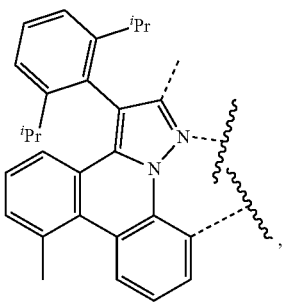 A82 | 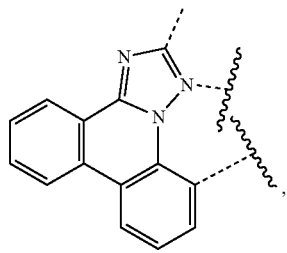 A87 |
| 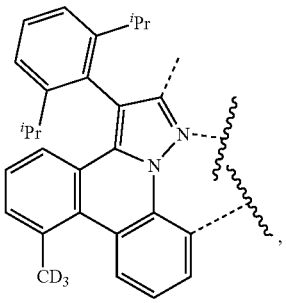 A83 | 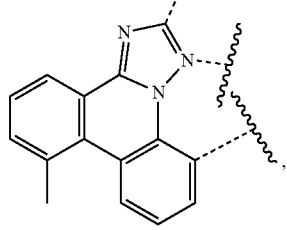 A88 |
| 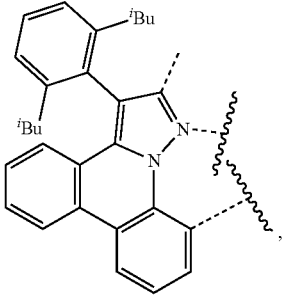 A84 | 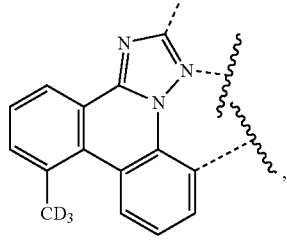 A89 |
| 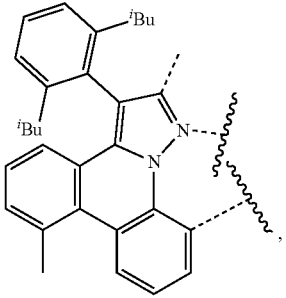 A85 | 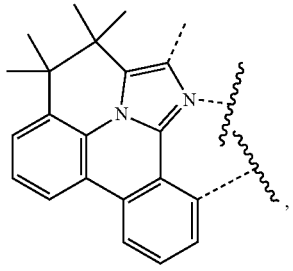 A90 |
| | 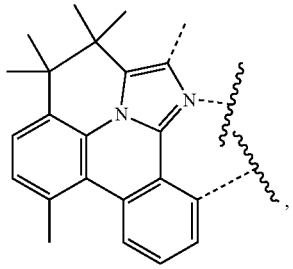 A91 |

-continued
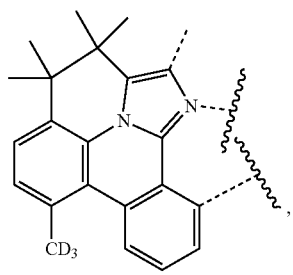 A92
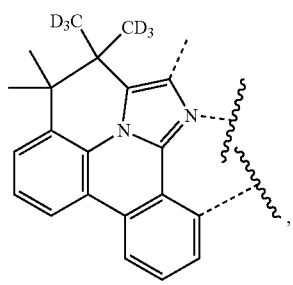 A93
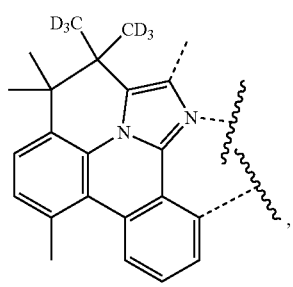 A94
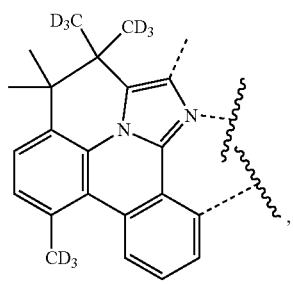 A95
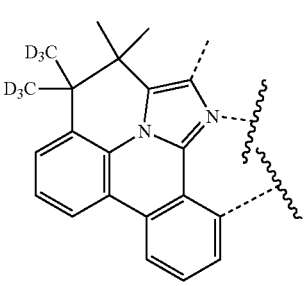 A96
-continued
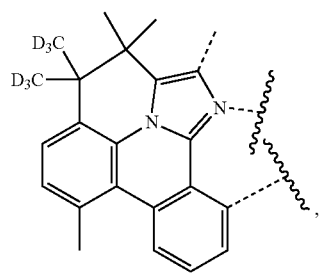 A97
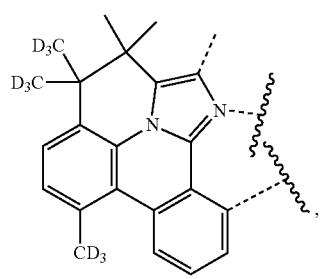 A98
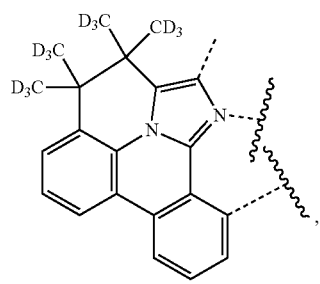 A99
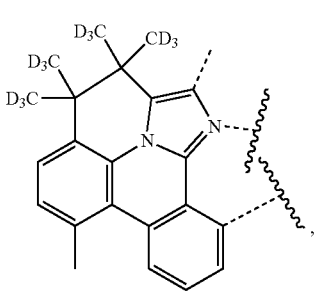 A100
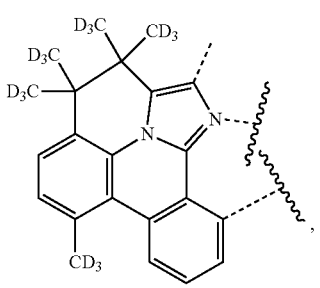 A101

213
-continued
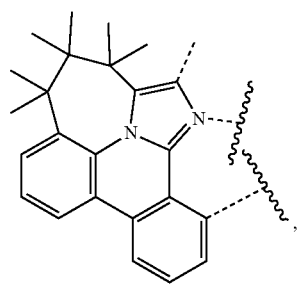
A102
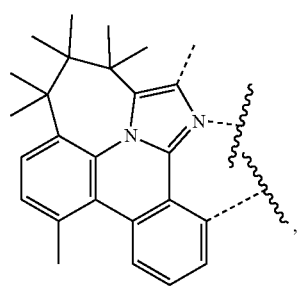
A103
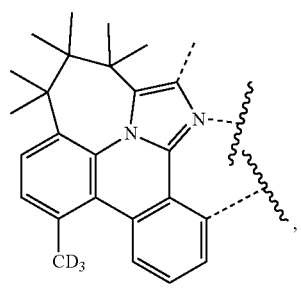
A104
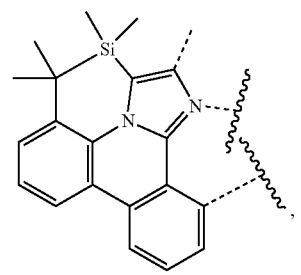
A105
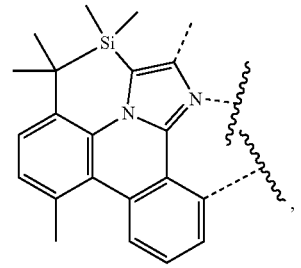
A106
214
-continued
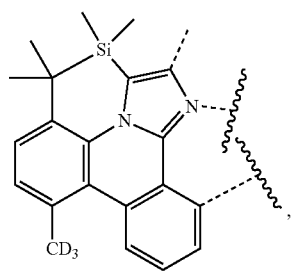
A107
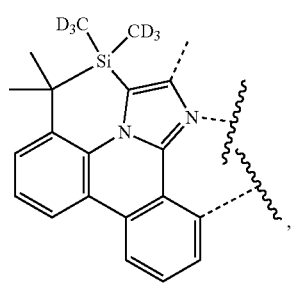
A108
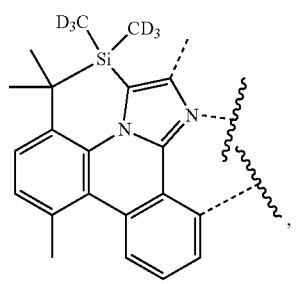
A109
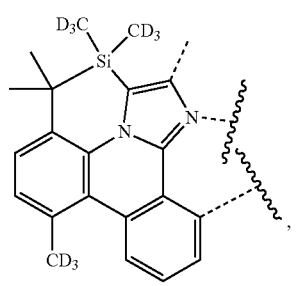
A110
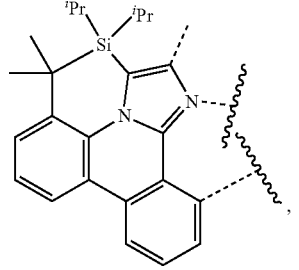
A111

A112
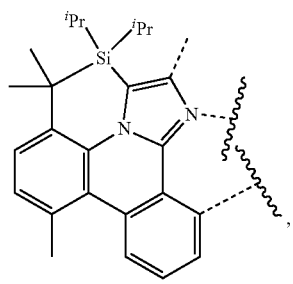
A113
A117
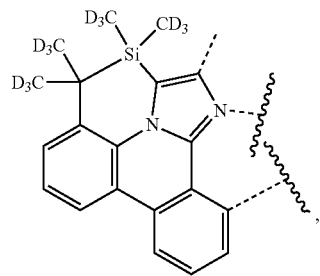
A118
A114
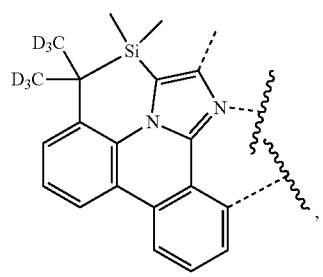
A119
A115
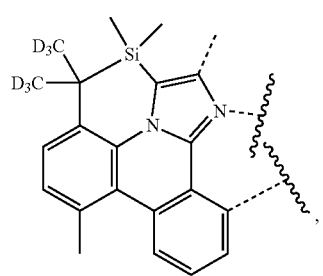
A120
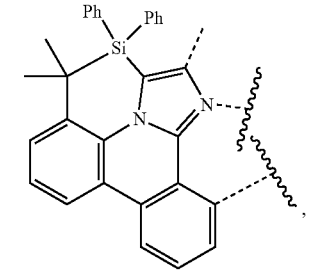
A116
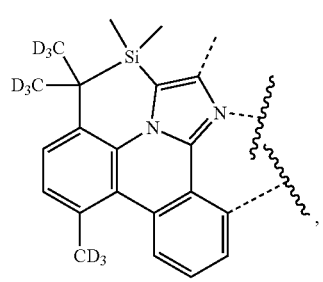
A121
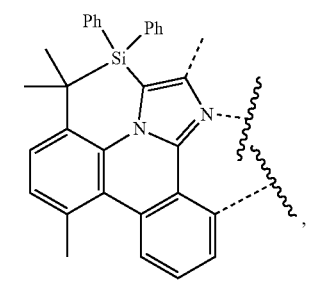

-continued
A122
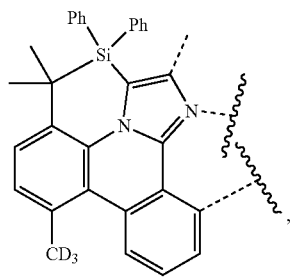,
A123
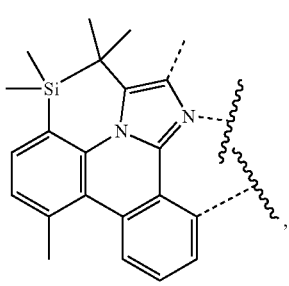,
A124
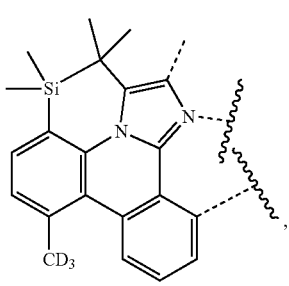,
A125
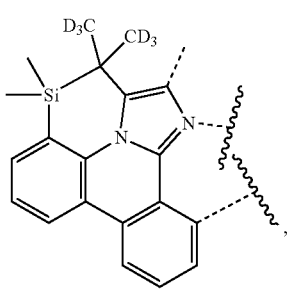,
A126
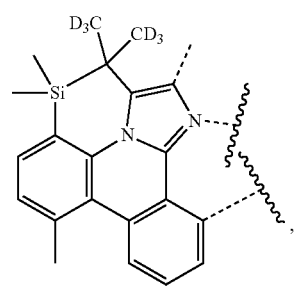,
-continued
A127
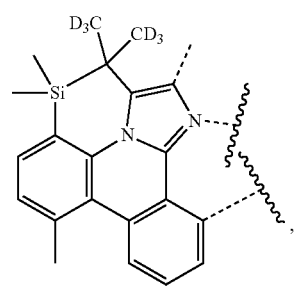,
A128
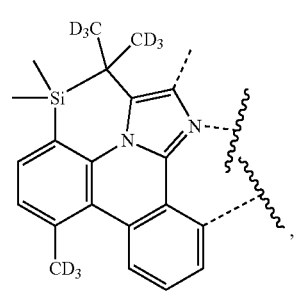,
A129
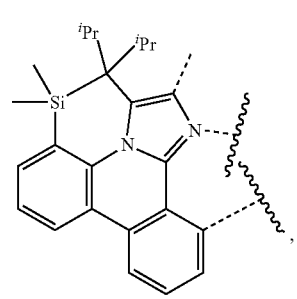,
A130
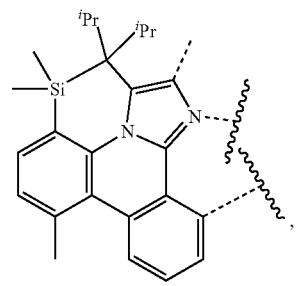,
A131
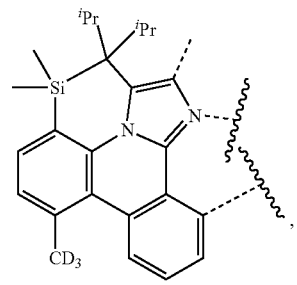, 219
-continued
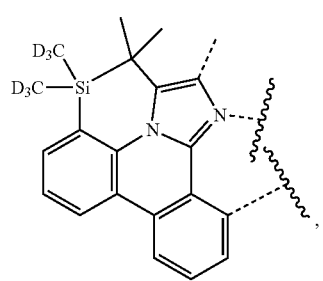
A132
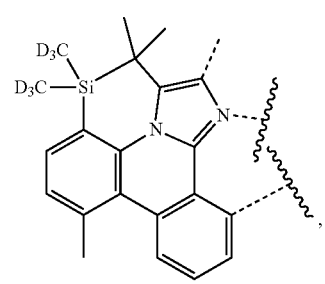
A133
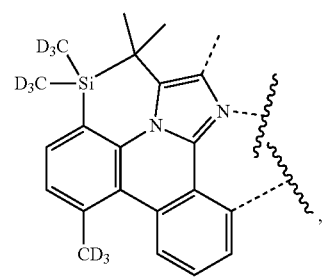
A134
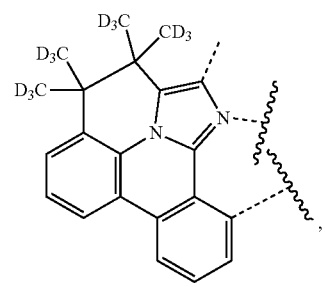
A135
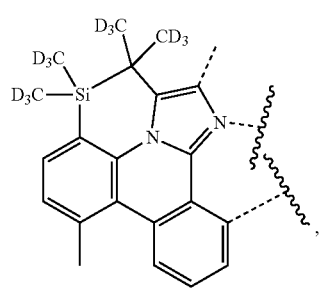
A136
220
-continued
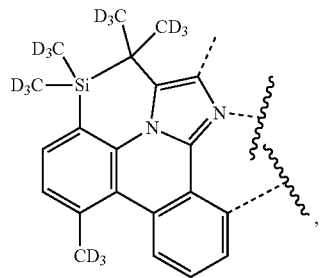
A137
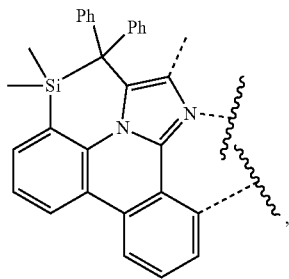
A138
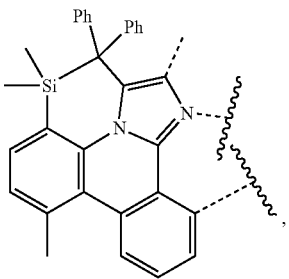
A139
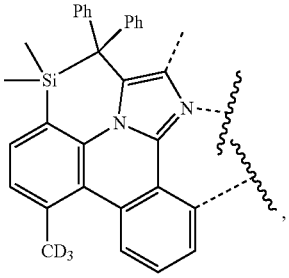
A140
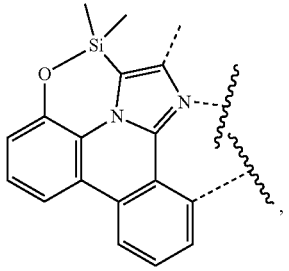
A141

-continued
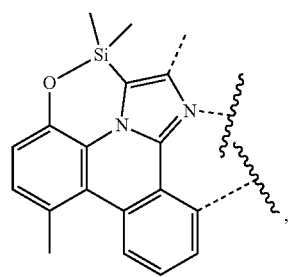 A142
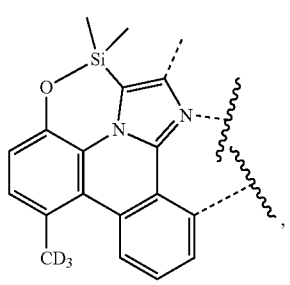 A143
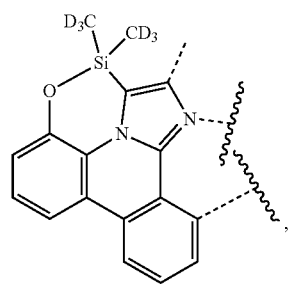 A144
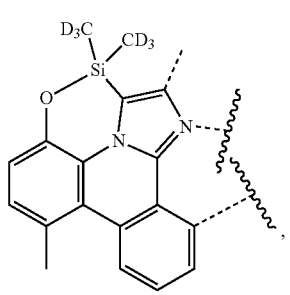 A145
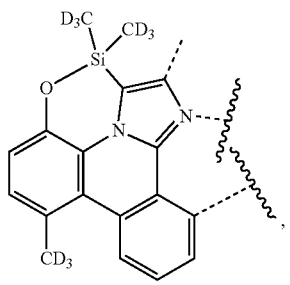 A146
-continued
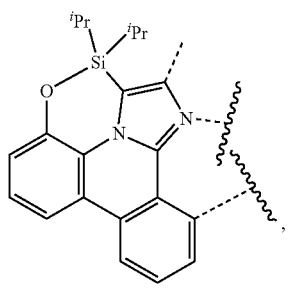 A147
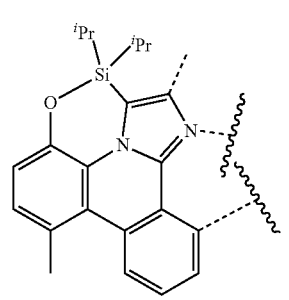 A148
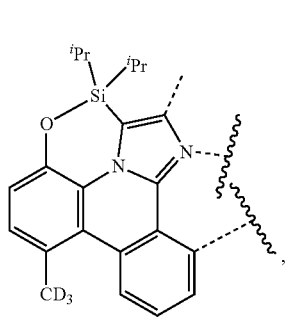 A149
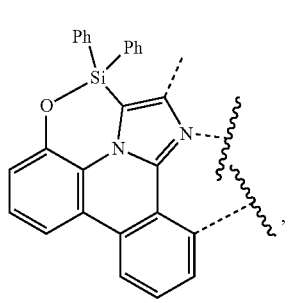 A150
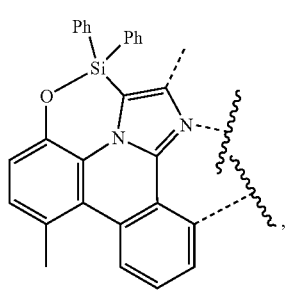 A151

A152 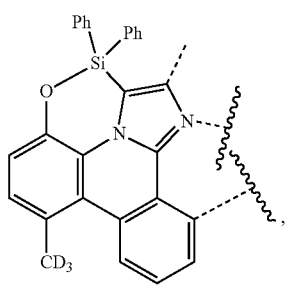
A153 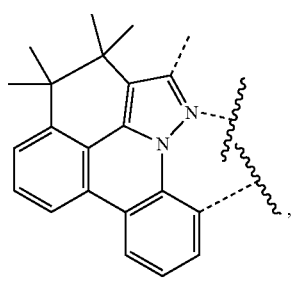
A154 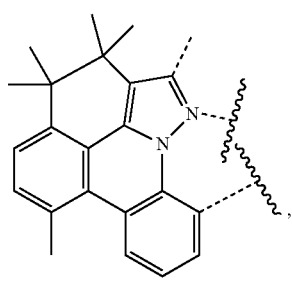
A155 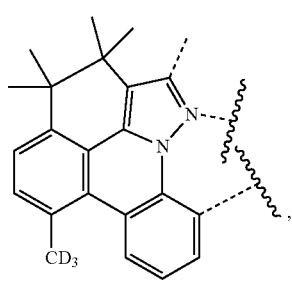
A156 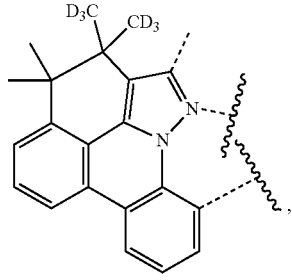
A157 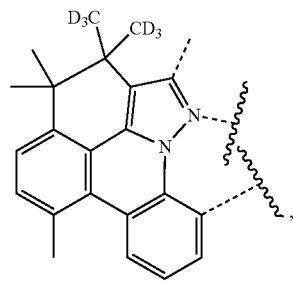
A158 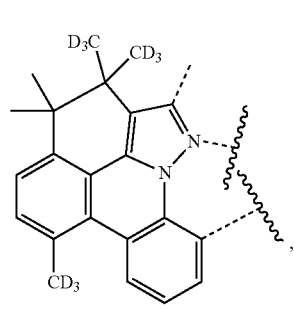
A159 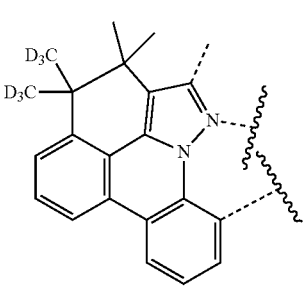
A160 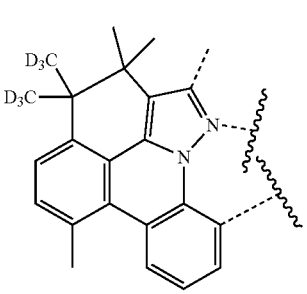
A161 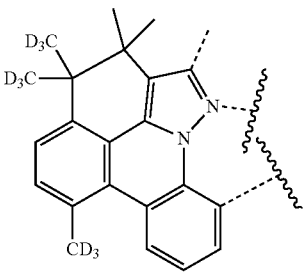

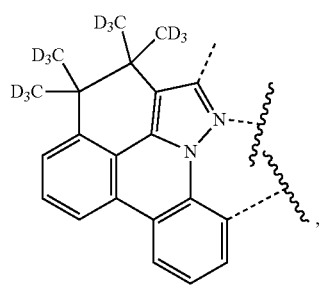
A162
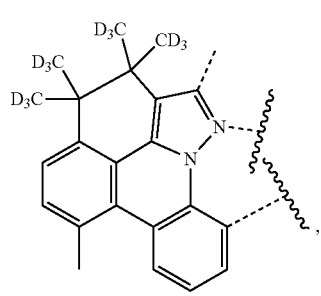
A163
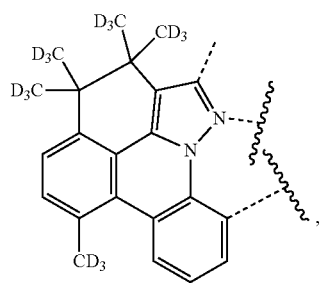
A164
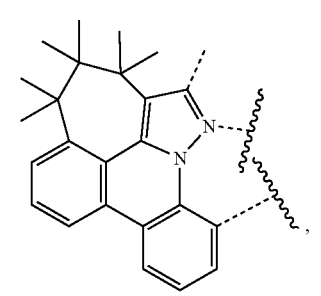
A165
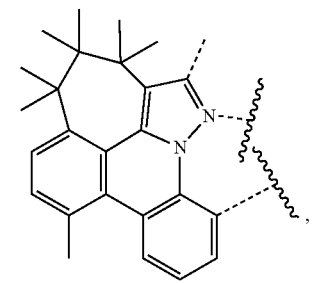
A166
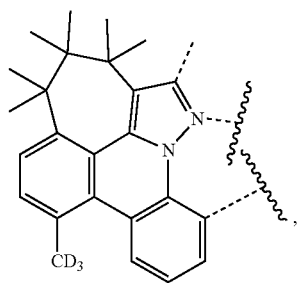
A167
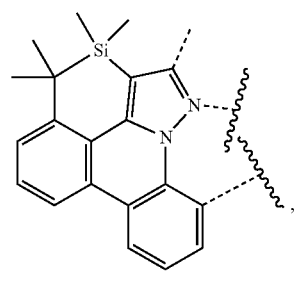
A168
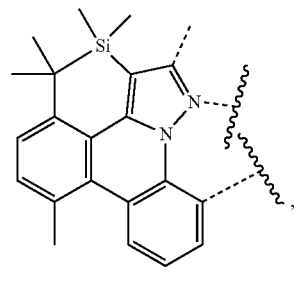
A169
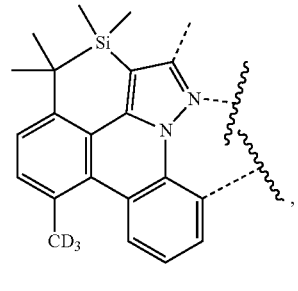
A170
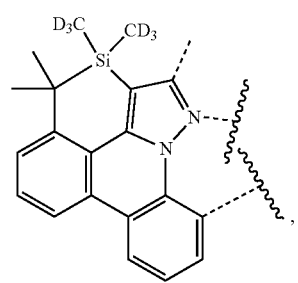
A171

A172 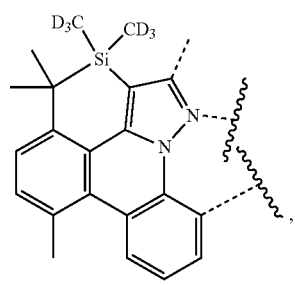,
A173 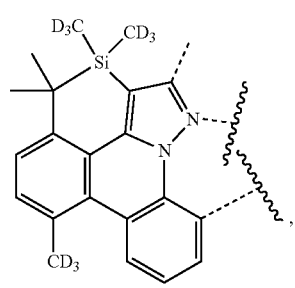,
A174 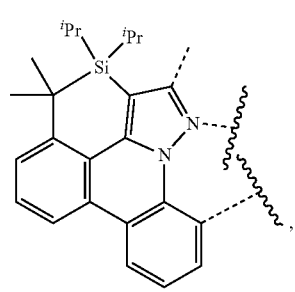,
A175 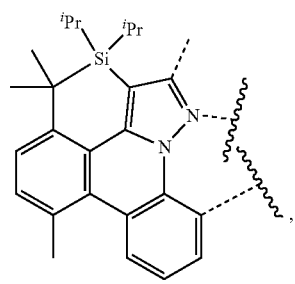,
A176 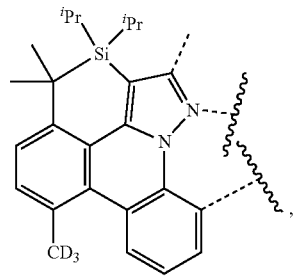,
A177 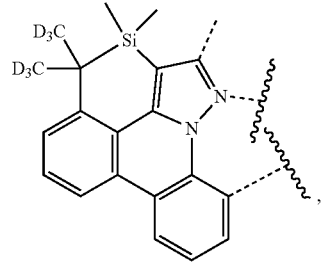,
A178 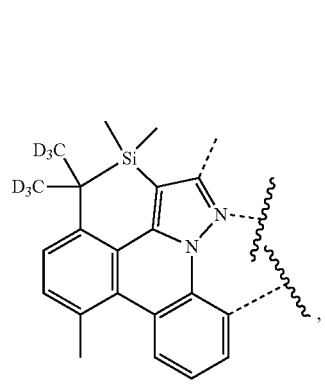,
A179 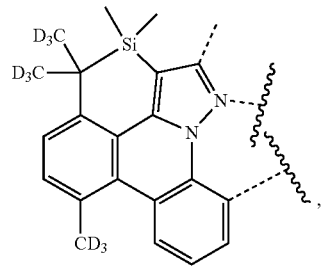,
A180 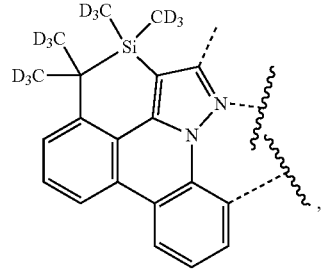,
A181 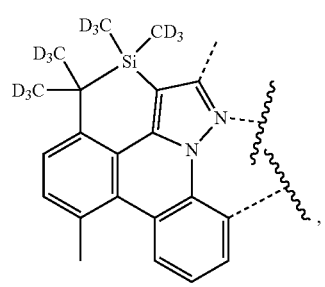, -continued
A182 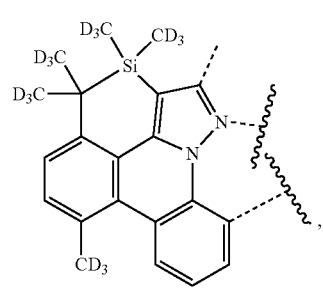
A183 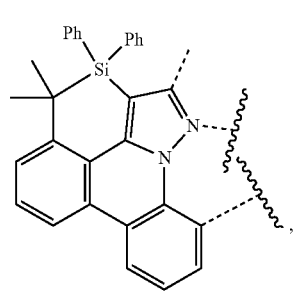
A184 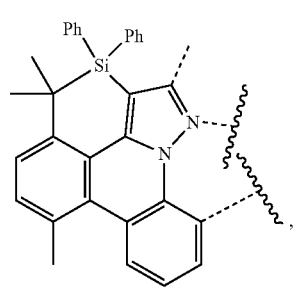
A185 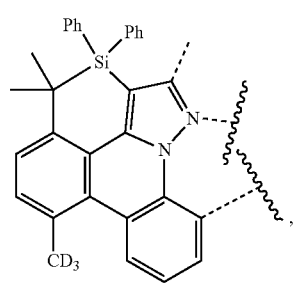
A186 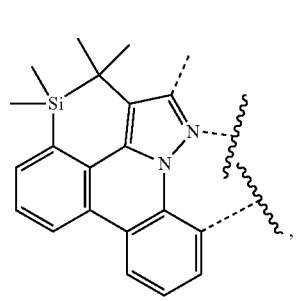
-continued
A187 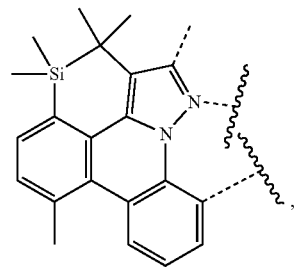
A188 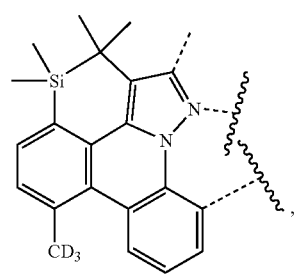
A189 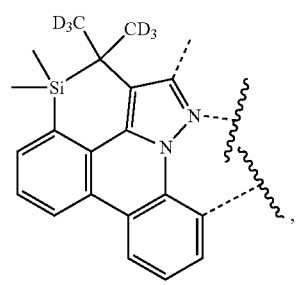
A190 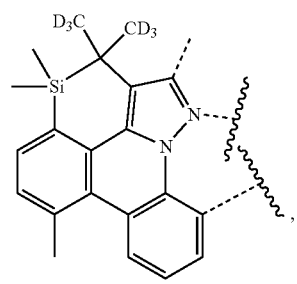
A191 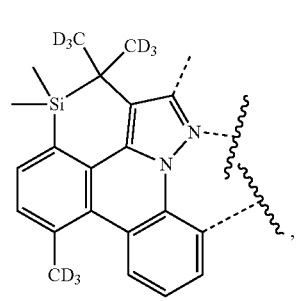

231
-continued
A192
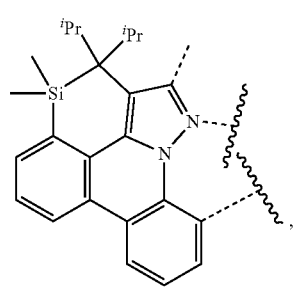
A193
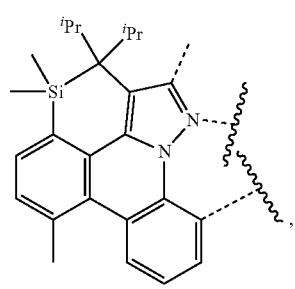
A194
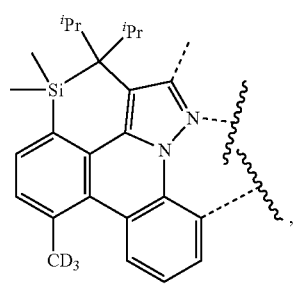
A195
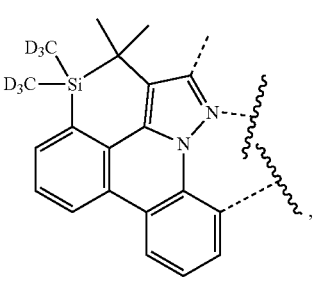
A196
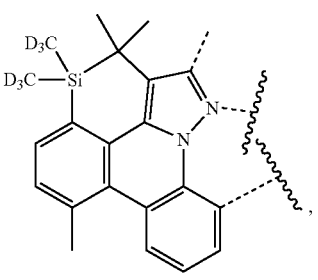
232
-continued
A197
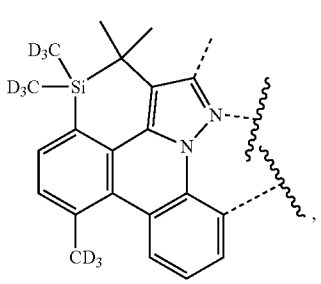
A198
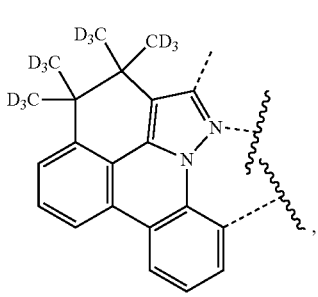
A199
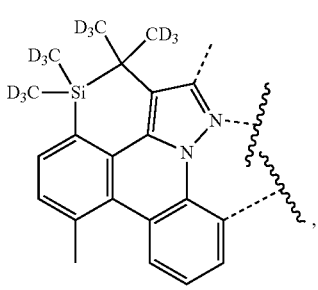
A200
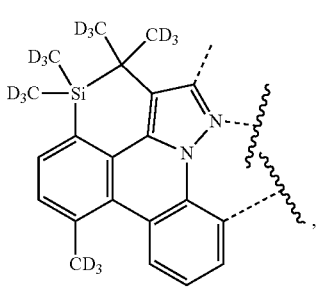
A201
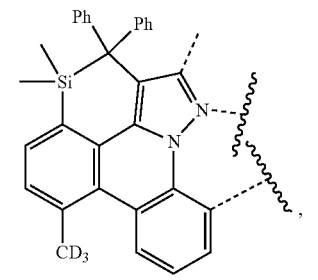

-continued
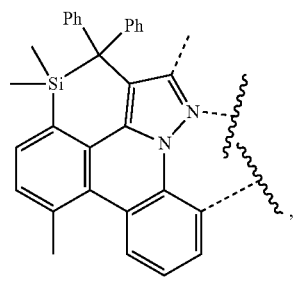
A202
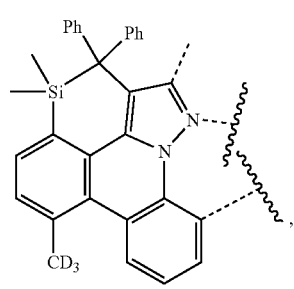
A203
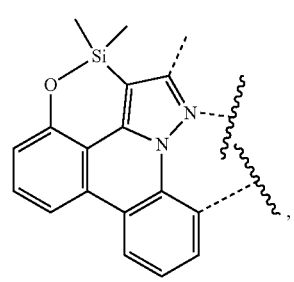
A204
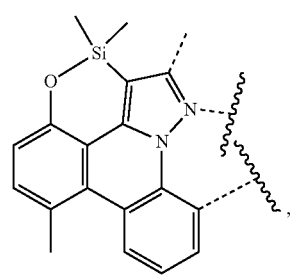
A205
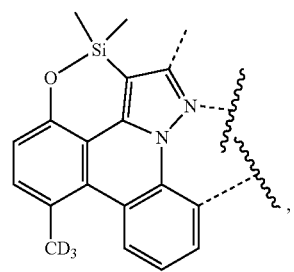
A206
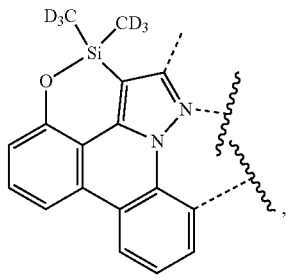
A207
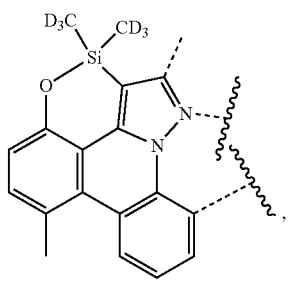
A208
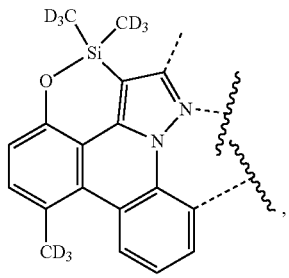
A209
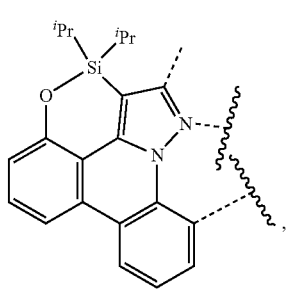
A210
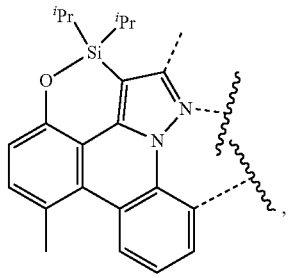
A211

A212
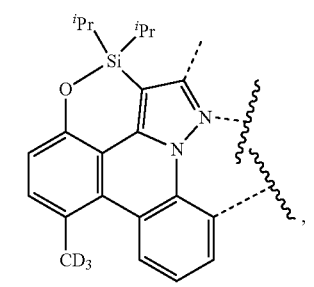
A213
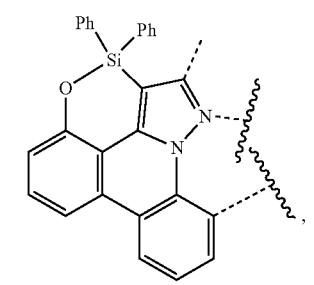
A214
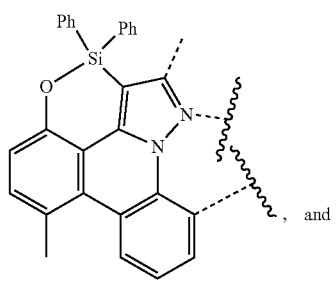, and
A215
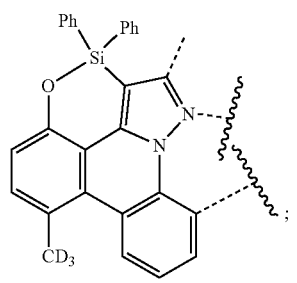;
and wherein L1 is selected from the group consisting of:
L1
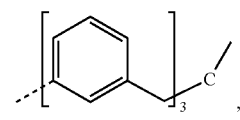,
L2
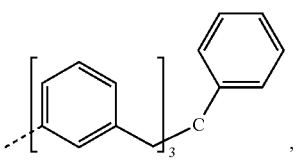,
L3
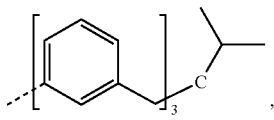,
L4
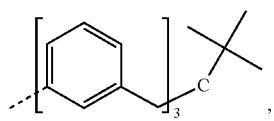,
L5
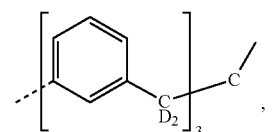,
L6
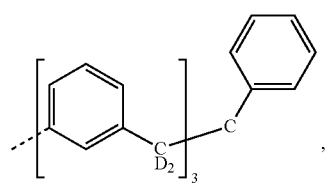,
L7
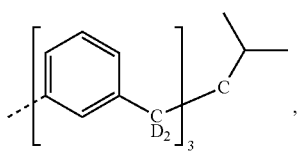,
L8
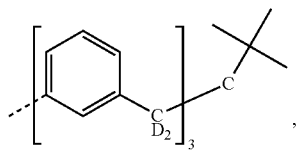,
L9
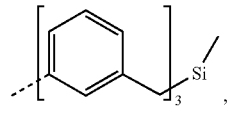,
L10
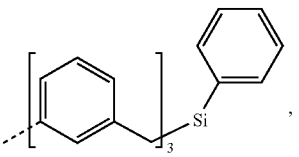,
L11
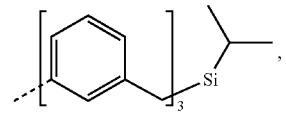,
L12
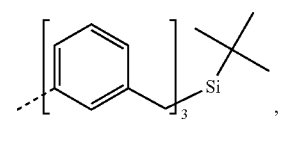,
L13
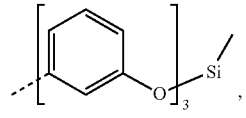, -continued
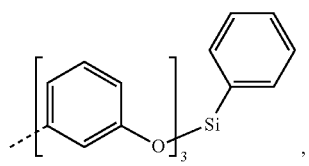 L14
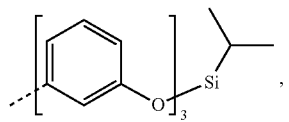 L15
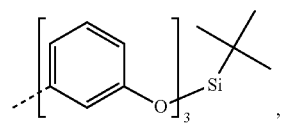 L16
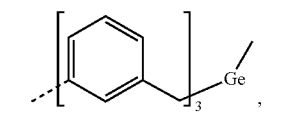 L17
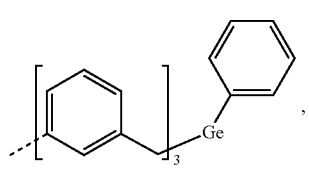 L18
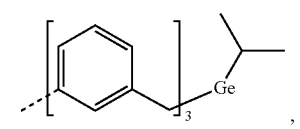 L19
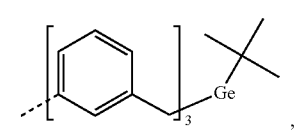 L20
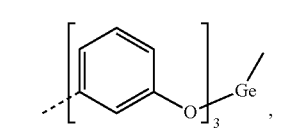 L21
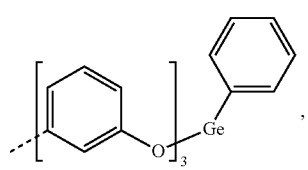 L22
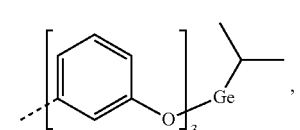 L23
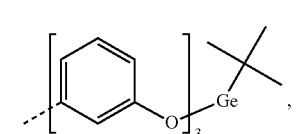 L24
-continued
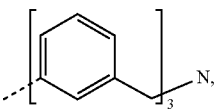 L25
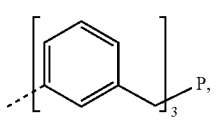 L26
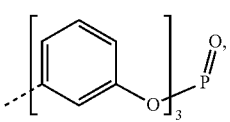 L27
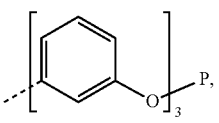 L28
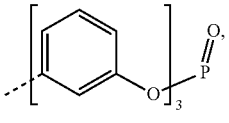 L29
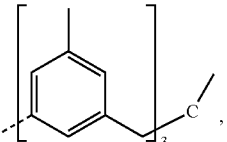 L30
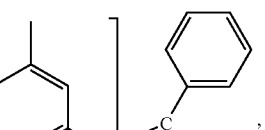 L31
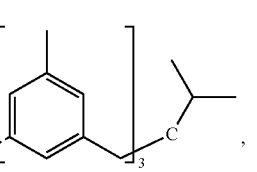 L32
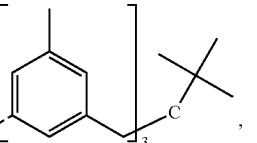 L33
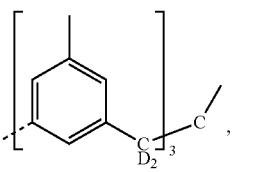 L34

-continued
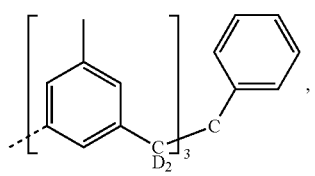 L35
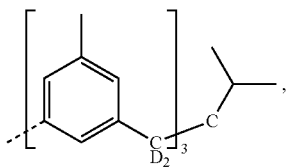 L36
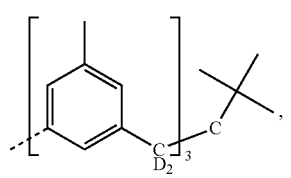 L37
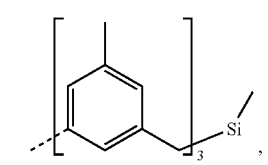 L38
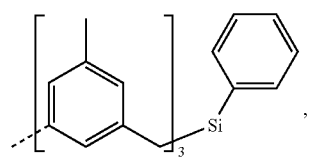 L39
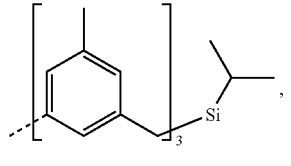 L40
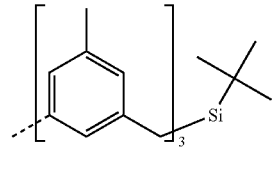 L41
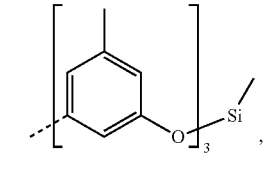 L42
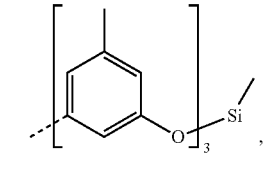 L42
-continued
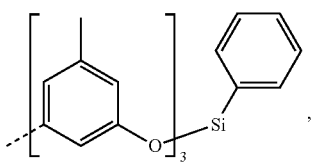 L43
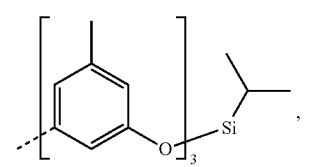 L44
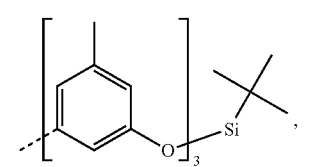 L45
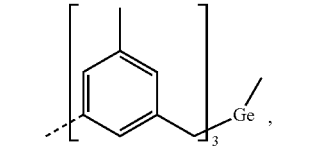 L46
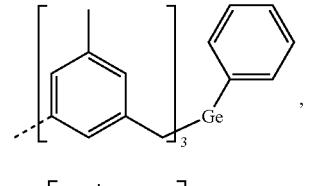 L47
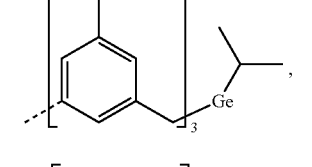 L48
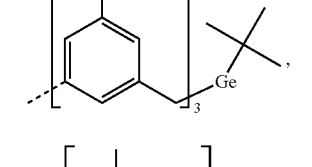 L49
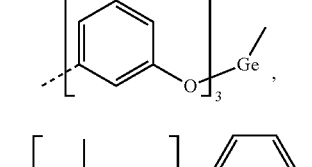 L50
L51

-continued
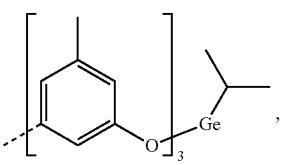 L52
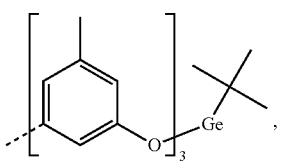 L53
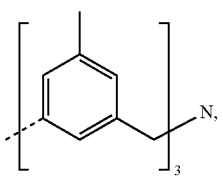 L54
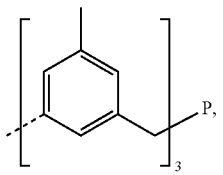 L55
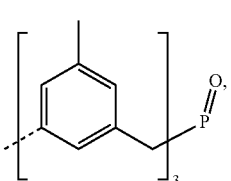 L56
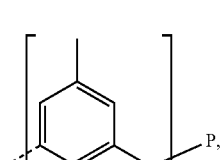 L57
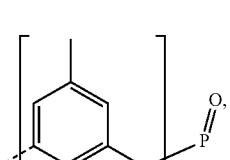 L58
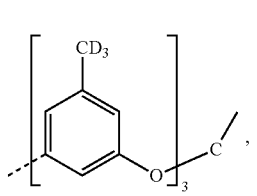 L59
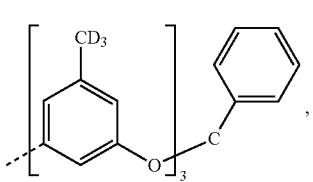 L60
-continued
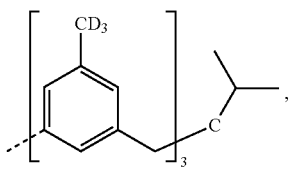 L61
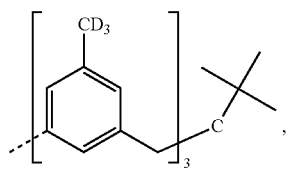 L62
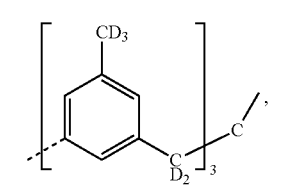 L63
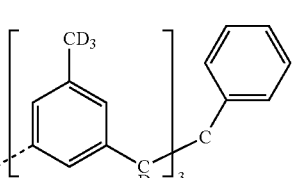 L64
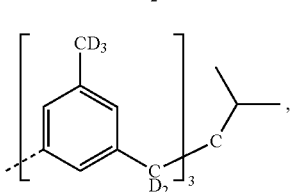 L65
L66
L67
L68
L69

-continued
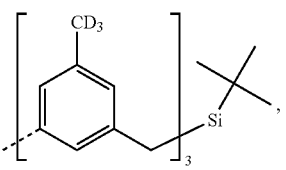 L70
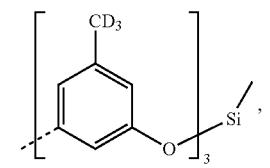 L71
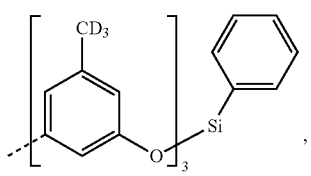 L72
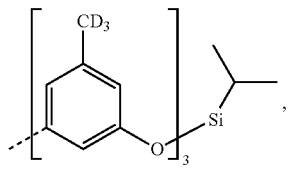 L73
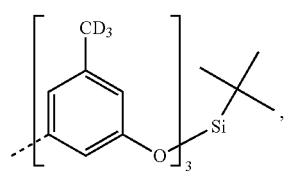 L74
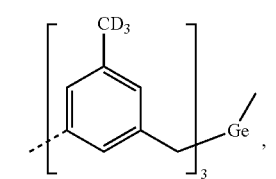 L75
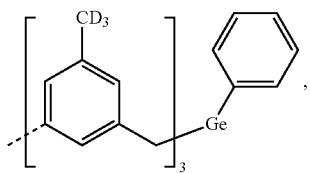 L76
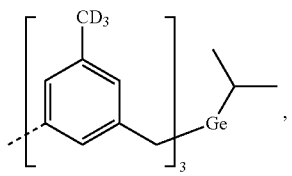 L77
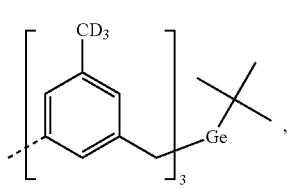 L78
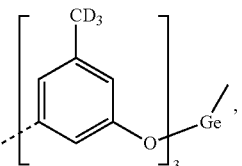 L79
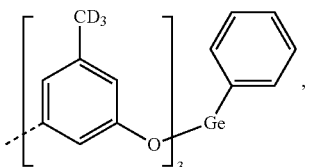 L80
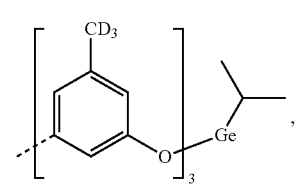 L81
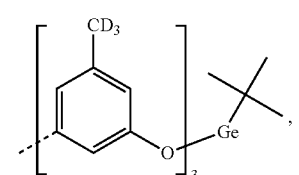 L82
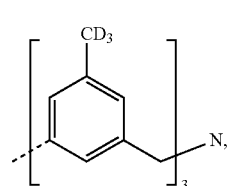 L83
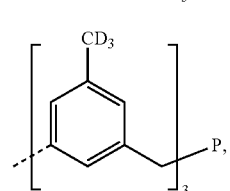 L84
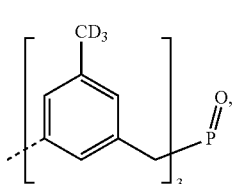 L85
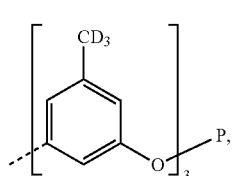 L86
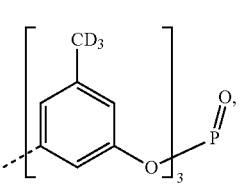 L87

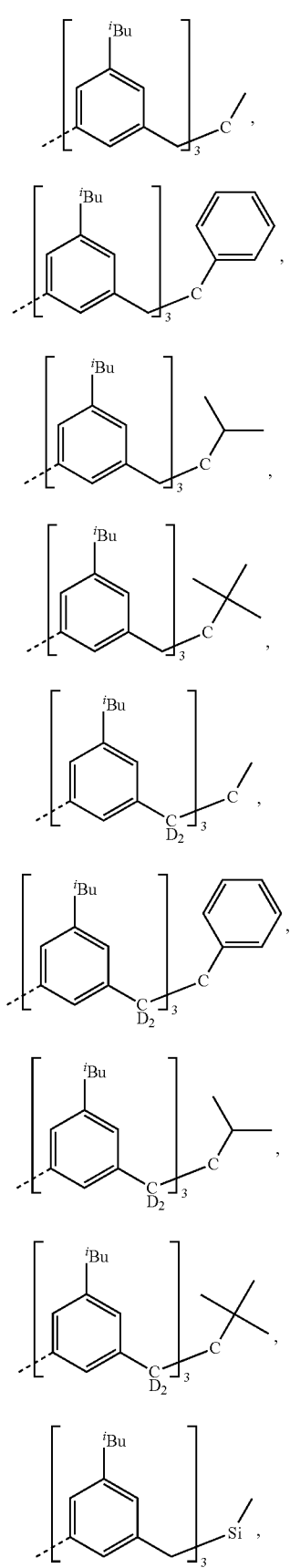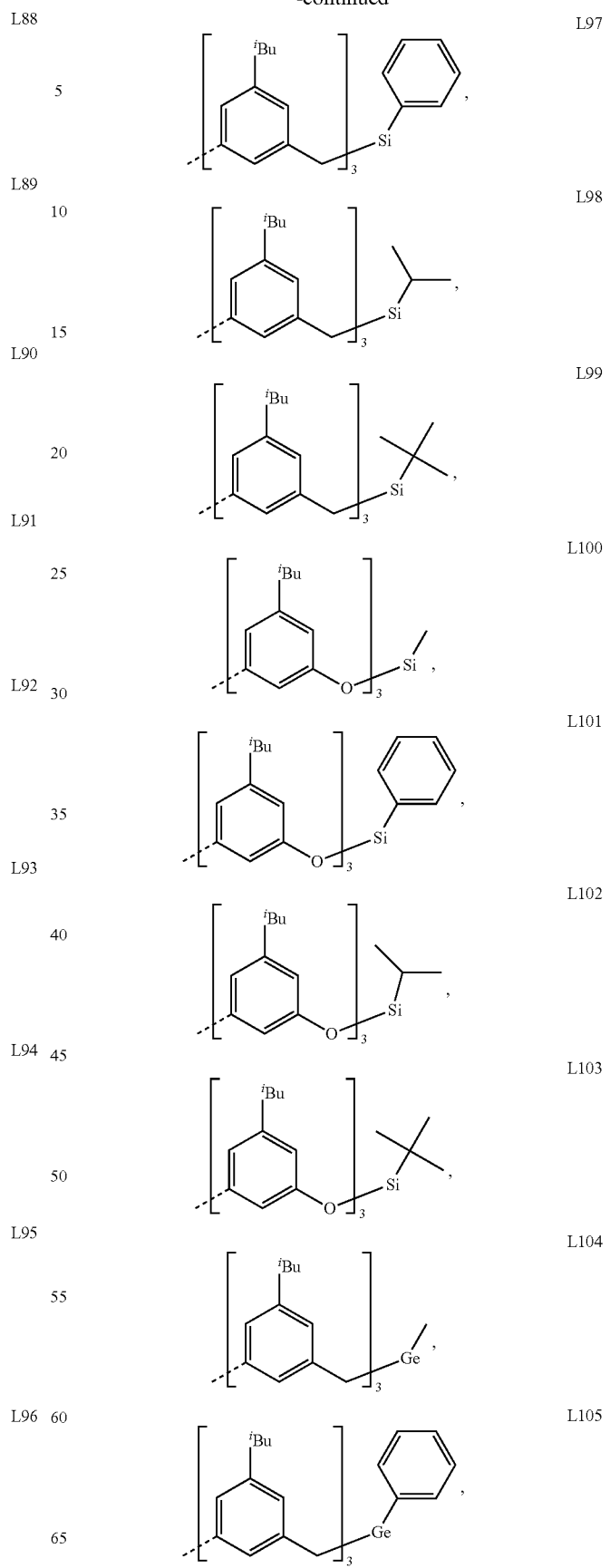

-continued
L106 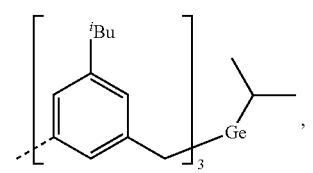
L107 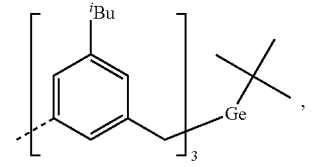
L108 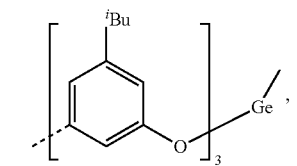
L109 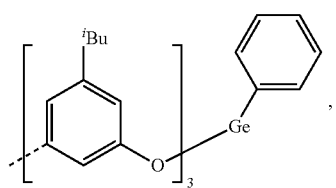
L110 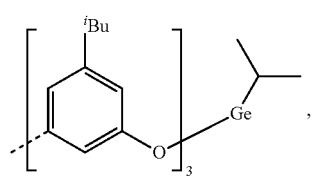
L111 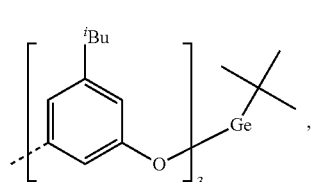
L112 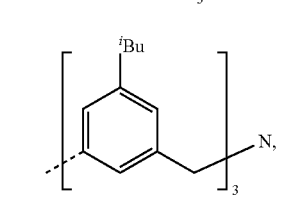
L113 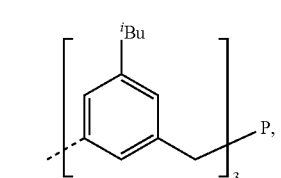
L114 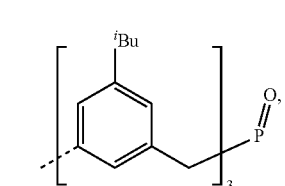
-continued
L115 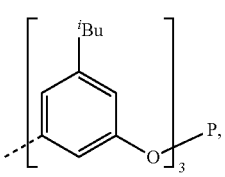
L116 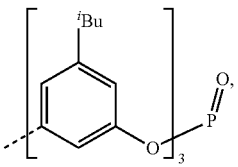
L117 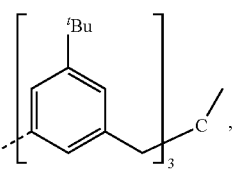
L118 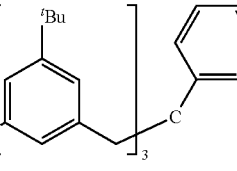
L119 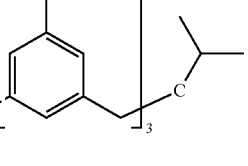
L120 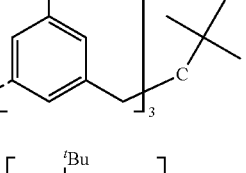
L121 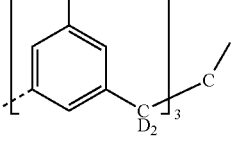
L122 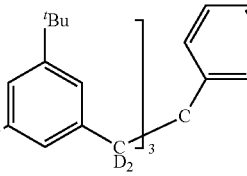
L123 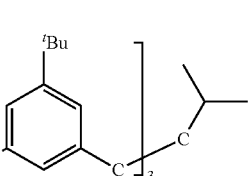

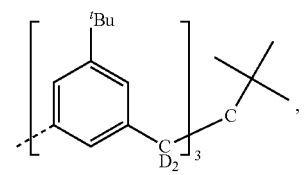 L124
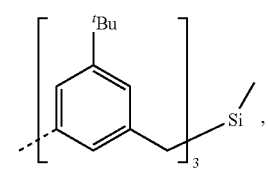 L125
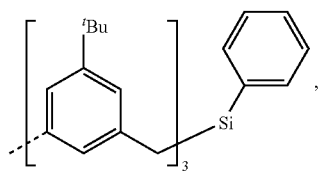 L126
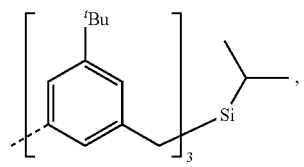 L127
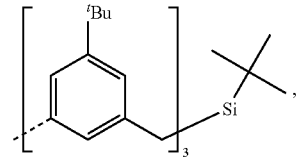 L128
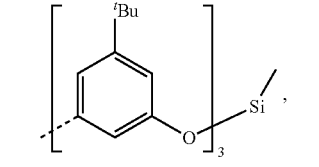 L129
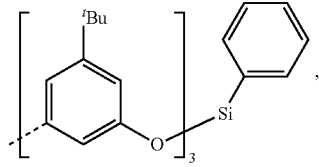 L130
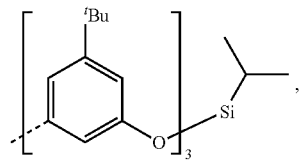 L131
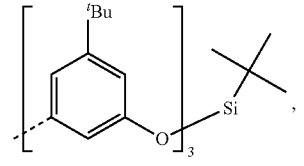 L132
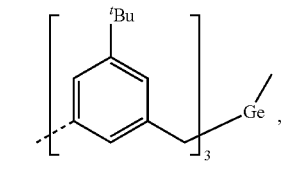 L133
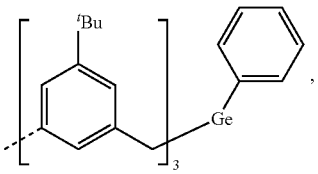 L134
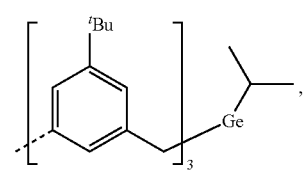 L135
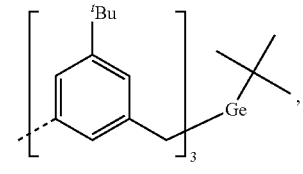 L136
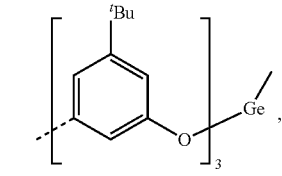 L137
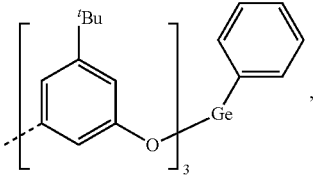 L138
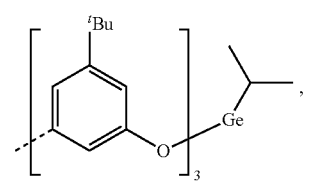 L139
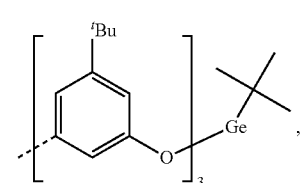 L140
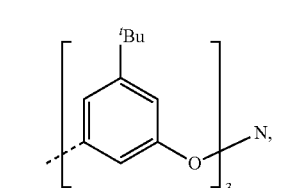 L141

251
-continued
| | |
|---|---|
| 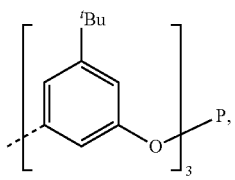 | L142 |
| 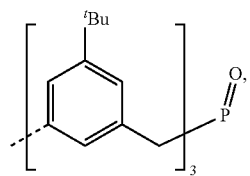 | L143 |
| 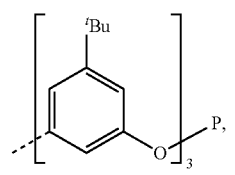 | L144 |
| 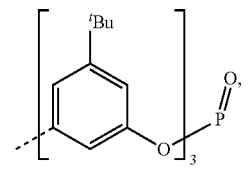 | L145 |
| 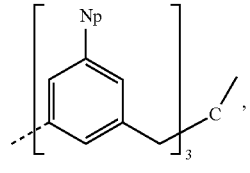 | L146 |
| 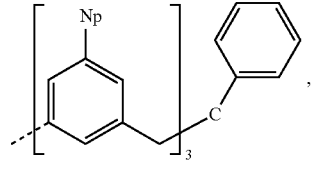 | L147 |
| 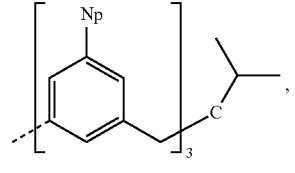 | L148 |
| 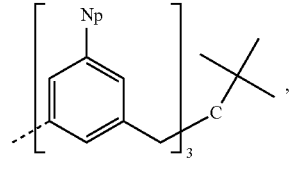 | L149 |
| 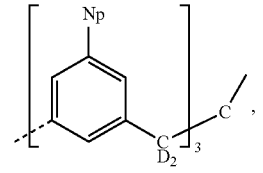 | L150 |
252
-continued
| | |
|---|---|
| 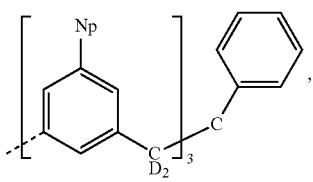 | L151 |
| 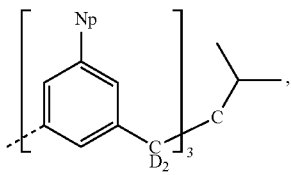 | L152 |
| 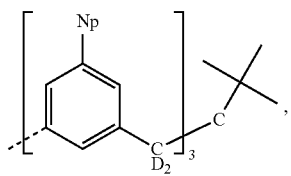 | L153 |
| 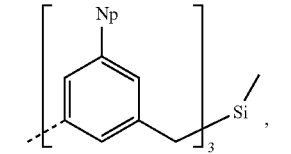 | L154 |
| 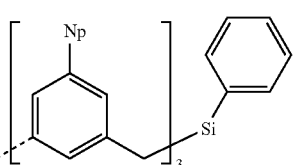 | L155 |
| 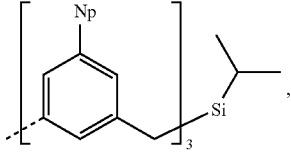 | L156 |
| 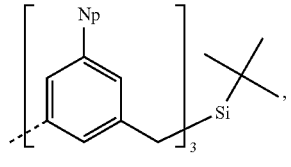 | L157 |
| 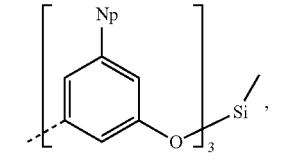 | L158 |
| 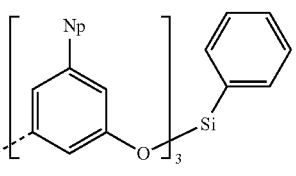 | L159 |

-continued
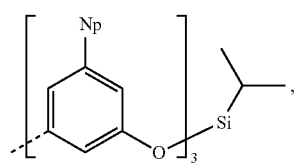 L160
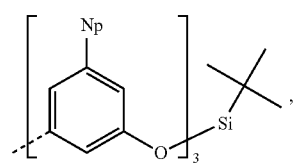 L161
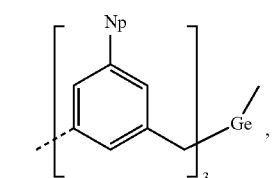 L162
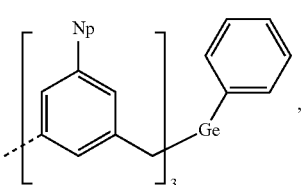 L163
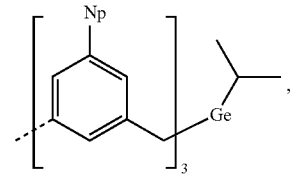 L164
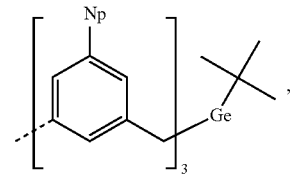 L165
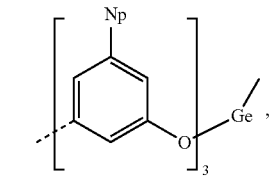 L166
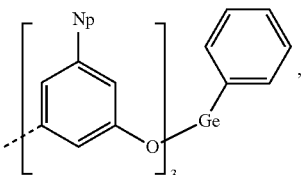 L167
-continued
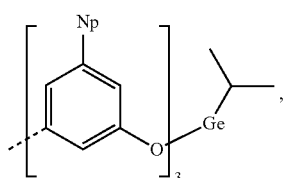 L168
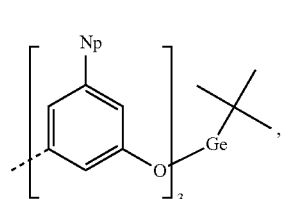 L169
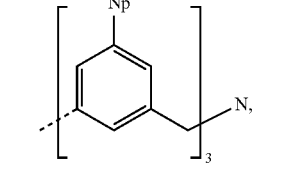 L170
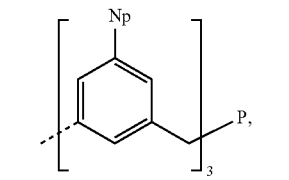 L171
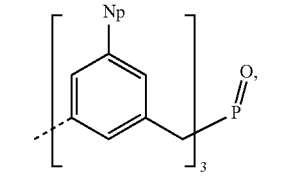 L172
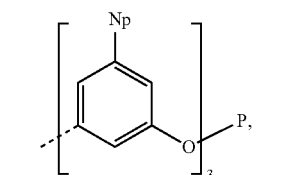 L173
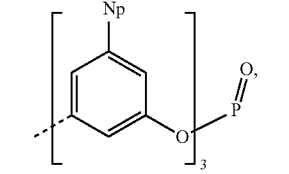 L174
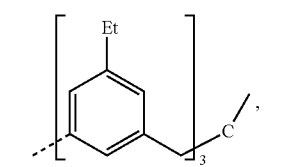 L175

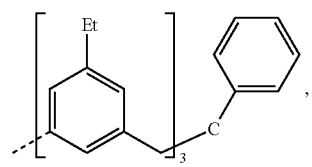 L176
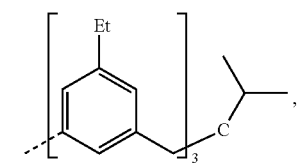 L177
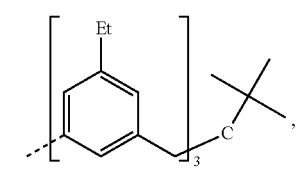 L178
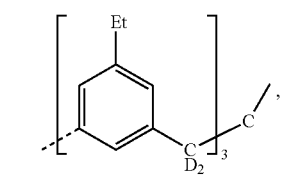 L179
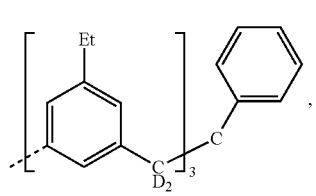 L180
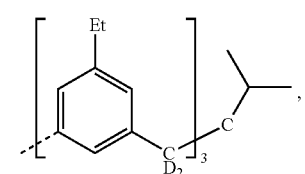 L181
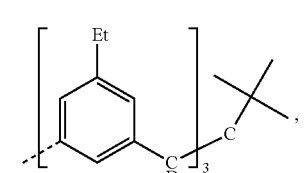 L182
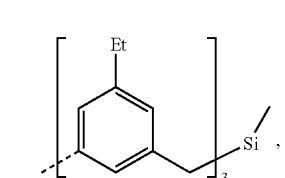 L183
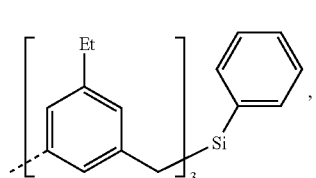 L184
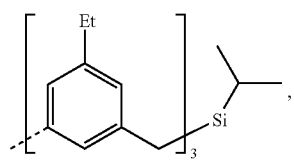 L185
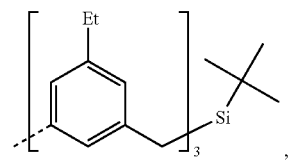 L186
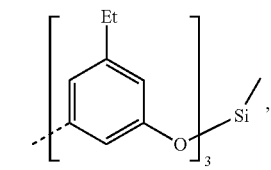 L187
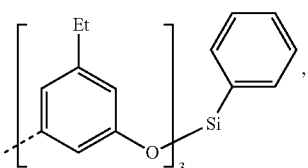 L188
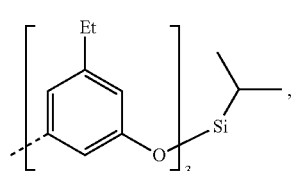 L189
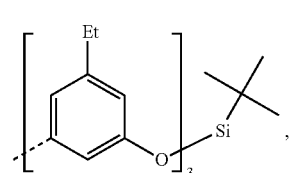 L190
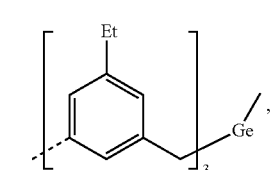 L191

L192 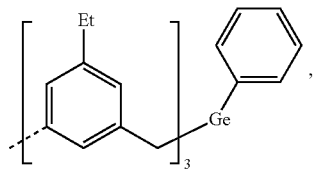
L193 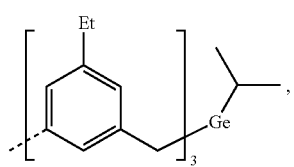
L194 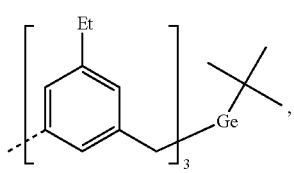
L195 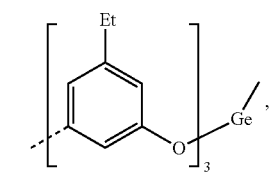
L196 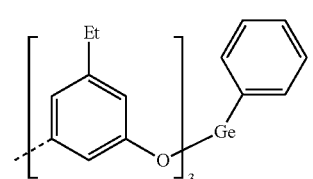
L197 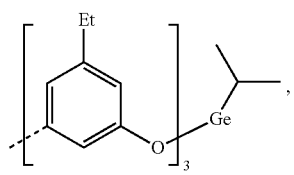
L198 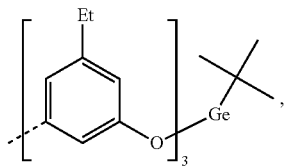
L199 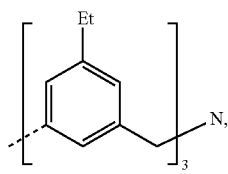
L200 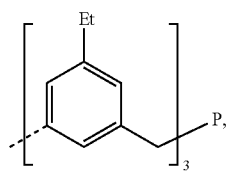
L201 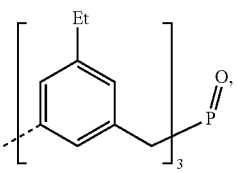
L202 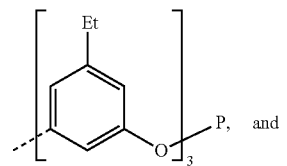
and
L203 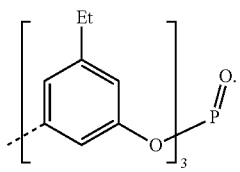
14. An organic light emitting device (OLED) comprising:
an anode;
a cathode; and
an organic layer, disposed between the anode and the cathode, comprising a compound comprising a first ligand $L_A$ having Formula 1:

Formula I

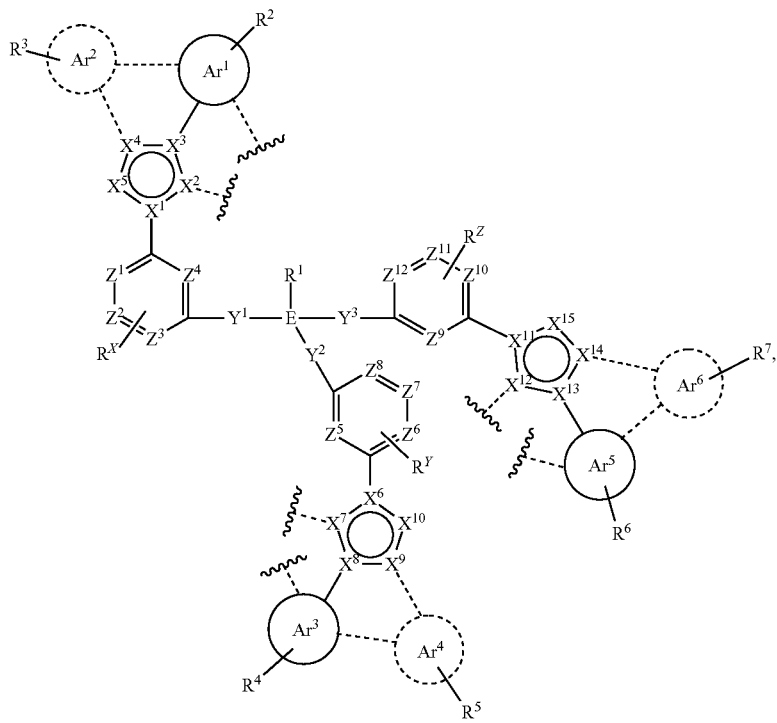

wherein $X^1$-$X^{15}$ are each independently C or N;

wherein $Y^1$, $Y^2$, and $Y^3$ each independently represent a direct bond, or an organic or inorganic linker;

wherein $Z^1$-$Z^{12}$ are each independently C or N;

wherein $R^1$-$R^7$, $R^X$, $R^Y$, and $R^Z$ each independently represents mono to the maximum allowable substitution, or no substitution;

wherein E is selected from the group consisting of C, N, Si, B, Al, P, and Ge;

wherein $R^1$ is not present when E is N, B, Al, or P;

wherein each $R^1$-$R^7$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein $Ar^1$, $Ar^3$, and $Ar^5$ are each independently a 5- or 6-membered carbocyclic or heterocyclic ring;

wherein $Ar^2$, $Ar^4$, and $Ar^6$ are each optionally present and are each independently a 5- or 6-membered carbocyclic or heterocyclic ring;

wherein any two substituents may be joined or fused to form a ring;

wherein the ligand $L_A$ is coordinated to a metal M; and wherein the wave lines indicate bonds to M.

15. The OLED of claim 14, wherein the organic layer is an emissive layer and the compound is an emissive dopant or a non-emissive dopant.

16. The OLED of claim 14, wherein the organic layer further comprises a host, wherein the host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

17. The OLED of claim 14, wherein the organic layer further comprises a host, wherein the host is selected from the group consisting of:

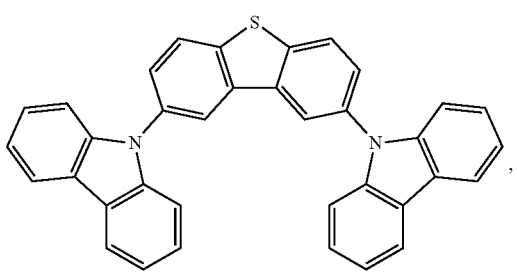

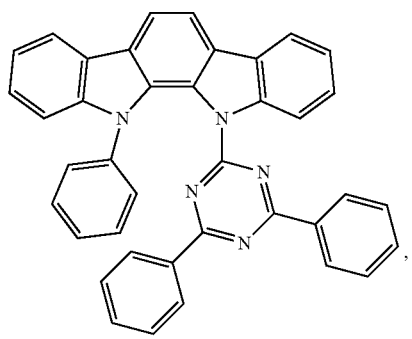

261
-continued
262
-continued
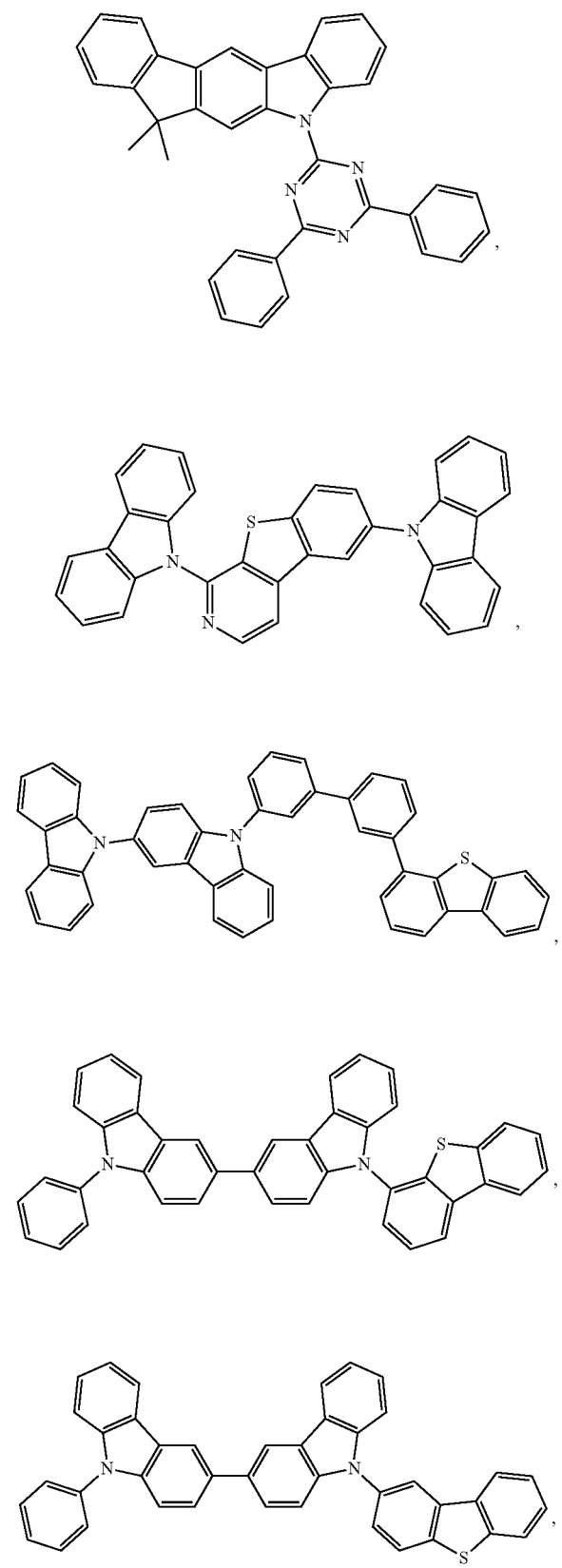
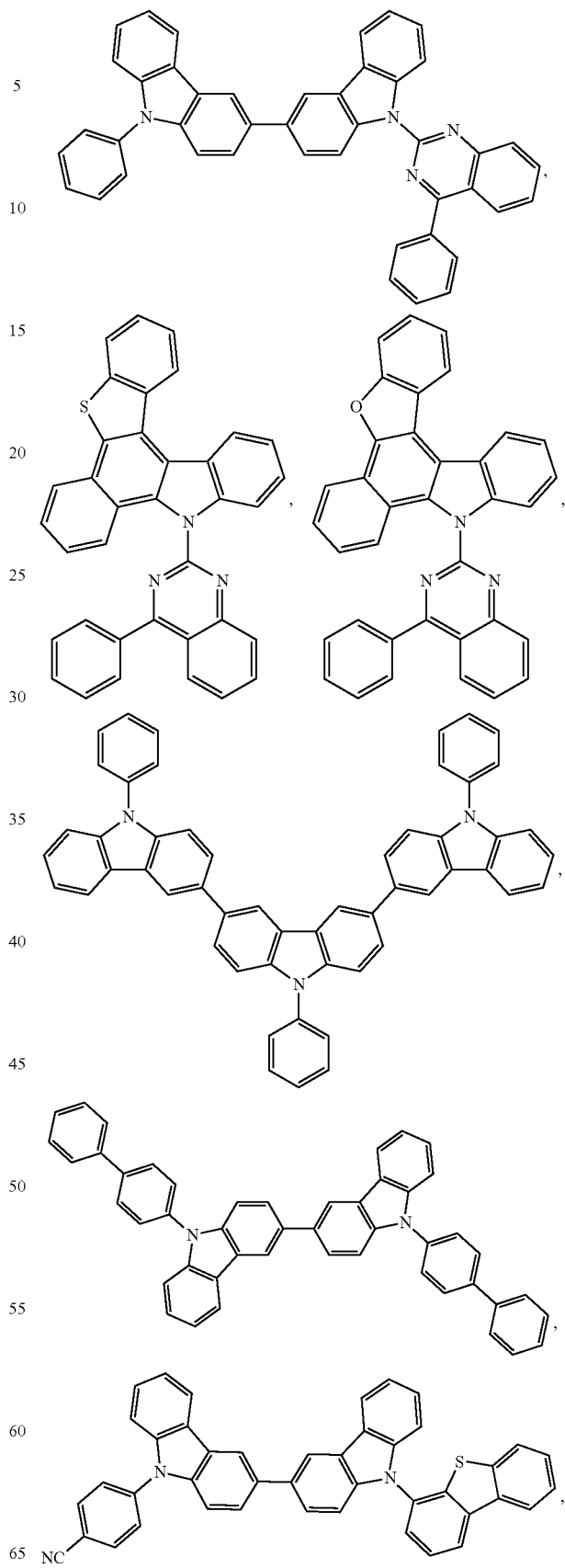

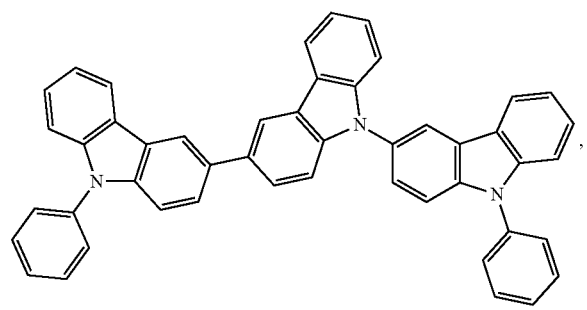
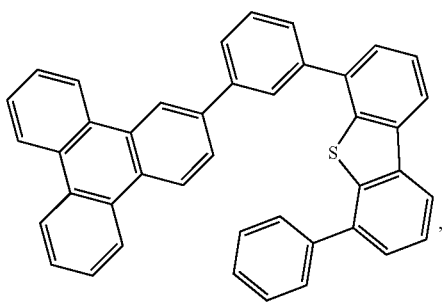
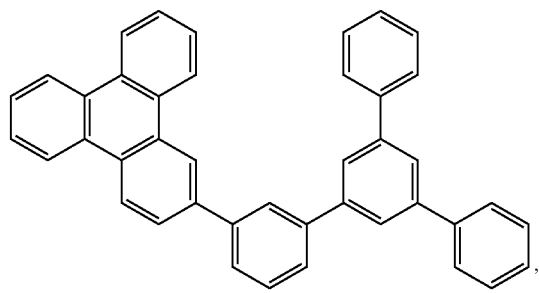
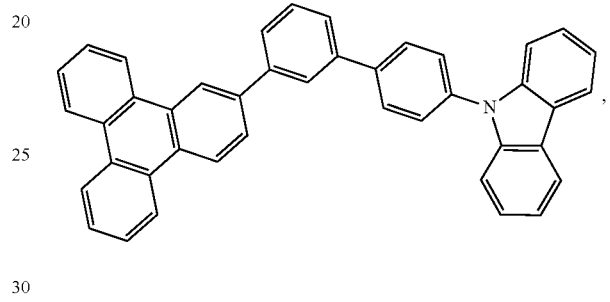
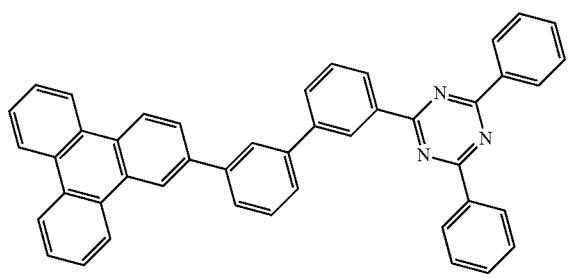
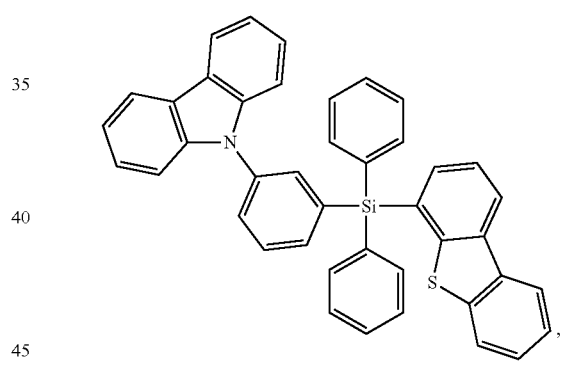
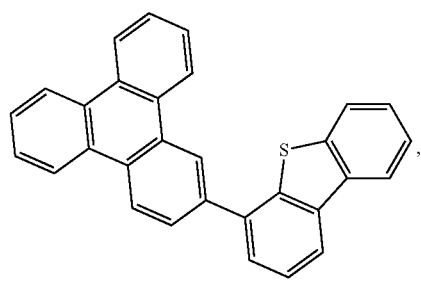
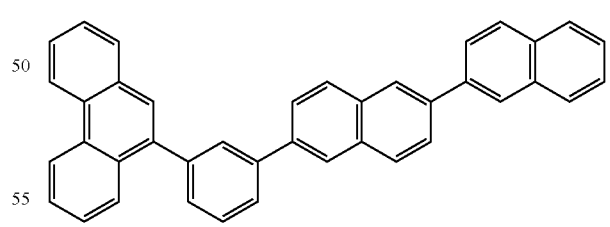
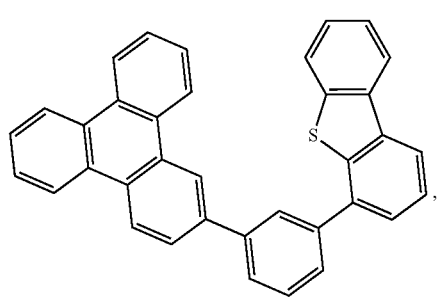
and combinations thereof.
18. A consumer product comprising an organic light-emitting device (OLED) comprising:
an anode;
a cathode; and
an organic layer, disposed between the anode and the cathode, comprising a compound comprising a first ligand $L_A$ having Formula 1:

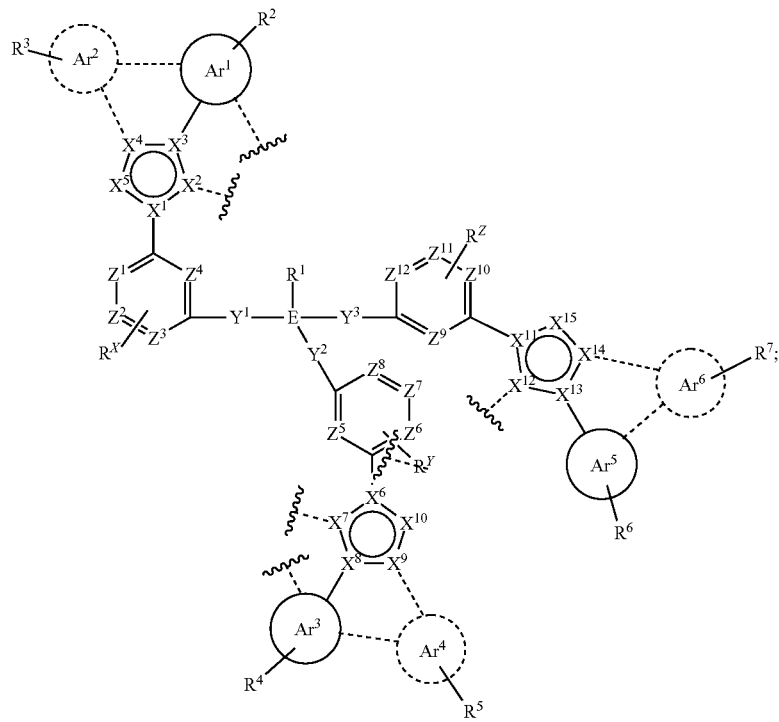

Formula I wherein $X^1$-$X^{15}$ are each independently C or N;
wherein $Y^1$, $Y^2$, and $Y^3$ each independently represent a direct bond, or an organic or inorganic linker;
wherein $Z^1$-$Z^{12}$ are each independently C or N;
wherein $R^1$-$R^7$, $R^X$, $R^Y$, and $R^Z$ each independently represents mono to the maximum allowable substitution, or no substitution;
wherein E is selected from the group consisting of C, N, Si, B, Al, P, and Ge;
wherein $R^1$ is not present when E is N, B, Al, or P;
wherein each $R^1$-$R^7$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;
wherein $Ar^1$, $Ar^2$, and $Ar^5$ are each independently a 5- or 6-membered carbocyclic or heterocyclic ring;
wherein $Ar^2$, $Ar^4$, and $Ar^6$ are each optionally present and are each independently a 5- or 6-membered carbocyclic or heterocyclic ring;
wherein any two substituents may be joined or fused to form a ring;
wherein the ligand $L_A$ is coordinated to a metal M; and
wherein the wave lines indicate bonds to M.

19. The consumer product of claim 18, wherein the consumer product is selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

20. A formulation comprising a compound of claim 1.

* * * * *

UNITED STATES PATENT AND TRADEMARK OFFICE
CERTIFICATE OF CORRECTION

PATENT NO. : 10,941,170 B2  
APPLICATION NO. : 15/944052  
DATED : March 9, 2021  
INVENTOR(S) : Geza Szigethy Page 1 of 1

It is certified that error appears in the above-identified patent and that said Letters Patent is hereby corrected as shown below:

In the Claims

Please amend the text of Claim 7, Column 188, Lines 50-54, to read:
-- 7. The compound of claim 1, wherein $X^2$, $X^4$, $X^7$, $X^9$, $X^{12}$, and $X^{14}$ are N, and $X^1$, $X^3$, $X^5$, $X^6$, $X^8$, $X^{10}$, $X^{11}$, $X^{13}$, and $X^{15}$ are C, or $X^2$, $X^3$, $X^7$, $X^8$, $X^{12}$, and $X^{13}$ are N, and $X^1$, $X^4$, $X^5$, $X^6$, $X^9$, $X^{10}$, $X^{11}$, $X^{14}$, and $X^{15}$ are C. --

In Claim 18, Column 265, Lines 48-49, should read as follows:
-- wherein $Ar^1$, $Ar^3$, and $Ar^5$ are each independently a 5- or 6-membered carbocyclic or heterocyclic ring; --

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*